(12) United States Patent
Bai et al.

(10) Patent No.: US 8,335,963 B2
(45) Date of Patent: Dec. 18, 2012

(54) METHOD FOR CONSTRUCTING CHECKING MATRIX OF LDPC CODE AND CODING AMD DECODING APPARATUS UTILIZING THE METHOD

(75) Inventors: Dong Bai, Beijing (CN); Binbin Liu, Beijing (CN); Tao Tao, Beijing (CN); Qihong Ge, Beijing (CN); Wen Chen, Beijing (CN); Huishi Song, Beijing (CN); Qun Li, Beijing (CN); Hongbing Shen, Beijing (CN); Qinghua Yang, Beijing (CN)

(73) Assignee: Timi Technologies Co., Ltd., Beijing (CN)

( * ) Notice: Subject to any disclaimer, the term of this patent is extended or adjusted under 35 U.S.C. 154(b) by 337 days.

(21) Appl. No.: 12/446,084

(22) PCT Filed: Nov. 16, 2006

(86) PCT No.: PCT/CN2006/003091
§ 371 (c)(1),
(2), (4) Date: Nov. 8, 2010

(87) PCT Pub. No.: WO2008/049285
PCT Pub. Date: May 2, 2008

(65) Prior Publication Data
US 2011/0239077 A1    Sep. 29, 2011

(30) Foreign Application Priority Data
Oct. 20, 2006 (CN) .......................... 2006 1 0113914

(51) Int. Cl.
*H03M 13/00* (2006.01)
(52) U.S. Cl. .................... 714/758; 714/752; 714/784
(58) Field of Classification Search .................. 714/758, 714/752, 784, 800, 799, 801, 807
See application file for complete search history.

(56) References Cited

U.S. PATENT DOCUMENTS

| | | | |
|---|---|---|---|
| 7,525,375 B2 * | 4/2009 | Bucher et al. | 330/9 |
| 7,536,623 B2 | 5/2009 | Kim et al. | |
| 7,627,805 B2 * | 12/2009 | Mittelsteadt et al. | 714/800 |
| 7,882,418 B2 * | 2/2011 | Lee et al. | 714/758 |
| 2009/0070652 A1 * | 3/2009 | Myung et al. | 714/752 |
| 2009/0106625 A1 | 4/2009 | Jun et al. | |
| 2009/0249159 A1 * | 10/2009 | Lee et al. | 714/752 |

FOREIGN PATENT DOCUMENTS

| | | |
|---|---|---|
| CN | 1558556 | 12/2004 |
| CN | 1564465 | 1/2005 |
| CN | 1770640 | 5/2006 |
| CN | 1783730 | 6/2006 |
| WO | WO 2006/031062 | 3/2006 |

* cited by examiner

*Primary Examiner* — Fritz Alphonse
(74) *Attorney, Agent, or Firm* — Morgan, Lewis & Bockius LLP

(57) ABSTRACT

The present invention relates to a method for constructing LPDC code check matrix and encoding and decoding devices using the same. The present invention constructs the LDPC code check matrix using an algebraic structure, obtaining the LDPC code with stable performance.

14 Claims, 3 Drawing Sheets

METHOD FOR CONSTRUCTING CHECKING MATRIX OF LDPC CODE AND CODING AMD DECODING APPARATUS UTILIZING THE METHOD

TECHNICAL FIELD

The present invention relates to a method for constructing forward error correction code in digital information transmission technology, and more particularly, to a method for constructing Low Density Parity Check (LDPC) code, and encoding and decoding devices using the same.

BACKGROUND

In 1948, Claude Shannon initially proposed his famous "noisy channel encoding theory" which firstly gives the maximum transmission rate of the noisy channel information, i.e., channel capacity. Meanwhile, Shannon also derived the maximum transmission capability of the noisy channel, i.e., the minimum Signal-to-Noise Ratio required by errorless information transmission, which is also called as Shannon's limit. The Shannon's limit is the most important feature for evaluating the capability of channel error correction. Closer the error correction performance curve to the Shannon's limit, the more excellent is the error correction performance. Otherwise, farther to the Shannon's limit, the worse is the performance. Although the encoding theory of Shannon gives the channel capacity which can be obtained by the optimal encoding scheme, detailed encoding scheme is not provided, and the complexity degree is not described either.

The Low Density Parity Check (LDPC) is a kind of excellent channel error correction encoding scheme which may approach the Shannon's limit. The LDPC code is a special linear parity block code, whose parity matrix is "sparse", i.e. there is only very few non-zero elements (for the binary code, non-zero element is 1), and the remaining elements are all zero. In 1960, Robert Gallager firstly proposed the concept of LDPC code in his Ph.D. dissertation and also suggested two iterated decoding algorithms, thus the LDPC code is also called as Gallager code. Gallager indicated theoretically that the LDPC code may approach the channel capacity with lower complexity by using iterated decoding algorithms (or message delivering algorithms). This is a great invention. However, in the following 30 years, researchers did not pay enough attention to the invention.

From the current viewpoint, one reasons why the LDPC code was ignored might consist in that the software and hardware levels of the computers were very inferior at that time, and thus the researches could not know the excellent performance of the LDPC code from results of computer simulations; as another reason, the LDPC code needs a larger storage space which could not be born at that time. Additionally, at that time, other codes such as Reed-Solomon code and Hamming code were available, which might be considered as temporarily usable channel encoding schemes, and thus the researchers did not intently forward their researches onto the LDPC code.

Even today, if it is intended to apply the LDPC code to actual communication systems, the LDPC code still needs to be carefully studied and designed. Because the actual communication systems put some special requirements on the LDPC code, such as hardware schemes of codec with lower complexity, excellent error correction performance, and the like, thus, besides the deep studies on the encoding/decoding method, it is also required to specially limit the construction of the parity matrix of the LDPC code. Generally, there are two methods of constructing the parity matrix of the LDPC code: one is to firstly set some limitations on the attribute of parity matrix such as minimum girth or junction degree distribution etc., and then randomly or pseudo-randomly generate the parity matrix by using the computer searching methods, the searching method takes a long period of time and it can not ensure the convergence of search procedure. Since the generated check matrices have high randomicity level and low regularity level, the check matrices have to be stored during the process of encoding and decoding, thus it increases the memory demand. The other method is to construct the parity matrix of the LDPC code by using the mathematical formulae to make it have regular structure. The method solves the problem of storing the check matrices. However, each row and column of a single check matrix lacks of rule, which is hard for parallel processing.

SUMMARY OF INVENTION

To solve the above problem, the present invention provides a method for constructing a LPDC code check matrix. With the method thereof, a LPDC code check matrix with stable performance can be constructed, and any code rate can be obtained. And the check matrix generated by the method is preferable for encoding and decoding.

According to an aspect of the invention, a method for constructing a LDPC check matrix is provided, which constructs a fundamental matrix firstly, then extends the fundamental matrix by extending columns firstly and then extending rows to obtain the objective check matrix.

The method for constructing the check matrix H with dimensions of M×N, comprises the following steps:

a step of obtaining a common factor set $F_c$ of M and N;

a step of selecting proper extending ratio $K \in F_c$ and generating a fundamental matrix $M_B \times N_B$ with dimensions $M_B \times N_B$ using any manner, in which $M_B = M/K$, $N_B = N/K$;

a step of extending by columns and constructing a matrix $H_R$ with dimensions of $M_B \times N$ based on the fundamental matrix, which comprises the following steps: for non-zero elements with row-column coordinate (m, n) in the fundamental matrix, selecting a set of column extending coefficients $\{k_i, 0 \leq k_i \leq K-1, i \in Z^+\}$ which are different from each other, with "1" on positions $(m, k_i \times N_B + n)$ of the matrix $H_R$; a step of extending by rows, and extending K rows based on each row of $H_R$, and the method comprising: the t row $(0 \leq t \leq K-1)$ extended by a certain row of $H_R$ is obtained by cyclic shifting $t \times N_B$ positions rightward.

To facilitate encoding, the $H_R$ generated according to the above constructing method can be stored in code table form. Each row of the code table records the positions of "1" in each row of $H_R$.

According to another aspect of the invention, a method for constructing LDPC code check matrix is provided, which constructs a fundamental matrix firstly, then extends the fundamental matrix by extending rows firstly and then extending columns to obtain the objective check matrix.

The method for constructing the check matrix H with dimensions of M×N, comprises the following steps:

a step of obtaining a common factor set $F_c$ of M and N;

a step of selecting proper extending ratio $K \in F_c$ and generating a fundamental matrix $M_B \times N_B$ with dimensions of using any manner, in which $M_B = M/K$, $N_B = N/K$, as shown in FIG. 1, in which black blocks denote "1" and white blocks represent "0";

a step of extending by rows and constructing a matrix $H_C$ with dimensions of $M \times N_B$ based on the fundamental matrix, which comprises the following steps: for non-zero elements with row-column coordinate (m, n) in the fundamental matrix, selecting a set of row extending coefficients $\{k_i, 0 \leq k_i \leq K-1, i \in Z'\}$ which are different from each other, with "1" on positions $(k_i \times M_B + m, n)$ of the matrix $H_C$;

a step of extending by columns, and extending out K columns by each column of $H_C$, and the step thereof comprises: the $t^{th}$ column ($0 \leq t \leq K-1$) extended by a certain column of $H_C$ is obtained by cyclic shifting $t \times N_B$ positions downward.

To facilitate encoding, the $H_C$ generated according to the above constructing method can be stored in code table form. Each row of the code table records the positions of "1" in each column of Hc.

According to still another aspect of the invention, a method of encoding a check matrix with dimensions of M×N constructed by the method for constructing a LDPC check matrix of the invention is provided, comprising the following steps:

a step of constructing a sort table IDX with a length of N, in which $IDX=\{I_k\}, 0 \leq k<N, 0 \leq I_k<N$;

a step of re-sorting the column of the check matrix with the dimensions of M×N according to the sort table IDX to generate a matrix H' with dimensions of M×N. The $k^{th}$ column of the matrix H' is the $I_k^{th}$ column of the original M×N matrix. The obtained matrix can be further separated into two sub matrices $H'=[H_I H_I]$, in which $H_I$ is a matrix with a dimension of M×(N-M) and $H_P$ is a matrix with a dimension of M×M;

a step of inputting sequence, constructing a column vector m with a dimension of (N-M)×1, and calculating the column vector with a dimension of M×1 $p^T=m^T(H_P^{-1}H_I)^T$; a step of outputting the sorting result based on the sorting table IDX in which $$c_{I_k} = \begin{cases} p_k & 0 \leq k < N-M \\ m_{k-N+M} & N-M \leq k < N. \end{cases}$$

According to a still further aspect of the invention, an encoding device is provided which encodes inputted binary information using the above encoding method and outputs system code sequence which is encoded and position transformed. The encoding device comprises: a matrix multiply module outputting a check sequence p which is obtained by multiplying the binary information sequence with a matrix $(H_P^{-1}H_I)^T$, i.e., $p^T=m^T(H_P^{-1}H_I)^T$; a sorting index module having N memory units which store index values of a sorting table IDX in turn; and a sorting output module which sorts m and p based on the index values stored in the sorting index table and outputs a code word c.

According to a still another aspect of the invention, a method of decoding the system code sequence formed by the above encoding method is provided comprising the following steps: a step of decoding the system code sequence outputted by the encoding device based on the M×N check matrix using any decoding algorithm; and a step of extracting information sequence after decoding using the same sorting table IDX as that for encoding.

According to a still further aspect of the invention, a decoding device is provided, which decodes the input encoded system code sequence using the above decoding method and outputs the decoded information sequence, the decoding device comprises: a LDPC decoding module which decodes an inputted system code sequence LLR using any LDPC decoding algorithm and outputs a hard-decision sequence ĉ; a sorting index module having N memory units which stores index values of a sorting table IDX; and a sorting output module which extracts an information sequence m̂ from the hard-decision sequence ĉ, i.e., $\hat{m}_k = \hat{c}_{I_{k+M}}, 0 \leq k \leq N-M$ based on the stored index values in the sorting index table.

The present invention constructs the LDPC code check matrix using an algebraic structure, obtaining the LDPC code with stable performance. In addition, the LDPC code can be obtained using any code rate. Further, the encoding and decoding devices of the invention occupy less memory, which is preferable for optimization of the devices.

BRIEF DESCRIPTION OF DRAWINGS

The present invention is described but not limited in conjunction with the embodiments shown in the drawings throughout which the similar reference signs represent the similar elements, in which.

DETAILED DESCRIPTION OF PREFERRED EMBODIMENTS

The preferred embodiment of the invention will be described in detail with reference to accompanying figures.

The preferred embodiment of the invention adopts the same configuration as the conventional communication system, i.e., the mobile multimedia broadcasting system constructed according to the LDPC code check matrix of the invention comprises an encoder, a modulator, a de-modulator, and a decoder. The data are transmitted through channels.

The encoder performs forward error correction encoding to the information sequence including encoding by computer software, encoding by embedded hardware and encoding by special hardware.

The modulator transforms the output of the encoder into signals which are suitable for physical channel transmission.

The de-modulator transforms the signals received from the channels into the information sequence to be inputted into the decoder.

The decoder restores the information sequence outputted from the de-modulator into information sequence which may have errors.

The channel can be any possible data transmission physical channel, including wired communication and wireless communication channels. And the channel includes any possible storage media, including magnetic storage medium, optical storage medium and electronic storage medium.

Mobile multimedia digital broadcasting system STiMi achieves broadcasting coverage in large area and transmits multicasting services through satellites. And users can realize mobile receiving with a terminal.

Now an illustrational LDPC code with a code length of 9216 will be described.

First Embodiment

A 4608×9126 check matrix is constructed according to the first method of the invention.

Firstly, a common factor set of 4608 and 9216 is obtained, which is denoted as $F_c$.

Figure 1:
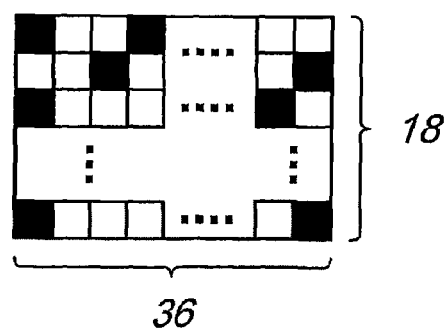
FIG. 1 is a schematic view of a fundamental matrix according to the first embodiment of the invention.

Secondly, a proper extending ratio K is selected, wherein $K \in F_c$. In the present embodiment, the extending ratio is selected to be a common factor 256. Thus, the dimensions of the fundamental matrix are 18×36. The fundamental matrix can be generated in any manner known in the art, as shown in FIG. 1 in which the black block represents "1" and the white block represents "0".

Figure 2:
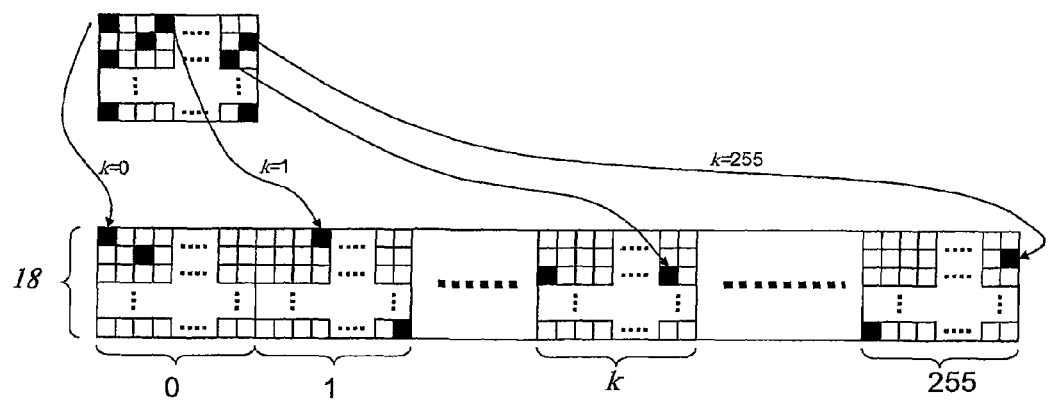
FIG. 2 is a schematic view of extending per column of the fundamental matrix according to the first embodiment of the invention.

For each non-zero element in the fundamental matrix with dimensions of 18×36, a set of column extending coefficients $\{k_i, 0 \leq k_i \leq 255, i \in Z^+\}$ which are different from each other are selected for extension, to be specific:

If the non-zero element has a row-column coordinate (m, n), there will be "1" in the positions (m, $k_i \times 36+n$), thus after extension, a 18×9216 matrix will be generated as shown in FIG. 2.

Figure 3:
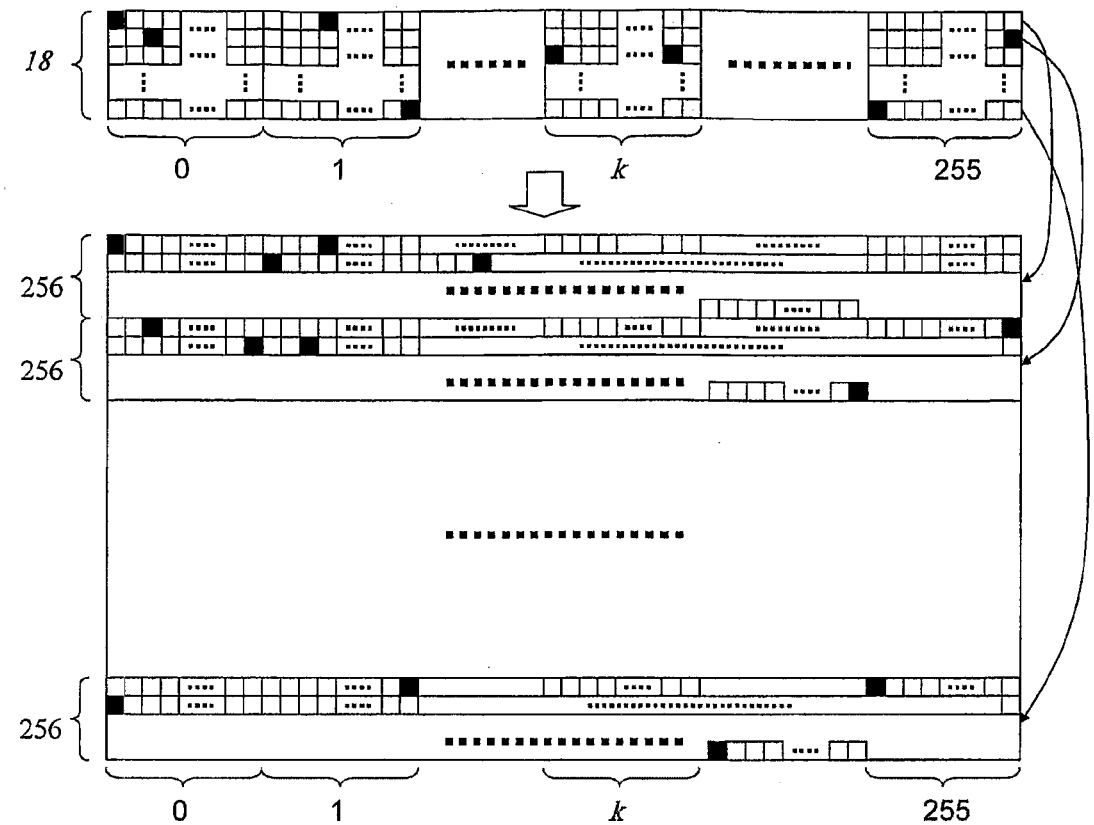
FIG. 3 is a schematic view of extending per column of the fundamental matrix and then extending per row according to the first embodiment of the invention.

After column extension, the generated 18×9216 matrix is extended per row, and each row of the matrix is extended to 256 rows. Specifically, for the first row of the 18×9216 matrix, it is cyclic shift rightward by t×36 to obtain the $t^{th}$ row of the extended first row, where $0 \leq t \leq 255$. For the second row, the above extending method is repeated, and according to this rule, all rows thereof are traversed as shown in FIG. 3.

The code table of the 18×9216 matrix generated according to the above method is as follows:

| 0 | 6 | 12 | 18 | 25 | 30 |
|---|---|---|---|---|---|
| 0 | 7 | 19 | 26 | 31 | 5664 |
| 0 | 8 | 13 | 20 | 32 | 8270 |
| 1 | 6 | 14 | 21 | 3085 | 8959 |
| 1 | 15 | 27 | 33 | 9128 | 9188 |
| 1 | 9 | 16 | 34 | 8485 | 9093 |
| 2 | 6 | 28 | 35 | 4156 | 7760 |
| 2 | 10 | 17 | 7335 | 7545 | 9138 |
| 2 | 11 | 22 | 5278 | 8728 | 8962 |
| 3 | 7 | 2510 | 4765 | 8637 | 8875 |
| 3 | 4653 | 4744 | 7541 | 9175 | 9198 |
| 3 | 23 | 2349 | 9012 | 9107 | 9168 |
| 4 | 7 | 29 | 5921 | 7774 | 8946 |
| 4 | 7224 | 8074 | 8339 | 8725 | 9212 |
| 4 | 4169 | 8650 | 8780 | 9023 | 9159 |
| 5 | 8 | 6638 | 8986 | 9064 | 9210 |
| 5 | 2107 | 7787 | 8655 | 9141 | 9171 |
| 5 | 24 | 5939 | 8507 | 8906 | 9173 |

Figure 4:
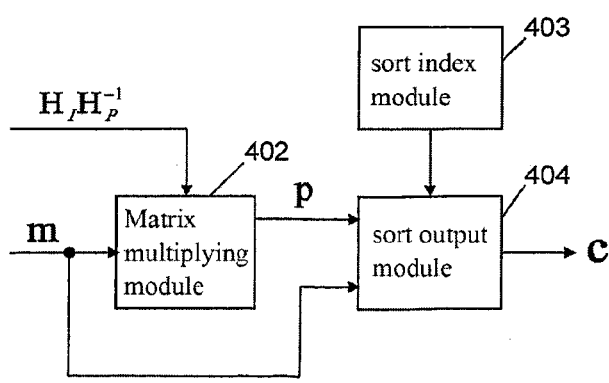
FIG. 4 is a schematic view of a structure of the encoder according to the embodiment of the invention.

The encoder encodes based on the above constructed LDPC code check matrix. The encoder comprises: a matrix multiply module 402 outputting a check sequence p which is obtained by multiplying the binary information sequence m with a matrix $(H_P^{-1} H_I)^T$, i.e., $p^T = m^T (H_P^{-1} H_I)^T$; a sorting index module 403 having 9216 memory units which store index values of a sorting table IDX in turn; and a sorting output module 404 which sorts m and p based on the index values stored in the sorting index table and outputs a code word c, as shown in FIG. 4. The flows of the processes conducted by the encoder are as follows:

constructing a sorting table IDX with a length of 9216, in which $IDX = \{I_k\}$, $0 \leq k < N$, $0 \leq I_k < N$, in which N=9216;

re-sorting the column of the 4608×9216 check matrix according to the sorting table IDX to generate a matrix $H' = [H_P \; H_I]$ in which $H_I$ is a 4608×(9216−4608) matrix, and $H_P$ is a 4608×4608 matrix. The object of constructing the sorting table IDX is to ensure that the $H_P^{-1}$ is also a sparse matrix;

inputting a (9216−4608)×1 column vector as sequence construction column to calculate a 4608×1 column vector $p^T = m^T (H_P^{-1} H_I)^T$ outputting sorting results based on the sort table IDX, in which $$c_{I_k} = \begin{cases} p_k & 0 \leq k < N-M \\ m_{k-N+M} & N-M \leq k < N. \end{cases}$$

The system code sequence which is position-transformed after encoding is transferred to a decoder through channels and decodes therein.

Figure 5:
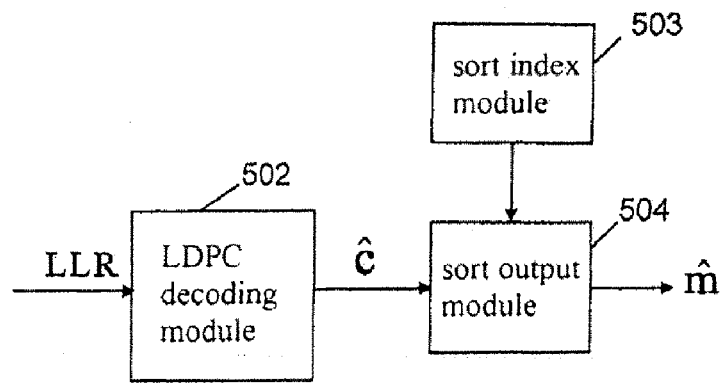
FIG. 5 is a schematic view of a structure of the decoder according to the embodiment of the invention.

As shown in FIG. 5, the decoder comprises: a LDPC decoding module 502 which decodes an inputted system code sequence LLR using any kind of LDPC decoding algorithm and outputs a hard-decision sequence ĉ; a sorting index module 503 having 9216 memory units which stores index values of the sorting table IDX; and a sorting output module 503 which extracts an information sequence m̂ from the hard-decision sequence ĉ based on the stored index values in the sorting index table.

The flows of the process conducted by the decoder are as follows:

In light of the 4608×9216 check matrix, the inputted system code sequence is decoded using any kind of decoding algorithm, and the decoded hard-decision sequence $\{\hat{c}_i, 0 \leq i \leq 9216\}$ is outputted;

The decoded binary information sequence $\{\hat{m}_k, 0 \leq k \leq 4607\}$ is extracted using the same sort table IDX as that stored in the encoder, in which $\hat{m}_{I_k} = \hat{c}_{k+4608}$, $0 \leq k < 4608$.

For the 4608×9216 check matrix, the sorting table IDX in the encoding device is as follows:

| 0 | 1 | 2 | 3 | 4 | 5 | 9 | 10 | 11 | 13 | 15 | 16 | 17 | 19 | 20 | 22 | 23 | 24 | 26 | 27 |
|---|---|---|---|---|---|---|---|---|---|---|---|---|---|---|---|---|---|---|---|
| 31 | 32 | 33 | 34 | 36 | 37 | 38 | 39 | 41 | 45 | 46 | 47 | 49 | 51 | 52 | 53 | 55 | 56 | 58 | 59 |
| 60 | 62 | 65 | 67 | 68 | 69 | 70 | 72 | 73 | 74 | 79 | 81 | 82 | 83 | 85 | 87 | 88 | 89 | 91 | 92 |
| 94 | 96 | 98 | 101 | 103 | 104 | 105 | 106 | 108 | 110 | 115 | 117 | 118 | 119 | 121 | 122 | 125 | 127 | 128 | 130 |
| 132 | 134 | 137 | 139 | 144 | 146 | 151 | 153 | 154 | 155 | 157 | 158 | 161 | 163 | 164 | 166 | 167 | 170 | 173 | 175 |
| 180 | 182 | 184 | 189 | 190 | 191 | 193 | 194 | 197 | 199 | 200 | 202 | 206 | 211 | 216 | 218 | 223 | 225 | 226 | 227 |
| 229 | 230 | 233 | 235 | 236 | 238 | 239 | 242 | 245 | 247 | 252 | 254 | 259 | 261 | 262 | 263 | 265 | 266 | 269 | 271 |
| 272 | 274 | 275 | 276 | 278 | 281 | 283 | 288 | 292 | 297 | 298 | 301 | 302 | 307 | 308 | 309 | 311 | 314 | 319 | 323 |
| 324 | 328 | 333 | 334 | 337 | 338 | 343 | 344 | 345 | 350 | 355 | 359 | 360 | 369 | 370 | 373 | 374 | 379 | 380 | 381 |
| 384 | 386 | 388 | 389 | 391 | 396 | 398 | 400 | 405 | 406 | 407 | 409 | 413 | 415 | 416 | 417 | 418 | 420 | 422 | 427 |
| 428 | 432 | 434 | 442 | 443 | 445 | 449 | 451 | 452 | 453 | 454 | 456 | 458 | 461 | 463 | 464 | 468 | 470 | 478 | 479 |
| 481 | 485 | 487 | 488 | 489 | 490 | 492 | 494 | 497 | 499 | 504 | 514 | 517 | 523 | 524 | 525 | 528 | 530 | 533 | 535 |
| 539 | 540 | 545 | 550 | 553 | 559 | 560 | 561 | 564 | 566 | 571 | 575 | 576 | 581 | 586 | 589 | 595 | 596 | 597 | 600 |
| 602 | 604 | 607 | 612 | 614 | 619 | 622 | 623 | 625 | 629 | 631 | 632 | 633 | 634 | 638 | 643 | 648 | 650 | 655 | 658 |
| 659 | 661 | 665 | 667 | 668 | 669 | 670 | 674 | 679 | 684 | 686 | 691 | 694 | 695 | 697 | 698 | 701 | 703 | 704 | 705 |
| 706 | 710 | 715 | 720 | 722 | 730 | 731 | 733 | 734 | 737 | 739 | 740 | 741 | 742 | 743 | 746 | 751 | 756 | 758 | 766 |

-continued

| | | | | | | | | | | | | | | | | | | | |
|---|---|---|---|---|---|---|---|---|---|---|---|---|---|---|---|---|---|---|---|
| 767 | 769 | 770 | 773 | 775 | 776 | 777 | 778 | 782 | 787 | 792 | 794 | 802 | 803 | 805 | 809 | 811 | 812 | 813 | 814 |
| 818 | 823 | 828 | 830 | 838 | 839 | 841 | 845 | 847 | 848 | 849 | 850 | 854 | 859 | 864 | 866 | 874 | 875 | 877 | 881 |
| 883 | 884 | 885 | 886 | 887 | 890 | 895 | 900 | 902 | 904 | 910 | 911 | 913 | 914 | 917 | 919 | 920 | 921 | 922 | 923 |
| 926 | 931 | 936 | 938 | 940 | 946 | 947 | 949 | 950 | 953 | 955 | 956 | 957 | 958 | 959 | 962 | 967 | 974 | 982 | 983 |
| 984 | 986 | 989 | 991 | 993 | 994 | 1010 | 1018 | 1019 | 1020 | 1025 | 1027 | 1029 | 1030 | 1046 | 1054 | 1055 | 1056 | 1061 | 1063 |
| 1065 | 1066 | 1082 | 1090 | 1091 | 1092 | 1095 | 1097 | 1099 | 1101 | 1102 | 1118 | 1120 | 1126 | 1127 | 1128 | 1133 | 1135 | 1137 | 1138 |
| 1143 | 1154 | 1156 | 1162 | 1163 | 1164 | 1169 | 1171 | 1173 | 1174 | 1179 | 1190 | 1198 | 1199 | 1200 | 1205 | 1207 | 1209 | 1210 | 1215 |
| 1226 | 1234 | 1235 | 1236 | 1241 | 1243 | 1245 | 1246 | 1251 | 1262 | 1270 | 1271 | 1272 | 1277 | 1279 | 1281 | 1282 | 1287 | 1298 | 1306 |
| 1307 | 1308 | 1313 | 1315 | 1317 | 1318 | 1323 | 1334 | 1335 | 1339 | 1342 | 1343 | 1344 | 1349 | 1353 | 1354 | 1359 | 1370 | 1371 | 1375 |
| 1378 | 1379 | 1380 | 1385 | 1389 | 1390 | 1395 | 1405 | 1406 | 1407 | 1411 | 1413 | 1414 | 1415 | 1416 | 1420 | 1421 | 1426 | 1431 | 1437 |
| 1438 | 1441 | 1442 | 1443 | 1447 | 1449 | 1451 | 1452 | 1456 | 1457 | 1462 | 1467 | 1473 | 1474 | 1477 | 1478 | 1479 | 1483 | 1485 | 1487 |
| 1488 | 1492 | 1498 | 1503 | 1509 | 1510 | 1511 | 1513 | 1514 | 1515 | 1519 | 1521 | 1523 | 1524 | 1528 | 1534 | 1539 | 1545 | 1546 | 1547 |
| 1549 | 1550 | 1551 | 1555 | 1557 | 1559 | 1560 | 1564 | 1570 | 1575 | 1581 | 1582 | 1583 | 1585 | 1586 | 1587 | 1591 | 1593 | 1595 | 1596 |
| 1600 | 1606 | 1611 | 1617 | 1618 | 1619 | 1621 | 1622 | 1623 | 1627 | 1629 | 1631 | 1632 | 1636 | 1642 | 1647 | 1653 | 1655 | 1657 | 1658 |
| 1659 | 1663 | 1665 | 1667 | 1668 | 1672 | 1678 | 1689 | 1691 | 1693 | 1699 | 1701 | 1702 | 1704 | 1708 | 1725 | 1727 | 1729 | 1735 | 1737 |
| 1738 | 1740 | 1744 | 1761 | 1763 | 1765 | 1771 | 1773 | 1774 | 1776 | 1780 | 1791 | 1797 | 1799 | 1801 | 1807 | 1809 | 1810 | 1812 | 1816 |
| 1823 | 1827 | 1833 | 1835 | 1837 | 1843 | 1845 | 1846 | 1848 | 1852 | 1859 | 1863 | 1869 | 1871 | 1873 | 1879 | 1881 | 1882 | 1884 | 1888 |
| 1895 | 1905 | 1907 | 1909 | 1915 | 1917 | 1918 | 1920 | 1924 | 1925 | 1931 | 1941 | 1943 | 1944 | 1945 | 1951 | 1952 | 1953 | 1954 | 1957 |
| 1960 | 1963 | 1964 | 1967 | 1970 | 1975 | 1977 | 1979 | 1980 | 1981 | 1983 | 1988 | 1989 | 1990 | 1993 | 1996 | 1997 | 2000 | 2003 | 2006 |
| 2007 | 2011 | 2013 | 2015 | 2016 | 2017 | 2025 | 2026 | 2029 | 2032 | 2033 | 2036 | 2039 | 2042 | 2043 | 2049 | 2051 | 2052 | 2061 | 2062 |
| 2065 | 2069 | 2072 | 2078 | 2087 | 2088 | 2097 | 2098 | 2102 | 2105 | 2108 | 2114 | 2123 | 2124 | 2133 | 2134 | 2137 | 2138 | 2141 | 2144 |
| 2150 | 2152 | 2155 | 2159 | 2160 | 2169 | 2170 | 2173 | 2174 | 2177 | 2180 | 2186 | 2188 | 2191 | 2195 | 2196 | 2205 | 2206 | 2209 | 2210 |
| 2213 | 2216 | 2222 | 2224 | 2227 | 2231 | 2232 | 2239 | 2241 | 2242 | 2245 | 2246 | 2249 | 2252 | 2258 | 2260 | 2267 | 2268 | 2272 | 2277 |
| 2278 | 2282 | 2285 | 2288 | 2289 | 2294 | 2296 | 2303 | 2304 | 2308 | 2313 | 2314 | 2318 | 2321 | 2323 | 2324 | 2330 | 2332 | 2339 | 2340 |
| 2344 | 2349 | 2350 | 2354 | 2357 | 2359 | 2360 | 2366 | 2368 | 2375 | 2376 | 2380 | 2385 | 2386 | 2390 | 2393 | 2395 | 2402 | 2404 |
| 2411 | 2412 | 2416 | 2422 | 2426 | 2429 | 2431 | 2432 | 2433 | 2438 | 2440 | 2447 | 2448 | 2452 | 2458 | 2462 | 2464 | 2465 | 2467 | 2468 |
| 2469 | 2474 | 2476 | 2484 | 2491 | 2493 | 2494 | 2498 | 2501 | 2503 | 2504 | 2505 | 2512 | 2520 | 2524 | 2530 | 2534 | 2536 | 2537 | 2539 |
| 2540 | 2544 | 2548 | 2556 | 2558 | 2566 | 2567 | 2570 | 2573 | 2575 | 2576 | 2578 | 2585 | 2592 | 2594 | 2602 | 2603 | 2606 | 2609 | 2611 |
| 2612 | 2614 | 2621 | 2628 | 2630 | 2638 | 2639 | 2642 | 2645 | 2648 | 2650 | 2652 | 2657 | 2664 | 2666 | 2671 | 2673 | 2674 | 2675 | 2678 |
| 2681 | 2683 | 2684 | 2686 | 2688 | 2690 | 2700 | 2702 | 2707 | 2709 | 2710 | 2711 | 2714 | 2716 | 2717 | 2719 | 2720 | 2722 | 2724 | 2734 |
| 2736 | 2738 | 2743 | 2745 | 2746 | 2747 | 2750 | 2752 | 2753 | 2755 | 2756 | 2758 | 2772 | 2774 | 2779 | 2781 | 2782 | 2783 | 2786 | 2789 |
| 2791 | 2792 | 2794 | 2798 | 2808 | 2810 | 2815 | 2817 | 2818 | 2819 | 2822 | 2825 | 2827 | 2828 | 2830 | 2834 | 2844 | 2846 | 2851 | 2854 |
| 2855 | 2858 | 2860 | 2861 | 2863 | 2864 | 2866 | 2868 | 2880 | 2882 | 2890 | 2891 | 2894 | 2899 | 2900 | 2902 | 2904 | 2909 | 2918 |
| 2923 | 2926 | 2927 | 2928 | 2930 | 2932 | 2938 | 2940 | 2945 | 2954 | 2959 | 2962 | 2963 | 2964 | 2968 | 2973 | 2974 | 2976 | 2981 | 2994 |
| 2995 | 2997 | 2998 | 3005 | 3009 | 3012 | 3017 | 3023 | 3025 | 3026 | 3033 | 3034 | 3035 | 3036 | 3040 | 3041 | 3043 | 3046 | 3048 | 3051 |
| 3053 | 3057 | 3058 | 3061 | 3062 | 3070 | 3071 | 3072 | 3076 | 3077 | 3079 | 3082 | 3084 | 3089 | 3093 | 3097 | 3098 | 3105 | 3106 | 3107 |
| 3108 | 3112 | 3113 | 3115 | 3118 | 3120 | 3122 | 3125 | 3127 | 3129 | 3134 | 3139 | 3142 | 3143 | 3144 | 3149 | 3153 | 3154 | 3156 | 3161 |
| 3165 | 3169 | 3170 | 3175 | 3177 | 3178 | 3179 | 3180 | 3184 | 3185 | 3190 | 3192 | 3195 | 3197 | 3201 | 3205 | 3211 | 3214 | 3216 | 3220 |
| 3221 | 3228 | 3237 | 3238 | 3239 | 3241 | 3243 | 3245 | 3247 | 3250 | 3252 | 3256 | 3257 | 3264 | 3273 | 3275 | 3277 | 3278 | 3279 | 3286 |
| 3287 | 3288 | 3292 | 3293 | 3295 | 3298 | 3309 | 3313 | 3315 | 3321 | 3324 | 3328 | 3331 | 3340 | 3345 | 3349 | 3351 | 3357 | 3359 | 3360 |
| 3364 | 3367 | 3370 | 3376 | 3381 | 3382 | 3385 | 3387 | 3390 | 3391 | 3393 | 3395 | 3398 | 3400 | 3406 | 3419 | 3421 | 3423 | 3427 | 3429 |
| 3431 | 3432 | 3436 | 3442 | 3447 | 3453 | 3455 | 3456 | 3457 | 3459 | 3464 | 3465 | 3467 | 3469 | 3472 | 3476 | 3478 | 3487 | 3488 | 3489 |
| 3491 | 3492 | 3493 | 3495 | 3500 | 3501 | 3505 | 3508 | 3512 | 3523 | 3524 | 3525 | 3527 | 3528 | 3535 | 3537 | 3541 | 3542 | 3548 | 3557 |
| 3560 | 3563 | 3564 | 3571 | 3573 | 3574 | 3577 | 3584 | 3585 | 3592 | 3593 | 3595 | 3596 | 3599 | 3600 | 3607 | 3609 | 3610 | 3613 | 3614 |
| 3620 | 3628 | 3632 | 3635 | 3636 | 3643 | 3645 | 3646 | 3649 | 3650 | 3655 | 3656 | 3664 | 3668 | 3671 | 3672 | 3679 | 3681 | 3685 | 3692 |
| 3693 | 3700 | 3707 | 3708 | 3717 | 3721 | 3722 | 3724 | 3728 | 3742 | 3743 | 3744 | 3753 | 3757 | 3764 | 3765 | 3772 | 3773 | 3779 |
| 3780 | 3789 | 3790 | 3793 | 3799 | 3800 | 3801 | 3809 | 3812 | 3815 | 3816 | 3823 | 3825 | 3826 | 3829 | 3832 | 3836 | 3837 | 3842 | 3844 |
| 3848 | 3851 | 3852 | 3859 | 3861 | 3862 | 3865 | 3872 | 3873 | 3878 | 3880 | 3884 | 3887 | 3888 | 3892 | 3901 | 3902 | 3908 | 3914 | 3923 |
| 3924 | 3937 | 3938 | 3943 | 3944 | 3950 | 3952 | 3959 | 3960 | 3965 | 3969 | 3971 | 3973 | 3974 | 3976 | 3977 | 3979 | 3980 | 3982 | 3986 |
| 3988 | 3989 | 3994 | 3995 | 3996 | 3998 | 4007 | 4009 | 4010 | 4015 | 4016 | 4018 | 4022 | 4024 | 4028 | 4031 | 4032 | 4034 | 4041 | 4043 |
| 4045 | 4046 | 4052 | 4054 | 4058 | 4064 | 4067 | 4070 | 4074 | 4075 | 4077 | 4082 | 4089 | 4090 | 4103 | 4104 | 4113 | 4117 | 4118 | 4121 |
| 4124 | 4126 | 4130 | 4136 | 4139 | 4140 | 4149 | 4150 | 4153 | 4154 | 4157 | 4160 | 4162 | 4166 | 4172 | 4175 | 4176 | 4177 | 4183 | 4185 |
| 4186 | 4189 | 4193 | 4196 | 4198 | 4202 | 4203 | 4205 | 4208 | 4211 | 4212 | 4214 | 4219 | 4226 | 4232 | 4234 | 4238 | 4244 | 4247 | 4248 |
| 4255 | 4257 | 4258 | 4262 | 4268 | 4274 | 4283 | 4284 | 4286 | 4293 | 4298 | 4304 | 4306 | 4314 | 4319 | 4320 | 4329 | 4330 | 4333 | 4334 |
| 4340 | 4346 | 4348 | 4352 | 4355 | 4356 | 4358 | 4365 | 4376 | 4377 | 4378 | 4382 | 4391 | 4392 | 4394 | 4399 | 4401 | 4402 | 4412 | 4414 |
| 4418 | 4424 | 4428 | 4430 | 4435 | 4437 | 4438 | 4448 | 4449 | 4450 | 4457 | 4464 | 4473 | 4474 | 4484 | 4485 | 4488 | 4499 | 4500 | 4502 |
| 4510 | 4520 | 4521 | 4522 | 4536 | 4538 | 4540 | 4546 | 4556 | 4557 | 4558 | 4560 | 4570 | 4572 | 4574 | 4582 | 4592 | 4593 | 4594 | 4596 |
| 4608 | 4610 | 4618 | 4619 | 4628 | 4629 | 4630 | 4631 | 4632 | 4639 | 4644 | 4646 | 4654 | 4655 | 4664 | 4665 | 4666 | 4668 | 4675 | 4680 |
| 4682 | 4690 | 4691 | 4700 | 4701 | 4702 | 4711 | 4716 | 4718 | 4726 | 4727 | 4736 | 4737 | 4738 | 4742 | 4747 | 4750 | 4752 | 4754 | 4755 |
| 4762 | 4763 | 4772 | 4773 | 4774 | 4778 | 4783 | 4786 | 4790 | 4791 | 4795 | 4798 | 4799 | 4800 | 4809 | 4810 | 4814 | 4819 | 4822 | 4826 |
| 4827 | 4834 | 4835 | 4836 | 4845 | 4846 | 4855 | 4862 | 4870 | 4871 | 4872 | 4881 | 4882 | 4891 | 4898 | 4900 | 4906 | 4907 | 4908 | 4918 |
| 4923 | 4927 | 4935 | 4936 | 4943 | 4944 | 4954 | 4958 | 4959 | 4963 | 4967 | 4970 | 4971 | 4975 | 4979 | 4980 | 4989 | 4990 | 4994 | 4999 |
| 5003 | 5006 | 5015 | 5016 | 5026 | 5030 | 5031 | 5035 | 5039 | 5040 | 5042 | 5044 | 5048 | 5051 | 5055 | 5060 | 5062 | 5071 | 5075 | 5087 |
| 5088 | 5095 | 5098 | 5107 | 5111 | 5114 | 5123 | 5124 | 5127 | 5131 | 5134 | 5143 | 5147 | 5150 | 5152 | 5159 | 5160 | 5167 | 5170 | 5174 |
| 5179 | 5182 | 5183 | 5186 | 5195 | 5196 | 5203 | 5206 | 5210 | 5211 | 5215 | 5218 | 5219 | 5221 | 5222 | 5226 | 5231 | 5234 | 5241 | 5242 |
| 5243 | 5246 | 5251 | 5254 | 5255 | 5257 | 5262 | 5266 | 5267 | 5270 | 5273 | 5277 | 5282 | 5285 | 5287 | 5290 | 5291 | 5294 | 5303 | 5304 |
| 5314 | 5315 | 5318 | 5319 | 5323 | 5326 | 5327 | 5329 | 5333 | 5334 | 5338 | 5339 | 5342 | 5345 | 5347 | 5349 | 5350 | 5351 | 5352 | 5354 |
| 5359 | 5362 | 5363 | 5370 | 5374 | 5375 | 5378 | 5379 | 5381 | 5385 | 5386 | 5387 | 5390 | 5395 | 5399 | 5400 | 5402 | 5408 | 5411 | 5414 |
| 5420 | 5421 | 5422 | 5423 | 5426 | 5427 | 5431 | 5432 | 5435 | 5436 | 5444 | 5446 | 5447 | 5453 | 5456 | 5457 | 5458 | 5460 | 5462 | 5467 |
| 5470 | 5471 | 5472 | 5482 | 5483 | 5489 | 5492 | 5493 | 5494 | 5498 | 5503 | 5507 | 5508 | 5513 | 5518 | 5519 | 5525 | 5528 | 5529 | 5530 |
| 5531 | 5539 | 5540 | 5543 | 5544 | 5546 | 5554 | 5555 | 5561 | 5564 | 5565 | 5575 | 5582 | 5587 | 5600 | 5605 | 5615 | 5616 | 5618 |
| 5623 | 5627 | 5636 | 5637 | 5640 | 5642 | 5647 | 5651 | 5652 | 5654 | 5656 | 5659 | 5663 | 5672 | 5673 | 5674 | 5678 | 5683 | 5687 | 5690 |
| 5694 | 5699 | 5709 | 5710 | 5714 | 5723 | 5726 | 5730 | 5731 | 5735 | 5745 | 5759 | 5762 | 5766 | 5767 | 5770 | 5777 | 5781 | 5795 | 5796 |
| 5798 | 5803 | 5804 | 5815 | 5816 | 5817 | 5823 | 5824 | 5828 | 5831 | 5832 | 5834 | 5839 | 5840 | 5851 | 5852 | 5853 | 5859 | 5860 | 5863 |
| 5867 | 5868 | 5870 | 5875 | 5879 | 5887 | 5888 | 5889 | 5894 | 5896 | 5899 | 5903 | 5906 | 5910 | 5911 | 5915 | 5925 | 5926 | 5932 |
| 5939 | 5942 | 5946 | 5947 | 5961 | 5968 | 5975 | 5978 | 5982 | 5983 | 5997 | 6012 | 6013 | 6014 | 6019 | 6020 | 6031 | 6032 | 6034 | 6040 |
| 6044 | 6046 | 6047 | 6048 | 6050 | 6055 | 6056 | 6058 | 6068 | 6069 | 6080 | 6084 | 6091 | 6104 | 6106 | 6122 | 6126 | 6127 | 6130 | 6141 |
| 6158 | 6160 | 6162 | 6163 | 6166 | 6170 | 6177 | 6190 | 6194 | 6198 | 6206 | 6211 | 6213 | 6215 | 6226 | 6229 | 6230 | 6238 | 6240 | 6243 |
| 6247 | 6251 | 6266 | 6274 | 6276 | 6283 | 6285 | 6306 | 6315 | 6321 | 6323 | 6326 | 6338 | 6346 | 6348 | 6350 | 6351 | 6359 | 6362 | 6373 |
| 6374 | 6382 | 6384 | 6391 | 6395 | 6409 | 6410 | 6418 | 6420 | 6434 | 6435 | 6442 | 6446 | 6454 | 6456 | 6458 | 6459 | 6461 | 6470 | 6480 |

-continued

| | | | | | | | | | | | | | | | | | | | |
|---|---|---|---|---|---|---|---|---|---|---|---|---|---|---|---|---|---|---|---|
| 6481 | 6488 | 6490 | 6493 | 6497 | 6500 | 6507 | 6514 | 6516 | 6524 | 6526 | 6529 | 6530 | 6535 | 6536 | 6540 | 6542 | 6550 | 6552 | 6562 |
| 6565 | 6566 | 6572 | 6576 | 6578 | 6583 | 6586 | 6594 | 6598 | 6602 | 6609 | 6614 | 6619 | 6622 | 6630 | 6634 | 6655 | 6658 | 6660 | 6664 |
| 6668 | 6670 | 6673 | 6680 | 6681 | 6683 | 6684 | 6691 | 6694 | 6696 | 6698 | 6704 | 6710 | 6716 | 6718 | 6727 | 6728 | 6732 | 6734 | 6746 |
| 6751 | 6752 | 6753 | 6754 | 6763 | 6764 | 6768 | 6770 | 6771 | 6773 | 6782 | 6787 | 6788 | 6789 | 6790 | 6792 | 6799 | 6800 | 6804 | 6807 |
| 6814 | 6818 | 6824 | 6825 | 6826 | 6835 | 6836 | 6838 | 6847 | 6850 | 6858 | 6859 | 6862 | 6864 | 6871 | 6874 | 6876 | 6878 | 6883 | 6896 |
| 6898 | 6900 | 6907 | 6908 | 6912 | 6920 | 6922 | 6929 | 6932 | 6934 | 6936 | 6943 | 6948 | 6955 | 6958 | 6965 | 6968 | 6971 | 6972 | 6974 |
| 6979 | 6984 | 6991 | 6994 | 7004 | 7007 | 7008 | 7010 | 7015 | 7018 | 7020 | 7027 | 7030 | 7039 | 7040 | 7043 | 7044 | 7046 | 7051 | 7054 |
| 7056 | 7063 | 7066 | 7080 | 7082 | 7090 | 7092 | 7099 | 7102 | 7103 | 7109 | 7115 | 7118 | 7128 | 7138 | 7139 | 7144 | 7145 | 7147 |
| 7148 | 7152 | 7154 | 7164 | 7166 | 7171 | 7174 | 7175 | 7179 | 7181 | 7184 | 7188 | 7190 | 7195 | 7200 | 7202 | 7204 | 7205 | 7210 | 7211 |
| 7215 | 7217 | 7219 | 7220 | 7226 | 7231 | 7236 | 7240 | 7241 | 7246 | 7255 | 7256 | 7259 | 7262 | 7267 | 7270 | 7272 | 7277 | 7282 | 7283 |
| 7291 | 7292 | 7298 | 7303 | 7306 | 7308 | 7311 | 7313 | 7315 | 7318 | 7319 | 7327 | 7329 | 7334 | 7339 | 7342 | 7344 | 7347 | 7349 | 7351 |
| 7354 | 7355 | 7363 | 7364 | 7365 | 7368 | 7375 | 7378 | 7380 | 7382 | 7383 | 7387 | 7388 | 7391 | 7394 | 7397 | 7399 | 7400 | 7404 | 7416 |
| 7417 | 7418 | 7427 | 7433 | 7436 | 7440 | 7442 | 7447 | 7450 | 7452 | 7454 | 7463 | 7469 | 7471 | 7472 | 7476 | 7478 | 7483 | 7490 | 7493 |
| 7495 | 7505 | 7512 | 7518 | 7522 | 7531 | 7540 | 7542 | 7548 | 7564 | 7565 | 7576 | 7584 | 7590 | 7591 | 7596 | 7603 | 7604 | 7606 | 7611 |
| 7612 | 7616 | 7620 | 7627 | 7632 | 7634 | 7637 | 7648 | 7652 | 7653 | 7663 | 7668 | 7669 | 7670 | 7673 | 7688 | 7699 | 7702 | 7704 | 7708 |
| 7709 | 7720 | 7724 | 7725 | 7735 | 7740 | 7742 | 7743 | 7745 | 7747 | 7756 | 7761 | 7771 | 7776 | 7781 | 7783 | 7797 | 7807 | 7812 | 7814 |
| 7828 | 7843 | 7848 | 7850 | 7851 | 7870 | 7879 | 7881 | 7884 | 7886 | 7887 | 7892 | 7906 | 7915 | 7922 | 7926 | 7936 | 7941 | 7942 | 7951 |
| 7953 | 7968 | 7978 | 7983 | 7987 | 7990 | 7993 | 7998 | 8013 | 8014 | 8023 | 8026 | 8030 | 8040 | 8050 | 8055 | 8059 | 8066 | 8076 | 8083 |
| 8086 | 8091 | 8095 | 8102 | 8112 | 8115 | 8119 | 8122 | 8131 | 8138 | 8148 | 8158 | 8163 | 8167 | 8174 | 8176 | 8184 | 8194 | 8199 | 8203 |
| 8209 | 8210 | 8214 | 8229 | 8230 | 8234 | 8245 | 8246 | 8250 | 8265 | 8270 | 8281 | 8286 | 8301 | 8311 | 8316 | 8317 | 8320 | 8337 | 8338 |
| 8339 | 8348 | 8352 | 8356 | 8362 | 8367 | 8374 | 8383 | 8392 | 8400 | 8403 | 8419 | 8428 | 8430 | 8439 | 8445 | 8455 | 8460 | 8481 | 8487 |
| 8496 | 8497 | 8504 | 8519 | 8527 | 8532 | 8533 | 8540 | 8563 | 8568 | 8589 | 8599 | 8604 | 8619 | 8625 | 8635 | 8636 | 8640 | 8645 | 8667 |
| 8671 | 8672 | 8676 | 8684 | 8691 | 8708 | 8712 | 8717 | 8743 | 8748 | 8749 | 8756 | 8774 | 8779 | 8784 | 8798 | 8801 | 8805 | 8810 | 8815 |
| 8820 | 8825 | 8846 | 8851 | 8856 | 8861 | 8887 | 8892 | 8897 | 8923 | 8928 | 8935 | 8936 | 8964 | 8969 | 8974 | 8985 | 8999 | 9000 | 9005 |
| 9007 | 9035 | 9036 | 9041 | 9043 | 9044 | 9072 | 9080 | 9106 | 9108 | 9113 | 9115 | 9116 | 9118 | 9144 | 9149 | 9152 | 9160 | 9168 | 9187 |
| 9190 | 9196 | 2461 | 2497 | 2533 | 2569 | 2605 | 2633 | 2641 | 2669 | 2677 | 2705 | 2713 | 2749 | 2785 | 2821 | 2849 | 2857 | 2885 | 2893 |
| 2921 | 2957 | 3130 | 3202 | 3412 | 3463 | 3475 | 3511 | 3547 | 3704 | 3715 | 3740 | 3751 | 3776 | 3787 | 3850 | 3920 | 3931 | 3956 | 3992 |
| 4039 | 4111 | 4144 | 4225 | 4261 | 4267 | 4297 | 4303 | 4339 | 4360 | 4369 | 4375 | 4405 | 4411 | 4441 | 4447 | 4471 | 4507 | 4513 | 4534 |
| 4565 | 4591 | 4606 | 4615 | 4627 | 4642 | 4678 | 4699 | 4714 | 4723 | 4759 | 4831 | 5099 | 5332 | 5405 | 5441 | 5449 | 5548 | 5584 | 5807 |
| 5843 | 5962 | 5998 | 6244 | 6275 | 6347 | 6383 | 6387 | 6388 | 6419 | 6441 | 6455 | 6495 | 6499 | 6513 | 6515 | 6557 | 671 | 6571 | 6607 |
| 6631 | 6665 | 6715 | 6724 | 1976 | 6775 | 6806 | 6823 | 6842 | 6845 | 6851 | 6879 | 6887 | 6895 | 6919 | 707 | 6923 | 6931 | 6950 | 6967 |
| 6997 | 7003 | 7033 | 7069 | 7075 | 7079 | 7111 | 7124 | 7130 | 7135 | 7183 | 7224 | 2107 | 7249 | 7274 | 7276 | 7285 | 7289 | 7310 | 7325 |
| 7346 | 7361 | 7423 | 7439 | 7459 | 7511 | 7526 | 7529 | 7562 | 7577 | 7598 | 7601 | 7609 | 7635 | 7636 | 7672 | 7947 | 7958 | 7994 | 2281 |
| 2317 | 8351 | 8363 | 8387 | 8414 | 8423 | 8427 | 8448 | 8450 | 8459 | 8464 | 8486 | 8500 | 8523 | 8559 | 8565 | 8595 | 8628 | 8630 | 8639 |
| 8664 | 8702 | 8719 | 8725 | 8731 | 8736 | 8738 | 8739 | 8753 | 8775 | 8780 | 8783 | 8823 | 8839 | 8855 | 8880 | 8882 | 8891 | 8916 | 8927 |
| 8933 | 8952 | 8963 | 8993 | 9062 | 9071 | 9079 | 9101 | 9107 | 9124 | 9132 | 9143 | 9168 | 9212 | 2644 | 2651 | 2667 | 825 | 2811 | 2847 |
| 969 | 2883 | 1005 | 1041 | 3207 | 1077 | 3233 | 1084 | 3255 | 3290 | 3305 | 3327 | 3372 | 3418 | 3521 | 3591 | 1197 | 3627 | 3695 | 460 |
| 833 | 3857 | 3916 | 3917 | 224 | 4135 | 4151 | 1351 | 4223 | 4295 | 4309 | 4344 | 4367 | 4380 | 4403 | 4420 | 4452 | 4463 | 4553 | 4625 |
| 538 | 4734 | 4806 | 4842 | 4863 | 4899 | 4913 | 4931 | 4949 | 4956 | 562 | 5092 | 574 | 5128 | 588 | 5309 | 5324 | 5450 | 610 | 5603 |
| 5692 | 5697 | 5715 | 5780 | 1786 | 5827 | 5916 | 5999 | 6035 | 646 | 6060 | 6142 | 6178 | 6202 | 6204 | 6214 | 6236 | 6312 | 1900 | 6469 |
| 6492 | 6612 | 6645 | 6651 | 6677 | 682 | 1966 | 6697 | 1972 | 6723 | 6749 | 6759 | 6785 | 6795 | 6831 | 6867 | 6939 | 6975 | 7011 | 7047 |
| 2058 | 718 | 7067 | 7108 | 2080 | 7151 | 2082 | 7180 | 7191 | 727 | 7222 | 7247 | 2116 | 7396 | 7410 | 754 | 7608 | 7656 | 7678 | 7716 |
| 7728 | 7752 | 7788 | 7796 | 7818 | 7824 | 7834 | 7896 | 7932 | 7977 | 8004 | 8044 | 8188 | 789 | 8305 | 8434 | 8456 | 799 | 8553 | 8578 |
| 8661 | 8697 | 8733 | 8768 | 8792 | 8804 | 8840 | 8841 | 8877 | 8901 | 8912 | 8948 | 8987 | 9146 | 2887 | 3094 | 3583 | 3619 | 3691 | 3962 |
| 3967 | 4106 | 4142 | 4178 | 4195 | 4209 | 4216 | 4231 | 4388 | 4477 | 4493 | 4549 | 4657 | 4687 | 4712 | 5258 | 347 | 5369 | 5474 | 5477 |
| 5510 | 5746 | 5890 | 6065 | 6097 | 6137 | 6208 | 6707 | 6743 | 6779 | 6815 | 2012 | 6914 | 7051 | 7094 | 2084 | 7196 | 7253 | 2143 |
| 7443 | 2425 | 7645 | 7681 | 7684 | 7921 | 8354 | 2353 | 8666 | 8755 | 8787 | 8827 | 8844 | 2389 | 9024 | 9060 | 9134 | 979 | 7909 | 4159 |
| 4180 | 5330 | 5366 | 5438 | 6173 | 6424 | 6466 | 6881 | 6917 | 6951 | 6987 | 7023 | 7059 | 7239 | 7897 | 8463 | 9003 | 2878 | 2884 | 3031 |
| 1024 | 3067 | 2647 | 3258 | 3294 | 3300 | 3330 | 3336 | 3341 | 3377 | 3403 | 3408 | 3449 | 3474 | 3480 | 3506 | 3580 | 3616 | 3624 | 3652 |
| 3662 | 3778 | 466 | 3806 | 3811 | 2661 | 3885 | 3922 | 1283 | 3958 | 4000 | 4093 | 4115 | 4120 | 4129 | 4165 | 1355 | 4187 | 4201 | 502 |
| 4273 | 4289 | 4439 | 1427 | 4483 | 4517 | 4555 | 4564 | 4604 | 4663 | 1480 | 2813 | 4697 | 4744 | 4769 | 4805 | 4879 | 5100 | 5237 | 5316 |
| 5440 | 5465 | 5512 | 1718 | 1726 | 5597 | 5693 | 1768 | 5809 | 1798 | 6025 | 6045 | 6070 | 1851 | 6184 | 6205 | 6222 | 6320 | 1891 | 6335 |
| 6358 | 2506 | 6385 | 6394 | 6432 | 6531 | 6574 | 6584 | 6726 | 6889 | 6902 | 6903 | 6925 | 6959 | 6995 | 2071 | 7119 | 7155 | 2090 | 178 |
| 7254 | 7406 | 7527 | 7573 | 753 | 7622 | 7649 | 7701 | 7721 | 7757 | 2766 | 7907 | 7910 | 8046 | 8057 | 8067 | 8074 | 8075 | 8124 | 8140 |
| 8157 | 8193 | 8224 | 8312 | 8322 | 8373 | 8436 | 8462 | 8466 | 8498 | 8879 | 8960 | 8983 | 9013 | 9156 | 6627 | 7268 | 8587 | 8659 | 3022 |
| 3029 | 3065 | 3117 | 3171 | 3181 | 3189 | 3196 | 1079 | 3225 | 3262 | 3284 | 3320 | 1113 | 3424 | 3445 | 1151 | 3483 | 3496 | 1168 | 3520 |
| 1177 | 3556 | 1185 | 1187 | 455 | 3660 | 3827 | 3840 | 3858 | 1273 | 3897 | 3933 | 3935 | 1295 | 3985 | 4021 | 4056 | 4057 | 4072 | 4084 |
| 4123 | 491 | 4163 | 4174 | 4237 | 4246 | 4252 | 4253 | 4277 | 4282 | 4288 | 4313 | 4318 | 4440 | 4451 | 4598 | 4670 | 4676 | 4683 |
| 4706 | 4784 | 4850 | 1531 | 4892 | 4922 | 4960 | 4996 | 5032 | 1567 | 5068 | 5079 | 5104 | 5133 | 5136 | 5140 | 5176 | 5236 | 5278 | 5443 |
| 1690 | 5534 | 5570 | 5586 | 5591 | 988 | 1762 | 5802 | 5833 | 142 | 6042 | 6043 | 6073 | 6103 | 6200 | 6203 | 6209 | 6286 | 6316 | 6352 |
| 6412 | 6423 | 6473 | 6474 | 6479 | 6496 | 284 | 6504 | 6506 | 6509 | 6511 | 1928 | 6527 | 6547 | 6595 | 6621 | 6663 | 6671 | 6689 | 6702 |
| 952 | 6735 | 6738 | 6794 | 6811 | 2018 | 7019 | 7037 | 7055 | 7058 | 7091 | 7107 | 2075 | 7141 | 7167 | 7232 | 7370 | 7425 | 750 | 7497 |
| 7501 | 7535 | 7571 | 7639 | 7694 | 7808 | 2238 | 7846 | 7864 | 7874 | 7916 | 8008 | 3001 | 2302 | 8255 | 8256 | 8303 | 392 | 8399 | 8409 |
| 8493 | 8509 | 8557 | 8582 | 8607 | 8617 | 8764 | 8797 | 8905 | 8918 | 8951 | 8954 | 9026 | 9049 | 9128 | 9164 | 9199 | 9204 | 3439 | 3629 |
| 3802 | 3948 | 1325 | 4169 | 5014 | 1717 | 6399 | 7197 | 7800 | 8259 | 8920 | 8984 | 3263 | 3335 | 3371 | 3413 | 3443 | 3458 | 3532 | 3551 |
| 3727 | 214 | 3786 | 4065 | 4094 | 1023 | 2806 | 4221 | 4240 | 500 | 2920 | 4384 | 4426 | 1425 | 232 | 4532 | 4562 | 124 | 531 | 4729 |
| 4735 | 4746 | 4748 | 1499 | 4771 | 548 | 4818 | 844 | 1532 | 4886 | 1533 | 1535 | 50 | 5021 | 1569 | 5043 | 5047 | 1034 | 5248 | 592 |
| 5413 | 264 | 5676 | 1803 | 1811 | 6131 | 6169 | 6186 | 6280 | 6311 | 6389 | 6421 | 6425 | 6430 | 916 | 6518 | 1942 | 176 | 6679 | 6693 |
| 6729 | 6758 | 2527 | 6866 | 6911 | 2870 | 7017 | 7429 | 2179 | 2842 | 7730 | 7822 | 8147 | 2293 | 8268 | 8345 | 8371 | 8407 | 8484 | 8522 |
| 8558 | 8567 | 8698 | 8802 | 2852 | 2626 | 9111 | 9188 | 3539 | 3604 | 2901 | 3910 | 1309 | 493 | 4194 | 4266 | 3081 | 4865 | 4937 | 1568 |
| 1576 | 1594 | 5162 | 1604 | 2428 | 5403 | 5484 | 5668 | 1756 | 5782 | 1784 | 1808 | 6398 | 6543 | 6956 | 2100 | 2104 |
| 7328 | 7419 | 8141 | 2319 | 2392 | 9085 | 3383 | 1132 | 3422 | 3045 | 480 | 1331 | 4138 | 4312 | 3073 | 520 | 4634 | 534 | 5000 | 5018 |
| 5078 | 5102 | 1605 | 2694 | 1643 | 3101 | 628 | 6059 | 1911 | 664 | 6643 | 1096 | 6801 | 6837 | 700 | 6873 | 6938 | 7061 | 7169 | 7207 |
| 2838 | 7275 | 1059 | 7933 | 7969 | 8003 | 8111 | 8183 | 8330 | 8438 | 9200 | 3507 | 8485 | 473 | 5812 | 1916 | 7679 | 3479 | 1259 | 2455 |
| 4192 | 4291 | 4354 | 4579 | 1497 | 4984 | 5286 | 5321 | 5865 | 6076 | 6551 | 680 | 2726 | 6820 | 6821 | 3375 | 1060 | 196 | 160 | 2338 |
| 2378 | 8859 | 8895 | 8988 | 2876 | 9055 | 9075 | 439 | 3576 | 3657 | 3694 | 3926 | 3983 | 4096 | 4156 | 4260 | 4350 | 4455 | 367 | 4932 |
| 1554 | 5009 | 5023 | 5118 | 5184 | 583 | 5292 | 5398 | 5442 | 1736 | 8 | 5681 | 5704 | 5711 | 5736 | 5772 | 1787 | 5880 | 1806 | 5901 |
| 1821 | 5952 | 1842 | 6088 | 2960 | 1902 | 404 | 1969 | 7034 | 2836 | 7227 | 7294 | 7583 | 7754 | 7930 | 2259 | 8308 | 3297 | 8437 | 2590 |
| 8552 | 1982 | 7882 | 444 | 3536 | 3763 | 4019 | 228 | 4239 | 3435 | 4316 | 5284 | 1767 | 6074 | 6830 | 2162 | 8627 | 8760 | 8819 | 1230 |
| 3452 | 6250 | 8800 | 8328 | 1176 | 1189 | 1212 | 2451 | 1240 | 474 | 3949 | 1294 | 484 | 4102 | 894 | 4168 | 1358 | 4300 | 840 | 4503 |

-continued

| | | | | | | | | | | | | | | | | | | | |
|---|---|---|---|---|---|---|---|---|---|---|---|---|---|---|---|---|---|---|---|
| 4516 | 1448 | 4638 | 1491 | 547 | 4856 | 4890 | 1538 | 4924 | 424 | 5148 | 5365 | 6564 | 6610 | 2525 | 2829 | 6875 | 6884 | 2064 | 7279 |
| 7589 | 2193 | 7607 | 2761 | 7895 | 7902 | 2271 | 8222 | 8298 | 2409 | 3554 | 2800 | 7053 | 8499 | 8679 | 8689 | 3194 | 3246 | 141 | 8401 |
| 421 | 4585 | 1571 | 606 | 5956 | 2727 | 2054 | 7642 | 7858 | 8473 | 8654 | 8816 | 4543 | 4651 | 3482 | 208 | 3748 | 3770 | 3819 | 3896 |
| 475 | 3518 | 4396 | 4468 | 4492 | 4709 | 5126 | 5200 | 906 | 1770 | 5878 | 6233 | 3268 | 6313 | 3334 | 1150 | 6369 | 6427 | 966 | 1938 |
| 6563 | 7629 | 7984 | 9129 | 4888 | 1804 | 5144 | 8327 | 8715 | 2480 | 3890 | 4049 | 4581 | 4624 | 6057 | 3415 | 6901 | 2560 | 1248 | 3899 |
| 1290 | 482 | 3517 | 2482 | 3356 | 3080 | 1520 | 4878 | 3526 | 1574 | 570 | 590 | 268 | 1772 | 1040 | 1182 | 6024 | 6241 | 6522 | 6646 |
| 6714 | 6894 | 7127 | 2754 | 2202 | 7700 | 8525 | 8529 | 8544 | 2355 | 8773 | 1527 | 4930 | 5033 | 1679 | 5645 | 1861 | 8479 | 394 | 9034 |
| 7097 | 7178 | 8767 | 4188 | 4224 | 5886 | 2581 | 3710 | 1186 | 3860 | 3946 | 3054 | 4026 | 4048 | 4147 | 410 | 4408 | 4770 | 554 | 4920 |
| 5367 | 3589 | 5771 | 6657 | 692 | 7016 | 304 | 2837 | 752 | 768 | 7934 | 932 | 8424 | 8425 | 9048 | 9088 | 9214 | 3698 | 1237 | 2799 |
| 147 | 7823 | 7940 | 872 | 8991 | 5053 | 5072 | 6650 | 7238 | 7243 | 2274 | 8378 | 8384 | 8695 | 2946 | 469 | 3579 | 4101 | 1392 | 4361 |
| 4757 | 5036 | 5220 | 8443 | 2410 | 5188 | 5240 | 3446 | 7013 | 7050 | 8538 | 2907 | 476 | 4432 | 644 | 169 | 673 | 6739 | 7085 | 7481 |
| 8699 | 8834 | 8872 | 9076 | 4643 | 1796 | 376 | 3921 | 1265 | 3904 | 1278 | 408 | 4148 | 4436 | 5154 | 1712 | 6197 | 6682 | 2122 | 9142 |
| 6193 | 1050 | 1367 | 4327 | 1563 | 5430 | 3119 | 2444 | 6827 | 6953 | 5281 | 207 | 7962 | 3249 | 6870 | 7366 | 1100 | 1071 | 4051 | 4389 |
| 4563 | 2127 | 8254 | 842 | 1788 | 5970 | 8472 | 4245 | 6078 | 279 | 1921 | 6508 | 6521 | 7733 | 7736 | 3386 | 7625 | 8512 | 8919 | 4336 |
| 5900 | 1885 | 7177 | 8949 | 5028 | 5891 | 2961 | 2167 | 4296 | 511 | 4684 | 4788 | 3405 | 5516 | 3688 | 8123 | 8262 | 2748 | 4461 | 973 |
| 5380 | 2320 | 3198 | 1892 | 3814 | 3570 | 4909 | 7009 | 4119 | 858 | 8921 | 3756 | 7209 | 7438 | 1518 | 1673 | 6310 | 4204 | 5191 | 6405 |
| 3792 | 2764 | 2276 | 8601 | 9023 | 5814 | 3135 | 3227 | 6549 | 7131 | 6534 | 3016 | 7014 | 2840 | 7465 | 6038 | 6992 | 7322 | 7838 | 2874 |
| 8726 | 3750 | 6544 | 316 | 8597 | 1022 | 6869 | 1175 | 4393 | 3835 | 1081 | 4860 | 1561 | 6711 | 2126 | 7825 | 4824 | 1592 | 1974 | 879 |
| 4497 | 728 | 4371 | 6487 | 6590 | 7106 | 8321 | 1069 | 4421 | 1078 | 1074 | 4292 | 4839 | 2937 | 5193 | 6996 | 7012 | 3875 | 8155 | 8315 |
| 9093 | 618 | 7539 | 1152 | 2050 | 2692 | 1607 | 8551 | 1556 | 1597 | 3674 | 678 | 2816 | 4256 | 3680 | 260 | 1743 | 5727 | 1828 | 3798 |
| 4069 | 968 | 219 | 2460 | 1696 | 6301 | 6463 | 3854 | 1254 | 4971 | 1923 | 9176 | 3622 | 4823 | 5608 | 3409 | 4576 | 2689 | 2157 | 4496 |
| 1148 | 1391 | 961 | 8609 | 9039 | 9095 | 7143 | 7832 | 3342 | 6079 | 8416 | 4425 | 6210 | 6840 | 2220 | 4299 | 3758 | 2419 | 4910 | 7630 |
| 7613 | 5573 | 2221 | 1512 | 3104 | 8931 | 930 | 2919 | 4782 | 6180 | 4948 | 366 | 253 | 9065 | 924 | 3174 | 6639 | 5232 | 3325 | 6863 |
| 2076 | 1356 | 3568 | 3030 | 6290 | 1364 | 1062 | 7024 | 440 | 4495 | 8561 | 4844 | 3718 | 5487 | 5268 | 5250 | 6560 | 7307 | 7952 | 2327 |
| 2911 | 6450 | 8967 | 5344 | 5733 | 6379 | 8060 | 8294 | 6260 | 2187 | 9025 | 3930 | 7913 | 4053 | 1940 | 4620 | 2871 | 5163 | 4275 | 401 | 846 | 687 |
| 8105 | 8340 | 1460 | 6415 | 4867 | 1035 | 8766 | 4541 | 1285 | 6587 | 624 | 7172 | 2980 | 3299 | 1766 | 7988 | 6615 | 1676 | 2286 | 8849 |
| 1146 | 4756 | 5010 | 660 | 5112 | 1829 | 8358 | 3553 | 2955 | 2284 | 869 | 1112 | 6113 | 8623 | 495 | 1141 | 6054 | 1256 | 8603 | 6853 |
| 3015 | 7661 | 6765 | 2805 | 1388 | 7402 | 4987 | 6839 | 462 | 1525 | 3898 | 4901 | 6523 | 666 | 2814 | 6816 | 2408 | 4633 | 3399 | 3522 |
| 280 | 8006 | 8442 | 9047 | 7786 | 3678 | 6149 | 4364 | 3410 | 433 | 9186 | 2922 | 819 | 503 | 3140 | 6308 | 4145 | 8405 | 6812 | 1548 |
| 8824 | 9201 | 783 | 8569 | 6570 | 8283 | 6843 | 8896 | 1913 | 1790 | 3150 | 4134 | 1814 | 4400 | 3337 | 1037 | 3594 | 3784 | 4966 | 402 |
| 905 | 289 | 4889 | 1350 | 3124 | 3281 | 987 | 693 | 1562 | 516 | 2204 | 543 | 7049 | 1573 | 4837 | 8118 | 4419 | 1517 | 2263 | 6261 |
| 9054 | 1760 | 5722 | 8406 | 4407 | 3049 | 3846 | 8478 | 3510 | 4078 | 1211 | 1750 | 3615 | 6904 | 7002 | 5949 | 696 | 5748 | 3407 | 4978 |
| 1372 | 1578 | 8063 | 1475 | 465 | 7348 | 1222 | 6067 | 4796 | 3172 | 3879 | 4719 | 9153 | 390 | 6834 | 1400 | 2859 | 3689 | 6731 | 4652 |
| 5741 | 4397 | 294 | 6865 | 3131 | 1777 | 9042 | 1439 | 8777 | 4469 | 4877 | 4768 | 6585 | 5576 | 7508 | 863 | 716 | 1014 | 9019 | 4649 |
| 8297 | 7821 | 6833 | 3363 | 1984 | 4227 | 2471 | 9194 | 1015 | 4343 | 6559 | 3706 | 3454 | 4728 | 3162 | 907 | 2941 | 8329 | 1301 | 8722 |
| 1122 | 2668 | 5788 | 1648 | 3565 | 6882 | 5981 | 6510 | 1360 | 1877 | 8364 | 4467 | 243 | 9184 | 3396 | 4181 | 2574 | 6805 | 4601 | 6066 |
| 5638 | 688 | 2264 | 7981 | 431 | 4981 | 3308 | 5551 | 1589 | 1188 | 6102 | 3167 | 8899 | 8763 | 8094 | 781 | 258 | 2117 | 8372 | 8913 |
| 4191 | 4406 | 267 | 8515 | 3428 | 1045 | 8272 | 4184 | 8452 | 505 | 3164 | 510 | 621 | 6810 | 3274 | 1332 | 9210 | 4597 | 6701 | 1085 |
| 1635 | 2201 | 3182 | 2888 | 6706 | 6852 | 6848 | 6517 | 1311 | 8103 | 2944 | 2110 | 6242 | 1320 | 2437 | 1117 | 738 | 76 | 5011 | 6605 |
| 5164 | 6114 | 3957 | 5272 | 2038 | 8411 | 321 | 4853 | 1566 | 7749 | 8377 | 6216 | 198 | 217 | 4897 | 6365 | 8418 | 270 | 3090 | 4626 |
| 5933 | 8090 | 1664 | 2326 | 851 | 385 | 8432 | 5138 | 5265 | 5361 | 5025 | 3361 | 9117 | 3531 | 2009 | 6776 | 1208 | 3886 | 3384 | 7750 |
| 8867 | 4864 | 3634 | 1402 | 8510 | 1088 | 8741 | 1624 | 1361 | 5178 | 2975 | 9208 | 2977 | 4703 | 3326 | 3504 | 1908 | 2383 | 358 | 2767 |
| 7203 | 637 | 4272 | 7597 | 5488 | 4280 | 5752 | 250 | 2057 | 8175 | 5083 | 5119 | 4720 | 7617 | 8413 | 1193 | 9059 | 2833 | 4707 | 1671 |
| 6813 | 438 | 8803 | 3945 | 3187 | 1129 | 4311 | 3434 | 2077 | 5434 | 1131 | 2535 | 4480 | 2228 | 1865 | 8179 | 5298 | 234 | 7159 | 2841 |
| 2565 | 7991 | 5703 | 2553 | 2300 | 3925 | 1196 | 1058 | 8073 | 6401 | 2531 | 1723 | 1314 | 5356 | 361 | 6201 | 4416 | 4083 | 3059 | 2744 |
| 7831 | 1223 | 7594 | 1588 | 2596 | 4281 | 1157 | 3768 | 1840 | 5149 | 4648 | 2835 | 1940 | 4620 | 2871 | 1565 | 2898 | 1721 | 5696 | 4698 |
| 5993 | 4785 | 448 | 943 | 771 | 5506 | 2372 | 2066 | 2405 | 1489 | 4490 | 7685 | 8690 | 168 | 3261 | 8293 | 888 | 1714 | 2348 | 5536 |
| 2163 | 6829 | 8488 | 615 | 4621 | 2472 | 901 | 5481 | 7214 | 714 | 2331 | 1822 | 6333 | 220 | 5898 | 4641 | 8098 | 2115 | 1733 | 9068 |
| 4353 | 8814 | 5698 | 4693 | 7837 | 934 | 1026 | 5335 | 2892 | 1887 | 4433 | 1705 | 7456 | 4740 | 5371 | 6854 | 1428 | 6819 | 8195 | 1860 |
| 2060 | 4647 | 8945 | 6172 | 5876 | 6148 | 4903 | 7569 | 2192 | 1470 | 5008 | 6999 | 6886 | 2147 | 3781 | 8668 | 4917 | 7337 | 5180 | 1419 |
| 4753 | 1858 | 6945 | 2728 | 8168 | 4095 | 5648 | 6036 | 1526 | 9018 | 4617 | 569 | 4152 | 5120 | 414 | 8883 | 395 | 5004 | 3966 | 3915 |
| 7158 | 8573 | 4673 | 1047 | 4991 | 6846 | 3849 | 7353 | 5689 | 1752 | 944 | 4662 | 2079 | 2547 | 5729 | 5346 | 4347 | 7032 | 4362 | 4509 |
| 1107 | 3682 | 8878 | 5972 | 1249 | 325 | 8890 | 1764 | 5572 | 2917 | 3481 | 1612 | 1274 | 3762 | 8909 | 1683 | 3402 | 1999 | 6659 | 7537 |
| 8341 | 8279 | 4171 | 8156 | 2543 | 2010 | 5836 | 4359 | 7293 | 4938 | 8947 | 1003 | 3346 | 4955 | 3289 | 3602 | 8116 | 5061 | 1669 |
| 5406 | 231 | 5725 | 8106 | 8651 | 5125 | 4290 | 8062 | 1312 | 4609 | 1461 | 4611 | 4612 | 4613 | 4614 | 2483 | 4616 | 4530 | 237 | 1463 |
| 1429 | 518 | 4622 | 4623 | 3575 | 2679 | 1394 | 843 | 1464 | 1465 | 1466 | 1083 | 1468 | 1330 | 1233 | 4635 | 4636 | 4637 | 4079 | 1469 |
| 4640 | 4475 | 2485 | 1232 | 1470 | 4645 | 1471 | 4501 | 1423 | 4199 | 4650 | 1184 | 4179 | 4653 | 1472 | 532 | 4656 | 2812 | 4658 | 4659 |
| 4660 | 4551 | 2929 | 2466 | 3747 | 1476 | 4667 | 2637 | 4669 | 412 | 4671 | 4672 | 4542 | 4674 | 126 | 3078 | 4677 | 2486 | 4679 |
| 536 | 4681 | 187 | 192 | 3810 | 4685 | 4686 | 2931 | 4688 | 4689 | 1481 | 1482 | 4692 | 2924 | 4694 | 4695 | 4696 | 985 | 4091 | 2487 |
| 537 | 1484 | 2680 | 1247 | 4704 | 4705 | 3625 | 4559 | 4708 | 4249 | 4710 | 1486 | 1328 | 4713 | 2488 | 4715 | 240 | 4717 | 241 | 1455 |
| 4372 | 4721 | 4722 | 2489 | 4724 | 4725 | 3939 | 1490 | 4213 | 2640 | 4730 | 4731 | 4732 | 4733 | 3438 | 3240 | 4014 | 541 | 1493 | 4739 |
| 945 | 4741 | 1494 | 4743 | 2933 | 4745 | 4279 | 1495 | 3242 | 4749 | 1496 | 4751 | 3404 | 521 | 542 | 1086 | 221 | 3720 | 4758 | 2490 |
| 4760 | 4761 | 1500 | 1501 | 4764 | 4765 | 4766 | 4767 | 1159 | 2934 | 3677 | 3244 | 1502 | 4131 | 1504 | 4775 | 4776 | 4777 | 1505 | 4779 |
| 4780 | 4781 | 3968 | 1506 | 3316 | 346 | 1507 | 4787 | 977 | 4789 | 1508 | 544 | 4792 | 4793 | 4794 | 77 | 3515 | 4797 | 546 | 3963 |
| 1170 | 4801 | 4802 | 4803 | 4804 | 2935 | 2682 | 4807 | 4808 | 1087 | 549 | 4811 | 4812 | 4813 | 1516 | 4815 | 4816 | 4817 | 450 | 4137 |
| 4820 | 4821 | 3834 | 2660 | 3876 | 4825 | 1374 | 3626 | 4828 | 4829 | 4830 | 4345 | 4832 | 4833 | 551 | 1522 | 552 | 341 | 4838 | 1453 |
| 4840 | 4841 | 4466 | 4843 | 3991 | 244 | 2456 | 4847 | 4848 | 4849 | 1031 | 4851 | 4852 | 4307 | 4854 | 4528 | 447 | 4857 | 4858 | 2936 |
| 3871 | 4861 | 3651 | 368 | 4341 | 3317 | 4866 | 3621 | 4868 | 4869 | 4085 | 1529 | 1530 | 4873 | 4874 | 4875 | 4876 | 4190 | 892 | 2936 |
| 4880 | 3083 | 3248 | 4883 | 4884 | 4885 | 1238 | 4887 | 1106 | 4122 | 1201 | 1089 | 1032 | 4893 | 4894 | 4895 | 4896 | 4314 | 555 | 2685 |
| 3251 | 4071 | 4902 | 4506 | 4904 | 4905 | 1536 | 1537 | 1172 | 1253 | 978 | 3929 | 4912 | 903 | 4914 | 4915 | 4916 | 3039 | 423 | 4919 |
| 1216 | 4921 | 3085 | 1540 | 4442 | 4925 | 4926 | 1541 | 4928 | 4929 | 397 | 2687 | 3822 | 4933 | 1542 | 1543 | 3318 | 4589 | 4939 |
| 4940 | 4941 | 4942 | 1544 | 557 | 4945 | 4946 | 4947 | 3970 | 28 | 4950 | 4951 | 4952 | 4953 | 558 | 529 | 3578 | 4957 | 78 | 4099 |
| 3086 | 4961 | 4962 | 246 | 4964 | 4965 | 1338 | 129 | 4968 | 4969 | 2913 | 1552 | 4972 | 4973 | 4974 | 1553 | 4976 | 4977 | 3981 | 3440 |
| 563 | 2454 | 4982 | 1130 | 3618 | 4985 | 4986 | 4066 | 4988 | 4989 | 248 | 4544 | 4992 | 4993 | 1558 | 4995 | 3087 | 4997 | 4998 | 565 |
| 3358 | 5001 | 5002 | 249 | 4537 | 5005 | 1267 | 5007 | 1440 | 3441 | 4042 | 4269 | 5012 | 5013 | 4128 | 5015 | 5016 | 5017 | 1377 | 5019 |
| 5020 | 3253 | 5022 | 1300 | 5024 | 1397 | 567 | 5027 | 3804 | 5029 | 1424 | 4308 | 3088 | 3653 | 5034 | 1033 | 1225 | 5037 | 5038 | 3319 |
| 3254 | 5041 | 568 | 889 | 3562 | 5045 | 5046 | 3529 | 1572 | 5049 | 5050 | 4133 | 5052 | 3705 | 5054 | 3199 | 5056 | 5057 | 5058 | 5059 |
| 4531 | 1028 | 2879 | 5063 | 5064 | 5065 | 5066 | 5067 | 411 | 5069 | 5070 | 1577 | 1369 | 5073 | 5074 | 4161 | 5076 | 5077 | 1119 | 3091 |
| 5080 | 5081 | 5082 | 4370 | 5084 | 5085 | 5086 | 1579 | 1580 | 5089 | 5090 | 5091 | 2691 | 5093 | 5094 | 3630 | 5096 | 5097 | 2672 | 2492 |
| 3893 | 5101 | 4331 | 5103 | 3092 | 5105 | 5106 | 572 | 5108 | 5109 | 5110 | 1584 | 4044 | 5113 | 573 | 5115 | 5116 | 5117 | 3889 | 3882 |

-continued

| | | | | | | | | | | | | | | | | | | |
|---|---|---|---|---|---|---|---|---|---|---|---|---|---|---|---|---|---|---|
| 4533 | 5121 | 5122 | 3905 | 251 | 4605 | 3586 | 4423 | 2693 | 5129 | 5130 | 501 | 5132 | 425 | 1590 | 5135 | 2795 | 5137 | 3485 | 5139 |
| 3095 | 5141 | 5142 | 50 | 3606 | 5145 | 5146 | 3877 | 3530 | 4429 | 577 | 5151 | 1109 | 5153 | 3754 | 5155 | 5156 | 5157 | 5158 | 578 |
| 579 | 5161 | 3322 | 5163 | 3932 | 5165 | 5166 | 3909 | 5168 | 5169 | 1598 | 5171 | 5172 | 5173 | 1599 | 5175 | 3096 | 5177 | 4349 | 580 |
| 4518 | 5181 | 1601 | 1602 | 3444 | 5185 | 1603 | 5187 | 3725 | 5189 | 5190 | 3838 | 5192 | 3894 | 5194 | 3323 | 3362 | 5197 | 5198 | 5199 |
| 3587 | 5201 | 5202 | 3972 | 5204 | 5205 | 3906 | 5207 | 5208 | 5209 | 1608 | 1609 | 5212 | 5213 | 5214 | 1610 | 5216 | 5217 | 582 | 4571 |
| 2659 | 1613 | 1614 | 5223 | 5224 | 5225 | 1615 | 5227 | 5228 | 5229 | 5230 | 1616 | 66 | 5233 | 1011 | 5235 | 4025 | 4017 | 5238 | 5239 |
| 3726 | 584 | 585 | 1620 | 5244 | 5245 | 131 | 5247 | 1110 | 5249 | 1303 | 587 | 5252 | 5253 | 1366 | 2654 | 5256 | 1625 | 4325 | 5259 |
| 5260 | 5261 | 1626 | 5263 | 5264 | 4328 | 255 | 1628 | 1302 | 5269 | 3631 | 5271 | 61 | 1630 | 5274 | 5275 | 5276 | 591 | 1036 | 5279 |
| 5280 | 1213 | 3259 | 5283 | 1160 | 1633 | 1134 | 1634 | 5288 | 5289 | 509 | 593 | 3027 | 5293 | 1637 | 5295 | 5296 | 5297 | 3582 | 5299 |
| 5300 | 5301 | 5302 | 1638 | 1639 | 5305 | 5306 | 5307 | 5308 | 2695 | 5310 | 5311 | 5312 | 5313 | 1640 | 1641 | 2939 | 5317 | 594 | 201 |
| 5320 | 4158 | 5322 | 1644 | 2696 | 5325 | 1645 | 1646 | 5328 | 256 | 963 | 5331 | 3912 | 3847 | 1649 | 4487 | 5336 | 5337 | 1650 | 1651 |
| 5340 | 5341 | 1652 | 5343 | 4003 | 257 | 981 | 1654 | 5348 | 3913 | 1656 | 598 | 599 | 5353 | 80 | 5355 | 4413 | 5357 | 5358 | 1660 |
| 5360 | 1396 | 1661 | 1662 | 5364 | 1398 | 2862 | 1264 | 5368 | 181 | 601 | 4494 | 5372 | 5373 | 4322 | 4539 | 5376 | 5377 | 1666 | 603 |
| 3820 | 133 | 5382 | 5383 | 5384 | 4599 | 1670 | 4379 | 5388 | 5389 | 605 | 5391 | 5392 | 5393 | 5394 | 3869 | 5396 | 5397 | 1144 | 1674 |
| 1675 | 5401 | 4037 | 3978 | 5404 | 3675 | 4600 | 5407 | 1677 | 5409 | 5410 | 1181 | 5412 | 3260 | 3654 | 5415 | 5416 | 5417 | 5418 | 5419 |
| 1680 | 1681 | 1682 | 4575 | 5424 | 5425 | 1684 | 1685 | 5428 | 5429 | 1080 | 1686 | 1687 | 5433 | 1239 | 1688 | 7 | 5437 | 964 | 5439 |
| 1341 | 2495 | 3448 | 3099 | 3100 | 5445 | 608 | 1692 | 5448 | 2496 | 2697 | 5451 | 5452 | 609 | 5454 | 5455 | 1694 | 1695 | 1280 | 5459 |
| 1697 | 5461 | 1698 | 5463 | 5464 | 3226 | 5466 | 2698 | 5468 | 5469 | 1700 | 611 | 135 | 5473 | 948 | 5475 | 5476 | 387 | 5478 | 5479 |
| 5480 | 2807 | 1703 | 613 | 3936 | 5485 | 5486 | 3993 | 4087 | 4491 | 5490 | 5491 | 1706 | 1707 | 4454 | 5495 | 5496 | 5497 | 1709 | 5499 |
| 3312 | 5501 | 5502 | 1710 | 5504 | 5505 | 4445 | 1711 | 3755 | 5509 | 2820 | 5511 | 2942 | 1713 | 5514 | 5515 | 3813 | 5517 | 1430 | 1715 |
| 5520 | 5521 | 5522 | 5523 | 5524 | 1716 | 5526 | 5527 | 1075 | 2943 | 1719 | 1720 | 5532 | 5533 | 3365 | 5535 | 4459 | 5537 | 5538 | 2646 |
| 1722 | 5541 | 5542 | 2473 | 1724 | 5545 | 2430 | 5547 | 2423 | 5549 | 5550 | 3229 | 5552 | 5553 | 3623 | 616 | 5556 | 5557 | 5558 | 5559 |
| 5560 | 1728 | 5562 | 5563 | 617 | 1730 | 5566 | 5567 | 5568 | 5569 | 3102 | 5571 | 4568 | 3961 | 5574 | 1731 | 1362 | 5577 | 5578 | 5579 |
| 1732 | 5581 | 4478 | 5583 | 348 | 5585 | 3103 | 1734 | 5588 | 5589 | 5590 | 3964 | 5592 | 5593 | 5594 | 5595 | 5596 | 2912 | 5598 | 5599 |
| 1275 | 1436 | 5602 | 2699 | 5604 | 5605 | 5606 | 5607 | 3934 | 5609 | 5610 | 5611 | 5612 | 5613 | 5614 | 136 | 620 | 5617 | 1739 | 5619 |
| 5620 | 5621 | 5622 | 1450 | 5624 | 5625 | 5626 | 1741 | 5628 | 5629 | 5630 | 5631 | 5632 | 5633 | 5634 | 5635 | 1742 | 2662 | 3870 | 5639 |
| 3450 | 5641 | 1745 | 5643 | 5644 | 212 | 5646 | 1746 | 4526 | 5649 | 5650 | 1747 | 1748 | 5653 | 1749 | 5655 | 3514 | 5657 | 5658 | 1751 |
| 5660 | 5661 | 5662 | 362 | 5664 | 5665 | 5666 | 5667 | 2635 | 5669 | 5670 | 5671 | 1753 | 1754 | 1755 | 5675 | 3020 | 5677 | 1111 | 5679 |
| 5680 | 3451 | 5682 | 1757 | 5684 | 5685 | 5686 | 1758 | 5688 | 1759 | 5691 | 3588 | 3714 | 4141 | 5695 | 3234 | 2701 | 4482 | 1383 |
| 5700 | 5701 | 5702 | 1417 | 205 | 5705 | 5706 | 5707 | 5708 | 1038 | 4030 | 1145 | 5712 | 5713 | 4567 | 4215 | 5716 | 5717 | 5718 | 5719 |
| 5720 | 5721 | 2802 | 1202 | 5724 | 4602 | 3038 | 2663 | 5728 | 4554 | 1161 | 2947 | 5732 | 4004 | 5734 | 1769 | 3232 | 5737 | 5738 | 5739 |
| 5740 | 1444 | 5742 | 5743 | 5744 | 1217 | 2435 | 5747 | 3060 | 5749 | 5750 | 5751 | 4366 | 5753 | 5754 | 5755 | 5756 | 5757 | 3329 | 626 |
| 5760 | 5761 | 3633 | 5763 | 5764 | 5765 | 627 | 3366 | 5768 | 5769 | 1775 | 4561 | 4040 | 5773 | 5774 | 5775 | 5776 | 138 | 5778 | 5779 |
| 2703 | 496 | 2886 | 5783 | 5784 | 5785 | 5786 | 5787 | 4222 | 5789 | 5790 | 5791 | 5792 | 5793 | 5794 | 1778 | 1779 | 5797 | 630 | 5799 |
| 5800 | 5801 | 1039 | 1781 | 1782 | 5805 | 5806 | 2499 | 5808 | 2948 | 5810 | 5811 | 3394 | 5813 | 3845 | 1783 | 3310 | 1785 | 5818 | 5819 |
| 5820 | 5821 | 5822 | 2704 | 1147 | 5825 | 5826 | 826 | 1337 | 5829 | 5830 | 1789 | 4109 | 4342 | 4317 | 5835 | 4586 | 5837 | 5838 | 1792 |
| 1793 | 5841 | 5842 | 2500 | 5844 | 5845 | 5846 | 5847 | 5848 | 5849 | 5850 | 1794 | 1795 | 3745 | 5854 | 5855 | 5856 | 5857 | 5858 | 35 |
| 2949 | 5861 | 5862 | 140 | 5864 | 971 | 5866 | 1800 | 273 | 5869 | 1802 | 5871 | 5872 | 5873 | 5874 | 3212 | 4504 | 5877 | 3590 | 3605 |
| 3940 | 5881 | 5882 | 5883 | 5884 | 5885 | 3665 | 1805 | 3217 | 635 | 63 | 3805 | 5892 | 5893 | 3332 | 636 | 3719 | 5897 | 1433 | 1093 |
| 976 | 1149 | 5902 | 3558 | 5904 | 5905 | 1813 | 5907 | 5908 | 5909 | 4112 | 1815 | 5912 | 5913 | 5914 | 639 | 2706 | 5917 | 5918 | 5919 |
| 5920 | 5921 | 5922 | 5923 | 5924 | 1817 | 1818 | 5927 | 5928 | 5929 | 5930 | 5931 | 1819 | 506 | 5934 | 5935 | 5936 | 5937 | 5938 | 1820 |
| 5940 | 5941 | 3460 | 5943 | 5944 | 5945 | 3783 | 640 | 5948 | 4155 | 5950 | 5951 | 3461 | 5953 | 5954 | 5955 | 1203 | 5957 | 5958 | 5959 |
| 5960 | 1824 | 349 | 5963 | 5964 | 5965 | 5966 | 5967 | 1825 | 5969 | 3785 | 5971 | 1167 | 5973 | 5974 | 1826 | 5976 | 5977 | 641 | 5979 |
| 5980 | 1373 | 3918 | 21 | 5984 | 5985 | 5986 | 5987 | 5988 | 5989 | 3333 | 5991 | 5992 | 4440 | 5994 | 5995 | 5996 | 1830 | 2502 | 908 |
| 6000 | 6001 | 6002 | 6003 | 6004 | 6005 | 6006 | 6007 | 6008 | 6009 | 6010 | 6011 | 1831 | 1832 | 642 | 6015 | 6016 | 6017 | 6018 | 1834 |
| 3109 | 6021 | 6022 | 6023 | 1204 | 2950 | 6026 | 1837 | 6028 | 6029 | 1836 | 3734 | 6033 | 1838 | 4527 | 6037 | 3855 | 6039 |
| 1839 | 6041 | 3110 | 3111 | 1422 | 2951 | 1841 | 3462 | 645 | 6049 | 1844 | 6051 | 6052 | 6053 | 3056 | 909 | 647 | 209 | 1847 | 1121 |
| 174 | 6061 | 6062 | 6063 | 6064 | 2823 | 1158 | 4167 | 143 | 1849 | 2952 | 6071 | 6072 | 2643 | 204 | 6075 | 3052 | 6077 | 3788 | 3752 |
| 1850 | 6081 | 6082 | 6083 | 2953 | 6085 | 6086 | 6087 | 2445 | 6089 | 6090 | 649 | 6092 | 6093 | 6094 | 6095 | 6096 | 2824 | 6098 | 6099 |
| 6100 | 6101 | 4250 | 1042 | 1853 | 6105 | 1854 | 6107 | 6108 | 6109 | 6110 | 6111 | 6112 | 1322 | 4301 | 6115 | 6116 | 6117 | 6118 | 6119 |
| 6120 | 6121 | 1855 | 6123 | 6124 | 6125 | 1856 | 1857 | 6128 | 6129 | 522 | 3265 | 6132 | 6133 | 6134 | 6135 | 6136 | 951 | 6138 | 6139 |
| 6140 | 277 | 371 | 6143 | 6144 | 6145 | 6146 | 6147 | 4505 | 4086 | 6150 | 6151 | 6152 | 6153 | 6154 | 6155 | 6156 | 6157 | 519 | 6159 |
| 1347 | 6161 | 1862 | 651 | 6164 | 6165 | 1864 | 6167 | 6168 | 3266 | 512 | 6171 | 3519 | 965 | 6174 | 6175 | 6176 | 1866 | 2712 | 6179 |
| 210 | 6181 | 6182 | 6183 | 3828 | 6185 | 3267 | 6187 | 6188 | 6189 | 1867 | 6191 | 6192 | 3760 | 1868 | 6195 | 6196 | 3831 | 652 | 6199 |
| 3114 | 4415 | 827 | 1043 | 912 | 3673 | 1870 | 6207 | 2826 | 3116 | 1286 | 653 | 6212 | 1872 | 2715 | 654 | 4386 | 6217 | 6218 | 6219 |
| 6220 | 6221 | 2956 | 6223 | 6224 | 6225 | 1874 | 6227 | 6228 | 1875 | 1876 | 6231 | 6232 | 2655 | 6234 | 6235 | 372 | 6237 | 4229 | 6239 |
| 1878 | 3637 | 3891 | 84 | 3735 | 6245 | 6246 | 1880 | 6248 | 6249 | 1165 | 656 | 6252 | 6253 | 6254 | 6255 | 6256 | 6257 | 6258 | 6259 |
| 4008 | 14 | 6262 | 6263 | 6264 | 6265 | 657 | 6267 | 6268 | 6269 | 6270 | 6271 | 6272 | 6273 | 1883 | 351 | 215 | 6277 | 6278 | 6279 |
| 1166 | 6281 | 6282 | 467 | 6284 | 1886 | 3019 | 6287 | 6288 | 6289 | 3984 | 6291 | 6292 | 6293 | 6294 | 6295 | 6296 | 6297 | 6298 | 6299 |
| 6300 | 4465 | 6302 | 6303 | 6304 | 6305 | 4489 | 6307 | 4525 | 6309 | 1021 | 3269 | 99 | 3771 | 4116 | 4080 | 1044 | 6317 | 6318 | 6319 |
| 2441 | 1889 | 6322 | 1890 | 6324 | 6325 | 2958 | 6327 | 6328 | 6329 | 6330 | 6331 | 6332 | 4472 | 6334 | 990 | 6336 | 6337 | 114 | 6339 |
| 6340 | 6341 | 6342 | 6343 | 6344 | 6345 | 1893 | 4595 | 1894 | 6349 | 1319 | 1896 | 3766 | 6353 | 6354 | 6355 | 6356 | 6357 | 1191 | 1897 |
| 6360 | 6361 | 1898 | 6363 | 6364 | 4315 | 6366 | 6367 | 1192 | 6370 | 6371 | 6372 | 1899 | 2718 | 6375 | 6376 | 6377 | 6378 | 4005 |
| 6380 | 6381 | 1901 | 2903 | 1012 | 403 | 6386 | 2507 | 2508 | 3270 | 6390 | 1903 | 6392 | 6393 | 992 | 1904 | 6396 | 6397 | 3213 | 3206 |
| 6400 | 4409 | 6402 | 6403 | 6404 | 3839 | 6406 | 6407 | 6408 | 145 | 1906 | 6411 | 4265 | 6413 | 6414 | 4023 | 6416 | 6417 | 662 | 2509 |
| 507 | 3271 | 6422 | 3121 | 2865 | 3272 | 6426 | 3597 | 6428 | 6429 | 1094 | 6431 | 3466 | 6433 | 663 | 1910 | 6436 | 6437 | 6438 | 6439 |
| 6440 | 2510 | 3368 | 6443 | 6444 | 6445 | 1912 | 6447 | 6448 | 6449 | 4001 | 6451 | 6452 | 6453 | 1346 | 2511 | 1914 | 6457 | 3369 | 4390 |
| 6460 | 282 | 6462 | 1140 | 6464 | 6465 | 3598 | 6467 | 6468 | 915 | 4073 | 6471 | 6472 | 2479 | 3123 | 6475 | 6476 | 6477 | 6478 | 1340 |
| 1919 | 54 | 6482 | 6483 | 6484 | 6485 | 6486 | 3883 | 1242 | 6489 | 1922 | 6491 | 2910 | 4011 | 6494 | 852 | 3572 | 3126 | 6498 | 2513 |
| 285 | 6501 | 6502 | 6503 | 1048 | 6505 | 3128 | 1926 | 3791 | 1049 | 4573 | 2442 | 6512 | 2514 | 1927 | 2515 | 837 | 4287 | 426 | 6519 |
| 6520 | 3047 | 3638 | 1266 | 1929 | 6525 | 1930 | 3132 | 6528 | 286 | 1932 | 2965 | 6533 | 1346 | 1931 | 1934 | 6537 | 6538 | 6539 |
| 1935 | 6541 | 1936 | 942 | 4264 | 6545 | 6546 | 3133 | 6548 | 1260 | 1937 | 4088 | 4206 | 6553 | 6554 | 6555 | 6556 | 2516 | 6558 | 4210 |
| 1304 | 6561 | 1939 | 1194 | 3218 | 3733 | 2517 | 6567 | 6568 | 6569 | 116 | 2518 | 3276 | 6573 | 2966 | 6575 | 672 | 6577 | 1229 | 6579 |
| 6580 | 6581 | 6582 | 287 | 2967 | 436 | 1946 | 4029 | 6588 | 6589 | 471 | 6591 | 6592 | 6593 | 1947 | 3761 | 6596 | 6597 | 1948 | 6599 |
| 6600 | 6601 | 1949 | 6603 | 6604 | 3955 | 6606 | 2519 | 6608 | 1950 | 3533 | 6611 | 2721 | 6613 | 675 | 4036 | 6616 | 6617 | 6618 | 676 |
| 6620 | 4146 | 677 | 6623 | 6624 | 6625 | 6626 | 4060 | 6628 | 6629 | 3911 | 853 | 6632 | 6633 | 1955 | 6635 | 6636 | 6637 | 6638 | 831 |
| 6640 | 6641 | 6642 | 4220 | 6644 | 4456 | 3639 | 6647 | 6648 | 6649 | 48 | 2723 | 6652 | 6653 | 6654 | 1956 | 6656 | 3683 | 1221 | 4578 |
| 1958 | 6661 | 6662 | 3136 | 1959 | 2521 | 6666 | 6667 | 3411 | 6669 | 1961 | 3137 | 6672 | 1962 | 6674 | 6675 | 6676 | 918 | 6678 | 109 |
| 681 | 2725 | 213 | 1965 | 3767 | 6685 | 6686 | 6687 | 6688 | 3138 | 6690 | 683 | 6692 | 1098 | 1968 | 6695 | 3903 | 2895 | 893 | 6699 |
| 6700 | 4278 | 1051 | 6703 | 1971 | 6705 | 1387 | 3224 | 6708 | 6709 | 4523 | 1268 | 6712 | 6713 | 3640 | 2522 | 1973 | 6717 | 1269 | 6719 |

-continued

| | | | | | | | | | | | | | | | | | | | |
|---|---|---|---|---|---|---|---|---|---|---|---|---|---|---|---|---|---|---|---|
| 6720 | 6721 | 6722 | 2729 | 2523 | 6725 | 188 | 685 | 352 | 3280 | 6730 | 2803 | 290 | 6733 | 1978 | 3141 | 6736 | 6737 | 1052 | 3737 |
| 6740 | 6741 | 6742 | 183 | 6744 | 6745 | 3486 | 6747 | 6748 | 2730 | 6750 | 4241 | 689 | 527 | 690 | 6755 | 6756 | 6757 | 4125 | 2731 |
| 6760 | 6761 | 6762 | 1257 | 1985 | 4062 | 6766 | 6767 | 1986 | 6769 | 1987 | 291 | 6772 | 3684 | 6774 | 3534 | 4335 | 6777 | 6778 | 112 |
| 6780 | 6781 | 4127 | 6783 | 6784 | 2732 | 6786 | 1991 | 1992 | 148 | 6791 | 1995 | 6793 | 1053 | 2733 | 6796 | 6797 | 6798 | 293 |
| 4387 | 891 | 6802 | 6803 | 1998 | 3064 | 2526 | 4577 | 6808 | 6809 | 3230 | 43 | 4098 | 896 | 4182 | 954 | 1329 | 6817 | 2001 | 4486 |
| 3215 | 3414 | 6822 | 3282 | 2002 | 295 | 2004 | 4427 | 6828 | 3818 | 3494 | 375 | 6832 | 1365 | 3063 | 2005 | 699 | 3373 | 3374 | 1326 |
| 3953 | 6841 | 2528 | 2801 | 6844 | 2529 | 4545 | 2008 | 2443 | 6849 | 1399 | 855 | 4285 | 4059 | 4218 | 6855 | 6856 | 6857 | 3561 | 296 |
| 6860 | 6861 | 2831 | 1296 | 702 | 3516 | 3283 | 2735 | 6868 | 3774 | 2014 | 6872 | 3235 | 149 | 3484 | 150 | 6877 | 299 | 4410 |
| 6880 | 2867 | 2463 | 3145 | 3867 | 6885 | 4512 | 2532 | 6888 | 2969 | 6890 | 6891 | 6892 | 6893 | 3641 | 2424 | 2019 | 6897 | 2020 | 6899 |
| 2021 | 2897 | 2970 | 2971 | 1348 | 6905 | 6906 | 2022 | 2023 | 6909 | 6910 | 4055 | 2024 | 6913 | 2832 | 1409 | 6916 | 185 | 6918 | 856 |
| 300 | 6921 | 1412 | 857 | 6924 | 2972 | 6926 | 6927 | 6928 | 2027 | 6930 | 3928 | 2028 | 6933 | 708 | 6935 | 2030 | 6937 | 1123 | 3746 |
| 6940 | 6941 | 6942 | 2031 | 6944 | 75 | 6946 | 6947 | 709 | 6949 | 2538 | 2869 | 3769 | 6952 | 86 | 4114 | 6957 | 2034 | 995 |
| 6960 | 6961 | 6962 | 6963 | 6964 | 2035 | 6966 | 353 | 711 | 6969 | 6970 | 2037 | 3941 | 6973 | 712 | 2737 | 6976 | 6977 | 6978 | 2040 |
| 6980 | 6981 | 6982 | 6983 | 2041 | 6985 | 6986 | 3285 | 6988 | 6989 | 6990 | 713 | 3856 | 6993 | 4063 | 996 | 3895 | 860 | 6998 | 3075 |
| 7000 | 7001 | 526 | 2541 | 2044 | 7005 | 7006 | 2045 | 2046 | 1017 | 2047 | 377 | 3716 | 1228 | 2450 | 2048 | 1218 | 29 | 152 | 3146 |
| 3749 | 7021 | 7022 | 4434 | 3987 | 7025 | 7026 | 1363 | 7028 | 7029 | 717 | 7031 | 123 | 2542 | 3468 | 7035 | 7036 | 3147 | 7038 | 2053 |
| 3566 | 7041 | 7042 | 2055 | 2056 | 7045 | 4368 | 2739 | 7048 | 4132 | 3729 | 7040 | 7052 | 3552 | 2059 | 3148 | 3355 | 7057 | 107 | 2872 |
| 7060 | 2889 | 7062 | 2741 | 7064 | 7065 | 719 | 2742 | 7068 | 4584 | 7070 | 7071 | 7072 | 7073 | 7074 | 861 | 7076 | 7077 | 7078 | 2545 |
| 2063 | 7081 | 3538 | 7083 | 7084 | 3738 | 7086 | 7087 | 7088 | 7089 | 303 | 4110 | 2475 | 7093 | 4173 | 7095 | 7096 | 1115 | 7098 | 2067 |
| 7100 | 7101 | 2068 | 721 | 7104 | 7105 | 2906 | 3151 | 378 | 2070 | 7110 | 2546 | 7112 | 7113 | 7114 | 1142 | 3686 | 7117 | 2073 | 997 |
| 7120 | 7121 | 7122 | 7123 | 899 | 7125 | 7126 | 3642 | 2074 | 7129 | 862 | 4235 | 7132 | 7133 | 7134 | 2549 | 7136 | 7137 | 3152 | 1297 |
| 7140 | 195 | 7142 | 3670 | 4550 | 723 | 7146 | 4552 | 3028 | 7149 | 7150 | 177 | 2081 | 7153 | 1293 | 1403 | 7156 | 7157 | 1446 | 4398 |
| 7160 | 7161 | 7162 | 7163 | 2083 | 7165 | 4431 | 1057 | 7168 | 3378 | 7170 | 2085 | 483 | 7173 | 2086 | 724 | 7176 | 3200 | 3661 | 725 |
| 925 | 2089 | 7182 | 2550 | 2978 | 7185 | 7186 | 7187 | 2091 | 7189 | 2092 | 3817 | 7192 | 7193 | 7194 | 2093 | 1153 | 2634 | 7198 | 7199 |
| 2094 | 7201 | 2095 | 3581 | 2096 | 726 | 2036 | 7206 | 3379 | 7208 | 1255 | 342 | 2099 | 7212 | 3687 | 2794 | 3338 | 7216 | 2101 | 3881 |
| 2103 | 7221 | 2979 | 7223 | 2551 | 7225 | 3339 | 3470 | 7228 | 7229 | 7230 | 729 | 3155 | 7233 | 7234 | 7235 | 2106 | 7237 | 3433 | 2873 |
| 2552 | 305 | 7242 | 3709 | 7244 | 7245 | 2109 | 2751 | 7248 | 897 | 7250 | 7251 | 7252 | 3380 | 1316 | 3401 | 2111 | 7257 | 7258 | 2112 |
| 7260 | 7261 | 2113 | 7263 | 7264 | 7265 | 7266 | 306 | 1261 | 7269 | 2809 | 7271 | 927 | 7273 | 2554 | 1124 | 2555 | 1381 | 7278 | 3021 |
| 7280 | 7281 | 2118 | 2119 | 7284 | 2804 | 7286 | 7287 | 7288 | 2557 | 7290 | 2120 | 2121 | 4588 | 3471 | 7295 | 7296 | 7297 | 834 | 7299 |
| 7300 | 7301 | 7302 | 732 | 7304 | 7305 | 12 | 3997 | 2125 | 7309 | 354 | 3874 | 7312 | 4514 | 7314 | 2128 | 7316 | 7317 | 2129 | 2130 |
| 7320 | 7321 | 2905 | 7323 | 7324 | 2559 | 7326 | 2131 | 3032 | 2132 | 7330 | 7331 | 7332 | 7333 | 25 | 7335 | 7336 | 2925 | 7338 | 735 |
| 7340 | 7341 | 2135 | 7343 | 2136 | 7345 | 3617 | 736 | 2915 | 57 | 7350 | 2139 | 7352 | 4547 | 2140 | 3808 | 7356 | 7357 | 7358 | 7359 |
| 7360 | 2561 | 7362 | 2142 | 2839 | 310 | 3775 | 7367 | 2145 | 7369 | 835 | 7371 | 7372 | 7373 | 2146 | 7376 | 7377 | 2478 | 7379 |
| 2148 | 7381 | 2149 | 156 | 7384 | 7385 | 7386 | 2151 | 312 | 7389 | 7390 | 2153 | 7392 | 7393 | 2154 | 7395 | 928 | 313 | 7398 | 2156 |
| 3732 | 7401 | 3223 | 7403 | 2158 | 7405 | 998 | 7407 | 7408 | 7409 | 3044 | 7411 | 7412 | 7413 | 7414 | 7415 | 90 | 744 | 2161 | 1386 |
| 7420 | 7421 | 7422 | 2562 | 7424 | 3157 | 7426 | 1013 | 7428 | 2453 | 7430 | 7431 | 7432 | 3354 | 7434 | 7435 | 2164 | 7437 | 3833 | 2563 |
| 2165 | 7441 | 2166 | 3853 | 7444 | 7445 | 7446 | 3807 | 7448 | 7449 | 2168 | 7451 | 745 | 7453 | 315 | 7455 | 1016 | 7457 | 7458 | 2564 |
| 7460 | 7461 | 7462 | 2171 | 7464 | 3927 | 7466 | 7467 | 7468 | 2172 | 7470 | 747 | 748 | 7473 | 7474 | 7475 | 2175 | 7477 | 2176 | 7479 |
| 7480 | 3739 | 7482 | 749 | 7484 | 7485 | 7486 | 7487 | 7488 | 7489 | 2178 | 7491 | 7492 | 429 | 7494 | 3158 | 7496 | 3159 | 7498 | 7499 |
| 7500 | 3160 | 7502 | 7503 | 7504 | 2181 | 7506 | 7507 | 3314 | 7509 | 7510 | 1336 | 2182 | 7513 | 7514 | 7515 | 7516 | 7517 | 2183 | 7519 |
| 7520 | 7521 | 2184 | 7523 | 7524 | 7525 | 865 | 2982 | 7528 | 97 | 7530 | 2185 | 7532 | 7533 | 7534 | 1125 | 7536 | 970 | 7538 | 1276 |
| 3863 | 7541 | 3350 | 7543 | 7544 | 7545 | 7546 | 7547 | 3824 | 7549 | 7550 | 7551 | 7552 | 7553 | 7554 | 7555 | 7556 | 7557 | 7558 | 7559 |
| 7560 | 7561 | 2568 | 7563 | 2189 | 2190 | 7566 | 7567 | 7568 | 2477 | 7570 | 498 | 7572 | 2983 | 7574 | 7575 | 2984 | 513 | 7578 | 7579 |
| 7580 | 7581 | 7582 | 441 | 4508 | 7585 | 7586 | 7587 | 7588 | 3540 | 1404 | 2194 | 7592 | 7593 | 4422 | 7595 | 929 | 4363 | 867 | 7599 |
| 7600 | 2571 | 7602 | 755 | 2197 | 7605 | 2198 | 4197 | 1445 | 2572 | 7610 | 2199 | 2200 | 1288 | 7614 | 7615 | 3951 | 4373 | 7618 | 7619 |
| 3644 | 7621 | 2985 | 7623 | 7624 | 3796 | 7626 | 2203 | 7628 | 3601 | 477 | 7631 | 71 | 7633 | 317 | 868 | 4236 | 757 | 7638 | 3163 |
| 7640 | 7641 | 3567 | 7643 | 7644 | 1458 | 7646 | 7647 | 2207 | 2986 | 7650 | 7651 | 2208 | 318 | 7654 | 7655 | 2757 | 7657 | 7658 | 7659 |
| 7660 | 4061 | 7662 | 759 | 7664 | 7665 | 7666 | 7667 | 2211 | 2212 | 760 | 7671 | 4050 | 2214 | 7674 | 7675 | 7676 | 7677 | 179 | 120 |
| 7680 | 2843 | 7682 | 7683 | 102 | 4451 | 7686 | 7687 | 2215 | 7689 | 7690 | 7691 | 7692 | 7693 | 4270 | 7695 | 7696 | 7697 | 7698 | 761 |
| 1206 | 2987 | 2217 | 7703 | 2218 | 7705 | 7706 | 7707 | 2219 | 3954 | 7710 | 7711 | 7712 | 7713 | 7714 | 7715 | 2759 | 7717 | 7718 | 7719 |
| 3699 | 2988 | 7722 | 7723 | 762 | 2223 | 7726 | 7727 | 2760 | 7729 | 2649 | 7731 | 7732 | 4164 | 7734 | 763 | 3794 | 7737 | 7738 | 7739 |
| 2225 | 7741 | 2226 | 764 | 7744 | 3868 | 7746 | 2229 | 7748 | 2670 | 4453 | 7751 | 3543 | 7753 | 3473 | 7755 | 2230 | 2989 | 7758 | 7759 |
| 7760 | 765 | 7762 | 7763 | 7764 | 7765 | 7766 | 7767 | 7768 | 7769 | 7770 | 18 | 7772 | 7773 | 7774 | 7775 | 2233 | 7777 | 7778 | 7779 |
| 7780 | 2234 | 7782 | 2235 | 7784 | 7785 | 515 | 7787 | 2762 | 7789 | 7790 | 7791 | 7792 | 7793 | 2236 | 2763 | 2236 | 7798 | 7799 |
| 3208 | 7801 | 7802 | 7803 | 7804 | 7805 | 7806 | 2237 | 3416 | 7809 | 7810 | 7811 | 3166 | 7813 | 320 | 7815 | 7816 | 7817 | 3841 | 7819 |
| 7820 | 4294 | 3291 | 3701 | 2765 | 3050 | 7826 | 7827 | 2240 | 7829 | 7830 | 898 | 3947 | 7833 | 2990 | 7835 | 7836 | 1434 | 42 | 7839 |
| 7840 | 7841 | 7842 | 1357 | 7844 | 7845 | 4251 | 7847 | 2459 | 7849 | 2243 | 2244 | 7852 | 7853 | 7854 | 7855 | 7856 | 7857 | 30 | 7859 |
| 7860 | 7861 | 7862 | 7863 | 3168 | 7865 | 7866 | 7867 | 7868 | 322 | 7871 | 7872 | 3417 | 7875 | 7876 | 7877 | 7878 | 4444 |
| 7880 | 2247 | 3042 | 7883 | 2248 | 7885 | 772 | 7250 | 7888 | 7889 | 7890 | 7891 | 2251 | 7893 | 7894 | 3544 | 4587 | 1263 | 7898 | 7899 |
| 7900 | 7901 | 3545 | 7903 | 7904 | 7905 | 159 | 2991 | 7908 | 3942 | 2992 | 7911 | 7912 | 4012 | 7914 | 2253 | 1299 | 7917 | 7918 | 7919 |
| 7920 | 2845 | 2254 | 7923 | 7924 | 7925 | 2255 | 7927 | 7928 | 7929 | 2439 | 7931 | 2768 | 3353 | 3690 | 7935 | 2256 | 7937 | 7938 | 7939 |
| 3702 | 2257 | 774 | 7943 | 7944 | 7945 | 7946 | 870 | 7948 | 7949 | 7950 | 2446 | 1305 | 2653 | 7954 | 7955 | 7956 | 7957 | 2577 | 7959 |
| 7960 | 7961 | 3697 | 7963 | 7964 | 7965 | 7966 | 7967 | 2261 | 4338 | 7970 | 7971 | 7972 | 7973 | 7974 | 7975 | 7976 | 2769 | 2262 | 7979 |
| 7980 | 4243 | 7982 | 3352 | 1459 | 7985 | 7986 | 4242 | 4035 | 7989 | 2265 | 1376 | 7992 | 2266 | 871 | 7995 | 7996 | 7997 | 836 | 7999 |
| 8000 | 8001 | 8002 | 1310 | 2770 | 8005 | 4081 | 8007 | 1007 | 8009 | 8010 | 8011 | 8012 | 326 | 2269 | 8015 | 8016 | 8017 | 8018 | 8019 |
| 8020 | 8021 | 8022 | 2270 | 8024 | 8025 | 3546 | 8027 | 8028 | 8029 | 327 | 8031 | 8032 | 8033 | 8034 | 8035 | 8036 | 8037 | 8038 | 8039 |
| 2273 | 8041 | 8042 | 8043 | 2771 | 8045 | 2993 | 8047 | 8048 | 8049 | 3667 | 8051 | 8052 | 8053 | 8054 | 2275 | 8056 | 799 | 999 | 1258 |
| 4006 | 8061 | 4607 | 1352 | 8064 | 8065 | 779 | 1000 | 8068 | 8069 | 8070 | 8071 | 8072 | 3676 | 2996 | 1001 | 780 | 8077 | 8078 | 8079 |
| 8080 | 8081 | 8082 | 2279 | 8084 | 8085 | 2280 | 8087 | 8088 | 8089 | 4321 | 2579 | 8092 | 8093 | 4254 | 3219 | 8096 | 8097 | 4476 | 8099 |
| 8100 | 8101 | 2283 | 95 | 8104 | 4020 | 4603 | 8107 | 8108 | 8109 | 8110 | 3795 | 3611 | 8113 | 8114 | 6 | 3068 | 8117 | 2665 | 4038 |
| 8120 | 8121 | 2287 | 186 | 1002 | 8125 | 8126 | 8127 | 8128 | 8129 | 8130 | 3513 | 8132 | 8133 | 8134 | 8135 | 8136 | 8137 | 784 | 8139 |
| 2999 | 2656 | 8142 | 8143 | 8144 | 8145 | 8146 | 430 | 2290 | 8149 | 8150 | 8151 | 8152 | 8153 | 8154 | 1327 | 4583 | 3000 | 2291 | 8159 |
| 8160 | 8161 | 8162 | 2292 | 8164 | 8165 | 8166 | 1103 | 4524 | 8169 | 8170 | 8171 | 8172 | 8173 | 785 | 2470 | 2295 | 8177 | 8178 | 4395 |
| 8180 | 8181 | 8182 | 111 | 786 | 8185 | 8186 | 8187 | 4443 | 8189 | 8190 | 8191 | 8192 | 3203 | 2297 | 3074 | 8196 | 8197 | 8198 | 2298 |
| 8200 | 8201 | 8202 | 2299 | 8204 | 8205 | 8206 | 8207 | 8208 | 4404 | 2301 | 8211 | 8212 | 8213 | 3173 | 8215 | 8216 | 8217 | 8218 | 8219 |
| 8220 | 8221 | 832 | 8223 | 3002 | 8225 | 8226 | 8227 | 8228 | 329 | 788 | 8231 | 8232 | 8233 | 2305 | 8235 | 8236 | 8237 | 8238 | 8239 |
| 8240 | 8241 | 8242 | 8243 | 8244 | 2306 | 2307 | 8247 | 8248 | 8249 | 2773 | 8251 | 8252 | 8253 | 3782 | 3975 | 419 | 8257 | 8258 | 3209 |
| 8260 | 8261 | 1250 | 8263 | 8264 | 2309 | 8266 | 8267 | 2877 | 8269 | 2310 | 8271 | 1108 | 8273 | 8274 | 8275 | 8276 | 8277 | 8278 | 3612 |
| 8280 | 2311 | 8282 | 4105 | 8284 | 8285 | 2312 | 8287 | 8288 | 8289 | 8290 | 8291 | 8292 | 3437 | 3731 | 8295 | 8296 | 4200 | 1178 | 8299 |
| 8300 | 790 | 8302 | 3176 | 8304 | 933 | 8306 | 8307 | 1155 | 8309 | 8310 | 791 | 3003 | 8313 | 8314 | 2797 | 2315 | 2316 | 8318 | 8319 |

-continued

| | | | | | | | | | | | | | | | | | | | |
|---|---|---|---|---|---|---|---|---|---|---|---|---|---|---|---|---|---|---|---|
| 2580 | 4337 | 3004 | 8323 | 8324 | 8325 | 8326 | 1195 | 3503 | 4217 | 3388 | 8331 | 8332 | 8333 | 8334 | 8335 | 8336 | 330 | 3343 | 3821 |
| 3055 | 4580 | 8342 | 8343 | 8344 | 1104 | 8346 | 8347 | 793 | 8349 | 8350 | 3666 | 2322 | 8353 | 1064 | 8355 | 331 | 8357 | 1321 | 8359 |
| 8360 | 8361 | 795 | 2582 | 4230 | 8365 | 8366 | 2325 | 8368 | 8369 | 8370 | 3296 | 1382 | 2481 | 4323 | 8375 | 8376 | 1393 | 3711 | 8379 |
| 8380 | 8381 | 8382 | 3999 | 3712 | 8385 | 8386 | 2583 | 8388 | 8389 | 8390 | 8391 | 2328 | 8393 | 8394 | 8395 | 8396 | 8397 | 8398 | 44 |
| 2329 | 3559 | 8402 | 796 | 8404 | 4097 | 4143 | 3477 | 8408 | 1180 | 8410 | 4305 | 8412 | 4374 | 2584 | 8415 | 1418 | 8417 | 3490 | 4470 |
| 8420 | 8421 | 8422 | 3703 | 1219 | 1220 | 8426 | 2586 | 797 | 8429 | 2333 | 8431 | 4326 | 8433 | 2775 | 8435 | 3006 | 203 | 3389 | 2334 |
| 8440 | 8441 | 1116 | 3723 | 8444 | 2335 | 8446 | 8447 | 2587 | 8449 | 2588 | 8451 | 1384 | 8453 | 8454 | 2336 | 2776 | 8457 | 8458 | 2589 |
| 2337 | 8461 | 3007 | 2875 | 3397 | 8465 | 3008 | 8467 | 8468 | 8469 | 8470 | 8471 | 3222 | 3569 | 8474 | 8475 | 8476 | 8477 | 3311 | 1139 |
| 8480 | 437 | 8482 | 8483 | 1105 | 3392 | 2591 | 798 | 4462 | 8489 | 8490 | 8491 | 8492 | 1067 | 8494 | 8495 | 2777 | 2341 | 1004 | 4047 |
| 873 | 8501 | 8502 | 8503 | 2342 | 8505 | 8506 | 8507 | 8508 | 3024 | 1291 | 8511 | 3797 | 8513 | 8514 | 4263 | 8516 | 8517 | 8518 | 2343 |
| 8520 | 8521 | 4033 | 2593 | 8524 | 113 | 8526 | 800 | 8528 | 3647 | 8530 | 8531 | 2345 | 2346 | 8534 | 8535 | 8536 | 8537 | 3730 | 8539 |
| 2347 | 8541 | 8542 | 8543 | 3648 | 8545 | 8546 | 8547 | 8548 | 8549 | 8550 | 3907 | 972 | 2778 | 8554 | 8555 | 8556 | 3069 | 829 | 356 |
| 8560 | 3990 | 8562 | 4458 | 2595 | 8564 | 8565 | 8566 | 3301 | 801 | 222 | 8570 | 8571 | 8572 | 4027 | 8574 | 8575 | 8576 | 8577 | 1435 | 8579 |
| 8580 | 8581 | 3183 | 8583 | 8584 | 8585 | 8586 | 1006 | 8588 | 332 | 8590 | 8591 | 8592 | 8593 | 8594 | 2914 | 8596 | 3864 | 8598 | 2351 |
| 8600 | 3843 | 8602 | 1324 | 2352 | 8605 | 8606 | 1068 | 8608 | 2908 | 8610 | 8611 | 8612 | 8613 | 8614 | 8615 | 8616 | 472 | 8618 | 363 |
| 8620 | 8621 | 8622 | 4013 | 8624 | 162 | 8626 | 3037 | 2597 | 8629 | 2598 | 8631 | 8632 | 8633 | 8634 | 1244 | 2356 | 8637 | 8638 | 2599 |
| 804 | 8641 | 8642 | 8643 | 8644 | 2358 | 8646 | 8647 | 8648 | 8649 | 8650 | 399 | 8652 | 8653 | 1252 | 8655 | 8656 | 8657 | 8658 | 3018 |
| 8660 | 2780 | 8662 | 8663 | 2600 | 8665 | 2848 | 93 | 4515 | 8669 | 8670 | 806 | 2361 | 8673 | 8674 | 8675 | 2362 | 8677 | 8678 | 3550 |
| 8680 | 8681 | 8682 | 8683 | 2363 | 8685 | 8686 | 8687 | 8688 | 3555 | 2676 | 2364 | 8692 | 8693 | 8694 | 3713 | 8696 | 935 | 3302 | 4385 |
| 8700 | 8701 | 2601 | 8703 | 8704 | 8705 | 8706 | 8707 | 2365 | 8709 | 8710 | 8711 | 807 | 8713 | 8714 | 3608 | 8716 | 2367 | 8718 | 357 |
| 8720 | 8721 | 2636 | 8723 | 8724 | 876 | 3669 | 8727 | 8728 | 3729 | 8730 | 2604 | 8732 | 382 | 8734 | 8735 | 824 | 8737 | 508 | 2607 |
| 8740 | 1401 | 8742 | 808 | 8744 | 8745 | 8746 | 8747 | 2369 | 2370 | 8750 | 8751 | 8752 | 2608 | 8754 | 2436 | 2371 | 8757 | 8758 | 8759 |
| 3497 | 8761 | 8762 | 2881 | 3186 | 8765 | 459 | 975 | 937 | 8769 | 8770 | 8771 | 8772 | 457 | 4446 | 878 | 8776 | 3663 | 8778 | 2373 |
| 2610 | 8781 | 8782 | 4170 | 2374 | 8785 | 8786 | 2850 | 8788 | 8789 | 8790 | 8791 | 2784 | 8793 | 8794 | 8795 | 8796 | 3231 | 335 | 8799 |
| 3502 | 810 | 3303 | 4271 | 2434 | 2377 | 8806 | 8807 | 8808 | 8809 | 3420 | 8811 | 8812 | 8813 | 4481 | 2379 | 1183 | 8817 | 8818 | 3498 |
| 336 | 8821 | 8822 | 880 | 4100 | 2381 | 8826 | 393 | 8828 | 8829 | 8830 | 8831 | 8832 | 8833 | 3741 | 8835 | 8836 | 8837 | 8838 | 2613 |
| 383 | 2787 | 8842 | 8843 | 3304 | 8845 | 2382 | 8847 | 8848 | 3509 | 8850 | 4357 | 8852 | 8853 | 8854 | 171 | 2384 | 8857 | 8858 | 1136 |
| 8860 | 40 | 8862 | 8863 | 8864 | 8865 | 8866 | 2916 | 8868 | 8869 | 8870 | 8871 | 3499 | 8873 | 8874 | 8875 | 8876 | 2788 | 3236 | 3010 |
| 2615 | 8881 | 2616 | 4535 | 8884 | 8885 | 8886 | 165 | 8888 | 8889 | 4566 | 2617 | 2387 | 8893 | 8894 | 3348 | 4107 | 2388 | 8898 | 3066 |
| 8900 | 939 | 8902 | 8903 | 8904 | 3188 | 8906 | 8907 | 8908 | 1454 | 8910 | 8911 | 2790 | 4259 | 8914 | 8915 | 2618 | 8917 | 1008 | 3919 |
| 3210 | 3830 | 8922 | 2853 | 8924 | 8925 | 8926 | 2619 | 339 | 8929 | 8930 | 1289 | 8932 | 2620 | 8934 | 2391 | 3344 | 8937 | 8938 | 8939 |
| 8940 | 8941 | 8942 | 8943 | 8944 | 4569 | 8946 | 4590 | 100 | 3803 | 8950 | 1070 | 882 | 8953 | 3191 | 8955 | 8956 | 8957 | 8958 | 8959 |
| 3011 | 8961 | 8962 | 2622 | 815 | 8965 | 8966 | 4002 | 8968 | 2394 | 8970 | 8971 | 8972 | 816 | 8975 | 8976 | 8977 | 8978 | 8979 |
| 8980 | 8981 | 8982 | 364 | 1076 | 817 | 8986 | 941 | 4381 | 8989 | 8990 | 2449 | 8992 | 2623 | 8994 | 8995 | 8996 | 8997 | 8998 | 2397 |
| 2398 | 9001 | 9002 | 64 | 9004 | 2399 | 9006 | 2400 | 9008 | 9009 | 9010 | 9011 | 9012 | 3013 | 9014 | 9015 | 9016 | 9017 | 4529 | 1214 |
| 9020 | 9021 | 9022 | 3347 | 3658 | 1432 | 3777 | 9027 | 9028 | 9029 | 9030 | 9031 | 9032 | 9033 | 3659 | 2401 | 340 | 9037 | 9038 | 1284 |
| 9040 | 2403 | 4228 | 4092 | 980 | 9045 | 9046 | 4417 | 3430 | 3193 | 9050 | 9051 | 9052 | 9053 | 1345 | 3425 | 9056 | 9057 | 9058 | 1408 |
| 960 | 9061 | 2624 | 9063 | 9064 | 1292 | 9066 | 9067 | 4479 | 9069 | 9070 | 2625 | 2406 | 9073 | 9074 | 3426 | 1231 | 9077 | 9078 | 365 |
| 2407 | 9081 | 9082 | 9083 | 9084 | 1114 | 9086 | 9087 | 2658 | 9089 | 9090 | 9091 | 9092 | 3900 | 9094 | 4383 | 9096 | 9097 | 9098 | 9099 |
| 9100 | 2627 | 9102 | 9103 | 9104 | 9105 | 4076 | 172 | 3549 | 9109 | 9110 | 3306 | 9112 | 1227 | 9114 | 820 | 821 | 4332 | 2413 | 9119 |
| 9120 | 9121 | 9122 | 9123 | 2629 | 9125 | 9126 | 9127 | 1368 | 3603 | 9130 | 9131 | 4519 | 9133 | 2856 | 9135 | 9136 | 9137 | 9138 | 9139 |
| 9140 | 9141 | 3759 | 2631 | 2414 | 9145 | 2793 | 9147 | 9148 | 2415 | 9150 | 9151 | 822 | 486 | 9154 | 9155 | 3014 | 9157 | 9158 | 9159 |
| 2417 | 9161 | 9162 | 9163 | 1072 | 9165 | 9166 | 9167 | 2632 | 9169 | 9170 | 9171 | 9172 | 9173 | 9174 | 9175 | 2457 | 9177 | 9178 | 9179 |
| 2418 | 9181 | 9182 | 9183 | 4233 | 9185 | 1333 | 4302 | 3307 | 9189 | 2420 | 9191 | 9192 | 9193 | 4207 | 9195 | 2421 | 9197 | 9198 | 1009 |
| 435 | 1224 | 9202 | 9203 | 1073 | 9205 | 9206 | 9207 | 4351 | 9209 | 4276 | 9211 | 2427 | 9213 | 3696 | 9215 | | | | |

Second Embodiment

A 2304×9216 check matrix is constructed according to a first method of the invention.

Firstly, a common factor set of 2304 and 9216 is obtained, which is denoted as $F_c$.

Secondly, a proper extending ratio K is selected, $K \in F_c$. In the present embodiment, the extending ratio is selected to be a common factor 256. The dimensions of the fundamental matrix are 9×36. The fundamental matrix can be generated in any way known in the art.

For each non-zero element in the fundamental matrix with dimensions of 18×36, a set of column extending coefficients $\{k_i, 0 \leq k_i \leq 255, i \in Z^+\}$ which are different from each other, are selected for extension, specifically:

If the non-zero element has a row-column coordinate (m, n), there will be "1" in the positions (m, $k_i \times 36+n$), thus after the extension, to be a 9×9216 matrix will be generated.

After column extension, the generated 9×9216 matrix is extended by rows, and each row of the matrix is extended to 256 rows. Specifically, for the first row of the 9×9216 matrix, it is cyclic shift rightward by t×36 to obtain the $t^{th}$ row of the extended first row, where $0 \leq t \leq 255$. For the second row, the above extending method is repeated, and according to this rule, all rows thereof are traversed.

The code table of the 9×9216 matrix generated according to the above method is as follows:

| | | | | | | | | | | | |
|---|---|---|---|---|---|---|---|---|---|---|---|
| 0 | 3 | 6 | 12 | 16 | 18 | 21 | 24 | 27 | 31 | 34 | 7494 |
| 0 | 4 | 10 | 13 | 25 | 28 | 5233 | 6498 | 7018 | 8358 | 8805 | 9211 |
| 0 | 7 | 11 | 19 | 22 | 6729 | 6831 | 7913 | 8944 | 9013 | 9133 | 9184 |
| 1 | 3 | 8 | 14 | 17 | 20 | 29 | 32 | 5000 | 5985 | 7189 | 7906 |
| 1 | 9 | 4612 | 5523 | 6456 | 7879 | 8487 | 8952 | 9081 | 9129 | 9164 | 9214 |
| 1 | 5 | 23 | 26 | 33 | 35 | 7135 | 8525 | 8983 | 9015 | 9048 | 9154 |
| 2 | 3 | 30 | 3652 | 4067 | 5123 | 7808 | 7838 | 8231 | 8474 | 8791 | 9162 |
| 2 | 35 | 3774 | 4310 | 6827 | 6917 | 8264 | 8416 | 8542 | 8834 | 9044 | 9089 |
| 2 | 15 | 631 | 1077 | 6256 | 7859 | 8069 | 8160 | 8657 | 8958 | 9094 | 9116 |

The encoder encodes based on the above constructed LDPC code check matrix. The encoder comprises: a matrix multiply module outputting a check sequence p which is obtained by multiplying the binary information sequence m with a matrix $(H_P^{-1}H_I)^T$, i.e., $p^T=m^T(H_P^{-1}H_I)^T$; a sorting index module having 9216 memory units which store index values of a sorting table IDX in turn; and a sorting output module which sorts m and p based on the index values stored in the sorting index table and outputs a code word c. The detailed encoding steps are as follows:

constructing a sorting table IDX with a length of 9216, in which IDX=$\{I_k\}$, $0 \leq k < N$, $0 \leq I_k < N$, i.e., N=9216;

re-sorting the column of the 2304×9216 check matrix according to the sorting table IDX to generate a matrix H'= $[H_P H_I]$ in which $H_I$ is a 2304×(9216−2304) matrix, and $H_P$ is a 2304×2304 matrix. The object of constructing the sorting table IDX is to ensure that the $H_P^{-1}$ is also a sparse matrix;

inputting sequence to construct (9216−2304)×1 column vector m, calculating 2304×1 column vector $p^T=m^T(H_P^{-1}H_I)^T$;

outputting sorting results based on the sorting table IDX, in which $$c_{I_k} = \begin{cases} p_k & 0 \leq k < 2304 \\ m_{k-2304} & 2304 \leq k < 9216. \end{cases}$$

The system code sequence which is position-transformed after encoding is transferred to a decoder through channels and decodes therein, specifically:

In light of the 2304×9216 check matrix, the inputted system code sequence is decoded using any kind of decoding algorithm, and the decoded hard-decision sequence $\{\hat{c}_i, 0 \leq i \leq 9216\}$ is outputted;

The decoded binary information sequence $\{\hat{m}_k, 0 \leq k \leq 6911\}$ is extracted using the same sorting table IDX as that stored in the encoder, in which $\hat{m}_k = \hat{c}_{I_{k+2304}}$, $0 \leq k < 6912$.

Since the decoder has the same configuration as the decoder in the above embodiment, the detailed description is omitted.

For the 2304×9216 check matrix, the sorting table IDX in the encoder is as follows:

| 0 | 1 | 2 | 4 | 5 | 7 | 9 | 10 | 11 | 13 | 15 | 19 | 22 | 23 | 25 | 26 | 28 | 33 | 35 | 37 |
|---|---|---|---|---|---|---|---|---|---|---|---|---|---|---|---|---|---|---|---|
| 38 | 40 | 41 | 42 | 45 | 59 | 62 | 69 | 71 | 72 | 74 | 79 | 80 | 81 | 82 | 83 | 85 | 87 | 91 | 94 |
| 97 | 100 | 109 | 110 | 112 | 113 | 114 | 117 | 131 | 134 | 141 | 143 | 144 | 151 | 152 | 155 | 157 | 163 | 166 | 169 |
| 172 | 174 | 182 | 185 | 186 | 193 | 194 | 219 | 224 | 225 | 229 | 230 | 233 | 236 | 245 | 246 | 248 | 254 | 258 | 260 |
| 265 | 267 | 291 | 292 | 296 | 305 | 317 | 318 | 320 | 324 | 331 | 332 | 333 | 335 | 337 | 343 | 346 | 349 | 352 | 354 |
| 363 | 364 | 377 | 380 | 383 | 389 | 390 | 392 | 396 | 400 | 403 | 405 | 407 | 409 | 410 | 415 | 418 | 421 | 424 | 426 |
| 432 | 436 | 437 | 439 | 442 | 443 | 445 | 449 | 451 | 460 | 468 | 475 | 477 | 479 | 481 | 482 | 487 | 490 | 493 | 496 |
| 498 | 510 | 512 | 513 | 517 | 541 | 546 | 549 | 553 | 563 | 566 | 570 | 573 | 575 | 582 | 584 | 585 | 589 | 615 | 620 |
| 625 | 626 | 627 | 635 | 641 | 642 | 644 | 651 | 657 | 661 | 665 | 668 | 677 | 680 | 686 | 688 | 690 | 692 | 699 | 720 |
| 724 | 727 | 729 | 730 | 731 | 733 | 734 | 739 | 745 | 748 | 750 | 756 | 757 | 760 | 761 | 763 | 765 | 767 | 769 | 779 |
| 781 | 782 | 784 | 789 | 791 | 792 | 794 | 796 | 799 | 802 | 803 | 805 | 811 | 817 | 821 | 828 | 832 | 835 | 837 | 839 |
| 841 | 850 | 856 | 857 | 864 | 871 | 875 | 877 | 883 | 884 | 892 | 906 | 908 | 913 | 928 | 939 | 944 | 945 | 949 | 950 |
| 956 | 965 | 968 | 975 | 981 | 985 | 989 | 992 | 1000 | 1001 | 1004 | 1014 | 1016 | 1021 | 1023 | 1050 | 1057 | 1061 | 1069 | 1072 |
| 1082 | 1086 | 1090 | 1094 | 1095 | 1120 | 1122 | 1129 | 1130 | 1141 | 1144 | 1152 | 1153 | 1157 | 1159 | 1161 | 1163 | 1165 | 1174 | 1178 |
| 1180 | 1185 | 1189 | 1192 | 1193 | 1194 | 1197 | 1211 | 1214 | 1223 | 1224 | 1232 | 1233 | 1235 | 1237 | 1243 | 1252 | 1261 | 1264 | 1265 |
| 1266 | 1269 | 1283 | 1286 | 1296 | 1304 | 1307 | 1309 | 1321 | 1324 | 1334 | 1338 | 1342 | 1361 | 1364 | 1371 | 1377 | 1381 | 1382 | 1385 |
| 1388 | 1393 | 1396 | 1397 | 1398 | 1400 | 1409 | 1410 | 1417 | 1419 | 1424 | 1432 | 1433 | 1436 | 1437 | 1439 | 1446 | 1453 | 1463 | 1465 |
| 1468 | 1469 | 1478 | 1479 | 1486 | 1496 | 1505 | 1508 | 1516 | 1518 | 1532 | 1535 | 1547 | 1548 | 1553 | 1555 | 1559 | 1561 | 1562 | 1574 |
| 1576 | 1585 | 1588 | 1589 | 1590 | 1593 | 1599 | 1610 | 1620 | 1629 | 1633 | 1639 | 1640 | 1645 | 1648 | 1660 | 1662 | 1665 | 1685 | 1688 |
| 1692 | 1701 | 1702 | 1703 | 1705 | 1706 | 1711 | 1717 | 1720 | 1733 | 1734 | 1741 | 1748 | 1760 | 1770 | 1772 | 1773 | 1774 | 1777 | 1780 |
| 1785 | 1788 | 1789 | 1791 | 1792 | 1795 | 1806 | 1809 | 1839 | 1842 | 1846 | 1848 | 1852 | 1854 | 1863 | 1867 | 1875 | 1885 | 1887 | 1889 |
| 1897 | 1901 | 1904 | 1912 | 1913 | 1914 | 1916 | 1918 | 1920 | 1921 | 1924 | 1929 | 1932 | 1933 | 1935 | 1936 | 1939 | 1943 | 1944 | 1948 |
| 1955 | 1957 | 1958 | 1972 | 1986 | 1989 | 1991 | 1992 | 1994 | 1996 | 2001 | 2004 | 2007 | 2008 | 2011 | 2018 | 2022 | 2045 | 2058 | 2065 |
| 2067 | 2077 | 2080 | 2081 | 2084 | 2092 | 2093 | 2094 | 2108 | 2123 | 2124 | 2128 | 2135 | 2137 | 2138 | 2146 | 2149 | 2152 | 2153 | 2156 |
| 2160 | 2165 | 2169 | 2170 | 2171 | 2173 | 2180 | 2188 | 2192 | 2193 | 2202 | 2209 | 2213 | 2221 | 2224 | 2225 | 2228 | 2235 | 2236 | 2237 |
| 2238 | 2253 | 2255 | 2259 | 2263 | 2272 | 2273 | 2274 | 2275 | 2276 | 2278 | 2281 | 2286 | 2291 | 2294 | 2296 | 2299 | 2307 | 2309 | 2310 |
| 2311 | 2315 | 2316 | 2320 | 2325 | 2331 | 2332 | 2335 | 2346 | 2365 | 2368 | 2372 | 2382 | 2386 | 2404 | 2417 | 2418 | 2429 | 2430 | 2435 |
| 2438 | 2439 | 2440 | 2446 | 2447 | 2451 | 2461 | 2465 | 2476 | 2477 | 2480 | 2485 | 2489 | 2490 | 2494 | 2499 | 2501 | 2504 | 2513 | 2516 |
| 2519 | 2526 | 2533 | 2537 | 2543 | 2548 | 2549 | 2552 | 2555 | 2561 | 2562 | 2569 | 2576 | 2591 | 2598 | 2605 | 2609 | 2620 | 2629 | 2633 |
| 2634 | 2637 | 2643 | 2644 | 2652 | 2654 | 2655 | 2659 | 2661 | 2664 | 2669 | 2675 | 2677 | 2686 | 2689 | 2692 | 2693 | 2701 | 2705 | 2706 |
| 2709 | 2723 | 2726 | 2730 | 2739 | 2740 | 2742 | 2748 | 2749 | 2752 | 2759 | 2760 | 2761 | 2762 | 2764 | 2771 | 2778 | 2779 | 2783 | 2784 |
| 2793 | 2799 | 2803 | 2806 | 2814 | 2819 | 2824 | 2830 | 2832 | 2835 | 2849 | 2850 | 2856 | 2860 | 2867 | 2868 | 2870 | 2873 | 2875 | 2876 |
| 2886 | 2888 | 2895 | 2908 | 2921 | 2922 | 2926 | 2932 | 2942 | 2944 | 2945 | 2947 | 2949 | 2950 | 2951 | 2956 | 2958 | 2960 | 2965 | 2978 |
| 2980 | 2987 | 2988 | 2994 | 2996 | 3006 | 3010 | 3015 | 3019 | 3027 | 3041 | 3053 | 3054 | 3056 | 3065 | 3066 | 3072 | 3075 | 3076 | 3078 |
| 3080 | 3087 | 3088 | 3102 | 3111 | 3133 | 3137 | 3138 | 3147 | 3148 | 3153 | 3156 | 3158 | 3159 | 3174 | 3192 | 3195 | 3199 | 3204 | 3208 |
| 3212 | 3215 | 3219 | 3229 | 3232 | 3245 | 3246 | 3252 | 3254 | 3263 | 3265 | 3268 | 3269 | 3272 | 3282 | 3291 | 3296 | 3305 | 3308 | 3316 |
| 3318 | 3324 | 3326 | 3327 | 3328 | 3339 | 3341 | 3344 | 3348 | 3352 | 3355 | 3357 | 3359 | 3361 | 3376 | 3380 | 3386 | 3390 | 3399 | 3401 |
| 3402 | 3407 | 3409 | 3411 | 3419 | 3426 | 3430 | 3433 | 3434 | 3435 | 3446 | 3449 | 3452 | 3453 | 3462 | 3468 | 3470 | 3471 | 3472 | 3482 |
| 3484 | 3485 | 3488 | 3497 | 3498 | 3508 | 3515 | 3518 | 3519 | 3523 | 3527 | 3534 | 3540 | 3544 | 3557 | 3570 | 3577 | 3591 | 3592 | 3593 |
| 3596 | 3606 | 3629 | 3641 | 3642 | 3648 | 3659 | 3662 | 3663 | 3668 | 3678 | 3704 | 3714 | 3717 | 3719 | 3720 | 3723 | 3735 | 3737 | 3740 |
| 3748 | 3750 | 3757 | 3758 | 3761 | 3768 | 3771 | 3773 | 3778 | 3781 | 3786 | 3788 | 3809 | 3811 | 3822 | 3823 | 3829 | 3838 | 3843 | 3844 |
| 3848 | 3857 | 3858 | 3860 | 3888 | 3899 | 3901 | 3903 | 3905 | 3916 | 3917 | 3920 | 3930 | 3940 | 3964 | 3966 | 3969 | 3973 | 3985 | 3987 |
| 3988 | 3989 | 3992 | 4002 | 4003 | 4006 | 4012 | 4018 | 4024 | 4025 | 4028 | 4038 | 4044 | 4047 | 4050 | 4059 | 4061 | 4074 | 4089 | 4095 |
| 4096 | 4097 | 4100 | 4110 | 4122 | 4131 | 4135 | 4138 | 4140 | 4144 | 4146 | 4148 | 4153 | 4164 | 4165 | 4167 | 4168 | 4172 | 4176 | 4183 |
| 4184 | 4187 | 4189 | 4205 | 4208 | 4216 | 4218 | 4225 | 4237 | 4239 | 4240 | 4241 | 4244 | 4253 | 4254 | 4259 | 4261 | 4264 | 4271 | 4274 |
| 4276 | 4288 | 4290 | 4297 | 4301 | 4309 | 4312 | 4315 | 4324 | 4325 | 4326 | 4331 | 4339 | 4343 | 4348 | 4362 | 4374 | 4378 | 4383 | 4385 |
| 4392 | 4399 | 4405 | 4420 | 4421 | 4424 | 4434 | 4441 | 4443 | 4446 | 4455 | 4456 | 4457 | 4460 | 4470 | 4474 | 4482 | 4489 | 4491 | 4492 |
| 4496 | 4506 | 4513 | 4518 | 4525 | 4527 | 4528 | 4529 | 4540 | 4549 | 4556 | 4563 | 4564 | 4565 | 4567 | 4568 | 4575 | 4576 | 4578 | 4585 |
| 4591 | 4600 | 4603 | 4606 | 4614 | 4619 | 4621 | 4633 | 4639 | 4650 | 4655 | 4657 | 4658 | 4672 | 4686 | 4692 | 4697 | 4704 | 4711 | 4714 |
| 4722 | 4727 | 4729 | 4738 | 4752 | 4757 | 4760 | 4763 | 4765 | 4771 | 4775 | 4777 | 4778 | 4780 | 4785 | 4794 | 4797 | 4799 | 4801 | 4802 |
| 4806 | 4813 | 4816 | 4817 | 4819 | 4820 | 4830 | 4831 | 4837 | 4839 | 4846 | 4849 | 4853 | 4856 | 4858 | 4871 | 4873 | 4888 | 4889 | 4892 |

-continued

| | | | | | | | | | | | | | | | | | | | |
|---|---|---|---|---|---|---|---|---|---|---|---|---|---|---|---|---|---|---|---|
| 4893 | 4903 | 4907 | 4908 | 4909 | 4914 | 4918 | 4924 | 4925 | 4928 | 4932 | 4939 | 4943 | 4957 | 4960 | 4961 | 4969 | 4974 | 4981 | 4983 |
| 4993 | 4996 | 5010 | 5017 | 5029 | 5031 | 5032 | 5033 | 5035 | 5047 | 5051 | 5053 | 5059 | 5068 | 5081 | 5087 | 5099 | 5102 | 5105 | 5107 |
| 5109 | 5119 | 5125 | 5137 | 5140 | 5154 | 5160 | 5161 | 5163 | 5176 | 5216 | 5226 | 5227 | 5232 | 5237 | 5251 | 5271 | 5285 | 5299 | 5314 |
| 5317 | 5334 | 5339 | 5346 | 5378 | 5389 | 5392 | 5406 | 5411 | 5424 | 5429 | 5450 | 5464 | 5483 | 5486 | 5537 | 5547 | 5550 | 5569 | 5571 |
| 5572 | 5587 | 5598 | 5599 | 5604 | 5607 | 5609 | 5611 | 5612 | 5616 | 5625 | 5626 | 5635 | 5644 | 5648 | 5681 | 5695 | 5702 | 5707 | 5717 |
| 5734 | 5735 | 5744 | 5749 | 5753 | 5761 | 5779 | 5786 | 5797 | 5819 | 5821 | 5822 | 5824 | 5839 | 5840 | 5897 | 5918 | 5931 | 5933 | 5957 |
| 5967 | 5972 | 6005 | 6029 | 6031 | 6041 | 6074 | 6075 | 6091 | 6098 | 6114 | 6120 | 6127 | 6130 | 6140 | 6145 | 6148 | 6149 | 6184 | 6202 |
| 6210 | 6213 | 6217 | 6220 | 6230 | 6251 | 6253 | 6254 | 6264 | 6297 | 6304 | 6329 | 6341 | 6347 | 6348 | 6354 | 6363 | 6367 | 6386 | 6388 |
| 6401 | 6415 | 6437 | 6450 | 6459 | 6461 | 6462 | 6471 | 6473 | 6475 | 6478 | 6486 | 6487 | 6497 | 6502 | 6522 | 6537 | 6540 | 6543 | 6547 |
| 6585 | 6594 | 6610 | 6630 | 6687 | 6696 | 6703 | 6717 | 6725 | 6727 | 6742 | 6746 | 6752 | 6761 | 6769 | 6782 | 6785 | 6788 | 6795 | 6797 |
| 6810 | 6846 | 6876 | 6882 | 6883 | 6894 | 6899 | 6903 | 6915 | 6919 | 6921 | 6941 | 6954 | 6968 | 6971 | 6973 | 6977 | 6979 | 6990 | 7020 |
| 7027 | 7042 | 7043 | 7063 | 7079 | 7104 | 7109 | 7111 | 7121 | 7124 | 7136 | 7170 | 7214 | 7222 | 7224 | 7237 | 7241 | 7242 | 7259 | 7282 |
| 7293 | 7299 | 7301 | 7311 | 7325 | 7337 | 7344 | 7349 | 7357 | 7386 | 7388 | 7422 | 7452 | 7462 | 7466 | 7488 | 7517 | 7520 | 7548 | 7553 |
| 7565 | 7584 | 7589 | 7597 | 7606 | 7610 | 7617 | 7625 | 7640 | 7648 | 7668 | 7673 | 7681 | 7683 | 7704 | 7709 | 7756 | 7757 | 7763 | 7776 |
| 7786 | 7806 | 7812 | 7814 | 7841 | 7848 | 7867 | 7876 | 7887 | 7894 | 7901 | 7913 | 7920 | 7940 | 7959 | 7973 | 7985 | 8006 | 8016 | 8028 |
| 8048 | 8057 | 8095 | 8100 | 8108 | 8110 | 8119 | 8122 | 8125 | 8128 | 8152 | 8159 | 8181 | 8191 | 8196 | 8202 | 8220 | 8224 | 8232 | 8236 |
| 8242 | 8272 | 8283 | 8318 | 8333 | 8336 | 8337 | 8340 | 8345 | 8347 | 8360 | 8381 | 8391 | 8395 | 8427 | 8432 | 8462 | 8473 | 8495 | 8513 |
| 8520 | 8550 | 8554 | 8576 | 8621 | 8641 | 8648 | 8655 | 8658 | 8660 | 8695 | 8714 | 8719 | 8729 | 8751 | 8762 | 8787 | 8797 | 8823 | 8825 |
| 8837 | 8877 | 8895 | 8936 | 8946 | 8947 | 8984 | 8998 | 9031 | 9036 | 9084 | 9122 | 9214 | 2072 | 2195 | 3656 | 3752 | 3942 | 4007 | 4092 |
| 4380 | 4524 | 4927 | 4962 | 5003 | 5048 | 5248 | 5305 | 5320 | 5716 | 6166 | 6192 | 6392 | 6396 | 6716 | 6932 | 7025 | 7048 | 7295 | 7330 |
| 7355 | 7366 | 7574 | 7675 | 7713 | 7766 | 7823 | 7964 | 8036 | 8113 | 8145 | 8223 | 8244 | 8355 | 8441 | 8592 | 8715 | 8732 | 8814 | 8828 |
| 8886 | 8908 | 8988 | 9038 | 9061 | 9129 | 9147 | 1583 | 1643 | 1697 | 416 | 124 | 1975 | 2111 | 2112 | 488 | 2284 | 2363 | 2618 | 2638 |
| 2704 | 2802 | 2805 | 2872 | 662 | 3085 | 3172 | 3952 | 4009 | 4075 | 4468 | 4743 | 4964 | 5037 | 5751 | 5954 | 5983 | 5999 | 6004 | 6081 |
| 6320 | 6477 | 6532 | 6723 | 6892 | 7211 | 8156 | 8472 | 8544 | 8659 | 1631 | 1782 | 2250 | 2758 | 2890 | 3007 | 3356 | 3384 | 3473 | 3559 |
| 3728 | 3783 | 3910 | 3958 | 4093 | 4152 | 4270 | 4279 | 4300 | 4323 | 4430 | 4452 | 4503 | 4531 | 4561 | 4566 | 4624 | 4644 | 4720 |
| 4798 | 4848 | 4886 | 4940 | 4970 | 4999 | 5098 | 5152 | 5245 | 5258 | 5359 | 5368 | 5403 | 5461 | 5557 | 5669 | 5682 | 5701 | 5800 | 5885 |
| 6066 | 6128 | 6205 | 6404 | 6757 | 6934 | 7346 | 7482 | 7501 | 7744 | 7837 | 7859 | 7886 | 7897 | 8198 | 8210 | 8243 | 8258 | 8264 | 8282 |
| 8418 | 8420 | 8750 | 9091 | 9152 | 1798 | 2161 | 2185 | 2304 | 2458 | 3084 | 3167 | 3257 | 3320 | 3443 | 3581 | 3725 | 3913 | 3955 | 4026 |
| 4053 | 4080 | 4169 | 4233 | 4273 | 4431 | 4459 | 4539 | 4716 | 4725 | 4788 | 4804 | 4807 | 4828 | 4843 | 4855 | 4899 | 5014 | 5134 | 5377 |
| 6133 | 6196 | 6277 | 6345 | 6975 | 7046 | 7290 | 7370 | 7825 | 7840 | 1315 | 8922 | 1622 | 1630 | 1664 | 1758 | 523 | 2464 | 2510 | 53 |
| 2632 | 2920 | 2999 | 717 | 3483 | 3644 | 3794 | 4245 | 4432 | 4504 | 4599 | 4698 | 4783 | 4851 | 4867 | 5122 | 5202 | 5479 | 5679 | 5964 |
| 6151 | 6219 | 285 | 6508 | 6656 | 6900 | 6937 | 7456 | 8268 | 8281 | 9058 | 1980 | 2350 | 2741 | 3284 | 3791 | 3816 | 3996 | 4521 | 4588 |
| 4868 | 4890 | 4896 | 4916 | 5020 | 5220 | 5431 | 5936 | 8319 | 2268 | 2443 | 2646 | 3358 | 886 | 4258 | 4608 | 4701 | 1696 | 1818 | 1882 |
| 1979 | 2066 | 2210 | 2322 | 2416 | 557 | 2581 | 2747 | 2807 | 2877 | 656 | 2970 | 2977 | 3150 | 3170 | 3456 | 3669 | 3679 | 3764 | 3800 |
| 3812 | 814 | 4010 | 4034 | 885 | 4299 | 4311 | 4345 | 4406 | 4415 | 4517 | 953 | 4664 | 4706 | 4836 | 4865 | 4879 | 4885 | 5173 | 5344 |
| 5356 | 5361 | 5402 | 5578 | 5859 | 5937 | 6061 | 6358 | 6519 | 6957 | 7151 | 7312 | 7459 | 1281 | 7798 | 8081 | 8235 | 8249 | 8308 | 8437 |
| 8673 | 8683 | 8766 | 9100 | 4669 | 2736 | 2905 | 3716 | 4741 | 5025 | 5629 | 427 | 1963 | 2035 | 2326 | 2371 | 2649 | 2696 | 162 | 2845 |
| 2995 | 3009 | 3092 | 3134 | 3240 | 3395 | 3516 | 3724 | 3739 | 3948 | 3976 | 4045 | 4136 | 4318 | 4412 | 937 | 4530 | 362 | 4815 | 4913 |
| 5128 | 5178 | 5240 | 5259 | 5400 | 5416 | 5708 | 6089 | 6096 | 6131 | 1156 | 6258 | 6545 | 6673 | 6942 | 7672 | 7691 | 7861 | 8083 | 1557 |
| 8566 | 8878 | 8991 | 4248 | 4572 | 2205 | 3500 | 3691 | 1405 | 6284 | 6860 | 3329 | 4015 | 4824 | 1450 | 434 | 466 | 2251 | 520 | 2323 |
| 2493 | 2772 | 2788 | 2796 | 3062 | 3765 | 3830 | 4087 | 4268 | 4414 | 4626 | 5172 | 5422 | 5741 | 5943 | 6243 | 6375 | 6958 | 7505 | 7508 |
| 1340 | 8309 | 8681 | 8834 | 8910 | 1861 | 423 | 1999 | 2168 | 2394 | 2540 | 2943 | 3315 | 3576 | 3713 | 869 | 4519 | 4612 | 4635 | 5004 |
| 5831 | 6123 | 7141 | 7161 | 7551 | 7855 | 1937 | 3017 | 4581 | 4689 | 4986 | 6305 | 6595 | 6602 | 4629 | 453 | 321 | 478 | 2303 | 2392 |
| 177 | 4071 | 4808 | 5641 | 1126 | 1171 | 7053 | 8669 | 9156 | 4472 | 8816 | 514 | 2647 | 2738 | 4302 | 4653 | 6907 | 4464 | 1969 | 2683 |
| 2826 | 3094 | 3710 | 4458 | 4791 | 4841 | 5008 | 5562 | 302 | 7816 | 8039 | 8261 | 897 | 562 | 2716 | 633 | 4056 | 4534 | 4627 | 4910 |
| 5331 | 6086 | 6397 | 8161 | 8323 | 8744 | 9065 | 1934 | 2052 | 569 | 2566 | 3861 | 4805 | 5254 | 6359 | 2157 | 2445 | 1509 | 4329 | 4387 |
| 4860 | 3198 | 130 | 3762 | 4212 | 5666 | 6344 | 8884 | 8229 | 3226 | 4444 | 5286 | 372 | 457 | 2200 | 3951 | 4648 | 2422 | 2766 | 3459 |
| 4119 | 4533 | 1908 | 2260 | 58 | 3251 | 3406 | 4063 | 4428 | 5217 | 2985 | 3365 | 4875 | 2034 | 2143 | 3178 | 5929 | 6318 | 279 | 7768 |
| 8045 | 2062 | 3671 | 1926 | 3760 | 4243 | 2002 | 2216 | 2866 | 2187 | 754 | 5121 | 417 | 2244 | 2662 | 3970 | 3999 | 4630 | 105 | 160 |
| 3726 | 3873 | 1813 | 5642 | 6160 | 1427 | 3709 | 4500 | 6872 | 3112 | 6910 | 3184 | 187 | 9174 | 2628 | 4737 | 4861 | 2014 | 4000 | 8342 |
| 3478 | 6239 | 7688 | 8346 | 3650 | 2829 | 8456 | 2114 | 463 | 2729 | 2032 | 4557 | 1423 | 4107 | 6201 | 133 | 6951 | 3060 | 951 | 1347 |
| 2983 | 4294 | 3477 | 982 | 7669 | 293 | 4447 | 1689 | 2473 | 2121 | 1573 | 1713 | 7072 | 3706 | 6134 | 4359 | 5909 | 1493 | 3631 | 4480 |
| 3711 | 2352 | 2676 | 4377 | 4593 | 2589 | 3818 | 3729 | 2328 | 4084 | 3833 | 148 | 2663 | 7616 | 5205 | 6337 | 381 | 4809 | 2279 | 6710 |
| 4425 | 2734 | 5296 | 3089 | 6115 | 2031 | 76 | 374 | 8518 | 6181 | 3747 | 9033 | 4719 | 2842 | 3185 | 2509 | 588 | 3487 | 2144 |
| 5028 | 5463 | 5544 | 2808 | 3458 | 2855 | 4179 | 3637 | 4462 | 3181 | 853 | 5348 | 4436 | 4618 | 6207 | 4596 | 2179 | 4594 | 7387 | 1484 |
| 619 | 4449 | 1951 | 2283 | 4251 | 256 | 5210 | 4163 | 4134 | 4207 | 3437 | 1707 | 2782 | 4391 | 2013 | 8312 | 3045 | 3214 | 2535 | 758 |
| 2038 | 1998 | 3936 | 149 | 4514 | 21 | 1691 | 4789 | 3994 | 538 | 4863 | 5614 | 3346 | 6228 | 5758 | 3063 | 808 | 1418 | 1067 | 6680 |
| 4537 | 4642 | 1455 | 5917 | 2266 | 7534 | 2367 | 4194 | 4228 | 2670 | 7461 | 572 | 1071 | 2914 | 6249 | 3732 | 3939 | 2889 | 3549 | 5600 |
| 2517 | 2186 | 4078 | 5157 | 1118 | 4068 | 4032 | 1927 | 2703 | 2936 | 4361 | 3008 | 106 | 2718 | 5150 | 2864 | 18 | 6132 | 2162 | 8709 |
| 2839 | 2883 | 2857 | 6190 | 3665 | 2665 | 2880 | 1570 | 2785 | 2085 | 84 | 1661 | 165 | 5805 | 4488 | 2577 | 2848 | 7590 | 8985 | 7960 |
| 8304 | 2673 | 4120 | 2714 | 3074 | 3972 | 3105 | 2349 | 4368 | 3123 | 3506 | 3636 | 995 | 6380 | 7177 | 6947 | 5026 | 2844 | 859 | 3599 |
| 2194 | 450 | 3574 | 6533 | 2678 | 5094 | 4678 | 5336 | 6057 | 75 | 6880 | 4001 | 6312 | 5345 | 560 | 4844 | 3141 | 4995 | 6049 | 2854 |
| 4200 | 2917 | 4344 | 8298 | 4423 | 1444 | 2797 | 2579 | 2619 | 6252 | 4877 | 6247 | 5457 | 6513 | 7271 | 3612 | 6235 | 4175 | 5565 | 4584 |
| 3670 | 6868 | 4141 | 4342 | 8003 | 2400 | 4088 | 2410 | 1675 | 4968 | 5333 | 1472 | 3997 | 7068 | 2041 | 5602 | 6767 | 998 | 2897 | 3525 |
| 2388 | 3627 | 2847 | 3874 | 1568 | 2305 | 2306 | 52 | 2308 | 518 | 519 | 1678 | 2312 | 2313 | 2314 | 521 | 522 | 2317 | 2318 | 2319 |
| 1616 | 2321 | 1683 | 1819 | 2324 | 524 | 1754 | 2327 | 2068 | 2329 | 2330 | 525 | 526 | 2333 | 2334 | 527 | 2336 | 2337 | 2338 | 2339 |
| 2340 | 2341 | 2342 | 2343 | 2344 | 2345 | 528 | 2347 | 2348 | 2351 | 2061 | 2353 | 2354 | 2355 | 2356 | 2357 | 2358 | 2359 |
| 2360 | 2361 | 2362 | 1457 | 2364 | 529 | 2366 | 2166 | 530 | 2369 | 2370 | 1755 | 531 | 2373 | 2374 | 2375 | 2376 | 2377 | 2378 | 2379 |
| 2380 | 2381 | 532 | 2383 | 2384 | 2385 | 533 | 2387 | 2300 | 2389 | 2390 | 2391 | 1879 | 2393 | 1849 | 2395 | 2396 | 2397 | 2398 | 2399 |
| 2285 | 2401 | 2402 | 2403 | 534 | 2405 | 2406 | 2407 | 2408 | 2409 | 2287 | 2411 | 2412 | 2413 | 2414 | 2415 | 1684 | 535 | 536 | 2419 |
| 2420 | 2421 | 441 | 2423 | 2424 | 2425 | 2426 | 2427 | 2428 | 537 | 476 | 2431 | 2432 | 2433 | 2434 | 539 | 2436 | 2437 | 540 | 145 |
| 542 | 2441 | 2442 | 1670 | 2444 | 435 | 543 | 544 | 2448 | 2449 | 2450 | 545 | 2452 | 2453 | 2454 | 2455 | 2456 | 2457 | 1569 | 2459 |
| 2460 | 146 | 2462 | 2463 | 1617 | 547 | 2466 | 2467 | 2468 | 2469 | 2470 | 2471 | 2472 | 2048 | 2474 | 2475 | 548 | 147 | 2478 | 2479 |
| 550 | 2481 | 2482 | 2483 | 2484 | 551 | 2486 | 2487 | 2488 | 552 | 2071 | 2491 | 2492 | 1820 | 554 | 2495 | 2496 | 2497 | 2498 | 555 |
| 2500 | 556 | 2502 | 2503 | 378 | 2505 | 2506 | 2507 | 2508 | 2096 | 1618 | 2511 | 2512 | 558 | 2514 | 2515 | 559 | 486 | 2518 | 2254 |
| 2520 | 2521 | 2522 | 2523 | 2524 | 2525 | 561 | 2527 | 2528 | 2529 | 2530 | 2531 | 2532 | 118 | 2534 | 474 | 2536 | 1974 | 2538 | 2539 |
| 1850 | 2541 | 2542 | 564 | 2544 | 2545 | 2546 | 2547 | 565 | 150 | 2550 | 2551 | 567 | 2553 | 2554 | 568 | 2556 | 2557 | 2558 | 2559 |
| 2560 | 431 | 1619 | 2563 | 2564 | 2565 | 1930 | 2567 | 2568 | 571 | 2570 | 2571 | 2572 | 2573 | 2574 | 2575 | 484 | 2215 | 2578 | 2267 |
| 2580 | 1686 | 2582 | 2583 | 2584 | 2585 | 2586 | 2587 | 2588 | 459 | 2590 | 54 | 2592 | 2593 | 2594 | 2595 | 2596 | 2597 | 574 | 2599 |
| 2600 | 2601 | 2602 | 2603 | 2604 | 153 | 2606 | 2607 | 2608 | 576 | 2610 | 2611 | 2612 | 2613 | 2614 | 2615 | 2616 | 2617 | 1458 | 1669 |

-continued

| | | | | | | | | | | | | | | | | | | | |
|---|---|---|---|---|---|---|---|---|---|---|---|---|---|---|---|---|---|---|---|
| 577 | 2621 | 2622 | 2623 | 2624 | 2625 | 2626 | 2627 | 2017 | 578 | 2630 | 2631 | 368 | 579 | 580 | 2635 | 2636 | 581 | 1459 | 2639 |
| 2640 | 2641 | 2642 | 154 | 583 | 2645 | 1671 | 1892 | 2648 | 1756 | 2650 | 2651 | 55 | 2653 | 156 | 586 | 2656 | 2657 | 2658 | 587 |
| 2660 | 2097 | 448 | 1876 | 56 | 1805 | 2666 | 2667 | 2668 | 590 | 135 | 2671 | 2672 | 138 | 2674 | 591 | 1981 | 592 | 1993 | 2679 |
| 2680 | 2681 | 2682 | 1899 | 2684 | 2685 | 593 | 2687 | 2688 | 594 | 2690 | 2691 | 595 | 596 | 2694 | 2695 | 1757 | 2697 | 2698 | 2699 |
| 2700 | 597 | 2702 | 136 | 1460 | 598 | 599 | 2707 | 2708 | 600 | 2710 | 2711 | 2712 | 2713 | 2223 | 2715 | 425 | 2717 | 489 | 2719 |
| 2720 | 2721 | 2722 | 601 | 2724 | 2725 | 602 | 2727 | 2728 | 2029 | 603 | 2731 | 2732 | 2733 | 2028 | 2735 | 1745 | 2737 | 1893 | 604 |
| 605 | 1653 | 606 | 2743 | 2744 | 2745 | 2746 | 1687 | 607 | 608 | 2750 | 2751 | 609 | 2753 | 2754 | 2755 | 2756 | 2757 | 2057 | 610 |
| 611 | 612 | 613 | 2763 | 614 | 2765 | 1451 | 2767 | 2768 | 2769 | 2770 | 158 | 1821 | 2773 | 2774 | 2775 | 2776 | 2777 | 616 | 617 |
| 2780 | 2781 | 2132 | 618 | 2120 | 2208 | 2786 | 2787 | 1822 | 2789 | 2790 | 2791 | 2792 | 159 | 2794 | 2795 | 1823 | 2164 | 2798 | 621 |
| 2800 | 2801 | 1461 | 622 | 2804 | 1462 | 623 | 379 | 2103 | 2809 | 2810 | 2811 | 2812 | 2813 | 624 | 2815 | 2816 | 2817 | 2818 | 1847 |
| 2820 | 2821 | 2822 | 2823 | 161 | 2825 | 1900 | 2827 | 2828 | 2025 | 1615 | 2831 | 628 | 2833 | 2834 | 629 | 2836 | 2837 | 2838 | 1954 |
| 2840 | 2841 | 467 | 2843 | 499 | 1759 | 2846 | 2302 | 1987 | 630 | 631 | 2851 | 2852 | 2853 | 503 | 2105 | 632 | 137 | 2858 | 2859 |
| 1915 | 2861 | 2862 | 2863 | 1394 | 2865 | 1988 | 634 | 57 | 2869 | 636 | 2871 | 338 | 637 | 2874 | 638 | 639 | 2047 | 2878 | 2879 |
| 2206 | 2881 | 2882 | 2201 | 2884 | 2885 | 640 | 2887 | 164 | 2177 | 1494 | 2891 | 2892 | 2893 | 2894 | 2212 | 2896 | 2298 | 2898 | 2899 |
| 2900 | 2901 | 2902 | 2903 | 2904 | 1746 | 2906 | 2907 | 643 | 2909 | 2910 | 2911 | 2912 | 2913 | 485 | 2915 | 2916 | 2261 | 2918 | 2919 |
| 1621 | 1964 | 645 | 2923 | 2924 | 2925 | 646 | 2927 | 2928 | 2929 | 2930 | 2931 | 647 | 2933 | 2934 | 2935 | 2189 | 2937 | 2938 | 2939 |
| 2940 | 2941 | 648 | 1851 | 649 | 650 | 2946 | 167 | 2948 | 652 | 653 | 654 | 2952 | 2953 | 2954 | 2955 | 655 | 2957 | 1690 | 2959 |
| 168 | 2961 | 2962 | 2963 | 2964 | 658 | 2966 | 2967 | 2968 | 2969 | 48 | 2971 | 2972 | 2973 | 2974 | 2975 | 2976 | 103 | 659 | 2979 |
| 660 | 2981 | 2982 | 2040 | 2984 | 1970 | 2986 | 14 | 1464 | 2989 | 2990 | 2991 | 2992 | 2993 | 663 | 393 | 664 | 2997 | 2998 | 1612 |
| 3000 | 3001 | 3002 | 3003 | 3004 | 3005 | 170 | 1495 | 2191 | 1761 | 666 | 3011 | 3012 | 3013 | 3014 | 667 | 3016 | 115 | 3018 | 171 |
| 3020 | 3021 | 3022 | 3023 | 3024 | 3025 | 3026 | 669 | 3028 | 3029 | 3030 | 3031 | 3032 | 3033 | 3034 | 3035 | 3036 | 3037 | 3038 | 3039 |
| 3040 | 670 | 3042 | 3043 | 3044 | 2136 | 3046 | 3047 | 3048 | 3049 | 3050 | 3051 | 3052 | 671 | 672 | 3055 | 673 | 3057 | 3058 | 3059 |
| 2037 | 3061 | 1824 | 2155 | 3064 | 674 | 675 | 3067 | 3068 | 3069 | 3070 | 3071 | 676 | 3073 | 494 | 60 | 678 | 3077 | 679 | 3079 |
| 173 | 3081 | 3082 | 3083 | 2207 | 339 | 3086 | 681 | 682 | 2083 | 3090 | 3091 | 1762 | 3093 | 47 | 3095 | 3096 | 3097 | 3098 | 3099 |
| 3100 | 3101 | 683 | 3103 | 3104 | 2226 | 3106 | 3107 | 3108 | 3109 | 684 | 2009 | 3113 | 3114 | 3115 | 3116 | 3117 | 3118 | 3119 |
| 3120 | 3121 | 3122 | 2229 | 3124 | 3125 | 3126 | 3127 | 3128 | 3129 | 3130 | 3131 | 3132 | 685 | 1763 | 3135 | 3136 | 61 | 687 | 3139 |
| 3140 | 2256 | 3142 | 3143 | 3144 | 3145 | 3146 | 175 | 689 | 3149 | 1693 | 3151 | 3152 | 176 | 3154 | 3155 | 691 | 3157 | 1880 | 693 |
| 3160 | 3161 | 3162 | 3163 | 3164 | 3165 | 3166 | 1571 | 3168 | 3169 | 1694 | 3171 | 1466 | 3173 | 694 | 3175 | 3176 | 3177 | 1452 | 3179 |
| 3180 | 2109 | 3182 | 3183 | 454 | 2095 | 3186 | 3187 | 3188 | 3189 | 3190 | 3191 | 695 | 3193 | 3194 | 696 | 3196 | 3197 | 1941 | 697 |
| 3200 | 3201 | 3202 | 3203 | 698 | 3205 | 3206 | 3207 | 178 | 3209 | 3210 | 3211 | 700 | 3213 | 473 | 701 | 3216 | 3217 | 3218 | 702 |
| 3220 | 3221 | 3222 | 3223 | 3224 | 3225 | 1949 | 3227 | 3228 | 703 | 3230 | 3231 | 704 | 3233 | 3234 | 3235 | 3236 | 3237 | 3238 | 3239 |
| 1764 | 3241 | 3242 | 3243 | 3244 | 705 | 706 | 3247 | 3248 | 3249 | 3250 | 1965 | 707 | 3253 | 708 | 3255 | 3256 | 1572 | 3258 | 3259 |
| 3260 | 3261 | 3262 | 709 | 3264 | 710 | 3266 | 3267 | 711 | 712 | 3270 | 3271 | 713 | 3273 | 3274 | 3275 | 3276 | 3277 | 3278 | 3279 |
| 3280 | 3281 | 714 | 3283 | 1654 | 3285 | 3286 | 3287 | 3288 | 3289 | 3290 | 715 | 3292 | 3293 | 3294 | 3295 | 716 | 3297 | 3298 | 3299 |
| 3300 | 3301 | 3302 | 3303 | 3304 | 1623 | 3306 | 3307 | 718 | 3309 | 3310 | 3311 | 3312 | 3313 | 3314 | 412 | 719 | 3317 | 179 | 3319 |
| 2050 | 3321 | 3322 | 3323 | 721 | 3325 | 722 | 723 | 180 | 1811 | 3330 | 3331 | 3332 | 3333 | 3334 | 3335 | 3336 | 3337 | 3338 | 725 |
| 3340 | 726 | 3342 | 3343 | 181 | 3345 | 132 | 3347 | 728 | 3349 | 3350 | 3351 | 3 | 3353 | 3354 | 183 | 345 | 184 | 1672 | 732 |
| 3360 | 63 | 3362 | 3363 | 3364 | 1971 | 3366 | 3367 | 3368 | 3369 | 3370 | 3371 | 3372 | 3373 | 3374 | 3375 | 64 | 3377 | 3378 | 3379 |
| 735 | 3381 | 3382 | 3383 | 1497 | 3385 | 736 | 3387 | 3388 | 3389 | 737 | 3391 | 3392 | 3393 | 3394 | 1765 | 3396 | 3397 | 3398 | 738 |
| 3400 | 2012 | 740 | 3403 | 3404 | 3405 | 1966 | 741 | 3408 | 742 | 3410 | 743 | 3412 | 3413 | 3414 | 3415 | 3416 | 3417 | 3418 | 744 |
| 3420 | 3421 | 3422 | 3423 | 3424 | 3425 | 188 | 3427 | 3428 | 3429 | 746 | 3431 | 3432 | 747 | 189 | 749 | 3436 | 2130 | 3438 | 3439 |
| 3440 | 3441 | 3442 | 359 | 3444 | 3445 | 190 | 3447 | 3448 | 751 | 3450 | 3451 | 752 | 753 | 3454 | 3455 | 1695 | 3457 | 2104 | 1959 |
| 3460 | 3461 | 1990 | 3463 | 3464 | 3465 | 3466 | 3467 | 755 | 3469 | 191 | 192 | 2139 | 1498 | 3474 | 3475 | 3476 | 2042 | 2020 | 3479 |
| 3480 | 3481 | 759 | 1624 | 65 | 66 | 3486 | 2098 | 762 | 3489 | 3490 | 3491 | 3492 | 3493 | 3494 | 3495 | 3496 | 195 | 764 | 3499 |
| 406 | 3501 | 3502 | 3503 | 3504 | 3505 | 2230 | 3507 | 196 | 3509 | 3510 | 3511 | 3512 | 3513 | 3514 | 766 | 1766 | 3517 | 197 | 768 |
| 3520 | 3521 | 3522 | 198 | 3524 | 516 | 3526 | 770 | 3528 | 3529 | 3530 | 3531 | 3532 | 3533 | 2086 | 3535 | 3536 | 3537 | 3538 | 3539 |
| 772 | 3541 | 3542 | 3543 | 773 | 3545 | 3546 | 3547 | 3548 | 2178 | 3550 | 3551 | 3552 | 3553 | 3554 | 3555 | 3556 | 774 | 3558 | 1499 |
| 3560 | 3561 | 3562 | 3563 | 3564 | 3565 | 3566 | 3567 | 3568 | 3569 | 775 | 3571 | 3572 | 3573 | 2242 | 3575 | 1853 | 776 | 3578 | 3579 |
| 3580 | 1575 | 3582 | 3583 | 3584 | 3585 | 3586 | 3587 | 3588 | 3589 | 3590 | 777 | 778 | 199 | 3594 | 3595 | 780 | 3597 | 3598 | 2239 |
| 3600 | 3601 | 3602 | 3603 | 3604 | 3605 | 200 | 3607 | 3608 | 3609 | 3610 | 3611 | 508 | 3613 | 3614 | 3615 | 3616 | 3617 | 3618 | 3619 |
| 3620 | 3621 | 3622 | 3623 | 3624 | 3625 | 3626 | 2301 | 3628 | 201 | 3630 | 458 | 3632 | 3633 | 3634 | 3635 | 2231 | 2107 | 3638 | 3639 |
| 3640 | 783 | 202 | 3643 | 1625 | 3645 | 3646 | 3647 | 785 | 3649 | 2024 | 3651 | 3652 | 3653 | 3654 | 3655 | 1395 | 3657 | 3658 | 786 |
| 3660 | 3661 | 787 | 788 | 3664 | 2204 | 3666 | 3667 | 203 | 1677 | 2280 | 1982 | 3672 | 3673 | 3674 | 3675 | 3676 | 3677 | 790 | 1449 |
| 3680 | 3681 | 3682 | 3683 | 3684 | 3685 | 3686 | 3687 | 3688 | 3689 | 1807 | 1902 | 3693 | 3694 | 3695 | 3696 | 3697 | 3698 | 3699 |
| 3700 | 3701 | 3702 | 3703 | 204 | 3705 | 2053 | 3707 | 3708 | 2006 | 1902 | 2060 | 3712 | 413 | 205 | 3715 | 1747 | 793 | 3718 | 206 |
| 795 | 3721 | 3722 | 207 | 1767 | 360 | 2000 | 3727 | 1500 | 129 | 3730 | 3731 | 2175 | 3733 | 3734 | 797 | 3736 | 798 | 3738 | 1768 |
| 208 | 3741 | 3742 | 3743 | 3744 | 3745 | 3746 | 2091 | 800 | 3749 | 801 | 3751 | 322 | 3753 | 3754 | 3755 | 3756 | 209 | 210 | 3759 |
| 1984 | 804 | 122 | 3763 | 1698 | 1825 | 3766 | 3767 | 211 | 3769 | 3770 | 806 | 3772 | 807 | 3774 | 3775 | 3776 | 3777 | 1753 | 3779 |
| 3780 | 809 | 3782 | 1501 | 3784 | 3785 | 810 | 3787 | 212 | 3789 | 3790 | 1655 | 3792 | 3793 | 1626 | 3795 | 3796 | 3797 | 3798 | 3799 |
| 1699 | 3801 | 3802 | 3803 | 3804 | 3805 | 3806 | 3807 | 3808 | 812 | 3810 | 813 | 1700 | 3813 | 3814 | 3815 | 1656 | 3817 | 1681 | 3819 |
| 3820 | 3821 | 2076 | 815 | 3824 | 3825 | 3826 | 3827 | 3828 | 816 | 1826 | 3831 | 3832 | 2070 | 3834 | 3835 | 3836 | 3837 | 213 | 3839 |
| 3840 | 3841 | 3842 | 818 | 819 | 3845 | 3846 | 3847 | 820 | 3849 | 3850 | 3851 | 3852 | 3853 | 3854 | 3855 | 3856 | 214 | 822 | 3859 |
| 823 | 1931 | 3862 | 3863 | 3864 | 3865 | 3866 | 3867 | 3868 | 3869 | 3870 | 3871 | 3872 | 2241 | 1878 | 3875 | 3876 | 3877 | 3878 | 3879 |
| 3880 | 3881 | 3882 | 3883 | 3884 | 3885 | 3886 | 3887 | 824 | 3889 | 3890 | 3891 | 3892 | 3893 | 3894 | 3895 | 3896 | 3897 | 3898 | 825 |
| 3900 | 826 | 3902 | 827 | 3904 | 215 | 3906 | 3907 | 3908 | 3909 | 1502 | 3911 | 3912 | 1577 | 3914 | 3915 | 829 | 830 | 3918 | 3919 |
| 831 | 3921 | 3922 | 3923 | 3924 | 3925 | 3926 | 3927 | 3928 | 3929 | 216 | 3931 | 3932 | 3933 | 3934 | 3935 | 2142 | 3937 | 3938 | 2176 |
| 833 | 3941 | 323 | 3943 | 3944 | 3945 | 3946 | 3947 | 1769 | 3949 | 3950 | 440 | 1467 | 3953 | 3954 | 1578 | 3956 | 3957 | 1503 | 3959 |
| 3960 | 3961 | 3962 | 3963 | 834 | 3965 | 217 | 3967 | 3968 | 836 | 1995 | 3971 | 495 | 218 | 3974 | 3975 | 394 | 3977 | 3978 | 3979 |
| 3980 | 3981 | 3982 | 3983 | 3984 | 838 | 3986 | 67 | 840 | 220 | 3990 | 3991 | 842 | 3993 | 2148 | 3995 | 1657 | 2292 | 3998 | 127 |
| 455 | 1817 | 843 | 844 | 4004 | 4005 | 845 | 89 | 4008 | 340 | 382 | 4011 | 846 | 4013 | 4014 | 1812 | 4016 | 4017 | 847 | 4019 |
| 4020 | 4021 | 4022 | 4023 | 848 | 849 | 1579 | 4027 | 221 | 4029 | 4030 | 4031 | 2181 | 4033 | 104 | 4035 | 4036 | 4037 | 851 | 4039 |
| 4040 | 4041 | 4042 | 4043 | 852 | 1771 | 4046 | 2110 | 4048 | 4049 | 854 | 4051 | 4052 | 1580 | 4054 | 4055 | 119 | 4057 | 4058 | 855 |
| 4060 | 222 | 4062 | 1967 | 4064 | 4065 | 4066 | 4067 | 1567 | 4069 | 4070 | 1881 | 4072 | 4073 | 223 | 341 | 4076 | 4077 | 2182 | 4079 |
| 1581 | 4081 | 4082 | 4083 | 2069 | 4085 | 4086 | 1827 | 142 | 858 | 4090 | 4091 | 1399 | 1504 | 4094 | 500 | 860 | 861 | 4098 | 4099 |
| 862 | 4101 | 4102 | 4103 | 4104 | 4105 | 4106 | 2033 | 4108 | 470 | 863 | 4111 | 4112 | 4113 | 4114 | 4115 | 4116 | 4117 | 4118 | 1960 |
| 2222 | 4121 | 68 | 4123 | 4124 | 4125 | 4126 | 4127 | 4128 | 4129 | 4130 | 865 | 4132 | 4133 | 471 | 866 | 395 | 4137 | 867 | 4139 |
| 868 | 2282 | 4142 | 4143 | 1855 | 4145 | 4146 | 870 | 4147 | 27 | 4149 | 4150 | 4151 | 96 | 872 | 4154 | 4155 | 4156 | 4157 | 4158 | 4159 |
| 4160 | 4161 | 4162 | 2127 | 873 | 874 | 4166 | 226 | 876 | 1582 | 4170 | 4171 | 227 | 4173 | 4174 | 2277 | 878 | 4177 | 4178 | 2106 |
| 4180 | 4181 | 4182 | 879 | 880 | 4185 | 4186 | 881 | 4188 | 882 | 4190 | 4191 | 4192 | 4193 | 2167 | 4195 | 4196 | 4197 | 4198 | 4199 |
| 1752 | 4201 | 4202 | 4203 | 4204 | 228 | 4206 | 2129 | 70 | 4209 | 4210 | 4211 | 438 | 4213 | 4214 | 4215 | 1704 | 4217 | 1673 | 4219 |

-continued

| | | | | | | | | | | | | | | | | | | | |
|---|---|---|---|---|---|---|---|---|---|---|---|---|---|---|---|---|---|---|---|
| 4220 | 4221 | 4222 | 4223 | 4224 | 887 | 4226 | 4227 | 411 | 4229 | 4230 | 4231 | 4232 | 1447 | 4234 | 4235 | 4236 | 888 | 4238 | 889 |
| 890 | 891 | 4242 | 1985 | 16 | 1627 | 4246 | 4247 | 1803 | 4249 | 4250 | 470 | 4252 | 893 | 894 | 4255 | 4256 | 4257 | 1674 | 895 |
| 4260 | 896 | 4262 | 4263 | 46 | 4265 | 4266 | 4267 | 1828 | 4269 | 1506 | 898 | 4272 | 1584 | 899 | 4275 | 900 | 4277 | 4278 | 1507 |
| 4280 | 4281 | 4282 | 4283 | 4284 | 4285 | 4286 | 4287 | 901 | 4289 | 902 | 4291 | 4292 | 4293 | 1891 | 4295 | 4296 | 903 | 4298 | 384 |
| 347 | 904 | 1894 | 4303 | 4304 | 1866 | 4306 | 4307 | 4308 | 905 | 4310 | 385 | 231 | 4313 | 4314 | 907 | 4316 | 4317 | 108 | 4319 |
| 1510 | 4321 | 4322 | 4323 | 232 | 909 | 910 | 4327 | 4328 | 1938 | 4330 | 911 | 4332 | 4333 | 4334 | 4335 | 4336 | 4337 | 4338 | 912 |
| 4340 | 4341 | 469 | 29 | 2262 | 2131 | 4346 | 4347 | 914 | 4349 | 4350 | 4351 | 4352 | 4353 | 4354 | 4355 | 4356 | 4357 | 4358 | 2055 |
| 4360 | 2190 | 915 | 4363 | 4364 | 4365 | 4366 | 4367 | 139 | 4369 | 4370 | 4371 | 4372 | 4373 | 916 | 4375 | 4376 | 2063 | 917 | 4379 |
| 325 | 4381 | 4382 | 918 | 4384 | 919 | 4386 | 121 | 4388 | 4389 | 4390 | 2133 | 920 | 4393 | 4394 | 4395 | 4396 | 4397 | 4398 | 921 |
| 4400 | 4401 | 4402 | 4403 | 4404 | 922 | 1708 | 4407 | 4408 | 4409 | 4410 | 4411 | 397 | 4413 | 1829 | 1709 | 4416 | 4417 | 4418 | 4419 |
| 923 | 924 | 4422 | 2264 | 925 | 462 | 4426 | 4427 | 1968 | 4429 | 1511 | 361 | 1628 | 4433 | 926 | 4435 | 1454 | 4437 | 4438 | 4439 |
| 4440 | 927 | 4442 | 234 | 1950 | 4445 | 929 | 2046 | 4448 | 2049 | 4450 | 4451 | 1512 | 4453 | 4454 | 930 | 931 | 932 | 1903 | 1586 |
| 933 | 4461 | 1942 | 4463 | 420 | 4465 | 4466 | 4467 | 1470 | 4469 | 934 | 4471 | 419 | 4473 | 935 | 4475 | 4476 | 4477 | 4478 | 4479 |
| 2059 | 4481 | 936 | 4483 | 4484 | 4485 | 4486 | 4487 | 2214 | 1775 | 4490 | 938 | 235 | 4493 | 4494 | 4495 | 940 | 4497 | 4498 | 4499 |
| 452 | 4501 | 4502 | 1513 | 369 | 4505 | 941 | 4507 | 4508 | 4509 | 4510 | 4511 | 4512 | 942 | 2099 | 4515 | 4516 | 1710 | 943 | 1856 |
| 4520 | 1658 | 4522 | 4523 | 1401 | 73 | 4526 | 237 | 946 | 947 | 1776 | 1514 | 4532 | 1961 | 1917 | 4535 | 4536 | 480 | 4538 | 1587 |
| 948 | 4541 | 4542 | 4543 | 4544 | 4545 | 4546 | 4547 | 4548 | 238 | 4551 | 4552 | 4553 | 4554 | 4555 | 239 | 491 | 4558 | 4559 |
| 4560 | 1515 | 4562 | 2140 | 952 | 386 | 348 | 954 | 955 | 4569 | 4570 | 4571 | 1804 | 4573 | 4574 | 240 | 957 | 4577 | 958 | 4579 |
| 4580 | 1868 | 4582 | 4583 | 2078 | 959 | 4586 | 4587 | 1659 | 4589 | 4590 | 960 | 4592 | 2064 | 2117 | 4595 | 2115 | 4597 | 4598 | 1613 |
| 961 | 4601 | 4602 | 962 | 4604 | 4605 | 963 | 4607 | 2288 | 4609 | 4610 | 4611 | 1857 | 4613 | 964 | 4615 | 4616 | 4617 | 2113 | 241 |
| 4620 | 966 | 4622 | 4623 | 1517 | 4625 | 1830 | 1751 | 4628 | 1874 | 1997 | 4631 | 4632 | 967 | 4634 | 1858 | 4636 | 4637 | 4638 | 242 |
| 4640 | 4641 | 1566 | 4643 | 2145 | 4645 | 4646 | 4647 | 1956 | 4649 | 969 | 4651 | 4652 | 1895 | 4654 | 970 | 4656 | 971 | 972 | 4659 |
| 4660 | 4661 | 4662 | 4663 | 1712 | 4665 | 4666 | 4667 | 4668 | 1744 | 4670 | 4671 | 973 | 4673 | 4674 | 4675 | 4676 | 4677 | 2246 | 4679 |
| 4680 | 4681 | 4682 | 4683 | 4684 | 4685 | 974 | 4687 | 4688 | 1869 | 4690 | 4691 | 243 | 4693 | 4694 | 4695 | 4696 | 976 | 1490 | 4699 |
| 4700 | 1676 | 4702 | 4703 | 977 | 4705 | 2051 | 4707 | 4708 | 4709 | 4710 | 4711 | 4712 | 4713 | 979 | 4715 | 398 | 4717 | 4718 | 4719 |
| 1519 | 4721 | 980 | 4723 | 4724 | 12 | 4726 | 244 | 4728 | 2043 | 4730 | 4731 | 4732 | 4733 | 4734 | 4735 | 4736 | 2015 | 983 | 4739 |
| 4740 | 107 | 4742 | 1471 | 4744 | 4745 | 4746 | 4747 | 4748 | 4749 | 1816 | 4751 | 984 | 4753 | 4754 | 4755 | 4756 | 30 | 4758 | 4759 |
| 986 | 4761 | 4762 | 987 | 4764 | 988 | 4766 | 4767 | 4768 | 4769 | 4770 | 2249 | 4772 | 4773 | 4774 | 990 | 4776 | 991 | 247 | 4779 |
| 993 | 4781 | 4782 | 1632 | 4784 | 994 | 4786 | 4787 | 101 | 2147 | 4790 | 422 | 4792 | 4793 | 2232 | 4795 | 4796 | 996 | 1520 | 997 |
| 4800 | 2297 | 999 | 4803 | 1591 | 120 | 2087 | 4807 | 1679 | 461 | 4810 | 4811 | 4812 | 249 | 4814 | 1778 | 1002 | 1003 | 4818 | 250 |
| 1005 | 4821 | 4822 | 4823 | 444 | 4825 | 4826 | 1592 | 365 | 4829 | 1006 | 1007 | 4832 | 4833 | 4834 | 4835 | 1714 | 1008 | 4838 | 1009 |
| 4840 | 1905 | 4842 | 1594 | 502 | 4845 | 1010 | 4847 | 1521 | 1011 | 4850 | 370 | 4852 | 1012 | 4854 | 1595 | 1013 | 4857 | 251 | 4859 |
| 1940 | 2016 | 4862 | 2150 | 4864 | 1715 | 4866 | 1634 | 375 | 4869 | 4870 | 1015 | 4872 | 252 | 4874 | 125 | 4876 | 2270 | 4878 | 1716 |
| 4880 | 4881 | 4882 | 4883 | 4884 | 387 | 1522 | 4887 | 1017 | 1018 | 2211 | 4891 | 1019 | 1020 | 4894 | 4895 | 376 | 4897 | 4898 | 1596 |
| 4900 | 4901 | 4902 | 253 | 4904 | 4905 | 4906 | 1022 | 77 | 1024 | 1919 | 4911 | 4912 | 1779 | 1025 | 4915 | 1663 | 4917 | 1026 | 4919 |
| 4920 | 4921 | 4922 | 4923 | 1027 | 1028 | 4926 | 1402 | 1029 | 4929 | 4930 | 4931 | 1030 | 4933 | 4934 | 4935 | 4936 | 4937 | 4938 | 1031 |
| 1523 | 4941 | 4942 | 1032 | 4944 | 4945 | 4946 | 4947 | 4948 | 4949 | 4950 | 4951 | 4952 | 4953 | 4954 | 4955 | 4956 | 1033 | 4958 | 4959 |
| 1034 | 1035 | 1403 | 4963 | 51 | 4965 | 4966 | 4967 | 2289 | 1036 | 1524 | 4971 | 4972 | 4973 | 1037 | 4975 | 4976 | 4977 | 4978 | 4979 |
| 4980 | 1038 | 4982 | 1039 | 4984 | 4985 | 1870 | 4987 | 4988 | 4989 | 4990 | 4991 | 4992 | 1040 | 4994 | 2257 | 1041 | 4997 | 4998 | 1525 |
| 5000 | 5001 | 5002 | 1404 | 1859 | 5005 | 5006 | 5007 | 1906 | 5009 | 1042 | 5011 | 5012 | 5013 | 1597 | 5015 | 5016 | 1043 | 5018 | 5019 |
| 1614 | 5021 | 5022 | 5023 | 5024 | 1749 | 140 | 5027 | 2100 | 1044 | 5030 | 1045 | 1046 | 1047 | 5034 | 1048 | 5036 | 1473 | 5038 | 5039 |
| 5040 | 5041 | 5042 | 5043 | 5044 | 5045 | 5046 | 1049 | 1808 | 5050 | 255 | 5052 | 1051 | 5054 | 5055 | 5056 | 5057 | 5058 | 1052 |
| 5060 | 5061 | 5062 | 5063 | 5064 | 5065 | 5066 | 5067 | 1053 | 5069 | 5070 | 5071 | 5072 | 5073 | 5074 | 5075 | 5076 | 5077 | 5078 | 5079 |
| 5080 | 1054 | 5082 | 5083 | 5084 | 5085 | 5086 | 1055 | 5088 | 5089 | 5090 | 5091 | 5092 | 5093 | 2245 | 5095 | 5096 | 5097 | 1526 | 1056 |
| 5100 | 5101 | 2125 | 5103 | 5104 | 1058 | 5106 | 1059 | 5108 | 1060 | 5110 | 5111 | 5112 | 5113 | 5114 | 5115 | 5116 | 5117 | 5118 | 257 |
| 5120 | 446 | 1635 | 5123 | 5124 | 1062 | 5126 | 5127 | 399 | 5129 | 5130 | 5131 | 5132 | 5133 | 1598 | 5135 | 5136 | 1063 | 5138 | 5139 |
| 1064 | 5141 | 5142 | 5143 | 5144 | 5145 | 5146 | 5147 | 5148 | 5149 | 2240 | 5151 | 1527 | 5153 | 1065 | 5155 | 5156 | 2183 | 5158 | 5159 |
| 1066 | 2158 | 5162 | 1068 | 5164 | 5165 | 5166 | 5167 | 5168 | 5169 | 5170 | 5171 | 1831 | 1718 | 5174 | 5175 | 78 | 5177 | 1781 | 5179 |
| 5180 | 5181 | 5182 | 5183 | 5184 | 5185 | 5186 | 5187 | 5188 | 5189 | 5190 | 5191 | 5192 | 5193 | 5194 | 5195 | 5196 | 5197 | 5198 | 5199 |
| 5200 | 5201 | 1636 | 5203 | 5204 | 2074 | 5206 | 5207 | 5208 | 5209 | 2126 | 5211 | 5212 | 5213 | 5214 | 5215 | 1070 | 1898 | 5218 | 5219 |
| 102 | 5221 | 5222 | 5223 | 5224 | 5225 | 2172 | 259 | 5228 | 5229 | 5230 | 5231 | 1073 | 5233 | 5234 | 5235 | 5236 | 1074 | 5238 | 5239 |
| 1491 | 5241 | 5242 | 5243 | 5244 | 1528 | 5246 | 5247 | 1406 | 5249 | 5250 | 1075 | 5252 | 5253 | 433 | 5255 | 5256 | 5257 | 1529 | 1783 |
| 5260 | 5261 | 5262 | 5263 | 5264 | 5265 | 5266 | 5267 | 5268 | 5269 | 5270 | 1076 | 5272 | 5273 | 5274 | 5275 | 5276 | 5277 | 5278 | 5279 |
| 5280 | 5281 | 5282 | 5283 | 5284 | 1077 | 2122 | 5287 | 5288 | 5289 | 5290 | 5291 | 5292 | 5293 | 5294 | 5295 | 2082 | 5297 | 5298 | 1078 |
| 5300 | 5301 | 5302 | 5303 | 5304 | 1407 | 5306 | 5307 | 5308 | 5309 | 5310 | 5311 | 5312 | 5313 | 1079 | 5315 | 5316 | 1080 | 5318 | 5319 |
| 1408 | 5321 | 5322 | 5323 | 5324 | 5325 | 5326 | 5327 | 5328 | 5329 | 5330 | 428 | 5332 | 2290 | 1081 | 5335 | 2247 | 5337 | 5338 | 31 |
| 5340 | 5341 | 5342 | 5343 | 1719 | 501 | 1083 | 5347 | 39 | 5349 | 5350 | 5351 | 5352 | 5353 | 5354 | 5355 | 388 | 5357 | 5358 | 1530 |
| 5360 | 1721 | 5362 | 5363 | 5364 | 5365 | 5366 | 5367 | 1531 | 5369 | 5370 | 5371 | 5372 | 5373 | 5374 | 5375 | 5376 | 366 | 1084 | 5379 |
| 5380 | 5381 | 5382 | 5383 | 5384 | 5385 | 5386 | 5387 | 5388 | 1085 | 5390 | 5391 | 261 | 5393 | 5394 | 5395 | 5396 | 5397 | 5398 | 5399 |
| 1784 | 5401 | 1722 | 350 | 5404 | 5405 | 1087 | 5407 | 5408 | 5409 | 5410 | 1088 | 5412 | 5413 | 5414 | 5415 | 6 | 5417 | 5418 | 5419 |
| 5420 | 5421 | 1832 | 5423 | 1089 | 5425 | 5426 | 5427 | 5428 | 262 | 5430 | 1666 | 5432 | 5433 | 5434 | 5435 | 5436 | 5437 | 5438 | 5439 |
| 5440 | 5441 | 5442 | 5443 | 5444 | 5445 | 5446 | 5447 | 5448 | 5449 | 1091 | 5451 | 5452 | 5453 | 5454 | 5455 | 5456 | 505 | 5458 | 5459 |
| 5460 | 1533 | 5462 | 2101 | 1092 | 5465 | 5466 | 5467 | 5468 | 5469 | 5470 | 5471 | 5472 | 5473 | 5474 | 5475 | 5476 | 5477 | 5478 | 1637 |
| 5480 | 5481 | 5482 | 1093 | 5484 | 5485 | 263 | 5487 | 5488 | 5489 | 5490 | 5491 | 5492 | 5493 | 5494 | 5495 | 5496 | 5497 | 5498 | 5499 |
| 5500 | 5501 | 5502 | 5503 | 5504 | 5505 | 5506 | 5507 | 5508 | 5509 | 5510 | 5511 | 5512 | 5513 | 5514 | 5515 | 5516 | 5517 | 5518 | 5519 |
| 5520 | 5521 | 5522 | 5523 | 5524 | 5525 | 5526 | 5527 | 5528 | 5529 | 5530 | 5531 | 5532 | 5533 | 5534 | 5535 | 5536 | 264 | 5538 | 5539 |
| 5540 | 5541 | 5542 | 5543 | 2102 | 5545 | 5546 | 1096 | 5548 | 5549 | 1097 | 5551 | 5552 | 5553 | 5554 | 5555 | 5556 | 1534 | 5558 | 5559 |
| 5560 | 5561 | 1907 | 5563 | 5564 | 50 | 5566 | 5567 | 5568 | 1098 | 5570 | 1099 | 1100 | 5573 | 5574 | 5575 | 5576 | 5577 | 1723 | 5579 |
| 5580 | 5581 | 5582 | 5583 | 5584 | 5585 | 5586 | 1101 | 5588 | 5589 | 5590 | 5591 | 5592 | 5593 | 5594 | 5595 | 5596 | 5597 | 1102 | 1103 |
| 2116 | 5601 | 2295 | 5603 | 1104 | 5605 | 5606 | 1105 | 5608 | 1106 | 5610 | 1107 | 1108 | 5613 | 2151 | 5615 | 1109 | 5617 | 5618 | 5619 |
| 5620 | 5621 | 5622 | 5623 | 5624 | 1110 | 1111 | 5627 | 5628 | 1750 | 5630 | 5631 | 5632 | 5633 | 5634 | 1112 | 5636 | 5637 | 5638 | 5639 |
| 5640 | 1883 | 2003 | 5643 | 1113 | 5645 | 5646 | 5647 | 1114 | 5649 | 5650 | 5651 | 5652 | 5653 | 5654 | 5655 | 5656 | 5657 | 5658 | 5659 |
| 5660 | 5661 | 5662 | 5663 | 5664 | 5665 | 1945 | 5667 | 5668 | 351 | 5670 | 5671 | 5672 | 5673 | 5674 | 5675 | 5676 | 5677 | 5678 | 1638 |
| 5680 | 1115 | 1536 | 5683 | 5684 | 5685 | 5686 | 5687 | 5688 | 5689 | 5690 | 5691 | 5692 | 5693 | 5694 | 1116 | 5696 | 5697 | 5698 | 5699 |
| 5700 | 1537 | 1117 | 5703 | 5704 | 5705 | 5706 | 2184 | 1786 | 5709 | 5710 | 5711 | 5712 | 5713 | 5714 | 5715 | 326 | 1119 | 5718 | 5719 |
| 5720 | 5721 | 5722 | 5723 | 5724 | 5725 | 5726 | 5727 | 5728 | 5729 | 5730 | 5731 | 5732 | 5733 | 32 | 1121 | 5736 | 5737 | 5738 | 5739 |
| 5740 | 1833 | 5742 | 5743 | 266 | 5745 | 5746 | 5747 | 5748 | 1123 | 5750 | 1474 | 5752 | 1124 | 5754 | 5755 | 5756 | 5757 | 2154 | 5759 |
| 5760 | 1125 | 5762 | 5763 | 5764 | 5765 | 5766 | 5767 | 5768 | 5769 | 5770 | 5771 | 5772 | 5773 | 5774 | 5775 | 5776 | 5777 | 5778 | 1884 |
| 5780 | 5781 | 5782 | 5783 | 5784 | 5785 | 1127 | 5787 | 5788 | 5789 | 5790 | 5791 | 5792 | 5793 | 5794 | 5795 | 5796 | 1128 | 5798 | 5799 |
| 1538 | 5801 | 5802 | 5803 | 5804 | 492 | 5806 | 5807 | 5808 | 5809 | 5810 | 5811 | 5812 | 5813 | 5814 | 5815 | 5816 | 5817 | 5818 | 17 |

-continued

| | | | | | | | | | | | | | | | | | | | |
|---|---|---|---|---|---|---|---|---|---|---|---|---|---|---|---|---|---|---|---|
| 5820 | 268 | 1131 | 5823 | 1132 | 5825 | 5826 | 5827 | 5828 | 5829 | 5830 | 1860 | 5832 | 5833 | 5834 | 5835 | 5836 | 5837 | 5838 | 1133 |
| 1134 | 5841 | 5842 | 5843 | 5844 | 5845 | 5846 | 5847 | 5848 | 5849 | 5850 | 5851 | 5852 | 5853 | 5854 | 5855 | 5856 | 5857 | 5858 | 1724 |
| 5860 | 5861 | 5862 | 5863 | 5864 | 5865 | 5866 | 5867 | 5868 | 5869 | 5870 | 5871 | 5872 | 5873 | 5874 | 5875 | 5876 | 5877 | 5878 | 5879 |
| 5880 | 5881 | 5882 | 5883 | 5884 | 1539 | 5886 | 5887 | 5888 | 5889 | 5890 | 5891 | 5892 | 5893 | 5894 | 5895 | 5896 | 1135 | 5898 | 5899 |
| 5900 | 5901 | 5902 | 5903 | 5904 | 5905 | 5906 | 5907 | 5908 | 2056 | 5910 | 5911 | 5912 | 5913 | 5914 | 5915 | 5916 | 2163 | 1136 | 5919 |
| 5920 | 5921 | 5922 | 5923 | 5924 | 5925 | 5926 | 5927 | 5928 | 1976 | 5930 | 1137 | 5932 | 1138 | 5934 | 5935 | 1667 | 1725 | 5938 | 5939 |
| 5940 | 5941 | 5942 | 1834 | 5944 | 5945 | 5946 | 5947 | 5948 | 5949 | 5950 | 5951 | 5952 | 5953 | 1475 | 5955 | 5956 | 1139 | 5958 | 5959 |
| 5960 | 5961 | 5962 | 5963 | 371 | 5965 | 5966 | 1140 | 5968 | 5969 | 5970 | 5971 | 269 | 5973 | 5974 | 5975 | 5976 | 5977 | 5978 | 5979 |
| 5980 | 5981 | 5982 | 1476 | 5984 | 5985 | 5986 | 5987 | 5988 | 5989 | 5990 | 5991 | 5992 | 5993 | 5994 | 5995 | 5996 | 5997 | 5998 | 1477 |
| 6000 | 6001 | 6002 | 6003 | 342 | 1142 | 6006 | 6007 | 6008 | 6009 | 6010 | 6011 | 6012 | 6013 | 6014 | 6015 | 6016 | 6017 | 6018 | 6019 |
| 6020 | 6021 | 6022 | 6023 | 6024 | 6025 | 6026 | 6027 | 6028 | 1143 | 6030 | 270 | 6032 | 6033 | 6034 | 6035 | 6036 | 6037 | 6038 | 6039 |
| 6040 | 1145 | 6042 | 6043 | 6044 | 6045 | 6046 | 6047 | 6048 | 2258 | 6050 | 6051 | 6052 | 6053 | 6054 | 6055 | 6056 | 2248 | 6058 | 6059 |
| 6060 | 1726 | 6062 | 6063 | 6064 | 6065 | 1540 | 6067 | 6068 | 6069 | 6070 | 6071 | 6072 | 6073 | 1146 | 1147 | 6076 | 6077 | 6078 | 6079 |
| 6080 | 95 | 6082 | 6083 | 6084 | 6085 | 429 | 6087 | 6088 | 1787 | 6090 | 1148 | 6092 | 6093 | 6094 | 6095 | 401 | 6097 | 1149 | 6099 |
| 6100 | 6101 | 6102 | 6103 | 6104 | 6105 | 6106 | 6107 | 6108 | 6109 | 6110 | 6111 | 6112 | 6113 | 1150 | 464 | 6116 | 6117 | 6118 | 6119 |
| 1151 | 6121 | 6122 | 1845 | 6124 | 6125 | 6126 | 271 | 1541 | 6129 | 272 | 402 | 2197 | 1600 | 2054 | 6135 | 6136 | 6137 | 6138 | 6139 |
| 1154 | 6141 | 6142 | 6143 | 6144 | 1155 | 6146 | 6147 | 1790 | 273 | 6150 | 1952 | 6152 | 6153 | 6154 | 6155 | 6156 | 6157 | 6158 | 6159 |
| 128 | 6161 | 6162 | 6163 | 6164 | 6165 | 327 | 6167 | 6168 | 6169 | 6170 | 6171 | 6172 | 6173 | 6174 | 6175 | 6176 | 6177 | 6178 | 6179 |
| 6180 | 2090 | 6182 | 6183 | 1158 | 6185 | 6186 | 6187 | 6188 | 6189 | 2203 | 6191 | 1411 | 6193 | 6194 | 6195 | 1601 | 6197 | 6198 | 6199 |
| 6200 | 1973 | 274 | 6203 | 6204 | 1542 | 6206 | 2027 | 6208 | 6209 | 1160 | 6211 | 6212 | 275 | 6214 | 6215 | 6216 | 1162 | 6218 | 1641 |
| 276 | 6221 | 6222 | 6223 | 6224 | 6225 | 6226 | 6227 | 1877 | 6229 | 1164 | 6231 | 6232 | 6233 | 6234 | 509 | 6236 | 6237 | 6238 | 2021 |
| 6240 | 6241 | 6242 | 1835 | 6244 | 6245 | 6246 | 2271 | 6248 | 2174 | 6250 | 277 | 2269 | 1166 | 1167 | 6255 | 6256 | 6257 | 43 | 6259 |
| 6260 | 6261 | 6262 | 6263 | 1168 | 6265 | 6266 | 6267 | 6268 | 6269 | 6270 | 6271 | 6272 | 6273 | 6274 | 6275 | 6276 | 1602 | 6278 | 6279 |
| 6280 | 6281 | 6282 | 6283 | 44 | 6285 | 6286 | 6287 | 6288 | 6289 | 6290 | 6291 | 6292 | 6293 | 6294 | 6295 | 6296 | 1169 | 6298 | 6299 |
| 6300 | 6301 | 6302 | 6303 | 1170 | 1871 | 6306 | 6307 | 6308 | 6309 | 6310 | 6311 | 2252 | 6313 | 6314 | 6315 | 6316 | 6317 | 1977 | 6319 |
| 1480 | 6321 | 6322 | 6323 | 6324 | 6325 | 6326 | 6327 | 6328 | 447 | 6330 | 6331 | 6332 | 6333 | 6334 | 6335 | 6336 | 2075 | 6338 | 6339 |
| 6340 | 1172 | 6342 | 6343 | 1946 | 1603 | 6346 | 1173 | 278 | 6349 | 6350 | 6351 | 6352 | 6353 | 1175 | 6355 | 6356 | 6357 | 1727 | 126 |
| 6360 | 6361 | 6362 | 1176 | 6364 | 6365 | 6366 | 1177 | 6368 | 6369 | 6370 | 6371 | 6372 | 6373 | 6374 | 1836 | 6376 | 6377 | 6378 | 6379 |
| 2233 | 6381 | 6382 | 6383 | 6384 | 6385 | 1978 | 6387 | 1179 | 6389 | 6390 | 6391 | 1412 | 6393 | 6394 | 6395 | 1413 | 1922 | 6398 | 6399 |
| 6400 | 280 | 6402 | 6403 | 1543 | 6405 | 6406 | 6407 | 6408 | 6409 | 6410 | 6411 | 6412 | 6413 | 6414 | 6415 | 1181 | 6416 | 6417 | 6418 | 6419 |
| 6420 | 6421 | 6422 | 6423 | 6424 | 6425 | 6426 | 6427 | 6428 | 6429 | 6430 | 6431 | 6432 | 6433 | 6434 | 6435 | 6436 | 1182 | 6438 | 6439 |
| 6440 | 6441 | 6442 | 6443 | 6444 | 6445 | 6446 | 6447 | 6448 | 6449 | 1183 | 6451 | 6452 | 6453 | 6454 | 6455 | 6456 | 6457 | 6458 | 1184 |
| 6460 | 281 | 1186 | 6463 | 6464 | 6465 | 6466 | 6467 | 6468 | 6469 | 6470 | 6471 | 1187 | 6472 | 1188 | 6474 | 282 | 6476 | 1481 | 1190 | 6479 |
| 6480 | 6481 | 6482 | 6483 | 6484 | 6485 | 1191 | 283 | 6488 | 6489 | 6490 | 6491 | 6492 | 6493 | 6494 | 6495 | 6496 | 284 | 6498 | 6499 |
| 6500 | 6501 | 1642 | 6503 | 6504 | 6505 | 6506 | 6507 | 1448 | 6509 | 6510 | 6511 | 6512 | 506 | 6514 | 6515 | 6516 | 6517 | 6518 | 1728 |
| 6520 | 6521 | 1195 | 6523 | 6524 | 6525 | 6526 | 6527 | 6528 | 6529 | 6530 | 6531 | 1482 | 2243 | 6534 | 6535 | 6536 | 1196 | 6538 | 6539 |
| 286 | 6541 | 6542 | 1198 | 6544 | 404 | 6546 | 1199 | 6548 | 6549 | 6550 | 6551 | 6552 | 6553 | 6554 | 6555 | 6556 | 6557 | 6558 | 6559 |
| 6560 | 6561 | 6562 | 6563 | 6564 | 6565 | 6566 | 6567 | 6568 | 6569 | 6570 | 6571 | 6572 | 6573 | 6574 | 6575 | 6576 | 6577 | 6578 | 6579 |
| 6580 | 6581 | 6582 | 6583 | 6584 | 1200 | 6586 | 6587 | 6588 | 6589 | 6590 | 6591 | 6592 | 6593 | 1201 | 1872 | 6596 | 6597 | 6598 | 6599 |
| 6600 | 6601 | 1873 | 6603 | 6604 | 6605 | 6606 | 6607 | 6608 | 6609 | 1202 | 6611 | 6612 | 6613 | 6614 | 6615 | 6616 | 6617 | 6618 | 6619 |
| 6620 | 6621 | 6622 | 6623 | 6624 | 6625 | 6626 | 6627 | 6628 | 6629 | 1203 | 6631 | 6632 | 6633 | 6634 | 6635 | 6636 | 6637 | 6638 | 6639 |
| 6640 | 6641 | 6642 | 6643 | 6644 | 6645 | 6646 | 6647 | 6648 | 6649 | 6650 | 6651 | 6652 | 6653 | 6654 | 6655 | 1644 | 6657 | 6658 | 6659 |
| 6660 | 6661 | 6662 | 6663 | 6664 | 6665 | 6666 | 6667 | 6668 | 6669 | 6670 | 6671 | 6672 | 1793 | 6674 | 6675 | 6676 | 6677 | 6678 | 6679 |
| 2159 | 6681 | 6682 | 6683 | 6684 | 6685 | 6686 | 1204 | 6688 | 6689 | 6690 | 6691 | 6692 | 6693 | 6694 | 6695 | 1205 | 6697 | 6698 | 6699 |
| 6700 | 6701 | 6702 | 1206 | 6704 | 6705 | 6706 | 6707 | 6708 | 6709 | 2079 | 6711 | 6712 | 6713 | 6714 | 6715 | 1414 | 1207 | 6718 | 6719 |
| 6720 | 6721 | 6722 | 1483 | 6724 | 6725 | 1208 | 6727 | 1209 | 6728 | 6729 | 6730 | 6731 | 6732 | 6733 | 6734 | 6735 | 6736 | 6737 | 6738 | 6739 |
| 6740 | 6741 | 1210 | 6743 | 6744 | 6745 | 287 | 6747 | 6748 | 6749 | 6750 | 6751 | 1212 | 6753 | 6754 | 6755 | 6756 | 1544 | 6758 | 6759 |
| 6760 | 1213 | 6762 | 6763 | 6764 | 6765 | 6766 | 515 | 6768 | 288 | 6770 | 6771 | 6772 | 6773 | 6774 | 6775 | 6776 | 6777 | 6778 | 6779 |
| 6780 | 6781 | 1215 | 6783 | 6784 | 1216 | 6786 | 6787 | 1217 | 6789 | 6790 | 6791 | 6792 | 6793 | 6794 | 1218 | 6796 | 1219 | 6798 | 6799 |
| 6800 | 6801 | 6802 | 6803 | 6804 | 6805 | 6806 | 6807 | 6808 | 6809 | 1220 | 6811 | 6812 | 6813 | 6814 | 6815 | 6816 | 6817 | 6818 | 6819 |
| 6820 | 6821 | 6822 | 6823 | 6824 | 6825 | 6826 | 6827 | 6828 | 6829 | 6830 | 6831 | 6832 | 6833 | 6834 | 6835 | 6836 | 6837 | 6838 | 6839 |
| 6840 | 6841 | 6842 | 6843 | 6844 | 6845 | 1221 | 6847 | 6848 | 6849 | 6850 | 6851 | 6852 | 6853 | 6854 | 6855 | 6856 | 6857 | 6858 | 6859 |
| 1810 | 6861 | 6862 | 6863 | 6864 | 6865 | 6866 | 6867 | 511 | 6869 | 6870 | 6871 | 1814 | 6873 | 6874 | 6875 | 1222 | 6877 | 6878 | 6879 |
| 1492 | 6881 | 289 | 290 | 6884 | 6885 | 6886 | 6887 | 6888 | 6889 | 6890 | 6891 | 2119 | 1225 | 6895 | 6896 | 6897 | 6898 | 1226 |
| 373 | 6901 | 6902 | 1227 | 6904 | 6905 | 6906 | 1896 | 6908 | 6909 | 2010 | 6911 | 6912 | 6913 | 6914 | 1228 | 6916 | 6917 | 6918 | 1229 |
| 6920 | 1230 | 6922 | 6923 | 6924 | 6925 | 6926 | 6927 | 6928 | 6929 | 6930 | 6931 | 1415 | 6933 | 1545 | 6935 | 6936 | 1646 | 6938 | 6939 |
| 6940 | 1231 | 1794 | 6943 | 6944 | 6945 | 6946 | 497 | 6948 | 6949 | 6950 | 2036 | 6952 | 6953 | 34 | 6955 | 6956 | 1729 | 1837 | 6959 |
| 6960 | 6961 | 6962 | 6963 | 6964 | 6965 | 6966 | 6967 | 2196 | 6969 | 6970 | 1234 | 6972 | 1953 | 6974 | 1604 | 6976 | 1236 | 6978 | 294 |
| 6980 | 6981 | 6982 | 6983 | 6984 | 6985 | 6986 | 6987 | 6988 | 6989 | 1238 | 6991 | 6992 | 6993 | 6994 | 6995 | 6996 | 6997 | 6998 | 6999 |
| 7000 | 7001 | 7002 | 7003 | 7004 | 7005 | 7006 | 7007 | 7008 | 7009 | 7010 | 7011 | 7012 | 7013 | 7014 | 7015 | 7016 | 7017 | 7018 | 7019 |
| 1239 | 7021 | 7022 | 7023 | 7024 | 1416 | 7026 | 1240 | 7028 | 7029 | 7030 | 7031 | 7032 | 7033 | 7034 | 7035 | 7036 | 7037 | 7038 | 7039 |
| 7040 | 7041 | 1241 | 1242 | 7044 | 7045 | 1605 | 7047 | 328 | 7049 | 7050 | 7051 | 7052 | 1886 | 7054 | 7055 | 7056 | 7057 | 7058 | 7059 |
| 7060 | 7061 | 7062 | 295 | 7064 | 7065 | 7066 | 7067 | 2293 | 7069 | 7070 | 7071 | 1928 | 7073 | 7074 | 7075 | 7076 | 7077 | 7078 | 1244 |
| 7080 | 7081 | 7082 | 7083 | 7084 | 7085 | 7086 | 7087 | 7088 | 7089 | 7090 | 7091 | 7092 | 7093 | 7094 | 7095 | 7096 | 7097 | 7098 | 7099 |
| 7100 | 7101 | 7102 | 7103 | 1245 | 7105 | 7106 | 7107 | 7108 | 1246 | 7110 | 1247 | 7112 | 7113 | 7114 | 7115 | 7116 | 7117 | 7118 | 7119 |
| 7120 | 1248 | 7122 | 7123 | 1249 | 7125 | 7126 | 7127 | 7128 | 7129 | 7130 | 7131 | 7132 | 7133 | 7134 | 7135 | 1250 | 7137 | 7138 | 7139 |
| 7140 | 1862 | 7142 | 7143 | 7144 | 7145 | 7146 | 7147 | 7148 | 7149 | 7150 | 1730 | 7152 | 7153 | 7154 | 7155 | 7156 | 7157 | 7158 | 7159 |
| 7160 | 414 | 7162 | 7163 | 7164 | 7165 | 7166 | 7167 | 7168 | 7169 | 1251 | 7171 | 7172 | 7173 | 7174 | 7175 | 7176 | 2234 | 7178 | 7179 |
| 7180 | 7181 | 7182 | 7183 | 7184 | 7185 | 7186 | 7187 | 7188 | 7189 | 7190 | 7191 | 7192 | 7193 | 7194 | 7195 | 7196 | 7197 | 7198 | 7199 |
| 7200 | 7201 | 7202 | 7203 | 7204 | 7205 | 7206 | 7207 | 7208 | 7209 | 7210 | 1485 | 7212 | 7213 | 1682 | 7215 | 7216 | 7217 | 7218 | 7219 |
| 7220 | 7221 | 1253 | 7223 | 1254 | 7225 | 7226 | 7227 | 7228 | 7229 | 7230 | 7231 | 7232 | 7233 | 7234 | 7235 | 7236 | 1255 | 7238 | 7239 |
| 7240 | 1256 | 1257 | 7243 | 7244 | 7245 | 7246 | 7247 | 7248 | 7249 | 7250 | 7251 | 7252 | 7253 | 7254 | 7255 | 7256 | 7257 | 7258 | 1258 |
| 7260 | 7261 | 7262 | 7263 | 7264 | 7265 | 7266 | 7267 | 7268 | 7269 | 7270 | 507 | 7272 | 7273 | 7274 | 7275 | 7276 | 7277 | 7278 | 1279 |
| 7280 | 7281 | 1259 | 7283 | 7284 | 7285 | 7286 | 7287 | 7288 | 7289 | 1606 | 7291 | 7292 | 1260 | 7294 | 1815 | 7296 | 7297 | 7298 | 297 |
| 7300 | 1262 | 7302 | 7303 | 7304 | 7305 | 7306 | 7307 | 7308 | 7309 | 7310 | 1263 | 1731 | 7313 | 7314 | 7315 | 7316 | 7317 | 7318 | 7319 |
| 7320 | 7321 | 7322 | 7323 | 7324 | 298 | 7326 | 7327 | 7328 | 7329 | 329 | 7331 | 7332 | 7333 | 7334 | 7335 | 7336 | 299 | 7338 | 7339 |
| 7340 | 7341 | 7342 | 7343 | 300 | 7345 | 1546 | 7347 | 7348 | 1267 | 7350 | 7351 | 7352 | 7353 | 7354 | 1420 | 7356 | 1268 | 7358 | 7359 |
| 7360 | 7361 | 7362 | 7363 | 7364 | 7365 | 1421 | 7367 | 7368 | 7369 | 1607 | 7371 | 7372 | 7373 | 7374 | 7375 | 7376 | 7377 | 7378 | 7379 |
| 7380 | 7381 | 7382 | 7383 | 7384 | 7385 | 301 | 2118 | 1270 | 7389 | 7390 | 7391 | 7392 | 7393 | 7394 | 7395 | 7396 | 7397 | 7398 | 7399 |
| 7400 | 7401 | 7402 | 7403 | 7404 | 7405 | 7406 | 7407 | 7408 | 7409 | 7410 | 7411 | 7412 | 7413 | 7414 | 7415 | 7416 | 7417 | 7418 | 7419 |

| | | | | | | | | | | | | | | | | | | | |
|---|---|---|---|---|---|---|---|---|---|---|---|---|---|---|---|---|---|---|---|
| 7420 | 7421 | 1271 | 7423 | 7424 | 7425 | 7426 | 7427 | 7428 | 7429 | 7430 | 7431 | 7432 | 7433 | 7434 | 7435 | 7436 | 7437 | 7438 | 7439 |
| 7440 | 7441 | 7442 | 7443 | 7444 | 7445 | 7446 | 7447 | 7448 | 7449 | 7450 | 7451 | 1272 | 7453 | 7454 | 7455 | 1647 | 7457 | 7458 | 1732 |
| 7460 | 483 | 1273 | 7463 | 7464 | 7465 | 1274 | 7467 | 7468 | 7469 | 7470 | 7471 | 7472 | 7473 | 7474 | 7475 | 7476 | 7477 | 7478 | 7479 |
| 7480 | 7481 | 98 | 7483 | 7484 | 7485 | 7486 | 7487 | 1275 | 7489 | 7490 | 7491 | 7492 | 7493 | 7494 | 7495 | 7496 | 7497 | 7498 | 7499 |
| 7500 | 353 | 7502 | 7503 | 7504 | 1838 | 7506 | 7507 | 408 | 7509 | 7510 | 7511 | 7512 | 7513 | 7514 | 7515 | 7516 | 1276 | 7518 | 7519 |
| 1277 | 7521 | 7522 | 7523 | 7524 | 7525 | 7526 | 7527 | 7528 | 7529 | 7530 | 7531 | 7532 | 7533 | 49 | 7535 | 7536 | 7537 | 7538 | 7539 |
| 7540 | 7541 | 7542 | 7543 | 7544 | 7545 | 7546 | 7547 | 1278 | 7549 | 7550 | 1864 | 7552 | 1279 | 7554 | 7555 | 7556 | 7557 | 7558 | 7559 |
| 7560 | 7561 | 7562 | 7563 | 7564 | 1280 | 7566 | 7567 | 7568 | 7569 | 7570 | 7571 | 7572 | 7573 | 1422 | 7575 | 7576 | 7577 | 7578 | 7579 |
| 7580 | 7581 | 7582 | 7583 | 2141 | 7585 | 7586 | 7587 | 7588 | 1282 | 2217 | 7591 | 7592 | 7593 | 7594 | 7595 | 7596 | 1962 | 7598 | 7599 |
| 7600 | 7601 | 7602 | 7603 | 7604 | 7605 | 1284 | 7607 | 7608 | 7609 | 1285 | 7611 | 7612 | 7613 | 7614 | 7615 | 2073 | 303 | 7618 | 7619 |
| 7620 | 7621 | 7622 | 7623 | 7624 | 1287 | 7626 | 7627 | 7628 | 7629 | 7630 | 7631 | 7632 | 7633 | 7634 | 7635 | 7636 | 7637 | 7638 | 7639 |
| 1288 | 7641 | 7642 | 7643 | 7644 | 7645 | 7646 | 7647 | 1289 | 7649 | 7650 | 7651 | 7652 | 7653 | 7654 | 7655 | 7656 | 7657 | 7658 | 7659 |
| 7660 | 7661 | 7662 | 7663 | 7664 | 7665 | 7666 | 7667 | 1290 | 2044 | 7670 | 7671 | 111 | 1291 | 7674 | 2030 | 7676 | 7677 | 7678 | 7679 |
| 7680 | 1292 | 7682 | 1293 | 7684 | 7685 | 7686 | 7687 | 456 | 7689 | 7690 | 1796 | 7692 | 7693 | 7694 | 7695 | 7696 | 7697 | 7698 | 7699 |
| 7700 | 7701 | 7702 | 7703 | 1294 | 7705 | 7706 | 7707 | 7708 | 1295 | 7710 | 7711 | 7712 | 330 | 7714 | 7715 | 7716 | 7717 | 7718 | 7719 |
| 7720 | 7721 | 7722 | 7723 | 7724 | 7725 | 7726 | 7727 | 7728 | 7729 | 7730 | 7731 | 7732 | 7733 | 7734 | 7735 | 7736 | 7737 | 7738 | 7739 |
| 7740 | 7741 | 7742 | 7743 | 1549 | 7745 | 7746 | 7747 | 7748 | 7749 | 7750 | 7751 | 7752 | 7753 | 7754 | 7755 | 304 | 1297 | 7758 | 7759 |
| 7760 | 7761 | 7762 | 1298 | 7764 | 7765 | 1425 | 7767 | 1680 | 7769 | 7770 | 7771 | 7772 | 7773 | 7774 | 7775 | 1299 | 7777 | 7778 | 7779 |
| 7780 | 7781 | 7782 | 7783 | 7784 | 7785 | 1300 | 7787 | 7788 | 7789 | 7790 | 7791 | 7792 | 7793 | 7794 | 7795 | 7796 | 7797 | 2198 | 7799 |
| 7800 | 7801 | 7802 | 7803 | 7804 | 7805 | 1301 | 7807 | 7808 | 7809 | 7810 | 7811 | 1302 | 7813 | 1303 | 7815 | 1909 | 7817 | 7818 | 7819 |
| 7820 | 7821 | 7822 | 1426 | 7824 | 1608 | 7826 | 7827 | 7828 | 7829 | 7830 | 7831 | 7832 | 7833 | 7834 | 7835 | 7836 | 1550 | 7838 | 7839 |
| 1609 | 36 | 7842 | 7843 | 7844 | 7845 | 7846 | 7847 | 1305 | 7849 | 7850 | 7851 | 7852 | 7853 | 7854 | 1865 | 7856 | 7857 | 7858 | 1551 |
| 7860 | 1797 | 7862 | 7863 | 7864 | 7865 | 7866 | 1306 | 7868 | 7869 | 7870 | 7871 | 7872 | 7873 | 7874 | 7875 | 306 | 7877 | 7878 | 7879 |
| 7880 | 7881 | 7882 | 7883 | 7884 | 7885 | 1552 | 1308 | 7888 | 7889 | 7890 | 7891 | 7892 | 7893 | 307 | 7895 | 7896 | 99 | 7898 | 7899 |
| 7900 | 1310 | 7902 | 7903 | 7904 | 7905 | 7906 | 7907 | 7908 | 7909 | 7910 | 7911 | 1311 | 7914 | 7915 | 7916 | 7917 | 7918 | 7919 | |
| 1312 | 7921 | 7922 | 7923 | 7924 | 7925 | 7926 | 7927 | 7928 | 7929 | 7930 | 7931 | 7932 | 7933 | 7934 | 7935 | 7936 | 7937 | 7938 | 7939 |
| 1313 | 7941 | 7942 | 7943 | 7944 | 7945 | 7946 | 7947 | 7948 | 7949 | 7950 | 7951 | 7952 | 7953 | 7954 | 7955 | 7956 | 7957 | 7958 | 1314 |
| 2219 | 7961 | 7962 | 7963 | 2005 | 7965 | 7966 | 7967 | 7968 | 7969 | 7970 | 7971 | 7972 | 367 | 7974 | 7975 | 7976 | 7977 | 7978 | 7979 |
| 7980 | 7981 | 7982 | 7983 | 7984 | 1316 | 7986 | 7987 | 7988 | 7989 | 7990 | 7991 | 7992 | 7993 | 7994 | 7995 | 7996 | 7997 | 7998 | 7999 |
| 8000 | 8001 | 8002 | 1456 | 8004 | 8005 | 1317 | 8007 | 8008 | 8009 | 8010 | 8011 | 8012 | 8013 | 8014 | 8015 | 1318 | 8017 | 8018 | 8019 |
| 8020 | 8021 | 8022 | 8023 | 8024 | 8025 | 8026 | 8027 | 1319 | 8029 | 8030 | 8031 | 8032 | 8033 | 8034 | 8035 | 1428 | 8037 | 8038 | 1910 |
| 8040 | 8041 | 8042 | 8043 | 8044 | 1651 | 8046 | 8047 | 1320 | 8049 | 8050 | 8051 | 8052 | 8053 | 8054 | 8055 | 8056 | 308 | 8058 | 8059 |
| 8060 | 8061 | 8062 | 8063 | 8064 | 8065 | 8066 | 8067 | 8068 | 8069 | 8070 | 8071 | 8072 | 8073 | 8074 | 8075 | 8076 | 8077 | 8078 | 8079 |
| 8080 | 1735 | 8082 | 1565 | 8084 | 8085 | 8086 | 8087 | 8088 | 8089 | 8090 | 8091 | 8092 | 8093 | 8094 | 1322 | 8096 | 8097 | 8098 | 8099 |
| 1323 | 8101 | 8102 | 8103 | 8104 | 8105 | 8106 | 8107 | 309 | 8109 | 1325 | 8111 | 8112 | 1429 | 8114 | 8115 | 8116 | 8117 | 8118 | 1326 |
| 8120 | 8121 | 1327 | 8123 | 8124 | 1328 | 8126 | 8127 | 1329 | 8129 | 8130 | 8131 | 8132 | 8133 | 8134 | 8135 | 8136 | 8137 | 8138 | 8139 |
| 8140 | 8141 | 8142 | 8143 | 8144 | 1430 | 8146 | 8147 | 8148 | 8149 | 8150 | 8151 | 1330 | 8153 | 8154 | 8155 | 344 | 8157 | 8158 | 1331 |
| 8160 | 1923 | 8162 | 8163 | 8164 | 8165 | 8166 | 8167 | 8168 | 8169 | 8170 | 8171 | 8172 | 8173 | 8174 | 8175 | 8176 | 8177 | 8178 | 8179 |
| 8180 | 1332 | 8182 | 8183 | 8184 | 8185 | 8186 | 8187 | 8188 | 8189 | 8190 | 1333 | 8192 | 8193 | 8194 | 8195 | 310 | 8197 | 1554 | 8199 |
| 8200 | 8201 | 1335 | 8203 | 8204 | 8205 | 8206 | 8207 | 8208 | 8209 | 355 | 8211 | 8212 | 8213 | 8214 | 8215 | 8216 | 8217 | 8218 | 8219 |
| 1336 | 8221 | 8222 | 1431 | 1337 | 8225 | 8226 | 8227 | 8228 | 123 | 8230 | 8231 | 311 | 8233 | 8234 | 1736 | 1339 | 8237 | 8238 | 8239 |
| 8240 | 8241 | 1840 | 1556 | 90 | 8245 | 8246 | 8247 | 8248 | 1737 | 8250 | 8251 | 8252 | 8253 | 8254 | 8255 | 8256 | 8257 | 1799 | 8259 |
| 8260 | 1911 | 8262 | 8263 | 1558 | 8265 | 8266 | 8267 | 2088 | 8269 | 8270 | 8271 | 1341 | 8273 | 8274 | 8275 | 8276 | 8277 | 8278 | 8279 |
| 8280 | 1649 | 356 | 312 | 8284 | 8285 | 8286 | 8287 | 8288 | 8289 | 8290 | 8291 | 8292 | 8293 | 8294 | 8295 | 8296 | 8297 | 504 | 8299 |
| 8300 | 8301 | 8302 | 8303 | 2220 | 8305 | 8306 | 8307 | 1738 | 1841 | 8310 | 8311 | 472 | 8313 | 8314 | 8315 | 8316 | 8317 | 1343 | 1668 |
| 8320 | 8321 | 8322 | 430 | 8324 | 8325 | 8326 | 8327 | 8328 | 8329 | 8330 | 8331 | 8332 | 1344 | 8334 | 8335 | 1345 | 1346 | 8338 | 8339 |
| 2039 | 8341 | 2019 | 8343 | 8344 | 1348 | 2023 | 1349 | 8348 | 8349 | 8350 | 8351 | 8352 | 8353 | 8354 | 20 | 8356 | 8357 | 8358 | 8359 |
| 1350 | 8361 | 8362 | 8363 | 8364 | 8365 | 8366 | 8367 | 8368 | 8369 | 8370 | 8371 | 8372 | 8373 | 8374 | 8375 | 8376 | 8377 | 8378 | 8379 |
| 8380 | 1351 | 8382 | 8383 | 8384 | 8385 | 8386 | 8387 | 8388 | 8389 | 8390 | 1352 | 8392 | 8393 | 8394 | 1353 | 8396 | 8397 | 8398 | 8399 |
| 8400 | 8401 | 8402 | 8403 | 8404 | 8405 | 8406 | 8407 | 8408 | 8409 | 8410 | 8411 | 8412 | 8413 | 8414 | 8415 | 8416 | 8417 | 1560 | 8419 |
| 357 | 8421 | 8422 | 8423 | 8424 | 8425 | 8426 | 1354 | 8428 | 8429 | 8430 | 8431 | 1355 | 8433 | 8434 | 8435 | 8436 | 1739 | 8438 | 8439 |
| 8440 | 1434 | 8442 | 8443 | 8444 | 8445 | 8446 | 8447 | 8448 | 8449 | 8450 | 8451 | 8452 | 8453 | 8454 | 8455 | 2026 | 8457 | 8458 | 8459 |
| 8460 | 8461 | 1356 | 8463 | 8464 | 8465 | 8466 | 8467 | 8468 | 8469 | 8470 | 8471 | 1487 | 1357 | 8474 | 8475 | 8476 | 8477 | 8478 | 8479 |
| 8480 | 8481 | 8482 | 8483 | 8484 | 8485 | 8486 | 8487 | 8488 | 8489 | 8490 | 8491 | 8492 | 8493 | 8494 | 1358 | 8496 | 8497 | 8498 | 8499 |
| 8500 | 8501 | 8502 | 8503 | 8504 | 8505 | 8506 | 8507 | 8508 | 8509 | 8510 | 8511 | 8512 | 1359 | 8514 | 8515 | 8516 | 8517 | 2089 | 8519 |
| 1360 | 8521 | 8522 | 8523 | 8524 | 8525 | 8526 | 8527 | 8528 | 8529 | 8530 | 8531 | 8532 | 8533 | 8534 | 8535 | 8536 | 8537 | 8538 | 8539 |
| 8540 | 8541 | 8542 | 8543 | 1488 | 8545 | 8546 | 8547 | 8548 | 8549 | 313 | 8551 | 8552 | 8553 | 1362 | 8555 | 8556 | 8557 | 8558 | 8559 |
| 8560 | 8561 | 8562 | 8563 | 8564 | 8565 | 1800 | 8567 | 8568 | 8569 | 8570 | 8571 | 8572 | 8573 | 8574 | 8575 | 1363 | 8577 | 8578 | 8579 |
| 8580 | 8581 | 8582 | 8583 | 8584 | 8585 | 8586 | 8587 | 8588 | 8589 | 8590 | 8591 | 1435 | 8593 | 8594 | 8595 | 8596 | 8597 | 8598 | 8599 |
| 8600 | 8601 | 8602 | 8603 | 8604 | 8605 | 8606 | 8607 | 8608 | 8609 | 8610 | 8611 | 8612 | 8613 | 8614 | 8615 | 8616 | 8617 | 8618 | 8619 |
| 8620 | 314 | 8622 | 8623 | 8624 | 8625 | 8626 | 8627 | 8628 | 8629 | 8630 | 8631 | 8632 | 8633 | 8634 | 8635 | 8636 | 8637 | 8638 | 8639 |
| 8640 | 1365 | 8642 | 8643 | 8644 | 8645 | 8646 | 8647 | 1366 | 8649 | 8650 | 8651 | 8652 | 8653 | 8654 | 1367 | 8656 | 8657 | 1368 | 1489 |
| 1369 | 8661 | 8662 | 8663 | 8664 | 8665 | 8666 | 8667 | 8668 | 116 | 8670 | 8671 | 8672 | 1740 | 8674 | 8675 | 8676 | 8677 | 8678 | 8679 |
| 8680 | 24 | 8682 | 391 | 8684 | 8685 | 8686 | 8687 | 8688 | 8689 | 8690 | 8691 | 8692 | 8693 | 8694 | 1370 | 8696 | 8697 | 8698 | 8699 |
| 8700 | 8701 | 8702 | 8703 | 8704 | 8705 | 8706 | 8707 | 8708 | 2199 | 8710 | 8711 | 8712 | 8713 | 315 | 92 | 8716 | 8717 | 8718 | 1372 |
| 8720 | 8721 | 8722 | 8723 | 8724 | 8725 | 8726 | 8727 | 8728 | 1373 | 8730 | 8731 | 334 | 8733 | 8734 | 8735 | 8736 | 8737 | 8738 | 8739 |
| 8740 | 8741 | 8742 | 8743 | 1925 | 8745 | 8746 | 8747 | 8748 | 8749 | 358 | 8751 | 1374 | 8753 | 8754 | 8755 | 8756 | 8757 | 8758 | 8759 |
| 8760 | 8761 | 1375 | 8763 | 8764 | 8765 | 1742 | 8767 | 8768 | 8769 | 8770 | 8771 | 8772 | 8773 | 8774 | 8775 | 8776 | 8777 | 8778 | 8779 |
| 8780 | 8781 | 8782 | 8783 | 8784 | 8785 | 8786 | 1376 | 8788 | 8789 | 8790 | 8791 | 8792 | 8793 | 8794 | 8795 | 8796 | 316 | 8798 | 8799 |
| 8800 | 8801 | 8802 | 8803 | 8804 | 8805 | 8806 | 8807 | 8808 | 8809 | 8810 | 8811 | 8812 | 8813 | 1438 | 8815 | 1890 | 8817 | 8818 | 8819 |
| 8820 | 8821 | 8822 | 1378 | 8824 | 1379 | 8826 | 8827 | 93 | 8829 | 8830 | 8831 | 8832 | 8833 | 1843 | 8835 | 8836 | 1380 | 8838 | 8839 |
| 8840 | 8841 | 8842 | 8843 | 8844 | 8845 | 8846 | 8847 | 8848 | 8849 | 8850 | 8851 | 8852 | 8853 | 8854 | 8855 | 8856 | 8857 | 8858 | 8859 |
| 8860 | 8861 | 8862 | 8863 | 8864 | 8865 | 8866 | 8867 | 8868 | 8869 | 8870 | 8871 | 8872 | 8873 | 8874 | 8875 | 8876 | 86 | 1801 | 8879 |
| 8880 | 8881 | 8882 | 8883 | 1947 | 8885 | 1440 | 8887 | 8888 | 8889 | 8890 | 8891 | 8892 | 8893 | 8894 | 8 | 8896 | 8897 | 8898 | 8899 |
| 8900 | 8901 | 8902 | 8903 | 8904 | 8905 | 8906 | 8907 | 1441 | 8909 | 1844 | 8911 | 8912 | 8913 | 8914 | 8915 | 8916 | 8917 | 8918 | 8919 |
| 8920 | 8921 | 1611 | 8923 | 8924 | 8925 | 8926 | 8927 | 8928 | 8929 | 8930 | 8931 | 8932 | 8933 | 8934 | 8935 | 1383 | 8937 | 8938 | 8939 |
| 8940 | 8941 | 8942 | 8943 | 8944 | 8945 | 1384 | 319 | 8948 | 8949 | 8950 | 8951 | 8952 | 8953 | 8954 | 8955 | 8956 | 8957 | 8958 | 8959 |
| 8960 | 8961 | 8962 | 8963 | 8964 | 8965 | 8966 | 8967 | 8968 | 8969 | 8970 | 8971 | 8972 | 8973 | 8974 | 8975 | 8976 | 8977 | 8978 | 8979 |
| 8980 | 8981 | 8982 | 8983 | 1386 | 2218 | 8986 | 8987 | 1442 | 8989 | 8990 | 1802 | 8992 | 8993 | 8994 | 8995 | 8996 | 8997 | 1387 | 8999 |
| 9000 | 9001 | 9002 | 9003 | 9004 | 9005 | 9006 | 9007 | 9008 | 9009 | 9010 | 9011 | 9012 | 9013 | 9014 | 9015 | 9016 | 9017 | 9018 | 9019 |

-continued

| 9020 | 9021 | 9022 | 9023 | 9024 | 9025 | 9026 | 9027 | 9028 | 9029 | 9030 | 88   | 9032 | 465  | 9034 | 9035 | 1389 | 9037 | 1443 | 9039 |
|------|------|------|------|------|------|------|------|------|------|------|------|------|------|------|------|------|------|------|------|
| 9040 | 9041 | 9042 | 9043 | 9044 | 9045 | 9046 | 9047 | 9048 | 9049 | 9050 | 9051 | 9052 | 9053 | 9054 | 9055 | 9056 | 9057 | 1650 | 9059 |
| 9060 | 2265 | 9062 | 9063 | 9064 | 1983 | 9066 | 9067 | 9068 | 9069 | 9070 | 9071 | 9072 | 9073 | 9074 | 9075 | 9076 | 9077 | 9078 | 9079 |
| 9080 | 9081 | 9082 | 9083 | 1390 | 9085 | 9086 | 9087 | 9088 | 9089 | 9090 | 1563 | 9092 | 9093 | 9094 | 9095 | 9096 | 9097 | 9098 | 9099 |
| 1743 | 9101 | 9102 | 9103 | 9104 | 9105 | 9106 | 9107 | 9108 | 9109 | 9110 | 9111 | 9112 | 9113 | 9114 | 9115 | 9116 | 9117 | 9118 | 9119 |
| 9120 | 9121 | 1391 | 9123 | 9124 | 9125 | 9126 | 9127 | 9128 | 1445 | 9130 | 9131 | 9132 | 9133 | 9134 | 9135 | 9136 | 9137 | 9138 | 9139 |
| 9140 | 9141 | 9142 | 9143 | 9144 | 9145 | 9146 | 336  | 9148 | 9149 | 9150 | 9151 | 1564 | 9153 | 9154 | 9155 | 1888 | 9157 | 9158 | 9159 |
| 9160 | 9161 | 9162 | 9163 | 9164 | 9165 | 9166 | 9167 | 9168 | 9169 | 9170 | 9171 | 9172 | 9173 | 2134 | 9175 | 9176 | 9177 | 9178 | 9179 |
| 9180 | 9181 | 9182 | 9183 | 9184 | 9185 | 9186 | 9187 | 9188 | 9189 | 9190 | 9191 | 9192 | 9193 | 9194 | 9195 | 9196 | 9197 | 9198 | 9199 |
| 9200 | 9201 | 9202 | 9203 | 9204 | 9205 | 9206 | 9207 | 9208 | 9209 | 9210 | 9211 | 9212 | 9213 | 1392 | 9215 |      |      |      |      |

Figure 6:
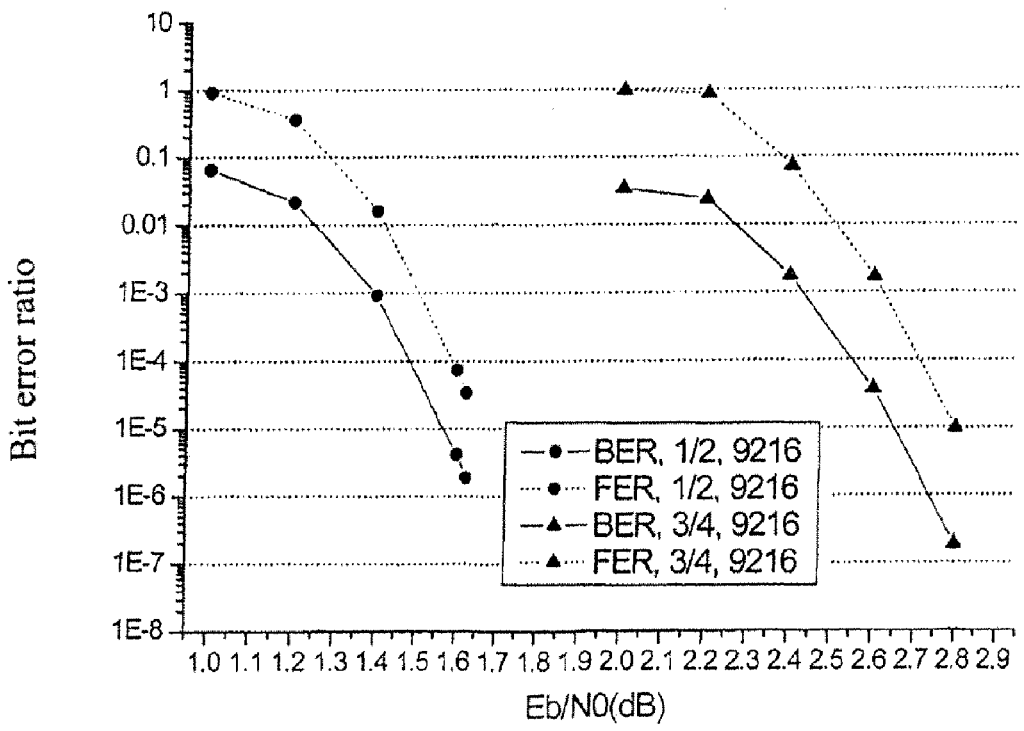
FIG. 6 is a performance curve chart of the LDPC code constructed according to the method of the invention.

Performances of the LDPC code constructed based on above two embodiments are shown in FIG. 6. According to theoretical analysis, when bit error ratio of a (3,6) regular LDPC code with a code rate of ½ approaches the theoretical limit of 10e-5, Eb/No is 1.12dB. From the simulation result in the figure, when the bit error ratio of the LDPC code constructed according to the constructing method of the present invention is 10e-5, the Eb/No is about 1.6dB which is approximating theoretical limit and has very excellent performance. And the LDPC code with a code rate of ¾ has the similar conclusion.

Third Embodiment

A 2304×9216 check matrix is constructed according to another method of the invention.

Firstly, a common factor set of 2304 and 9216 is obtained, which is denoted as $F_c$.

Secondly, a proper extending ratio K is selected, wherein $K \epsilon F_c$. In the present embodiment, the extending ratio is selected to be a common factor 256. Thus, the fundamental matrix with dimensions of 9×36 is obtained. The fundamental matrix can be generated in any manner known in the art.

For each non-zero element in the fundamental matrix with dimensions of 18×36, a set of row extending coefficients $\{k_i, 0 \leq k_i \leq 255, i \epsilon Z^+\}$ which are different from each other are selected for extension, in which $0 \leq k_i \leq 255$. Specifically:

If the non-zero element has a row-column coordinate (m, n), there will be "1" in the positions ($k_i \times 9+m$, n), thus after the extension, a 2304×36 matrix will be generated.

After row extension, the generated 2304×36 matrix is extended by columns, and each column of the matrix is extended to 256 columns. Specifically, for the first column of the 2304×36 matrix, it is cyclic shift rightward by t×9 to obtain the $t^{th}$ column of the extended first column, where $0 \leq t \leq 255$. For the second column, the above extending method is repeated, and according to this rule, all columns thereof are traversed, thus generating a 2304×9216 check matrix.

Although the present invention is described in conjunction with the examples and embodiments, the present invention is not intended to be limited thereto. On the contrary, the present invention obviously covers the various modifications and may equivalences, which are all enclosed in the scope of the following claims.

What is claimed is:

1. A method for constructing a low density parity check (LDPC) code check matrix using a processor, in the case that the constructed check matrix has dimensions of M×N, the method comprising the following steps:
   using a processor to obtain a common factor set $F_c$ of M and N, where M and N denote positive integers;
   using a processor to select a proper extending ratio $K \epsilon F_c$ and generating a fundamental matrix with dimensions $M_B \times N_B$ using any manner, in which $M_B = M/K, N_B = N/K$;
   using a processor to extend the fundamental matrix by columns and constructing a $M_B \times N$ matrix, the step comprising:
   for non-zero elements with row-column coordinate (m,n) in the fundamental matrix, selecting a set of column extending coefficients $\{k_i, 0 \leq k_i \leq K-1, i \epsilon Z^+\}$ which are different from each other, with "1" on positions ($m, k_i \times N_B + n$) of the $M_B \times N$ matrix, where the $Z^+$ denotes the set of positive integers; and
   using a processor to extend K rows based on each row of the constructed $M_B \times N$ matrix.

2. The method according to claim 1, wherein the step of using a processor to extend K rows based on each row of the constructed $M_B \times N$ matrix comprising:
   the $t^{th}$ row extended by a certain row of the constructed $M_B \times N$ matrix is obtained by cyclic shifting $t \times N_B$ positions rightward, where $0 \leq t \leq K-1$.

3. The method according to claim 1, wherein the $M_B \times N$ matrix is stored in code table form, and each row of the code table records positions of "1" in each row of the $M_B \times N$ matrix.

4. The method according to claim 1, wherein in the case that $M_B = 18$, $N_B = 36$ and $K = 256$, the row code table of the 18×9216 matrix is as follows:

| 0 | 6    | 12   | 18   | 25   | 30   |
|---|------|------|------|------|------|
| 0 | 7    | 19   | 26   | 31   | 5664 |
| 0 | 8    | 13   | 20   | 32   | 8270 |
| 1 | 6    | 14   | 21   | 3085 | 8959 |
| 1 | 15   | 27   | 33   | 9128 | 9188 |
| 1 | 9    | 16   | 34   | 8485 | 9093 |
| 2 | 6    | 28   | 35   | 4156 | 7760 |
| 2 | 10   | 17   | 7335 | 7545 | 9138 |
| 2 | 11   | 22   | 5278 | 8728 | 8962 |
| 3 | 7    | 2510 | 4765 | 8637 | 8875 |
| 3 | 4653 | 4744 | 7541 | 9175 | 9198 |
| 3 | 23   | 2349 | 9012 | 9107 | 9168 |
| 4 | 7    | 29   | 5921 | 7774 | 8946 |
| 4 | 7224 | 8074 | 8339 | 8725 | 9212 |
| 4 | 4169 | 8650 | 8780 | 9023 | 9159 |
| 5 | 8    | 6638 | 8986 | 9064 | 9210 |
| 5 | 2107 | 7787 | 8655 | 9141 | 9171 |
| 5 | 24   | 5939 | 8507 | 8906 | 9173.|

5. The method according to claim 1, wherein in the case that $M_B = 18$, $N_B = 36$ and $K = 256$, the row code table of the 18×9216 matrix is as follows:

0 3 6 12 16 18 21 24 27 31 34 7494
0 4 10 13 25 28 5233 6498 7018 8358 8805 9211
0 7 11 19 22 6729 6831 7913 8944 9013 9133 9184

-continued

```
1 3 8 14 17 20 29 32 5000 5985 7189 7906
1 9 4612 5523 6456 7879 8487 8952 9081 9129 9164 9214
1 5 23 26 33 35 7135 8525 8983 9015 9048 9154
2 3 30 3652 4067 5123 7808 7838 8231 8474 8791 9162
2 35 3774 4310 6827 6917 8264 8416 8542 8834 9044 9089
2 15 631 1077 6256 7859 8069 8160 8657 8958 9094 9116.
```

6. An encoding method using the M×N check matrix constructed according to claim 1 using a processor, comprising the following steps:

using a processor to construct a sorting table IDX with a length of N, in which IDX={$I_k$}, $0 \leq k < N, 0 \leq I_k < N$;

using a processor to re-sort the column of the M×N check matrix according to the sort table IDX to generate a matrix H' with dimensions of M×N, the $k^{th}$ column of the matrix H' being the $I_k^{th}$ column of the original M×N matrix, the obtained matrix being capable of being further separated into two sub matrices, H'=[$H_P$ $H_I$], in which $H_I$ is a matrix with a dimension of M×(N−M) and $H_P$ is a matrix with a dimension of M×M;

a step of inputting sequence and constructing a column vector m with a dimension of (N−M)×1, and calculating the column vector with a dimension of M×1, $p^T = (H_p^{-1} H_I)^T m$;

a step of outputting the sort result based on the sorting table IDX in which $$c_{I_k} = \begin{cases} p_k & 0 \leq k < N - M \\ m_{k-N+M} & N - M \leq k < N. \end{cases}$$

7. An encoding device, which encodes inputted binary information using the encoding method according to claim 6 and outputs system code sequence which is encoded and position transformed, the encoding device comprising:

a matrix multiply module outputting a check sequence p which is obtained by multiplying the binary information sequence m with a matrix $(H_P^{-1} H_I)^T$, i.e., $p^{T=m(H_I^T H_P^{-1})^T}$;

a sorting index module having N memory units which store index values of a sorting table IDX in turn; and a sorting output module which sorts m and p based on the index values stored in the sorting index table and outputs a code word c.

8. The device according to claim 7, wherein, in the case that the M×N check matrix is a 4608×9216 check matrix, the sorting table IDX is as follows:

| 0 | 1 | 2 | 3 | 4 | 5 | 9 | 10 | 11 | 13 | 15 | 16 | 17 | 19 | 20 | 22 | 23 | 24 | 26 | 27 |
|---|---|---|---|---|---|---|---|---|---|---|---|---|---|---|---|---|---|---|---|
| 31 | 32 | 33 | 34 | 36 | 37 | 38 | 39 | 41 | 45 | 46 | 47 | 49 | 51 | 52 | 53 | 55 | 56 | 58 | 59 |
| 60 | 62 | 65 | 67 | 68 | 69 | 70 | 72 | 73 | 74 | 79 | 81 | 82 | 83 | 85 | 87 | 88 | 89 | 91 | 92 |
| 94 | 96 | 98 | 101 | 103 | 104 | 105 | 106 | 108 | 110 | 115 | 117 | 118 | 119 | 121 | 122 | 125 | 127 | 128 | 130 |
| 132 | 134 | 137 | 139 | 144 | 146 | 151 | 153 | 154 | 155 | 157 | 158 | 161 | 163 | 164 | 166 | 167 | 170 | 173 | 175 |
| 180 | 182 | 184 | 189 | 190 | 191 | 193 | 194 | 197 | 199 | 200 | 202 | 206 | 211 | 216 | 218 | 223 | 225 | 226 | 227 |
| 229 | 230 | 233 | 235 | 236 | 238 | 239 | 242 | 245 | 247 | 252 | 254 | 259 | 261 | 262 | 263 | 265 | 266 | 269 | 271 |
| 272 | 274 | 275 | 276 | 278 | 281 | 283 | 288 | 292 | 297 | 298 | 301 | 302 | 307 | 308 | 309 | 311 | 314 | 319 | 323 |
| 324 | 328 | 333 | 334 | 337 | 338 | 343 | 344 | 345 | 350 | 355 | 359 | 360 | 369 | 370 | 373 | 374 | 379 | 380 | 381 |
| 384 | 386 | 388 | 389 | 391 | 396 | 398 | 400 | 405 | 406 | 407 | 409 | 413 | 415 | 416 | 417 | 418 | 420 | 422 | 427 |
| 428 | 432 | 434 | 442 | 443 | 445 | 449 | 451 | 452 | 453 | 454 | 456 | 458 | 461 | 463 | 464 | 468 | 470 | 478 | 479 |
| 481 | 485 | 487 | 488 | 489 | 490 | 492 | 494 | 497 | 499 | 504 | 514 | 517 | 523 | 524 | 525 | 528 | 530 | 533 | 535 |
| 539 | 540 | 545 | 550 | 553 | 559 | 560 | 561 | 564 | 566 | 571 | 575 | 576 | 581 | 586 | 589 | 595 | 596 | 597 | 600 |
| 602 | 604 | 607 | 612 | 614 | 619 | 622 | 623 | 625 | 629 | 631 | 632 | 633 | 634 | 638 | 643 | 648 | 650 | 655 | 658 |
| 659 | 661 | 665 | 667 | 668 | 669 | 670 | 674 | 679 | 684 | 686 | 691 | 694 | 695 | 697 | 698 | 701 | 703 | 704 | 705 |
| 706 | 710 | 715 | 720 | 722 | 730 | 731 | 733 | 734 | 737 | 739 | 740 | 741 | 742 | 743 | 746 | 751 | 756 | 758 | 766 |
| 767 | 769 | 770 | 773 | 775 | 776 | 777 | 778 | 782 | 787 | 792 | 794 | 802 | 803 | 805 | 809 | 811 | 812 | 813 | 814 |
| 818 | 823 | 828 | 830 | 838 | 839 | 841 | 845 | 847 | 848 | 849 | 850 | 854 | 859 | 864 | 866 | 874 | 875 | 877 | 881 |
| 883 | 884 | 885 | 886 | 887 | 890 | 895 | 900 | 902 | 904 | 910 | 911 | 913 | 914 | 917 | 919 | 920 | 921 | 922 | 923 |
| 926 | 931 | 936 | 938 | 940 | 946 | 947 | 949 | 950 | 953 | 955 | 956 | 957 | 958 | 959 | 962 | 967 | 974 | 982 | 983 |
| 984 | 986 | 989 | 991 | 993 | 994 | 1010 | 1018 | 1019 | 1020 | 1025 | 1027 | 1029 | 1030 | 1046 | 1054 | 1055 | 1056 | 1061 | 1063 |
| 1065 | 1066 | 1082 | 1090 | 1091 | 1092 | 1095 | 1097 | 1099 | 1101 | 1102 | 1118 | 1120 | 1126 | 1127 | 1128 | 1133 | 1135 | 1137 | 1138 |
| 1143 | 1154 | 1156 | 1162 | 1163 | 1164 | 1169 | 1171 | 1173 | 1174 | 1179 | 1190 | 1198 | 1199 | 1200 | 1205 | 1207 | 1209 | 1210 | 1215 |
| 1226 | 1234 | 1235 | 1236 | 1241 | 1243 | 1245 | 1246 | 1251 | 1262 | 1270 | 1271 | 1272 | 1277 | 1279 | 1281 | 1282 | 1287 | 1298 | 1306 |
| 1307 | 1308 | 1313 | 1315 | 1317 | 1318 | 1323 | 1334 | 1335 | 1339 | 1342 | 1343 | 1344 | 1349 | 1353 | 1354 | 1359 | 1370 | 1371 | 1375 |
| 1378 | 1379 | 1380 | 1385 | 1389 | 1390 | 1395 | 1405 | 1406 | 1407 | 1411 | 1413 | 1414 | 1415 | 1416 | 1420 | 1421 | 1426 | 1431 | 1437 |
| 1438 | 1441 | 1442 | 1443 | 1447 | 1449 | 1451 | 1452 | 1456 | 1457 | 1462 | 1467 | 1473 | 1474 | 1477 | 1478 | 1479 | 1483 | 1485 | 1487 |
| 1488 | 1492 | 1498 | 1503 | 1509 | 1510 | 1511 | 1513 | 1514 | 1515 | 1519 | 1521 | 1523 | 1524 | 1528 | 1534 | 1539 | 1545 | 1546 | 1547 |
| 1549 | 1550 | 1551 | 1555 | 1557 | 1559 | 1560 | 1564 | 1570 | 1575 | 1581 | 1582 | 1583 | 1585 | 1586 | 1587 | 1591 | 1593 | 1595 | 1596 |
| 1600 | 1606 | 1611 | 1617 | 1618 | 1619 | 1621 | 1622 | 1623 | 1627 | 1629 | 1631 | 1632 | 1636 | 1642 | 1647 | 1653 | 1655 | 1657 | 1658 |
| 1659 | 1663 | 1665 | 1667 | 1668 | 1672 | 1678 | 1689 | 1691 | 1693 | 1699 | 1701 | 1702 | 1704 | 1708 | 1725 | 1727 | 1729 | 1735 | 1737 |
| 1738 | 1740 | 1744 | 1761 | 1763 | 1765 | 1771 | 1773 | 1774 | 1776 | 1780 | 1791 | 1797 | 1799 | 1801 | 1807 | 1809 | 1810 | 1812 | 1816 |
| 1823 | 1827 | 1833 | 1835 | 1837 | 1843 | 1845 | 1846 | 1848 | 1852 | 1859 | 1863 | 1869 | 1871 | 1873 | 1879 | 1881 | 1882 | 1884 | 1888 |
| 1895 | 1905 | 1907 | 1909 | 1915 | 1917 | 1918 | 1920 | 1924 | 1925 | 1931 | 1941 | 1943 | 1944 | 1945 | 1951 | 1952 | 1953 | 1954 | 1957 |
| 1960 | 1963 | 1964 | 1967 | 1970 | 1975 | 1977 | 1979 | 1980 | 1981 | 1983 | 1988 | 1989 | 1990 | 1993 | 1996 | 1997 | 2000 | 2003 | 2006 |
| 2007 | 2011 | 2013 | 2015 | 2016 | 2017 | 2025 | 2026 | 2029 | 2032 | 2033 | 2036 | 2039 | 2042 | 2043 | 2049 | 2051 | 2052 | 2061 | 2062 |
| 2065 | 2069 | 2072 | 2078 | 2087 | 2088 | 2097 | 2098 | 2102 | 2105 | 2108 | 2114 | 2123 | 2124 | 2133 | 2134 | 2137 | 2138 | 2141 | 2144 |
| 2150 | 2152 | 2155 | 2159 | 2160 | 2169 | 2170 | 2173 | 2174 | 2177 | 2180 | 2186 | 2188 | 2191 | 2195 | 2196 | 2205 | 2206 | 2209 | 2210 |
| 2213 | 2216 | 2222 | 2224 | 2227 | 2231 | 2232 | 2239 | 2241 | 2242 | 2245 | 2246 | 2249 | 2252 | 2258 | 2260 | 2267 | 2268 | 2272 | 2277 |
| 2278 | 2282 | 2285 | 2288 | 2289 | 2294 | 2296 | 2303 | 2304 | 2308 | 2313 | 2314 | 2318 | 2321 | 2323 | 2324 | 2330 | 2332 | 2339 | 2340 |
| 2344 | 2349 | 2350 | 2354 | 2357 | 2359 | 2360 | 2366 | 2368 | 2375 | 2376 | 2380 | 2385 | 2386 | 2390 | 2393 | 2395 | 2396 | 2402 | 2404 |
| 2411 | 2412 | 2416 | 2422 | 2426 | 2429 | 2431 | 2432 | 2433 | 2438 | 2440 | 2447 | 2448 | 2452 | 2458 | 2462 | 2464 | 2465 | 2467 | 2468 |
| 2469 | 2474 | 2476 | 2484 | 2491 | 2493 | 2494 | 2498 | 2501 | 2503 | 2504 | 2505 | 2512 | 2520 | 2524 | 2530 | 2534 | 2536 | 2537 | 2539 |
| 2540 | 2544 | 2548 | 2556 | 2558 | 2566 | 2567 | 2570 | 2573 | 2575 | 2576 | 2578 | 2585 | 2592 | 2594 | 2602 | 2603 | 2606 | 2609 | 2611 |
| 2612 | 2614 | 2621 | 2628 | 2630 | 2638 | 2639 | 2642 | 2645 | 2648 | 2650 | 2652 | 2657 | 2664 | 2666 | 2671 | 2673 | 2674 | 2675 | 2678 |
| 2681 | 2683 | 2684 | 2686 | 2688 | 2690 | 2700 | 2702 | 2707 | 2709 | 2710 | 2711 | 2714 | 2716 | 2717 | 2719 | 2720 | 2722 | 2724 | 2734 |
| 2736 | 2738 | 2743 | 2745 | 2746 | 2747 | 2750 | 2752 | 2753 | 2755 | 2756 | 2758 | 2772 | 2774 | 2779 | 2781 | 2782 | 2783 | 2786 | 2789 |
| 2791 | 2792 | 2794 | 2798 | 2808 | 2810 | 2815 | 2817 | 2818 | 2819 | 2822 | 2825 | 2827 | 2828 | 2830 | 2834 | 2844 | 2846 | 2851 | 2854 |

-continued

| | | | | | | | | | | | | | | | | | | | |
|---|---|---|---|---|---|---|---|---|---|---|---|---|---|---|---|---|---|---|---|
| 2855 | 2858 | 2860 | 2861 | 2863 | 2864 | 2866 | 2868 | 2880 | 2882 | 2890 | 2891 | 2894 | 2896 | 2899 | 2900 | 2902 | 2904 | 2909 | 2918 |
| 2923 | 2926 | 2927 | 2928 | 2930 | 2932 | 2938 | 2940 | 2945 | 2954 | 2959 | 2962 | 2963 | 2964 | 2968 | 2973 | 2974 | 2976 | 2981 | 2994 |
| 2995 | 2997 | 2998 | 3005 | 3009 | 3012 | 3017 | 3023 | 3025 | 3026 | 3033 | 3034 | 3035 | 3036 | 3040 | 3041 | 3043 | 3046 | 3048 | 3051 |
| 3053 | 3057 | 3058 | 3061 | 3062 | 3070 | 3071 | 3072 | 3076 | 3077 | 3079 | 3082 | 3084 | 3089 | 3093 | 3097 | 3098 | 3105 | 3106 | 3107 |
| 3108 | 3112 | 3113 | 3115 | 3118 | 3120 | 3122 | 3125 | 3127 | 3129 | 3134 | 3139 | 3142 | 3143 | 3144 | 3149 | 3153 | 3154 | 3156 | 3161 |
| 3165 | 3169 | 3170 | 3175 | 3177 | 3178 | 3179 | 3180 | 3184 | 3185 | 3190 | 3192 | 3195 | 3197 | 3201 | 3205 | 3211 | 3214 | 3216 | 3220 |
| 3221 | 3228 | 3237 | 3238 | 3239 | 3241 | 3243 | 3245 | 3247 | 3250 | 3252 | 3256 | 3257 | 3264 | 3273 | 3275 | 3277 | 3278 | 3279 | 3286 |
| 3287 | 3288 | 3292 | 3293 | 3295 | 3298 | 3309 | 3313 | 3315 | 3321 | 3324 | 3328 | 3331 | 3340 | 3345 | 3349 | 3351 | 3357 | 3359 | 3360 |
| 3364 | 3367 | 3370 | 3376 | 3381 | 3382 | 3385 | 3387 | 3390 | 3391 | 3393 | 3395 | 3398 | 3400 | 3406 | 3419 | 3421 | 3423 | 3427 | 3429 |
| 3431 | 3432 | 3436 | 3442 | 3447 | 3453 | 3455 | 3456 | 3457 | 3459 | 3464 | 3465 | 3467 | 3469 | 3472 | 3476 | 3478 | 3487 | 3488 | 3489 |
| 3491 | 3492 | 3493 | 3495 | 3500 | 3501 | 3505 | 3508 | 3512 | 3523 | 3524 | 3525 | 3527 | 3528 | 3535 | 3537 | 3541 | 3542 | 3548 | 3557 |
| 3560 | 3563 | 3564 | 3571 | 3573 | 3574 | 3577 | 3584 | 3585 | 3592 | 3593 | 3595 | 3596 | 3599 | 3600 | 3607 | 3609 | 3610 | 3613 | 3614 |
| 3620 | 3628 | 3632 | 3635 | 3636 | 3643 | 3645 | 3646 | 3649 | 3650 | 3655 | 3656 | 3664 | 3668 | 3671 | 3672 | 3679 | 3681 | 3685 | 3692 |
| 3693 | 3700 | 3707 | 3708 | 3717 | 3721 | 3722 | 3724 | 3728 | 3736 | 3742 | 3743 | 3744 | 3753 | 3757 | 3764 | 3765 | 3772 | 3773 | 3779 |
| 3780 | 3789 | 3790 | 3793 | 3799 | 3800 | 3801 | 3809 | 3812 | 3815 | 3816 | 3823 | 3825 | 3826 | 3829 | 3832 | 3836 | 3837 | 3842 | 3844 |
| 3848 | 3851 | 3852 | 3859 | 3861 | 3862 | 3865 | 3872 | 3873 | 3878 | 3880 | 3884 | 3887 | 3888 | 3892 | 3901 | 3902 | 3908 | 3914 | 3923 |
| 3924 | 3937 | 3938 | 3943 | 3944 | 3950 | 3952 | 3959 | 3960 | 3965 | 3969 | 3971 | 3973 | 3974 | 3976 | 3977 | 3979 | 3980 | 3982 | 3986 |
| 3988 | 3989 | 3994 | 3995 | 3996 | 3998 | 4007 | 4009 | 4010 | 4015 | 4016 | 4018 | 4022 | 4024 | 4028 | 4031 | 4032 | 4034 | 4041 | 4043 |
| 4045 | 4046 | 4052 | 4054 | 4058 | 4064 | 4067 | 4070 | 4074 | 4075 | 4077 | 4082 | 4089 | 4090 | 4103 | 4104 | 4113 | 4117 | 4118 | 4121 |
| 4124 | 4126 | 4130 | 4136 | 4139 | 4140 | 4149 | 4150 | 4153 | 4154 | 4157 | 4160 | 4162 | 4166 | 4172 | 4175 | 4176 | 4177 | 4183 | 4185 |
| 4186 | 4189 | 4193 | 4196 | 4198 | 4202 | 4203 | 4205 | 4208 | 4211 | 4212 | 4214 | 4219 | 4226 | 4232 | 4234 | 4238 | 4244 | 4247 | 4248 |
| 4255 | 4257 | 4258 | 4262 | 4268 | 4274 | 4283 | 4284 | 4286 | 4293 | 4298 | 4304 | 4306 | 4310 | 4319 | 4320 | 4329 | 4330 | 4333 | 4334 |
| 4340 | 4346 | 4348 | 4352 | 4355 | 4356 | 4358 | 4365 | 4376 | 4377 | 4378 | 4382 | 4391 | 4392 | 4394 | 4399 | 4401 | 4402 | 4412 | 4414 |
| 4418 | 4424 | 4428 | 4430 | 4435 | 4437 | 4438 | 4448 | 4449 | 4450 | 4457 | 4464 | 4473 | 4474 | 4484 | 4485 | 4488 | 4499 | 4500 | 4502 |
| 4510 | 4520 | 4521 | 4522 | 4536 | 4538 | 4540 | 4546 | 4556 | 4557 | 4558 | 4560 | 4570 | 4572 | 4574 | 4582 | 4592 | 4593 | 4594 | 4596 |
| 4608 | 4610 | 4618 | 4619 | 4628 | 4629 | 4630 | 4631 | 4632 | 4639 | 4644 | 4646 | 4654 | 4655 | 4664 | 4665 | 4666 | 4668 | 4675 | 4680 |
| 4682 | 4690 | 4691 | 4700 | 4701 | 4702 | 4711 | 4716 | 4718 | 4726 | 4727 | 4736 | 4737 | 4738 | 4742 | 4747 | 4750 | 4752 | 4754 | 4755 |
| 4762 | 4763 | 4772 | 4773 | 4774 | 4778 | 4783 | 4786 | 4790 | 4791 | 4795 | 4798 | 4799 | 4800 | 4809 | 4810 | 4814 | 4819 | 4822 | 4826 |
| 4827 | 4834 | 4835 | 4836 | 4845 | 4846 | 4855 | 4862 | 4870 | 4871 | 4872 | 4881 | 4882 | 4891 | 4898 | 4900 | 4906 | 4907 | 4908 | 4918 |
| 4923 | 4927 | 4935 | 4936 | 4943 | 4944 | 4954 | 4958 | 4959 | 4963 | 4967 | 4970 | 4971 | 4975 | 4979 | 4980 | 4983 | 4990 | 4994 | 4999 |
| 5003 | 5006 | 5015 | 5016 | 5026 | 5030 | 5031 | 5035 | 5039 | 5040 | 5042 | 5044 | 5048 | 5051 | 5055 | 5060 | 5062 | 5071 | 5075 | 5087 |
| 5088 | 5095 | 5098 | 5107 | 5111 | 5114 | 5123 | 5124 | 5127 | 5131 | 5134 | 5143 | 5147 | 5150 | 5152 | 5159 | 5160 | 5167 | 5170 | 5174 |
| 5179 | 5182 | 5183 | 5186 | 5195 | 5196 | 5203 | 5206 | 5210 | 5211 | 5215 | 5218 | 5219 | 5221 | 5222 | 5226 | 5231 | 5234 | 5241 | 5242 |
| 5243 | 5246 | 5251 | 5254 | 5255 | 5257 | 5262 | 5266 | 5267 | 5270 | 5273 | 5277 | 5282 | 5285 | 5287 | 5290 | 5291 | 5294 | 5303 | 5304 |
| 5314 | 5315 | 5318 | 5319 | 5323 | 5326 | 5327 | 5329 | 5333 | 5334 | 5338 | 5339 | 5342 | 5345 | 5347 | 5349 | 5350 | 5351 | 5352 | 5354 |
| 5359 | 5362 | 5363 | 5370 | 5374 | 5375 | 5378 | 5379 | 5381 | 5385 | 5386 | 5387 | 5390 | 5395 | 5399 | 5400 | 5402 | 5408 | 5411 | 5414 |
| 5420 | 5421 | 5422 | 5423 | 5426 | 5427 | 5431 | 5432 | 5435 | 5436 | 5444 | 5446 | 5447 | 5453 | 5456 | 5457 | 5458 | 5460 | 5462 | 5467 |
| 5470 | 5471 | 5472 | 5482 | 5483 | 5489 | 5492 | 5493 | 5494 | 5498 | 5503 | 5507 | 5508 | 5513 | 5518 | 5519 | 5525 | 5528 | 5529 | 5530 |
| 5531 | 5539 | 5540 | 5543 | 5544 | 5546 | 5554 | 5555 | 5561 | 5564 | 5565 | 5575 | 5580 | 5582 | 5587 | 5600 | 5601 | 5615 | 5616 | 5618 |
| 5623 | 5627 | 5636 | 5637 | 5640 | 5642 | 5647 | 5651 | 5652 | 5654 | 5656 | 5659 | 5663 | 5672 | 5673 | 5674 | 5678 | 5683 | 5687 | 5690 |
| 5694 | 5699 | 5709 | 5710 | 5714 | 5723 | 5726 | 5730 | 5731 | 5735 | 5745 | 5759 | 5762 | 5766 | 5767 | 5770 | 5777 | 5781 | 5795 | 5796 |
| 5798 | 5803 | 5804 | 5815 | 5816 | 5817 | 5823 | 5824 | 5828 | 5831 | 5832 | 5834 | 5839 | 5840 | 5851 | 5852 | 5853 | 5859 | 5860 | 5863 |
| 5867 | 5868 | 5870 | 5875 | 5879 | 5887 | 5888 | 5889 | 5894 | 5895 | 5896 | 5899 | 5903 | 5906 | 5910 | 5911 | 5915 | 5925 | 5926 | 5932 |
| 5939 | 5942 | 5946 | 5947 | 5961 | 5968 | 5975 | 5978 | 5982 | 5983 | 5997 | 6012 | 6013 | 6014 | 6019 | 6020 | 6031 | 6032 | 6034 | 6040 |
| 6044 | 6046 | 6047 | 6048 | 6050 | 6055 | 6056 | 6058 | 6068 | 6069 | 6080 | 6084 | 6091 | 6104 | 6106 | 6122 | 6126 | 6127 | 6130 | 6141 |
| 6158 | 6160 | 6162 | 6163 | 6166 | 6170 | 6177 | 6190 | 6194 | 6198 | 6206 | 6211 | 6213 | 6215 | 6226 | 6229 | 6230 | 6238 | 6240 | 6243 |
| 6247 | 6251 | 6266 | 6274 | 6276 | 6283 | 6285 | 6306 | 6315 | 6321 | 6323 | 6326 | 6338 | 6346 | 6348 | 6350 | 6351 | 6359 | 6362 | 6373 |
| 6374 | 6382 | 6384 | 6391 | 6395 | 6409 | 6410 | 6418 | 6420 | 6434 | 6435 | 6442 | 6446 | 6454 | 6456 | 6458 | 6459 | 6461 | 6470 | 6480 |
| 6481 | 6488 | 6490 | 6493 | 6497 | 6500 | 6507 | 6514 | 6516 | 6524 | 6526 | 6529 | 6530 | 6535 | 6536 | 6540 | 6542 | 6550 | 6552 | 6562 |
| 6565 | 6566 | 6572 | 6576 | 6578 | 6583 | 6586 | 6594 | 6598 | 6602 | 6609 | 6614 | 6619 | 6622 | 6630 | 6634 | 6655 | 6658 | 6660 | 6664 |
| 6668 | 6670 | 6673 | 6680 | 6681 | 6683 | 6684 | 6691 | 6694 | 6696 | 6698 | 6704 | 6710 | 6716 | 6718 | 6727 | 6728 | 6732 | 6734 | 6746 |
| 6751 | 6752 | 6753 | 6754 | 6763 | 6764 | 6768 | 6770 | 6771 | 6773 | 6782 | 6787 | 6788 | 6789 | 6790 | 6792 | 6799 | 6800 | 6804 | 6807 |
| 6814 | 6818 | 6824 | 6825 | 6826 | 6835 | 6836 | 6838 | 6847 | 6850 | 6858 | 6859 | 6862 | 6864 | 6871 | 6874 | 6876 | 6878 | 6883 | 6896 |
| 6898 | 6900 | 6907 | 6908 | 6912 | 6920 | 6922 | 6929 | 6932 | 6934 | 6936 | 6943 | 6948 | 6955 | 6958 | 6965 | 6968 | 6971 | 6972 | 6974 |
| 6979 | 6984 | 6991 | 6994 | 7004 | 7007 | 7008 | 7010 | 7015 | 7018 | 7020 | 7027 | 7030 | 7039 | 7040 | 7043 | 7044 | 7046 | 7051 | 7054 |
| 7056 | 7063 | 7066 | 7080 | 7082 | 7090 | 7092 | 7099 | 7102 | 7103 | 7109 | 7115 | 7116 | 7118 | 7128 | 7138 | 7139 | 7144 | 7145 | 7147 |
| 7148 | 7152 | 7154 | 7164 | 7166 | 7171 | 7174 | 7175 | 7179 | 7181 | 7184 | 7188 | 7190 | 7195 | 7200 | 7202 | 7204 | 7205 | 7210 | 7211 |
| 7215 | 7217 | 7219 | 7220 | 7226 | 7231 | 7236 | 7240 | 7241 | 7246 | 7255 | 7259 | 7262 | 7267 | 7270 | 7272 | 7277 | 7282 | 7283 |
| 7291 | 7292 | 7298 | 7303 | 7306 | 7308 | 7311 | 7313 | 7315 | 7318 | 7319 | 7327 | 7329 | 7334 | 7339 | 7342 | 7344 | 7347 | 7349 | 7351 |
| 7354 | 7355 | 7363 | 7364 | 7365 | 7368 | 7375 | 7378 | 7380 | 7382 | 7383 | 7387 | 7388 | 7391 | 7394 | 7397 | 7399 | 7400 | 7404 | 7416 |
| 7417 | 7418 | 7427 | 7433 | 7436 | 7440 | 7442 | 7447 | 7450 | 7452 | 7454 | 7463 | 7469 | 7471 | 7472 | 7476 | 7478 | 7483 | 7490 | 7493 |
| 7495 | 7505 | 7512 | 7518 | 7522 | 7531 | 7540 | 7542 | 7548 | 7564 | 7565 | 7576 | 7584 | 7590 | 7591 | 7596 | 7603 | 7604 | 7606 | 7611 |
| 7612 | 7616 | 7620 | 7627 | 7632 | 7634 | 7637 | 7648 | 7652 | 7653 | 7663 | 7668 | 7669 | 7670 | 7673 | 7688 | 7699 | 7702 | 7704 | 7708 |
| 7709 | 7720 | 7724 | 7725 | 7735 | 7740 | 7742 | 7743 | 7745 | 7747 | 7756 | 7761 | 7771 | 7776 | 7781 | 7783 | 7797 | 7807 | 7812 | 7814 |
| 7828 | 7843 | 7848 | 7850 | 7851 | 7870 | 7879 | 7881 | 7884 | 7886 | 7887 | 7892 | 7906 | 7915 | 7922 | 7926 | 7936 | 7941 | 7942 | 7951 |
| 7953 | 7968 | 7978 | 7983 | 7987 | 7990 | 7993 | 7998 | 8013 | 8014 | 8023 | 8026 | 8030 | 8040 | 8050 | 8055 | 8059 | 8066 | 8076 | 8083 |
| 8086 | 8091 | 8095 | 8102 | 8112 | 8115 | 8119 | 8122 | 8131 | 8138 | 8148 | 8158 | 8163 | 8167 | 8174 | 8176 | 8184 | 8194 | 8199 | 8203 |
| 8209 | 8210 | 8214 | 8229 | 8230 | 8234 | 8245 | 8246 | 8250 | 8265 | 8270 | 8281 | 8286 | 8301 | 8311 | 8316 | 8317 | 8320 | 8337 | 8338 |
| 8339 | 8348 | 8352 | 8356 | 8362 | 8367 | 8374 | 8383 | 8392 | 8400 | 8403 | 8419 | 8428 | 8430 | 8439 | 8445 | 8455 | 8460 | 8481 | 8487 |
| 8496 | 8497 | 8504 | 8519 | 8527 | 8532 | 8533 | 8540 | 8563 | 8568 | 8589 | 8599 | 8604 | 8619 | 8625 | 8635 | 8636 | 8640 | 8645 | 8667 |
| 8671 | 8672 | 8676 | 8684 | 8691 | 8708 | 8712 | 8717 | 8743 | 8748 | 8749 | 8751 | 8779 | 8784 | 8798 | 8801 | 8805 | 8810 | 8815 |
| 8820 | 8825 | 8846 | 8851 | 8856 | 8861 | 8887 | 8892 | 8897 | 8923 | 8928 | 8935 | 8936 | 8964 | 8969 | 8974 | 8985 | 8999 | 9000 | 9005 |
| 9007 | 9035 | 9036 | 9041 | 9043 | 9044 | 9072 | 9080 | 9106 | 9108 | 9113 | 9115 | 9116 | 9118 | 9144 | 9149 | 9152 | 9160 | 9180 | 9187 |
| 9190 | 9196 | 2461 | 2497 | 2533 | 2569 | 2605 | 2633 | 2641 | 2669 | 2677 | 2705 | 2713 | 2749 | 2785 | 2821 | 2849 | 2857 | 2885 | 2893 |
| 2921 | 2957 | 3130 | 3202 | 3412 | 3463 | 3475 | 3511 | 3547 | 3704 | 3715 | 3740 | 3751 | 3787 | 3850 | 3920 | 3931 | 3956 | 3992 |
| 4039 | 4111 | 4144 | 4225 | 4261 | 4267 | 4297 | 4303 | 4339 | 4360 | 4369 | 4375 | 4405 | 4411 | 4441 | 4447 | 4471 | 4507 | 4513 | 4534 |
| 4565 | 4591 | 4606 | 4615 | 4627 | 4642 | 4678 | 4699 | 4714 | 4723 | 4759 | 4831 | 5099 | 5332 | 5405 | 5441 | 5449 | 5548 | 5584 | 5807 |
| 5843 | 5962 | 5998 | 6244 | 6275 | 6347 | 6383 | 6387 | 6388 | 6419 | 6441 | 6455 | 6495 | 6499 | 6513 | 6515 | 6557 | 671 | 6571 | 6607 |
| 6631 | 6665 | 6715 | 6724 | 1976 | 6775 | 6806 | 6823 | 6842 | 6845 | 6851 | 6879 | 6887 | 6895 | 6919 | 707 | 6923 | 6931 | 6950 | 6967 |
| 6997 | 7003 | 7033 | 7069 | 7075 | 7079 | 7111 | 7124 | 7130 | 7135 | 7183 | 7224 | 2107 | 7249 | 7274 | 7276 | 7285 | 7289 | 7310 | 7325 |

-continued

| | | | | | | | | | | | | | | | | | | |
|---|---|---|---|---|---|---|---|---|---|---|---|---|---|---|---|---|---|---|
| 7346 | 7361 | 7423 | 7439 | 7459 | 7511 | 7526 | 7529 | 7562 | 7577 | 7598 | 7601 | 7609 | 7635 | 7636 | 7672 | 7947 | 7958 | 7994 | 2281 |
| 2317 | 8351 | 8363 | 8387 | 8414 | 8423 | 8427 | 8448 | 8450 | 8459 | 8464 | 8486 | 8500 | 8523 | 8559 | 8565 | 8595 | 8628 | 8630 | 8639 |
| 8664 | 8702 | 8719 | 8725 | 8731 | 8736 | 8738 | 8739 | 8753 | 8775 | 8780 | 8783 | 8823 | 8839 | 8855 | 8880 | 8882 | 8891 | 8916 | 8927 |
| 8933 | 8952 | 8963 | 8993 | 9062 | 9071 | 9079 | 9101 | 9107 | 9124 | 9132 | 9143 | 9168 | 9212 | 2644 | 2651 | 2667 | 825 | 2811 | 2847 |
| 969 | 2883 | 1005 | 1041 | 3207 | 1077 | 3233 | 1084 | 3255 | 3290 | 3305 | 3327 | 3372 | 3418 | 3521 | 3591 | 1197 | 3627 | 3695 | 460 |
| 833 | 3857 | 3916 | 3917 | 224 | 4135 | 4151 | 1351 | 4223 | 4295 | 4309 | 4344 | 4367 | 4380 | 4403 | 4420 | 4452 | 4463 | 4553 | 4625 |
| 538 | 4734 | 4806 | 4842 | 4863 | 4899 | 4913 | 4931 | 4949 | 4956 | 562 | 5092 | 574 | 5128 | 588 | 5309 | 5324 | 5450 | 610 | 5603 |
| 5692 | 5697 | 5715 | 5780 | 1786 | 5827 | 5916 | 5999 | 6035 | 646 | 6060 | 6142 | 6178 | 6202 | 6204 | 6214 | 6236 | 6312 | 1900 | 6469 |
| 6492 | 6612 | 6645 | 6651 | 6677 | 682 | 1966 | 6697 | 1972 | 6723 | 6749 | 6759 | 6785 | 6795 | 6831 | 6867 | 6939 | 6975 | 7011 | 7047 |
| 2058 | 718 | 7067 | 7108 | 2080 | 7151 | 2082 | 7180 | 7191 | 727 | 7222 | 7247 | 2116 | 7396 | 7410 | 754 | 7608 | 7656 | 7678 | 7716 |
| 7728 | 7752 | 7788 | 7796 | 7818 | 7824 | 7834 | 7896 | 7932 | 7977 | 8004 | 8044 | 8188 | 789 | 8305 | 8434 | 8456 | 799 | 8553 | 8578 |
| 8661 | 8697 | 8733 | 8768 | 8792 | 8804 | 8840 | 8841 | 8877 | 8901 | 8912 | 8948 | 8987 | 9146 | 2887 | 3094 | 3583 | 3619 | 3691 | 3962 |
| 3967 | 4106 | 4142 | 4178 | 4195 | 4209 | 4216 | 4231 | 4388 | 4477 | 4493 | 4549 | 4657 | 4687 | 4712 | 5258 | 347 | 5369 | 5474 | 5477 |
| 5510 | 5746 | 5890 | 6065 | 6097 | 6137 | 6208 | 6707 | 6743 | 6779 | 6815 | 2012 | 6914 | 6915 | 7094 | 2084 | 7196 | 7213 | 7253 | 2143 |
| 7443 | 2425 | 7645 | 7681 | 7684 | 7921 | 8354 | 2353 | 8666 | 8755 | 8787 | 8827 | 8844 | 2389 | 9024 | 9060 | 9134 | 979 | 7909 | 4159 |
| 4180 | 5330 | 5366 | 5438 | 6173 | 6424 | 6466 | 6881 | 6917 | 6951 | 6987 | 7023 | 7059 | 7239 | 7897 | 8463 | 9003 | 2878 | 2884 | 3031 |
| 1024 | 3067 | 2647 | 3258 | 3294 | 3300 | 3330 | 3336 | 3341 | 3377 | 3403 | 3408 | 3449 | 3474 | 3480 | 3506 | 3580 | 3616 | 3624 | 3652 |
| 3662 | 3778 | 466 | 3806 | 3811 | 2661 | 3885 | 3922 | 1283 | 3958 | 4000 | 4093 | 4115 | 4120 | 4129 | 4165 | 1355 | 4187 | 4201 | 502 |
| 4273 | 4289 | 4439 | 1427 | 4483 | 4517 | 4555 | 4564 | 4604 | 4663 | 1480 | 2813 | 4697 | 4744 | 4769 | 4805 | 4879 | 5100 | 5237 | 5316 |
| 5440 | 5465 | 5512 | 1718 | 1726 | 5597 | 5693 | 1768 | 5809 | 1798 | 6025 | 6045 | 6070 | 1851 | 6184 | 6205 | 6222 | 6320 | 1891 | 6335 |
| 6358 | 2506 | 6385 | 6394 | 6432 | 6531 | 6574 | 6584 | 6726 | 6889 | 6902 | 6693 | 6925 | 6959 | 6995 | 2071 | 7119 | 7155 | 2090 | 178 |
| 7254 | 7406 | 7527 | 7573 | 753 | 7622 | 7649 | 7701 | 7721 | 7757 | 2766 | 7907 | 7910 | 8046 | 8057 | 8067 | 8074 | 8075 | 8124 | 8140 |
| 8157 | 8193 | 8224 | 8312 | 8322 | 8373 | 8436 | 8462 | 8466 | 8498 | 8879 | 8960 | 8983 | 9013 | 9156 | 6627 | 7268 | 8587 | 8659 | 3022 |
| 3029 | 3065 | 3117 | 3171 | 3181 | 3189 | 3196 | 1079 | 3225 | 3262 | 3284 | 3320 | 1113 | 3424 | 3445 | 1151 | 3483 | 3496 | 1168 | 3520 |
| 1177 | 3556 | 1185 | 1187 | 455 | 3660 | 3827 | 3840 | 3858 | 1273 | 3897 | 3933 | 3935 | 1295 | 3985 | 4021 | 4056 | 4057 | 4072 | 4084 |
| 4123 | 491 | 4163 | 4174 | 4237 | 4246 | 4252 | 4253 | 4277 | 4282 | 4288 | 4313 | 4318 | 4460 | 4498 | 4511 | 4598 | 4670 | 4676 | 4683 |
| 4706 | 4784 | 4850 | 1531 | 4892 | 4922 | 4960 | 4996 | 5032 | 1567 | 5068 | 5079 | 5104 | 5133 | 5136 | 5140 | 5176 | 5236 | 5278 | 5443 |
| 1690 | 5534 | 5570 | 5586 | 5591 | 988 | 1762 | 5802 | 5833 | 142 | 6042 | 6043 | 6073 | 6103 | 6200 | 6203 | 6209 | 6286 | 6316 | 6352 |
| 6412 | 6423 | 6473 | 6474 | 6479 | 6496 | 284 | 6504 | 6506 | 6509 | 6511 | 1928 | 6527 | 6547 | 6595 | 6621 | 6663 | 6671 | 6689 | 6702 |
| 952 | 6735 | 6738 | 6794 | 6811 | 2018 | 7019 | 7037 | 7055 | 7058 | 7091 | 7107 | 2075 | 7141 | 7167 | 7232 | 7370 | 7425 | 750 | 7497 |
| 7501 | 7535 | 7571 | 7639 | 7694 | 7808 | 2238 | 7846 | 7864 | 7874 | 7916 | 8008 | 3001 | 2302 | 8255 | 8256 | 8303 | 392 | 8399 | 8409 |
| 8493 | 8509 | 8557 | 8582 | 8607 | 8617 | 8764 | 8797 | 8905 | 8918 | 8951 | 8954 | 9026 | 9049 | 9128 | 9164 | 9199 | 9204 | 3439 | 3629 |
| 3802 | 3948 | 1325 | 4169 | 5014 | 1717 | 6399 | 7197 | 7800 | 8259 | 8920 | 8984 | 3263 | 3335 | 3371 | 3413 | 3443 | 3458 | 3532 | 3551 |
| 3727 | 214 | 3786 | 4065 | 4094 | 1023 | 2806 | 4221 | 4240 | 500 | 2920 | 4384 | 4426 | 1425 | 232 | 4532 | 4562 | 124 | 531 | 4729 |
| 4735 | 4746 | 4748 | 1499 | 4771 | 548 | 4818 | 844 | 1532 | 4886 | 1533 | 1535 | 556 | 5021 | 1569 | 5043 | 5047 | 1034 | 5248 | 592 |
| 5413 | 264 | 5676 | 1803 | 1811 | 6131 | 6169 | 6186 | 6280 | 6311 | 6389 | 6421 | 6425 | 6430 | 916 | 6518 | 1942 | 176 | 6679 | 6693 |
| 6729 | 6758 | 2527 | 6866 | 6911 | 2870 | 7017 | 7429 | 2179 | 2842 | 7730 | 7822 | 8147 | 2293 | 8268 | 8345 | 8371 | 8407 | 8484 | 8522 |
| 8558 | 8567 | 8698 | 8802 | 2852 | 2626 | 9111 | 9188 | 3539 | 3604 | 2901 | 3910 | 1309 | 493 | 4194 | 4266 | 3081 | 4855 | 4937 | 1568 |
| 1576 | 1594 | 5162 | 1604 | 2428 | 5403 | 5484 | 5668 | 1756 | 5758 | 5782 | 1784 | 1808 | 5990 | 6314 | 6398 | 6543 | 6956 | 2100 | 2104 |
| 7328 | 7419 | 8141 | 2319 | 2392 | 9085 | 3383 | 1132 | 3422 | 3045 | 480 | 1331 | 4138 | 4312 | 3073 | 520 | 4634 | 534 | 5000 | 5018 |
| 5078 | 5102 | 1605 | 2694 | 1643 | 3101 | 628 | 6059 | 1911 | 664 | 6643 | 1096 | 6801 | 6837 | 700 | 6873 | 6938 | 7061 | 7169 | 7207 |
| 2838 | 7275 | 1059 | 7933 | 7969 | 8003 | 8111 | 8183 | 8330 | 8438 | 9200 | 3507 | 8485 | 473 | 5812 | 1916 | 7679 | 3479 | 1259 | 2455 |
| 4192 | 4291 | 4354 | 4579 | 1497 | 4984 | 5286 | 5321 | 5865 | 6076 | 6551 | 680 | 2726 | 6820 | 6821 | 3375 | 1060 | 196 | 160 | 2338 |
| 2378 | 8859 | 8895 | 8988 | 2876 | 9055 | 9075 | 439 | 3576 | 3657 | 3694 | 3926 | 3983 | 4096 | 4156 | 4260 | 4350 | 4455 | 367 | 4932 |
| 1554 | 5009 | 5023 | 5118 | 5184 | 583 | 5292 | 5398 | 5442 | 1736 | 8 | 5681 | 5704 | 5711 | 5736 | 5772 | 1787 | 5880 | 1806 | 5901 |
| 1821 | 5952 | 1842 | 6088 | 2960 | 1902 | 404 | 1969 | 7034 | 2836 | 7227 | 7294 | 7583 | 7754 | 7930 | 2259 | 8308 | 3297 | 8437 | 2590 |
| 8552 | 1982 | 7882 | 444 | 3536 | 3763 | 4019 | 228 | 4239 | 3435 | 4316 | 5284 | 1767 | 6074 | 6830 | 2162 | 8627 | 8760 | 8819 | 1230 |
| 3452 | 6250 | 8800 | 8328 | 1176 | 1189 | 1212 | 2451 | 1240 | 474 | 3949 | 1294 | 484 | 4102 | 894 | 4168 | 1358 | 4300 | 840 | 4503 |
| 4516 | 1448 | 4638 | 1491 | 547 | 4856 | 4890 | 1538 | 4924 | 424 | 5148 | 5365 | 6564 | 6610 | 2525 | 2829 | 6875 | 6884 | 2064 | 7279 |
| 7589 | 2193 | 7607 | 2761 | 7895 | 7902 | 2271 | 8222 | 8298 | 2409 | 3554 | 2800 | 7053 | 8499 | 8679 | 8689 | 3194 | 3246 | 141 | 8401 |
| 421 | 4585 | 1571 | 606 | 5956 | 2727 | 2054 | 7642 | 7858 | 8473 | 8654 | 8816 | 4543 | 4651 | 3482 | 208 | 3748 | 3770 | 3819 | 3896 |
| 475 | 3518 | 4396 | 4468 | 4492 | 4709 | 5126 | 5200 | 906 | 1770 | 5878 | 6233 | 3268 | 6313 | 3334 | 1150 | 6369 | 6427 | 966 | 1938 |
| 6563 | 7629 | 7984 | 9129 | 4888 | 1804 | 5144 | 8327 | 8715 | 2480 | 3890 | 4049 | 4581 | 4624 | 6057 | 3415 | 6901 | 2560 | 1248 | 3899 |
| 1290 | 482 | 3517 | 2482 | 3356 | 3080 | 1520 | 4878 | 3526 | 1574 | 570 | 1964 | 268 | 1772 | 1040 | 1182 | 6024 | 6241 | 6522 | 6646 |
| 6714 | 6894 | 7127 | 2754 | 2202 | 7700 | 8525 | 8529 | 8544 | 2355 | 8773 | 1527 | 4930 | 5033 | 1679 | 5645 | 1861 | 8479 | 394 | 9034 |
| 7097 | 7178 | 8767 | 4188 | 4224 | 5886 | 2581 | 3710 | 1186 | 3860 | 3946 | 3054 | 4026 | 4048 | 4147 | 410 | 4408 | 4770 | 554 | 4920 |
| 5367 | 3589 | 5771 | 6657 | 692 | 7016 | 304 | 2837 | 752 | 768 | 7934 | 932 | 8424 | 8425 | 9048 | 9088 | 9214 | 3698 | 1237 | 2799 |
| 147 | 7823 | 7940 | 872 | 8991 | 5053 | 5072 | 6650 | 7238 | 7243 | 2274 | 8378 | 8384 | 8695 | 2946 | 469 | 3579 | 4101 | 1392 | 4361 |
| 4757 | 5036 | 5220 | 8443 | 2410 | 5188 | 5240 | 3446 | 7013 | 7050 | 8538 | 2907 | 476 | 4432 | 644 | 169 | 673 | 6739 | 7085 | 7481 |
| 8699 | 8834 | 8872 | 9076 | 4643 | 1796 | 376 | 3921 | 1265 | 3904 | 1278 | 408 | 4148 | 4436 | 5154 | 1712 | 6197 | 6682 | 2122 | 9142 |
| 6193 | 1050 | 1367 | 4327 | 1563 | 5430 | 3119 | 2444 | 6827 | 6953 | 5281 | 207 | 7962 | 3249 | 6870 | 7366 | 1100 | 1071 | 4051 | 4389 |
| 4563 | 2127 | 8254 | 842 | 1788 | 5970 | 8472 | 4245 | 6078 | 279 | 1921 | 6508 | 6521 | 7733 | 7736 | 3386 | 7625 | 8512 | 8919 | 4336 |
| 5900 | 1885 | 7177 | 8949 | 5028 | 5891 | 2961 | 2167 | 4296 | 511 | 4684 | 4788 | 5305 | 5516 | 3688 | 8123 | 8262 | 2748 | 4461 | 973 |
| 5380 | 2320 | 3198 | 1892 | 3814 | 3570 | 4909 | 7009 | 4119 | 858 | 8921 | 3756 | 7209 | 7438 | 1518 | 1673 | 6310 | 4204 | 5191 | 6405 |
| 3792 | 2764 | 2276 | 8601 | 9023 | 5814 | 3135 | 3227 | 6549 | 7131 | 6534 | 3016 | 7014 | 2840 | 7465 | 6038 | 6992 | 7322 | 7838 | 2874 |
| 8726 | 3750 | 6544 | 316 | 8597 | 1022 | 6869 | 1175 | 4393 | 3835 | 1081 | 4860 | 1561 | 6711 | 2126 | 7825 | 4824 | 1592 | 1974 | 879 |
| 4497 | 728 | 4371 | 6487 | 6590 | 7106 | 8321 | 1069 | 4421 | 1078 | 1074 | 4292 | 4839 | 2937 | 5193 | 6996 | 7012 | 3875 | 8155 | 8315 |
| 9093 | 618 | 7539 | 1152 | 2050 | 2692 | 1607 | 8551 | 1556 | 1597 | 3674 | 678 | 2816 | 4256 | 3680 | 260 | 1743 | 5727 | 1828 | 3798 |
| 4069 | 968 | 219 | 2460 | 1696 | 6301 | 6463 | 3854 | 1254 | 4911 | 1923 | 9176 | 3622 | 4823 | 5608 | 3409 | 4576 | 2689 | 2157 | 4496 |
| 1148 | 1391 | 961 | 8609 | 9039 | 9095 | 7143 | 7832 | 3342 | 6079 | 8416 | 4425 | 6210 | 6840 | 2220 | 4299 | 3758 | 2419 | 4910 | 7630 |
| 7613 | 5573 | 2221 | 1512 | 3104 | 8931 | 930 | 2919 | 4782 | 6180 | 4948 | 366 | 253 | 9065 | 924 | 3174 | 6639 | 5232 | 3325 | 6863 |
| 2076 | 1356 | 3568 | 3030 | 6290 | 1364 | 1062 | 7024 | 440 | 4495 | 8561 | 4844 | 3718 | 5487 | 5268 | 5250 | 6560 | 7307 | 7952 | 2327 |
| 2911 | 6450 | 8967 | 5344 | 5733 | 6379 | 8060 | 8294 | 6260 | 2187 | 9025 | 3930 | 7913 | 4053 | 446 | 5500 | 4275 | 401 | 846 | 687 |
| 8105 | 8340 | 1460 | 6415 | 4867 | 1035 | 8766 | 4541 | 1285 | 6587 | 624 | 7172 | 2980 | 3299 | 1766 | 7988 | 6615 | 1676 | 2286 | 8849 |
| 1146 | 4756 | 5010 | 660 | 5112 | 1829 | 8358 | 3553 | 2955 | 2284 | 869 | 1112 | 6613 | 8623 | 495 | 1141 | 6054 | 1256 | 8603 | 6853 |
| 3015 | 7661 | 6765 | 2805 | 1388 | 7402 | 4987 | 6839 | 462 | 1525 | 3898 | 4901 | 6523 | 666 | 2814 | 6816 | 2408 | 4633 | 3399 | 3522 |
| 280 | 8006 | 8442 | 9047 | 7786 | 3678 | 6149 | 4364 | 3410 | 433 | 9186 | 2922 | 819 | 503 | 3140 | 6308 | 4145 | 8405 | 6812 | 1548 |
| 8824 | 9201 | 783 | 8569 | 6570 | 8283 | 6843 | 8896 | 1913 | 1790 | 3150 | 4134 | 1814 | 4400 | 3337 | 1037 | 3594 | 3784 | 4966 | 402 |
| 905 | 289 | 4889 | 1350 | 3124 | 3281 | 987 | 693 | 1562 | 516 | 2204 | 543 | 7049 | 1573 | 4837 | 8118 | 4419 | 1517 | 2263 | 6261 |
| 9054 | 1760 | 5722 | 8406 | 4407 | 3049 | 3846 | 8478 | 3510 | 4078 | 1211 | 1750 | 3615 | 6904 | 7002 | 5949 | 696 | 5748 | 3407 | 4978 |

-continued

| | | | | | | | | | | | | | | | | | | | |
|---|---|---|---|---|---|---|---|---|---|---|---|---|---|---|---|---|---|---|---|
| 1372 | 1578 | 8063 | 1475 | 465 | 7348 | 1222 | 6067 | 4796 | 3172 | 3879 | 4719 | 9153 | 390 | 6834 | 1400 | 2859 | 3689 | 6731 | 4652 |
| 5741 | 4397 | 294 | 6865 | 3131 | 1777 | 9042 | 1439 | 8777 | 4469 | 4877 | 4768 | 6585 | 5576 | 7508 | 863 | 716 | 1014 | 9019 | 4649 |
| 8297 | 7821 | 6833 | 3363 | 1984 | 4227 | 2471 | 9194 | 1015 | 4343 | 6559 | 3706 | 3454 | 4728 | 3162 | 907 | 2941 | 8329 | 1301 | 8722 |
| 1122 | 2668 | 5788 | 1648 | 3565 | 6882 | 5981 | 6510 | 1360 | 1877 | 8364 | 4467 | 243 | 9184 | 3396 | 4181 | 2574 | 6805 | 4601 | 6066 |
| 5638 | 688 | 2264 | 7981 | 431 | 4981 | 3308 | 5551 | 1589 | 1188 | 6102 | 3167 | 8899 | 8763 | 8094 | 781 | 258 | 2117 | 8372 | 8913 |
| 4191 | 4406 | 267 | 8515 | 3428 | 1045 | 8272 | 4184 | 8452 | 505 | 3164 | 510 | 621 | 6810 | 3274 | 1332 | 9210 | 4597 | 6701 | 1085 |
| 1635 | 2201 | 3182 | 2888 | 6706 | 6852 | 6848 | 6517 | 1311 | 8103 | 2944 | 2110 | 6242 | 1320 | 2437 | 1117 | 738 | 76 | 5011 | 6605 |
| 5164 | 6114 | 3957 | 5272 | 2038 | 8411 | 321 | 4853 | 1566 | 7749 | 8377 | 6216 | 198 | 217 | 4897 | 6365 | 8418 | 270 | 3090 | 4626 |
| 5933 | 8090 | 1664 | 2326 | 851 | 385 | 8432 | 5138 | 5265 | 5361 | 5025 | 3361 | 9117 | 3531 | 2009 | 6776 | 1208 | 3886 | 3384 | 7750 |
| 8867 | 4864 | 3634 | 1402 | 8510 | 1088 | 8741 | 1624 | 1361 | 5178 | 2975 | 9208 | 2977 | 4703 | 3326 | 3504 | 1908 | 2383 | 358 | 2767 |
| 7203 | 637 | 4272 | 7597 | 5488 | 4280 | 5752 | 250 | 2057 | 8175 | 5083 | 5119 | 4720 | 7617 | 8413 | 1193 | 9059 | 2833 | 4707 | 1671 |
| 6813 | 438 | 8803 | 3945 | 3187 | 1129 | 4311 | 3434 | 2077 | 5434 | 1131 | 2535 | 4480 | 2228 | 1865 | 8179 | 5298 | 234 | 7159 | 2841 |
| 2565 | 7991 | 5703 | 2553 | 2300 | 3925 | 1196 | 1058 | 8073 | 6401 | 2531 | 1723 | 1314 | 5356 | 361 | 6201 | 4416 | 4083 | 3059 | 2744 |
| 7831 | 1223 | 7594 | 1588 | 2596 | 4281 | 1157 | 3768 | 1840 | 5149 | 4648 | 2835 | 1940 | 4620 | 2871 | 1565 | 2898 | 1721 | 5696 | 4698 |
| 5993 | 4785 | 448 | 943 | 771 | 5506 | 2372 | 2066 | 2405 | 1489 | 4490 | 7685 | 8690 | 168 | 3261 | 8293 | 888 | 1714 | 2348 | 5536 |
| 2163 | 6829 | 8488 | 615 | 4621 | 2472 | 901 | 5481 | 7214 | 714 | 2331 | 1822 | 6333 | 220 | 5898 | 4641 | 8098 | 2115 | 1733 | 9068 |
| 4353 | 8814 | 5698 | 4693 | 7837 | 934 | 1026 | 5335 | 2892 | 1887 | 4433 | 1705 | 7456 | 4740 | 5371 | 6854 | 1428 | 6819 | 8195 | 1860 |
| 2060 | 4647 | 8945 | 6172 | 5876 | 6148 | 4903 | 7569 | 2192 | 1410 | 5008 | 6999 | 6886 | 2147 | 3781 | 8668 | 4917 | 7337 | 5180 | 1419 |
| 4753 | 1858 | 6945 | 2728 | 8168 | 4095 | 5648 | 6036 | 1526 | 9018 | 4617 | 569 | 4152 | 5120 | 414 | 8883 | 395 | 5004 | 3966 | 3915 |
| 7158 | 8573 | 4673 | 1047 | 4991 | 6846 | 3849 | 7353 | 5689 | 1752 | 944 | 4662 | 2079 | 2547 | 5729 | 5346 | 4347 | 7032 | 4362 | 4509 |
| 1107 | 3682 | 8878 | 5972 | 1249 | 325 | 8890 | 1764 | 5572 | 2917 | 3481 | 1612 | 1274 | 3762 | 8909 | 1683 | 3402 | 1999 | 6659 | 7537 |
| 8341 | 8279 | 4171 | 8156 | 2543 | 2010 | 5836 | 4359 | 7293 | 4938 | 8947 | 1003 | 3346 | 4955 | 3289 | 4324 | 3602 | 8116 | 5061 | 1669 |
| 5406 | 231 | 5725 | 8106 | 8651 | 5125 | 4290 | 8062 | 1312 | 4609 | 1461 | 4611 | 4612 | 4613 | 4614 | 2483 | 4616 | 4530 | 237 | 1463 |
| 1429 | 518 | 4622 | 4623 | 3575 | 2679 | 1394 | 843 | 1464 | 1465 | 1466 | 1083 | 1468 | 1330 | 1233 | 4635 | 4636 | 4637 | 4079 | 1469 |
| 4640 | 4475 | 2485 | 1232 | 1470 | 4645 | 1471 | 4501 | 1423 | 4199 | 4650 | 1184 | 4653 | 1472 | 532 | 4656 | 2812 | 4658 | 4659 |
| 4660 | 4661 | 4551 | 2929 | 2466 | 3747 | 1476 | 4667 | 2637 | 4669 | 412 | 4671 | 4672 | 4542 | 4674 | 126 | 3078 | 4677 | 2486 | 4679 |
| 536 | 4681 | 187 | 192 | 3810 | 4685 | 4686 | 2931 | 4688 | 4689 | 1481 | 1482 | 4692 | 2924 | 4694 | 4695 | 4696 | 985 | 4091 | 2487 |
| 537 | 1484 | 2680 | 1247 | 4704 | 4705 | 3625 | 4559 | 4708 | 4249 | 4710 | 1486 | 1328 | 4713 | 2488 | 4715 | 240 | 4717 | 241 | 1455 |
| 4372 | 4721 | 4722 | 2489 | 4724 | 4725 | 3939 | 1490 | 4213 | 2640 | 4730 | 4731 | 4732 | 4733 | 3438 | 3240 | 4014 | 541 | 1493 | 4739 |
| 945 | 4741 | 1494 | 4743 | 2933 | 4745 | 4279 | 1495 | 3242 | 4749 | 1496 | 4751 | 3404 | 521 | 542 | 1086 | 221 | 3720 | 4758 | 2490 |
| 4760 | 4761 | 1500 | 1501 | 4764 | 4765 | 4766 | 4767 | 1159 | 2934 | 3677 | 3244 | 1502 | 4131 | 1504 | 4775 | 4776 | 4777 | 1505 | 4779 |
| 4780 | 4781 | 3968 | 1506 | 3316 | 346 | 1507 | 4787 | 977 | 4789 | 1508 | 544 | 4792 | 4793 | 4794 | 77 | 3515 | 4797 | 546 | 3963 |
| 1170 | 4801 | 4802 | 4803 | 4804 | 2935 | 2682 | 4807 | 4808 | 1087 | 549 | 4811 | 4812 | 4813 | 1516 | 4815 | 4816 | 4817 | 450 | 4137 |
| 4820 | 4821 | 3834 | 2660 | 3876 | 4825 | 1374 | 3626 | 4828 | 4829 | 4830 | 4345 | 4832 | 4833 | 551 | 1522 | 552 | 341 | 4838 | 1453 |
| 4840 | 4841 | 4466 | 4843 | 3991 | 244 | 2456 | 4847 | 4848 | 4849 | 1031 | 4851 | 4852 | 4307 | 4854 | 4528 | 447 | 4857 | 4858 | 4859 |
| 3871 | 4861 | 3651 | 368 | 4341 | 3317 | 4866 | 3621 | 4868 | 4869 | 4085 | 1529 | 1530 | 4873 | 4874 | 4875 | 4876 | 4190 | 892 | 2936 |
| 4880 | 3083 | 3248 | 4883 | 4884 | 4885 | 1238 | 4887 | 1106 | 4122 | 1201 | 1089 | 1032 | 4893 | 4894 | 4895 | 4896 | 4314 | 555 | 2685 |
| 3251 | 4071 | 4902 | 4506 | 4904 | 4905 | 1536 | 1537 | 1172 | 1253 | 978 | 3929 | 4912 | 903 | 4914 | 4915 | 4916 | 3039 | 423 | 4919 |
| 1216 | 4921 | 3085 | 1540 | 4442 | 4925 | 4926 | 1541 | 4928 | 4929 | 397 | 2687 | 3822 | 4933 | 4934 | 1542 | 1543 | 3318 | 4589 | 4939 |
| 4940 | 4941 | 4942 | 1544 | 557 | 4945 | 4946 | 4947 | 3970 | 28 | 4950 | 4951 | 4952 | 4953 | 558 | 529 | 3578 | 4957 | 78 | 4099 |
| 3086 | 4961 | 4962 | 246 | 4964 | 4965 | 1338 | 129 | 4968 | 4969 | 2913 | 1552 | 4972 | 4973 | 4974 | 1553 | 4976 | 4977 | 3981 | 3440 |
| 563 | 2454 | 4982 | 1130 | 3618 | 4985 | 4986 | 4066 | 4988 | 4989 | 248 | 4544 | 4992 | 4993 | 1558 | 4995 | 3087 | 4997 | 4998 | 565 |
| 3358 | 5001 | 5002 | 249 | 4537 | 5005 | 1267 | 5007 | 1440 | 3441 | 4042 | 4269 | 5012 | 5013 | 3204 | 4128 | 4068 | 5017 | 1377 | 5019 |
| 5020 | 3253 | 5022 | 1300 | 5024 | 1397 | 567 | 5027 | 3804 | 5029 | 1424 | 4308 | 3088 | 3653 | 5034 | 1033 | 1225 | 5037 | 5038 | 3319 |
| 3254 | 5041 | 568 | 889 | 3562 | 5045 | 5046 | 3529 | 1572 | 5049 | 5050 | 4133 | 5052 | 3705 | 5054 | 3199 | 5056 | 5057 | 5058 | 5059 |
| 4531 | 1028 | 2879 | 5063 | 5064 | 5065 | 5066 | 5067 | 411 | 5069 | 5070 | 1577 | 1369 | 5073 | 5074 | 4161 | 5076 | 5077 | 1119 | 3091 |
| 5080 | 5081 | 5082 | 4370 | 5084 | 5085 | 5086 | 1579 | 1580 | 5089 | 5090 | 5091 | 2691 | 5093 | 5094 | 3630 | 5096 | 5097 | 2672 | 2492 |
| 3893 | 5101 | 4331 | 5103 | 3092 | 5105 | 5106 | 572 | 5108 | 5109 | 5110 | 1584 | 4044 | 5113 | 573 | 5115 | 5116 | 5117 | 3889 | 3882 |
| 4533 | 5121 | 5122 | 3905 | 251 | 4605 | 3586 | 4423 | 2693 | 5129 | 5130 | 501 | 5132 | 425 | 1590 | 5135 | 2795 | 5137 | 3485 | 5139 |
| 3095 | 5141 | 5142 | 50 | 3606 | 5145 | 5146 | 3877 | 3530 | 4429 | 577 | 5151 | 1109 | 5153 | 3754 | 5155 | 5156 | 5157 | 5158 | 578 |
| 579 | 5161 | 3322 | 5163 | 3932 | 5165 | 5166 | 3909 | 5168 | 5169 | 1598 | 5171 | 5172 | 5173 | 1599 | 5175 | 3096 | 5177 | 4349 | 580 |
| 4518 | 5181 | 1601 | 1602 | 3444 | 5185 | 1603 | 5187 | 3725 | 5189 | 5190 | 3838 | 5192 | 3894 | 5194 | 3323 | 3362 | 5197 | 5198 | 5199 |
| 3587 | 5201 | 5202 | 3972 | 5204 | 5205 | 3906 | 5207 | 5208 | 5209 | 1608 | 1609 | 5212 | 5213 | 5214 | 1610 | 5216 | 5217 | 582 | 4571 |
| 2659 | 1613 | 1614 | 5223 | 5224 | 5225 | 1615 | 5227 | 5228 | 5229 | 5230 | 1616 | 66 | 5233 | 1011 | 5235 | 4025 | 4017 | 5238 | 5239 |
| 3726 | 584 | 585 | 1620 | 5244 | 5245 | 131 | 5247 | 1110 | 5249 | 1303 | 587 | 5252 | 5253 | 1366 | 2654 | 5256 | 1625 | 4325 | 5259 |
| 5260 | 5261 | 1626 | 5263 | 5264 | 4328 | 255 | 1628 | 1302 | 5269 | 3631 | 5271 | 61 | 1630 | 5274 | 5275 | 5276 | 591 | 1036 | 5279 |
| 5280 | 1213 | 3259 | 5283 | 1160 | 1633 | 1134 | 1634 | 5288 | 5289 | 509 | 593 | 3027 | 5293 | 1637 | 5295 | 5296 | 5297 | 3582 | 5299 |
| 5300 | 5301 | 5302 | 1638 | 1639 | 5305 | 5306 | 5307 | 5308 | 2695 | 5310 | 5311 | 5312 | 1640 | 1641 | 2939 | 5317 | 594 | 201 |
| 5320 | 4158 | 5322 | 1644 | 2696 | 5325 | 1645 | 1646 | 5328 | 256 | 963 | 5331 | 3912 | 3847 | 1649 | 4487 | 5336 | 5337 | 1650 | 1651 |
| 5340 | 5341 | 1652 | 5343 | 4003 | 257 | 981 | 1654 | 5348 | 3913 | 1656 | 598 | 599 | 5353 | 80 | 5355 | 4413 | 5357 | 5358 | 1660 |
| 5360 | 1396 | 1661 | 1662 | 5364 | 1398 | 2862 | 1264 | 5368 | 181 | 601 | 4494 | 5372 | 5373 | 4322 | 4539 | 5376 | 5377 | 1666 | 603 |
| 3820 | 133 | 5382 | 5383 | 5384 | 4599 | 1670 | 4379 | 5388 | 5389 | 605 | 5391 | 5392 | 5393 | 5394 | 3869 | 5396 | 5397 | 1144 | 1674 |
| 1675 | 5401 | 4037 | 3978 | 5404 | 3675 | 4600 | 5407 | 1677 | 5409 | 5410 | 1181 | 5412 | 3260 | 3654 | 5415 | 5416 | 5417 | 5418 | 5419 |
| 1680 | 1681 | 1682 | 4575 | 5424 | 5425 | 1684 | 1685 | 5428 | 5429 | 1080 | 1686 | 1687 | 5433 | 1239 | 1688 | 7 | 5437 | 964 | 5439 |
| 1341 | 2495 | 3448 | 3099 | 3100 | 5445 | 608 | 1692 | 5448 | 2496 | 2697 | 5451 | 5452 | 609 | 5454 | 5455 | 1694 | 1695 | 1280 | 5459 |
| 1697 | 5461 | 1698 | 5463 | 5464 | 3226 | 5466 | 2698 | 5468 | 5469 | 1700 | 611 | 135 | 5473 | 948 | 5475 | 5476 | 387 | 5478 | 5479 |
| 5480 | 2807 | 1703 | 613 | 3936 | 5485 | 5486 | 3993 | 4087 | 4491 | 5491 | 1706 | 1707 | 4454 | 5495 | 5496 | 5497 | 1709 | 5499 |
| 3312 | 5501 | 5502 | 1710 | 5504 | 5505 | 4445 | 1711 | 3755 | 5509 | 2820 | 5511 | 2942 | 1713 | 5514 | 5515 | 3813 | 5517 | 1430 | 1715 |
| 5520 | 5521 | 5522 | 5523 | 5524 | 1716 | 5526 | 5527 | 1075 | 2943 | 1719 | 1720 | 5532 | 5533 | 3365 | 5535 | 4459 | 5537 | 5538 | 2646 |
| 1722 | 5541 | 5542 | 2473 | 1724 | 5545 | 2430 | 5547 | 2423 | 5549 | 5550 | 3229 | 5552 | 5553 | 3623 | 616 | 5556 | 5557 | 5558 | 5559 |
| 5560 | 1728 | 5562 | 5563 | 617 | 1730 | 5566 | 5567 | 5568 | 5569 | 3102 | 5571 | 4568 | 3961 | 5574 | 1731 | 1362 | 5577 | 5578 | 5579 |
| 1732 | 5581 | 4478 | 5583 | 348 | 5585 | 3103 | 1734 | 5588 | 5589 | 5590 | 3964 | 5592 | 5593 | 5594 | 5595 | 5596 | 2912 | 5598 | 5599 |
| 1275 | 1436 | 5602 | 2699 | 5604 | 5605 | 5606 | 5607 | 3934 | 5609 | 5610 | 5611 | 5612 | 5613 | 5614 | 136 | 620 | 5617 | 1739 | 5619 |
| 5620 | 5621 | 5622 | 1450 | 5624 | 5625 | 5626 | 1741 | 5628 | 5629 | 5630 | 5631 | 5632 | 5633 | 5634 | 5635 | 1742 | 2662 | 3870 | 5639 |
| 3450 | 5641 | 1745 | 5643 | 5644 | 212 | 5646 | 1746 | 4526 | 5649 | 5650 | 1747 | 1748 | 5653 | 1749 | 5655 | 3514 | 5657 | 5658 | 1751 |
| 5660 | 5661 | 5662 | 362 | 5664 | 5665 | 5666 | 5667 | 2635 | 5669 | 5670 | 5671 | 1753 | 1754 | 1755 | 5675 | 3020 | 5677 | 1111 | 5679 |
| 5680 | 3451 | 5682 | 1757 | 5684 | 5685 | 5686 | 1758 | 5688 | 4548 | 1759 | 5691 | 3588 | 3714 | 4141 | 5695 | 3234 | 2701 | 4482 | 1383 |
| 5700 | 5701 | 5702 | 1417 | 205 | 5705 | 5706 | 5707 | 5708 | 1038 | 4030 | 1145 | 5712 | 5713 | 4567 | 4215 | 5716 | 5717 | 5718 | 5719 |
| 5720 | 5721 | 2802 | 1202 | 5724 | 4602 | 3038 | 2663 | 5728 | 4554 | 1161 | 2947 | 5732 | 4004 | 5734 | 1769 | 3232 | 5737 | 5738 | 5739 |
| 5740 | 1444 | 5742 | 5743 | 5744 | 1217 | 2435 | 5747 | 3060 | 5749 | 5750 | 5751 | 4366 | 5753 | 5754 | 5755 | 5756 | 5757 | 3329 | 626 |

-continued

| | | | | | | | | | | | | | | | | | | | |
|---|---|---|---|---|---|---|---|---|---|---|---|---|---|---|---|---|---|---|---|
| 5760 | 5761 | 3633 | 5763 | 5764 | 5765 | 627 | 3366 | 5768 | 5769 | 1775 | 4561 | 4040 | 5773 | 5774 | 5775 | 5776 | 138 | 5778 | 5779 |
| 2703 | 496 | 2886 | 5783 | 5784 | 5785 | 5786 | 5787 | 4222 | 5789 | 5790 | 5791 | 5792 | 5793 | 5794 | 1778 | 1779 | 5797 | 630 | 5799 |
| 5800 | 5801 | 1039 | 1781 | 1782 | 5805 | 5806 | 2499 | 5808 | 2948 | 5810 | 5811 | 3394 | 5813 | 3845 | 1783 | 3310 | 1785 | 5818 | 5819 |
| 5820 | 5821 | 5822 | 2704 | 1147 | 5825 | 5826 | 826 | 1337 | 5829 | 5830 | 1789 | 4109 | 4342 | 4317 | 5835 | 4586 | 5837 | 5838 | 1792 |
| 1793 | 5841 | 5842 | 2500 | 5844 | 5845 | 5846 | 5847 | 5848 | 5849 | 5850 | 1794 | 1795 | 3745 | 5854 | 5855 | 5856 | 5857 | 5858 | 35 |
| 2949 | 5861 | 5862 | 140 | 5864 | 971 | 5866 | 1800 | 273 | 5869 | 1802 | 5871 | 5872 | 5873 | 5874 | 3212 | 4504 | 5877 | 3590 | 3605 |
| 3940 | 5881 | 5882 | 5883 | 5884 | 5885 | 3665 | 1805 | 3217 | 635 | 63 | 3805 | 5892 | 5893 | 3332 | 636 | 3719 | 5897 | 1433 | 1093 |
| 976 | 1149 | 5902 | 3558 | 5904 | 5905 | 1813 | 5907 | 5908 | 5909 | 4112 | 1815 | 5912 | 5913 | 5914 | 639 | 2706 | 5917 | 5918 | 5919 |
| 5920 | 5921 | 5922 | 5923 | 5924 | 1817 | 1818 | 5927 | 5928 | 5929 | 5930 | 5931 | 1819 | 506 | 5934 | 5935 | 5936 | 5937 | 5938 | 1820 |
| 5940 | 5941 | 3460 | 5943 | 5944 | 5945 | 3783 | 640 | 5948 | 4155 | 5950 | 5951 | 3461 | 5953 | 5954 | 5955 | 1203 | 5957 | 5958 | 5959 |
| 5960 | 1824 | 349 | 5963 | 5964 | 5965 | 5966 | 5967 | 1825 | 5969 | 3785 | 5971 | 1167 | 5973 | 5974 | 1826 | 5976 | 5977 | 641 | 5979 |
| 5980 | 1373 | 3918 | 21 | 5984 | 5985 | 5986 | 5987 | 5988 | 5989 | 3333 | 5991 | 5992 | 4440 | 5994 | 5995 | 5996 | 1830 | 2502 | 908 |
| 6000 | 6001 | 6002 | 6003 | 6004 | 6005 | 6006 | 6007 | 6008 | 6009 | 6010 | 6011 | 1831 | 1832 | 642 | 6015 | 6016 | 6017 | 6018 | 1834 |
| 3109 | 6021 | 6022 | 6023 | 1204 | 2950 | 6026 | 6027 | 6028 | 6029 | 6030 | 1836 | 3734 | 6033 | 1838 | 2708 | 4527 | 6037 | 3855 | 6039 |
| 1839 | 6041 | 3110 | 3111 | 1422 | 2951 | 1841 | 3462 | 645 | 6049 | 1844 | 6051 | 6052 | 6053 | 3056 | 909 | 647 | 209 | 1847 | 1121 |
| 174 | 6061 | 6062 | 6063 | 6064 | 2823 | 1158 | 4167 | 143 | 1849 | 2952 | 6071 | 6072 | 2643 | 204 | 6075 | 3052 | 6077 | 3788 | 3752 |
| 1850 | 6081 | 6082 | 6083 | 2953 | 6085 | 6086 | 6087 | 2445 | 609 | 649 | 6092 | 6093 | 6094 | 6095 | 6096 | 2824 | 6098 | 6099 | |
| 6100 | 6101 | 4250 | 1042 | 1853 | 6105 | 1854 | 6107 | 6108 | 6109 | 6110 | 6111 | 6112 | 1322 | 4301 | 6115 | 6116 | 6117 | 6118 | 6119 |
| 6120 | 6121 | 1855 | 6123 | 6124 | 6125 | 1856 | 1857 | 6128 | 6129 | 522 | 3265 | 6132 | 6133 | 6134 | 6135 | 6136 | 951 | 6138 | 6139 |
| 6140 | 277 | 371 | 6143 | 6144 | 6145 | 6146 | 6147 | 4505 | 4086 | 6150 | 6151 | 6152 | 6153 | 6154 | 6155 | 6156 | 6157 | 519 | 6159 |
| 1347 | 6161 | 1862 | 651 | 6164 | 6165 | 1864 | 6167 | 6168 | 3266 | 512 | 6171 | 3519 | 965 | 6174 | 6175 | 6176 | 1866 | 2712 | 6179 |
| 210 | 6181 | 6182 | 6183 | 3828 | 6185 | 3267 | 6187 | 6188 | 6189 | 1867 | 6191 | 6192 | 3760 | 1868 | 6195 | 6196 | 3831 | 652 | 6199 |
| 3114 | 4415 | 827 | 1043 | 912 | 3673 | 1870 | 6207 | 2826 | 3116 | 1286 | 653 | 6212 | 1872 | 2715 | 654 | 4386 | 6217 | 6218 | 6219 |
| 6220 | 6221 | 2956 | 6223 | 6224 | 6225 | 1874 | 6227 | 6228 | 1875 | 1876 | 6231 | 6232 | 2655 | 6234 | 6235 | 372 | 6237 | 4229 | 6239 |
| 1878 | 3637 | 3891 | 84 | 3735 | 6245 | 6246 | 1880 | 6248 | 6249 | 1165 | 656 | 6252 | 6253 | 6254 | 6255 | 6256 | 6257 | 6258 | 6259 |
| 4008 | 14 | 6262 | 6263 | 6264 | 6265 | 657 | 6267 | 6268 | 6269 | 6270 | 6271 | 6272 | 6273 | 1883 | 351 | 215 | 6277 | 6278 | 6279 |
| 1166 | 6281 | 6282 | 467 | 6284 | 1886 | 3019 | 6287 | 6288 | 6289 | 3984 | 6291 | 6292 | 6293 | 6294 | 6295 | 6296 | 6297 | 6298 | 6299 |
| 6300 | 4465 | 6302 | 6303 | 6304 | 6305 | 4489 | 6307 | 4525 | 6309 | 1021 | 3269 | 99 | 3771 | 4116 | 4080 | 1044 | 6317 | 6318 | 6319 |
| 2441 | 1889 | 6322 | 1890 | 6324 | 6325 | 2958 | 6327 | 6328 | 6329 | 6330 | 6331 | 6332 | 4472 | 6334 | 990 | 6336 | 6337 | 114 | 6339 |
| 6340 | 6341 | 6342 | 6343 | 6344 | 6345 | 1893 | 4595 | 1894 | 6349 | 1319 | 1896 | 3766 | 6353 | 6354 | 6355 | 6356 | 6357 | 1191 | 1897 |
| 6360 | 6361 | 1898 | 6363 | 6364 | 4315 | 6366 | 6367 | 6368 | 1192 | 6370 | 6371 | 6372 | 1899 | 2718 | 6375 | 6376 | 6377 | 6378 | 4005 |
| 6380 | 6381 | 1901 | 2903 | 1012 | 403 | 6386 | 2507 | 2508 | 3270 | 6390 | 1903 | 6392 | 6393 | 992 | 1904 | 6396 | 6397 | 3213 | 3206 |
| 6400 | 4409 | 6402 | 6403 | 6404 | 3839 | 6406 | 6407 | 6408 | 145 | 1906 | 6411 | 6412 | 6413 | 6414 | 4023 | 6416 | 6417 | 662 | 2509 |
| 507 | 3271 | 6422 | 3121 | 2865 | 3272 | 6426 | 3597 | 6428 | 6429 | 1094 | 6431 | 3466 | 6433 | 663 | 1910 | 6436 | 6437 | 6438 | 6439 |
| 6440 | 2510 | 3368 | 6443 | 6444 | 6445 | 1912 | 6447 | 6448 | 6449 | 4001 | 6451 | 6452 | 6453 | 4108 | 2511 | 1914 | 6457 | 3369 | 4390 |
| 6460 | 282 | 6462 | 1140 | 6464 | 6465 | 3598 | 6467 | 6468 | 915 | 4073 | 6471 | 6472 | 2479 | 3123 | 6475 | 6476 | 6477 | 6478 | 1340 |
| 1919 | 54 | 6482 | 6483 | 6484 | 6485 | 6486 | 3883 | 1242 | 6489 | 1922 | 6491 | 2910 | 4011 | 6494 | 852 | 3572 | 3126 | 6498 | 2513 |
| 285 | 6501 | 6502 | 6503 | 1048 | 6505 | 3128 | 1926 | 3791 | 1049 | 4573 | 2442 | 6512 | 2514 | 1927 | 2515 | 837 | 4287 | 426 | 6519 |
| 6520 | 3047 | 3638 | 1266 | 1929 | 6525 | 1930 | 3132 | 6528 | 286 | 1932 | 2965 | 6532 | 6533 | 1346 | 1933 | 1934 | 6537 | 6538 | 6539 |
| 1935 | 6541 | 1936 | 942 | 4264 | 6545 | 6546 | 3133 | 6548 | 1260 | 1937 | 4088 | 4206 | 6553 | 6554 | 6555 | 6556 | 2516 | 6558 | 4210 |
| 1304 | 6561 | 1939 | 1194 | 3218 | 3733 | 2517 | 6567 | 6568 | 6569 | 116 | 2518 | 3276 | 6573 | 2966 | 6575 | 672 | 6577 | 1229 | 6579 |
| 6580 | 6581 | 6582 | 287 | 2967 | 436 | 1946 | 4029 | 6588 | 6589 | 471 | 6591 | 6592 | 6593 | 1947 | 3761 | 6596 | 6597 | 1948 | 6599 |
| 6600 | 6601 | 1949 | 6603 | 6604 | 3955 | 6606 | 2519 | 6608 | 1950 | 3533 | 6611 | 2721 | 6613 | 675 | 4036 | 6616 | 6617 | 6618 | 676 |
| 6620 | 4146 | 677 | 6623 | 6624 | 6625 | 6626 | 4060 | 6628 | 6629 | 3911 | 853 | 6632 | 6633 | 1955 | 6635 | 6636 | 6637 | 6638 | 831 |
| 6640 | 6641 | 6642 | 4220 | 6644 | 4456 | 3639 | 6647 | 6648 | 6649 | 48 | 2723 | 6652 | 6653 | 6654 | 1956 | 6656 | 3683 | 1221 | 4578 |
| 1958 | 6661 | 6662 | 3136 | 1959 | 2521 | 6666 | 6667 | 1961 | 3137 | 6672 | 1962 | 6674 | 6675 | 6676 | 918 | 6678 | 109 | | |
| 681 | 2725 | 213 | 1965 | 3767 | 6685 | 6686 | 6687 | 6688 | 3138 | 6690 | 683 | 6692 | 1098 | 1968 | 6695 | 3903 | 2895 | 893 | 6699 |
| 6700 | 4278 | 1051 | 6703 | 1971 | 6705 | 1387 | 3224 | 6708 | 6709 | 4523 | 1268 | 6712 | 6713 | 3640 | 2522 | 1973 | 6717 | 1269 | 6719 |
| 6720 | 6721 | 6722 | 2729 | 2523 | 6725 | 188 | 685 | 352 | 3280 | 6730 | 2803 | 290 | 6733 | 1978 | 3141 | 6736 | 6737 | 1052 | 3737 |
| 6740 | 6741 | 6742 | 183 | 6744 | 6745 | 3486 | 6747 | 6748 | 6750 | 4241 | 689 | 527 | 690 | 6755 | 6756 | 6757 | 4125 | 2731 | |
| 6760 | 6761 | 6762 | 1257 | 1985 | 4062 | 6766 | 6767 | 1986 | 6769 | 1987 | 291 | 6772 | 3684 | 6774 | 3534 | 4335 | 6777 | 6778 | 112 |
| 6780 | 6781 | 4127 | 6783 | 6784 | 2732 | 6786 | 1991 | 1992 | 148 | 1994 | 6791 | 1995 | 6793 | 1053 | 2733 | 6796 | 6797 | 6798 | 293 |
| 4387 | 891 | 6802 | 6803 | 1998 | 3064 | 2526 | 4577 | 6808 | 6809 | 3230 | 43 | 4098 | 896 | 4182 | 954 | 1329 | 6817 | 2001 | 4486 |
| 3215 | 3414 | 6822 | 3282 | 2002 | 295 | 2004 | 4427 | 6828 | 3818 | 3494 | 375 | 6832 | 1365 | 3063 | 699 | 3373 | 3374 | 1326 | |
| 3953 | 6841 | 2528 | 2801 | 6844 | 2529 | 4545 | 2008 | 2443 | 6849 | 1399 | 855 | 4285 | 4059 | 4218 | 6855 | 6856 | 6857 | 3561 | 296 |
| 6860 | 6861 | 2831 | 1296 | 702 | 3516 | 3283 | 2735 | 6868 | 3866 | 3774 | 2014 | 6872 | 3235 | 149 | 3484 | 150 | 6877 | 299 | 4410 |
| 6880 | 2867 | 2463 | 3145 | 3867 | 6885 | 4512 | 2532 | 6888 | 2969 | 6890 | 6891 | 6892 | 6893 | 3641 | 2424 | 2019 | 6897 | 2020 | 6899 |
| 2021 | 2897 | 2970 | 2971 | 1348 | 6905 | 6906 | 2022 | 2023 | 6909 | 4055 | 2024 | 6913 | 2832 | 1409 | 6916 | 185 | 6918 | 856 | |
| 300 | 6921 | 1412 | 857 | 6924 | 2972 | 6926 | 6927 | 6928 | 2027 | 6930 | 3928 | 2028 | 6933 | 708 | 6935 | 2030 | 6937 | 1123 | 3746 |
| 6940 | 6941 | 6942 | 2031 | 6944 | 75 | 6946 | 6947 | 709 | 6949 | 2538 | 2869 | 6952 | 3769 | 6954 | 86 | 4114 | 6957 | 2034 | 995 |
| 6960 | 6961 | 6962 | 6963 | 6964 | 2035 | 6966 | 353 | 711 | 6969 | 6970 | 2037 | 3941 | 6973 | 712 | 2737 | 6976 | 6977 | 6978 | 2040 |
| 6980 | 6981 | 6982 | 6983 | 2041 | 6985 | 6986 | 3285 | 6988 | 6989 | 713 | 3856 | 6993 | 4063 | 996 | 3895 | 860 | 6998 | 3075 | |
| 7000 | 7001 | 526 | 2541 | 2044 | 7005 | 7006 | 2045 | 2046 | 1017 | 2047 | 377 | 3716 | 1228 | 2450 | 2048 | 1218 | 29 | 152 | 3146 |
| 3749 | 7021 | 7022 | 4434 | 3987 | 7025 | 7026 | 1363 | 7028 | 7029 | 717 | 7031 | 123 | 2542 | 3468 | 7035 | 7036 | 3147 | 7038 | 2053 |
| 3566 | 7041 | 7042 | 2055 | 2056 | 7045 | 4368 | 2739 | 7048 | 4132 | 3729 | 2740 | 7052 | 3552 | 2059 | 3148 | 3355 | 7057 | 107 | 2872 |
| 7060 | 2889 | 7062 | 2741 | 7064 | 7065 | 719 | 2742 | 7068 | 4584 | 7070 | 7071 | 7072 | 7073 | 7074 | 861 | 7076 | 7077 | 7078 | 2545 |
| 2063 | 7081 | 3538 | 7083 | 7084 | 3738 | 7086 | 7087 | 7088 | 2969 | 303 | 4110 | 2475 | 7093 | 4173 | 7095 | 7096 | 1115 | 7098 | 2067 |
| 7100 | 7101 | 2068 | 721 | 7104 | 7105 | 2906 | 3151 | 378 | 2070 | 7110 | 2546 | 7112 | 7113 | 7114 | 1142 | 3686 | 7117 | 2073 | 997 |
| 7120 | 7121 | 7122 | 7123 | 899 | 7125 | 7126 | 3642 | 2074 | 7129 | 862 | 4235 | 7132 | 7133 | 7134 | 2549 | 7136 | 7137 | 3152 | 1297 |
| 7140 | 195 | 7142 | 3670 | 4550 | 723 | 7146 | 4552 | 3028 | 7149 | 7150 | 177 | 2081 | 7153 | 1293 | 1403 | 7156 | 7157 | 1446 | 4398 |
| 7160 | 7161 | 7162 | 7163 | 2083 | 7165 | 4431 | 1057 | 7168 | 3378 | 7170 | 2085 | 7173 | 2086 | 724 | 1176 | 3200 | 3661 | 725 | |
| 925 | 2089 | 7182 | 2550 | 2978 | 7185 | 7186 | 7187 | 2091 | 7189 | 2092 | 3817 | 7192 | 7193 | 7194 | 2093 | 1153 | 2634 | 7198 | 7199 |
| 2094 | 7201 | 2095 | 3581 | 2096 | 726 | 7206 | 3379 | 7208 | 1255 | 342 | 2099 | 7212 | 3687 | 2796 | 3338 | 7216 | 2101 | 7218 | 3881 |
| 2103 | 7221 | 2979 | 7223 | 2551 | 7225 | 3339 | 3470 | 7228 | 7229 | 7230 | 729 | 3155 | 7233 | 7234 | 7235 | 2106 | 7237 | 3433 | 2873 |
| 2552 | 305 | 7242 | 3709 | 7244 | 7245 | 2109 | 2751 | 7248 | 897 | 7250 | 7251 | 7252 | 3380 | 1316 | 3401 | 2111 | 7257 | 7258 | 2112 |
| 7260 | 7261 | 2113 | 7263 | 7264 | 7265 | 7266 | 306 | 1261 | 7269 | 2809 | 7271 | 927 | 7273 | 2554 | 1124 | 2555 | 1381 | 7278 | 3021 |
| 7280 | 7281 | 2118 | 2119 | 7284 | 2804 | 7286 | 7287 | 7288 | 2557 | 7290 | 2120 | 2121 | 4588 | 3471 | 7295 | 7296 | 7297 | 834 | 7299 |
| 7300 | 7301 | 7302 | 732 | 7304 | 7305 | 12 | 3997 | 2125 | 7309 | 354 | 3874 | 7312 | 4514 | 7314 | 2128 | 7316 | 7317 | 2129 | 2130 |
| 7320 | 7321 | 2905 | 7323 | 7324 | 2559 | 7326 | 2131 | 3032 | 2132 | 7330 | 7331 | 7332 | 7333 | 25 | 7335 | 7336 | 2925 | 7338 | 735 |
| 7340 | 7341 | 2135 | 7343 | 2136 | 7345 | 3617 | 736 | 2915 | 57 | 7350 | 2139 | 7352 | 4547 | 2140 | 3808 | 7356 | 7357 | 7358 | 7359 |

-continued

| | | | | | | | | | | | | | | | | | | | |
|---|---|---|---|---|---|---|---|---|---|---|---|---|---|---|---|---|---|---|---|
| 7360 | 2561 | 7362 | 2142 | 2839 | 310 | 3775 | 7367 | 2145 | 7369 | 835 | 7371 | 7372 | 7373 | 7374 | 2146 | 7376 | 7377 | 2478 | 7379 |
| 2148 | 7381 | 2149 | 156 | 7384 | 7385 | 7386 | 2151 | 312 | 7389 | 7390 | 2153 | 7392 | 7393 | 2154 | 7395 | 928 | 313 | 7398 | 2156 |
| 3732 | 7401 | 3223 | 7403 | 2158 | 7405 | 998 | 7407 | 7408 | 7409 | 3044 | 7411 | 7412 | 7413 | 7414 | 7415 | 90 | 744 | 2161 | 1386 |
| 7420 | 7421 | 7422 | 2562 | 7424 | 3157 | 7426 | 1013 | 7428 | 2453 | 7430 | 7431 | 7432 | 3354 | 7434 | 7435 | 2164 | 7437 | 3833 | 2563 |
| 2165 | 7441 | 2166 | 3853 | 7444 | 7445 | 7446 | 3807 | 7448 | 7449 | 2168 | 7451 | 745 | 7453 | 315 | 7455 | 1016 | 7457 | 7458 | 2564 |
| 7460 | 7461 | 7462 | 2171 | 7464 | 3927 | 7466 | 7467 | 7468 | 2172 | 7470 | 747 | 748 | 7473 | 7474 | 7475 | 2175 | 7477 | 2176 | 7479 |
| 7480 | 3739 | 7482 | 749 | 7484 | 7485 | 7486 | 7487 | 7488 | 7489 | 2178 | 7491 | 7492 | 429 | 7494 | 3158 | 7496 | 3159 | 7498 | 7499 |
| 7500 | 3160 | 7502 | 7503 | 7504 | 2181 | 7506 | 7507 | 3314 | 7509 | 1336 | 2182 | 7513 | 7514 | 7515 | 7516 | 7517 | 2183 | 7519 |
| 7520 | 7521 | 2184 | 7523 | 7524 | 7525 | 865 | 2982 | 7528 | 97 | 7530 | 2185 | 7532 | 7533 | 7534 | 1125 | 7536 | 970 | 7538 | 1276 |
| 3863 | 7541 | 3350 | 7543 | 7544 | 7545 | 7546 | 7547 | 3824 | 7549 | 7550 | 7551 | 7552 | 7553 | 7554 | 7555 | 7556 | 7557 | 7558 | 7559 |
| 7560 | 7561 | 2568 | 7563 | 2189 | 2190 | 7566 | 7567 | 7568 | 2477 | 7570 | 498 | 7572 | 2983 | 7574 | 7575 | 2984 | 513 | 7578 | 7579 |
| 7580 | 7581 | 7582 | 441 | 4508 | 7585 | 7586 | 7587 | 7588 | 3540 | 1404 | 2194 | 7592 | 7593 | 4422 | 7595 | 929 | 4363 | 867 | 7599 |
| 7600 | 2571 | 7602 | 755 | 2197 | 7605 | 2198 | 4197 | 1445 | 2572 | 7610 | 2199 | 2200 | 1288 | 7614 | 7615 | 3951 | 4373 | 7618 | 7619 |
| 3644 | 7621 | 2985 | 7623 | 7624 | 3796 | 7626 | 2203 | 7628 | 3601 | 477 | 7631 | 71 | 7633 | 317 | 868 | 4236 | 757 | 7638 | 3163 |
| 7640 | 7641 | 3567 | 7643 | 7644 | 1458 | 7646 | 7647 | 2207 | 2986 | 7650 | 7651 | 2208 | 318 | 7654 | 7655 | 2757 | 7657 | 7658 | 7659 |
| 7660 | 4061 | 7662 | 759 | 7664 | 7665 | 7666 | 7667 | 2211 | 2212 | 760 | 7671 | 4050 | 2214 | 7674 | 7675 | 7676 | 7677 | 179 | 120 |
| 7680 | 2843 | 7682 | 7683 | 102 | 4451 | 7686 | 7687 | 2215 | 7689 | 7690 | 7691 | 7692 | 7693 | 4270 | 7695 | 7696 | 7697 | 7698 | 761 |
| 1206 | 2987 | 2217 | 7703 | 2218 | 7705 | 7706 | 7707 | 2219 | 3954 | 7710 | 7711 | 7712 | 7713 | 7714 | 7715 | 2759 | 7717 | 7718 | 7719 |
| 3699 | 2988 | 7722 | 7723 | 762 | 2223 | 7726 | 7727 | 2760 | 7729 | 2649 | 7731 | 7732 | 4164 | 7734 | 763 | 3794 | 7737 | 7738 | 7739 |
| 2225 | 7741 | 2226 | 764 | 7744 | 3868 | 7746 | 2229 | 7748 | 2670 | 4453 | 7751 | 3543 | 7753 | 3473 | 7755 | 2230 | 2989 | 7758 | 7759 |
| 7760 | 765 | 7762 | 7763 | 7764 | 7765 | 7766 | 7767 | 7768 | 7769 | 18 | 7772 | 7773 | 7774 | 7775 | 2233 | 7777 | 7778 | 7779 |
| 7780 | 2234 | 7782 | 2235 | 7784 | 7785 | 515 | 7787 | 2762 | 7789 | 7790 | 7791 | 7792 | 7793 | 7794 | 7795 | 2763 | 2236 | 7798 | 7799 |
| 3208 | 7801 | 7802 | 7803 | 7804 | 7805 | 7806 | 2237 | 3416 | 7809 | 7810 | 7811 | 3166 | 7813 | 320 | 7815 | 7816 | 7817 | 3841 | 7819 |
| 7820 | 4294 | 3291 | 3701 | 2765 | 3050 | 7826 | 7827 | 2240 | 7829 | 7830 | 898 | 3947 | 7833 | 2990 | 7835 | 7836 | 1434 | 42 | 7839 |
| 7840 | 7841 | 7842 | 1357 | 7844 | 7845 | 4251 | 7847 | 2459 | 7849 | 2243 | 2244 | 7852 | 7853 | 7854 | 7855 | 7856 | 7857 | 30 | 7859 |
| 7860 | 7861 | 7862 | 7863 | 3168 | 7865 | 7866 | 7867 | 7868 | 7869 | 322 | 7871 | 7872 | 7873 | 3417 | 7875 | 7876 | 7877 | 7878 | 4444 |
| 7880 | 2247 | 3042 | 7883 | 2248 | 7885 | 772 | 7887 | 2250 | 7888 | 7889 | 7890 | 7891 | 2251 | 7893 | 7894 | 3544 | 4587 | 1263 | 7898 | 7899 |
| 7900 | 7901 | 3545 | 7903 | 7904 | 7905 | 159 | 2991 | 7908 | 3942 | 2992 | 7911 | 7912 | 4012 | 7914 | 2253 | 1299 | 7917 | 7918 | 7919 |
| 7920 | 2845 | 2254 | 7923 | 7924 | 7925 | 2255 | 7927 | 7928 | 7929 | 2439 | 7931 | 2768 | 3353 | 3690 | 7935 | 2256 | 7937 | 7938 | 7939 |
| 3702 | 2257 | 774 | 7943 | 7944 | 7945 | 7946 | 870 | 7948 | 7949 | 7950 | 2446 | 1305 | 2653 | 7954 | 7955 | 7956 | 7957 | 2577 | 7959 |
| 7960 | 7961 | 3697 | 7963 | 7964 | 7965 | 7966 | 7967 | 2261 | 4338 | 7970 | 7971 | 7972 | 7973 | 7974 | 7975 | 7976 | 2769 | 2262 | 7979 |
| 7980 | 4243 | 7982 | 3352 | 1459 | 7985 | 7986 | 4242 | 4035 | 7989 | 2265 | 1376 | 7992 | 2266 | 871 | 7995 | 7996 | 7997 | 836 | 7999 |
| 8000 | 8001 | 8002 | 1310 | 2770 | 8005 | 8006 | 8007 | 1007 | 8009 | 8010 | 8011 | 8012 | 326 | 2269 | 8015 | 8016 | 8017 | 8018 | 8019 |
| 8020 | 8021 | 8022 | 2270 | 8024 | 8025 | 3546 | 8027 | 8028 | 8029 | 327 | 8031 | 8032 | 8033 | 8034 | 8035 | 8036 | 8037 | 8038 | 8039 |
| 2273 | 8041 | 8042 | 8043 | 2771 | 8045 | 2993 | 8047 | 8048 | 8049 | 3667 | 8051 | 8052 | 8053 | 8054 | 2275 | 8056 | 999 | 8058 | 1258 |
| 4006 | 8061 | 4607 | 1352 | 8064 | 8065 | 779 | 1000 | 8068 | 8069 | 8070 | 8071 | 8072 | 3676 | 2996 | 1001 | 780 | 8077 | 8078 | 8079 |
| 8080 | 8081 | 8082 | 2279 | 8084 | 8085 | 2280 | 8087 | 8088 | 8089 | 4321 | 2579 | 8092 | 8093 | 4254 | 3219 | 8096 | 8097 | 4476 | 8099 |
| 8100 | 8101 | 2283 | 95 | 8104 | 4020 | 4603 | 8107 | 8108 | 8109 | 8110 | 3795 | 3611 | 8113 | 8114 | 6 | 3068 | 8117 | 2665 | 4038 |
| 8120 | 8121 | 2287 | 186 | 1002 | 8125 | 8126 | 8127 | 8128 | 8129 | 8130 | 3513 | 8132 | 8133 | 8134 | 8135 | 8136 | 8137 | 784 | 8139 |
| 2999 | 2656 | 8142 | 8143 | 8144 | 8145 | 8146 | 430 | 2290 | 8149 | 8150 | 8151 | 8152 | 8153 | 8154 | 1327 | 4583 | 3000 | 2291 | 8159 |
| 8160 | 8161 | 8162 | 2292 | 8164 | 8165 | 8166 | 1103 | 4524 | 8169 | 8170 | 8171 | 8172 | 8173 | 785 | 2470 | 2295 | 8177 | 8178 | 4395 |
| 8180 | 8181 | 8182 | 111 | 786 | 8185 | 8186 | 8187 | 4443 | 8189 | 8190 | 8191 | 8192 | 3203 | 2297 | 3074 | 8196 | 8197 | 8198 | 2298 |
| 8200 | 8201 | 8202 | 2299 | 8204 | 8205 | 8206 | 8207 | 8208 | 4404 | 2301 | 8211 | 8212 | 8213 | 3173 | 8215 | 8216 | 8217 | 8218 | 8219 |
| 8220 | 8221 | 832 | 8223 | 3002 | 8225 | 8226 | 8227 | 8228 | 329 | 788 | 8231 | 8232 | 8233 | 2305 | 8235 | 8236 | 8237 | 8238 | 8239 |
| 8240 | 8241 | 8242 | 8243 | 8244 | 2306 | 2307 | 8247 | 8248 | 8249 | 2773 | 8251 | 8252 | 8253 | 3782 | 3975 | 419 | 8257 | 8258 | 3209 |
| 8260 | 8261 | 1250 | 8263 | 8264 | 2309 | 8266 | 8267 | 2877 | 8269 | 2310 | 8271 | 1108 | 8273 | 8274 | 8275 | 8276 | 8277 | 8278 | 3612 |
| 8280 | 2311 | 8282 | 4105 | 8284 | 8285 | 2312 | 8287 | 8288 | 8289 | 8290 | 8291 | 8292 | 3437 | 3731 | 8295 | 8296 | 4200 | 1178 | 8299 |
| 8300 | 790 | 8302 | 3176 | 8304 | 933 | 8306 | 8307 | 1155 | 8309 | 8310 | 791 | 3003 | 8313 | 8314 | 2797 | 2315 | 2316 | 8318 | 8319 |
| 2580 | 4337 | 3004 | 8323 | 8324 | 8325 | 8326 | 1195 | 3503 | 4217 | 3388 | 8331 | 8332 | 8333 | 8334 | 8335 | 8336 | 330 | 3343 | 3821 |
| 3055 | 4580 | 8342 | 8343 | 8344 | 1104 | 8346 | 8347 | 793 | 8349 | 8350 | 3666 | 2322 | 8353 | 1064 | 8355 | 331 | 8357 | 1321 | 8359 |
| 8360 | 8361 | 795 | 2582 | 4230 | 8365 | 8366 | 2325 | 8368 | 8369 | 8370 | 3296 | 1382 | 2481 | 4323 | 8375 | 8376 | 1393 | 3711 | 8379 |
| 8380 | 8381 | 8382 | 3999 | 3712 | 8385 | 8386 | 2583 | 8388 | 8389 | 8390 | 8391 | 2328 | 8393 | 8394 | 8395 | 8396 | 8397 | 8398 | 44 |
| 2329 | 3559 | 8402 | 796 | 8404 | 4097 | 4143 | 3477 | 8408 | 1180 | 8410 | 4305 | 8412 | 4374 | 2584 | 8415 | 1418 | 8417 | 3490 | 4470 |
| 8420 | 8421 | 8422 | 3703 | 1219 | 1220 | 8426 | 2586 | 797 | 8429 | 2333 | 8431 | 4326 | 8433 | 2775 | 8435 | 3006 | 203 | 3389 | 2334 |
| 8440 | 8441 | 1116 | 3723 | 8444 | 2335 | 8446 | 8447 | 2587 | 8449 | 2588 | 8451 | 1384 | 8453 | 8454 | 2336 | 2776 | 8457 | 8458 | 2589 |
| 2337 | 8461 | 3007 | 2875 | 3397 | 8465 | 3008 | 8467 | 8468 | 8469 | 8470 | 8471 | 3222 | 3569 | 8474 | 8475 | 8476 | 8477 | 3311 | 1139 |
| 8480 | 437 | 8482 | 8483 | 1105 | 3392 | 2591 | 798 | 4462 | 8489 | 8490 | 8491 | 8492 | 1067 | 8494 | 8495 | 2777 | 2341 | 1004 | 4047 |
| 873 | 8501 | 8502 | 8503 | 2342 | 8505 | 8506 | 8507 | 8508 | 3024 | 1291 | 8511 | 3797 | 8513 | 8514 | 4263 | 8516 | 8517 | 8518 | 2343 |
| 8520 | 8521 | 4033 | 2593 | 8524 | 113 | 8526 | 800 | 8528 | 3647 | 8530 | 8531 | 2345 | 2346 | 8534 | 8535 | 8536 | 8537 | 3730 | 8539 |
| 2347 | 8541 | 8542 | 8543 | 3648 | 8545 | 8546 | 8547 | 8548 | 8549 | 8550 | 3907 | 972 | 2778 | 8554 | 8555 | 8556 | 3069 | 829 | 356 |
| 8560 | 3990 | 8562 | 4458 | 8564 | 2595 | 8566 | 3301 | 801 | 222 | 8570 | 8571 | 8572 | 4027 | 8574 | 8575 | 8576 | 8577 | 1435 | 8579 |
| 8580 | 8581 | 3183 | 8583 | 8584 | 8585 | 8586 | 1006 | 8588 | 332 | 8590 | 8591 | 8592 | 8593 | 8594 | 2914 | 8596 | 3864 | 8598 | 2351 |
| 8600 | 3843 | 8602 | 1324 | 2352 | 8605 | 8606 | 1068 | 8608 | 2908 | 8610 | 8611 | 8612 | 8613 | 8614 | 8615 | 8616 | 472 | 8618 | 363 |
| 8620 | 8621 | 8622 | 4013 | 8624 | 162 | 8626 | 3037 | 2597 | 8629 | 2598 | 8631 | 8632 | 8633 | 8634 | 1244 | 2356 | 8637 | 8638 | 2599 |
| 804 | 8641 | 8642 | 8643 | 8644 | 2358 | 8646 | 8647 | 8648 | 8649 | 8650 | 399 | 8652 | 8653 | 1252 | 8655 | 8656 | 8657 | 8658 | 3018 |
| 8660 | 2780 | 8662 | 8663 | 2600 | 8665 | 2848 | 93 | 4515 | 8669 | 8670 | 806 | 2361 | 8673 | 8674 | 8675 | 2362 | 8677 | 8678 | 3550 |
| 8680 | 8681 | 8682 | 8683 | 2363 | 8685 | 8686 | 8687 | 8688 | 3555 | 2676 | 8691 | 2364 | 8692 | 8693 | 8694 | 3713 | 8696 | 935 | 3302 | 4385 |
| 8700 | 8701 | 2601 | 8703 | 8704 | 8705 | 8706 | 8707 | 2365 | 8709 | 8710 | 8711 | 807 | 8713 | 8714 | 3608 | 8716 | 2367 | 8718 | 357 |
| 8720 | 8721 | 2636 | 8723 | 8724 | 876 | 3669 | 8727 | 8728 | 8729 | 8730 | 2604 | 8732 | 382 | 8734 | 8735 | 824 | 8737 | 508 | 2607 |
| 8740 | 1401 | 8742 | 808 | 8744 | 8745 | 8746 | 8747 | 2369 | 2370 | 8750 | 8751 | 8752 | 2608 | 8754 | 2436 | 2371 | 8757 | 8758 | 8759 |
| 3497 | 8761 | 2881 | 3186 | 8765 | 459 | 975 | 937 | 8769 | 8770 | 8771 | 457 | 4446 | 878 | 8776 | 3663 | 8778 | 2373 |
| 2610 | 8781 | 8782 | 4170 | 2374 | 8785 | 8786 | 2850 | 8788 | 8789 | 8790 | 8791 | 2784 | 8793 | 8794 | 8795 | 8796 | 3231 | 335 | 8799 |
| 3502 | 810 | 3303 | 4271 | 2434 | 2377 | 8806 | 8807 | 8808 | 8809 | 3420 | 8811 | 8812 | 8813 | 4481 | 2379 | 1183 | 8817 | 8818 | 3498 |
| 336 | 8821 | 8822 | 880 | 4100 | 2381 | 8826 | 393 | 8828 | 8829 | 8830 | 8831 | 8832 | 8833 | 3741 | 8835 | 8836 | 8837 | 8838 | 2613 |
| 383 | 2787 | 8842 | 8843 | 3304 | 8845 | 2382 | 8847 | 8848 | 3509 | 8850 | 8851 | 4357 | 8852 | 8853 | 8854 | 171 | 2384 | 8857 | 8858 | 1136 |
| 8860 | 40 | 8862 | 8863 | 8864 | 8865 | 8866 | 2916 | 8868 | 8869 | 8870 | 8871 | 3499 | 8873 | 8874 | 8875 | 8876 | 2788 | 3236 | 3010 |
| 2615 | 8881 | 2616 | 4535 | 8884 | 8885 | 8886 | 165 | 8888 | 8889 | 4566 | 2617 | 2387 | 8893 | 8894 | 8895 | 3348 | 4107 | 2388 | 8898 | 3066 |
| 8900 | 939 | 8902 | 8903 | 8904 | 3188 | 8906 | 8907 | 8908 | 1454 | 8910 | 8911 | 2790 | 4259 | 8914 | 8915 | 2618 | 8917 | 1008 | 3919 |
| 3210 | 3830 | 8922 | 2853 | 8924 | 8925 | 8926 | 2619 | 339 | 8929 | 8930 | 1289 | 8932 | 2620 | 8934 | 2391 | 3344 | 8937 | 8938 | 8939 |
| 8940 | 8941 | 8942 | 8943 | 8944 | 4569 | 8946 | 4590 | 100 | 3803 | 8950 | 1070 | 882 | 8953 | 3191 | 8955 | 8956 | 8957 | 8958 | 8959 |

-continued

| | | | | | | | | | | | | | | | | | | | |
|---|---|---|---|---|---|---|---|---|---|---|---|---|---|---|---|---|---|---|---|
| 3011 | 8961 | 8962 | 2622 | 815 | 8965 | 8966 | 4002 | 8968 | 2394 | 8970 | 8971 | 8972 | 8973 | 816 | 8975 | 8976 | 8977 | 8978 | 8979 |
| 8980 | 8981 | 8982 | 364 | 1076 | 817 | 8986 | 941 | 4381 | 8989 | 8990 | 2449 | 8992 | 2623 | 8994 | 8995 | 8996 | 8997 | 8998 | 2397 |
| 2398 | 9001 | 9002 | 64 | 9004 | 2399 | 9006 | 2400 | 9008 | 9009 | 9010 | 9011 | 9012 | 3013 | 9014 | 9015 | 9016 | 9017 | 4529 | 1214 |
| 9020 | 9021 | 9022 | 3347 | 3658 | 1432 | 3777 | 9027 | 9028 | 9029 | 9030 | 9031 | 9032 | 9033 | 3659 | 2401 | 340 | 9037 | 9038 | 1284 |
| 9040 | 2403 | 4228 | 4092 | 980 | 9045 | 9046 | 4417 | 3430 | 3193 | 9050 | 9051 | 9052 | 9053 | 1345 | 3425 | 9056 | 9057 | 9058 | 1408 |
| 960 | 9061 | 2624 | 9063 | 9064 | 1292 | 9066 | 9067 | 4479 | 9069 | 9070 | 2625 | 2406 | 9073 | 9074 | 3426 | 1231 | 9077 | 9078 | 365 |
| 2407 | 9081 | 9082 | 9083 | 9084 | 1114 | 9086 | 9087 | 2658 | 9089 | 9090 | 9091 | 9092 | 3900 | 9094 | 4383 | 9096 | 9097 | 9098 | 9099 |
| 9100 | 2627 | 9102 | 9103 | 9104 | 9105 | 4076 | 172 | 3549 | 9109 | 9110 | 3306 | 9112 | 1227 | 9114 | 820 | 821 | 4332 | 2413 | 9119 |
| 9120 | 9121 | 9122 | 9123 | 2629 | 9125 | 9126 | 9127 | 1368 | 3603 | 9130 | 9131 | 4519 | 9133 | 2856 | 9135 | 9136 | 9137 | 9138 | 9139 |
| 9140 | 9141 | 3759 | 2631 | 2414 | 9145 | 2793 | 9147 | 9148 | 2415 | 9150 | 9151 | 822 | 486 | 9154 | 9155 | 3014 | 9157 | 9158 | 9159 |
| 2417 | 9161 | 9162 | 9163 | 1072 | 9165 | 9166 | 9167 | 2632 | 9169 | 9170 | 9171 | 9172 | 9173 | 9174 | 9175 | 2457 | 9177 | 9178 | 9179 |
| 2418 | 9181 | 9182 | 9183 | 4233 | 9185 | 1333 | 4302 | 3307 | 9189 | 2420 | 9191 | 9192 | 9193 | 4207 | 9195 | 2421 | 9197 | 9198 | 1009 |
| 435 | 1224 | 9202 | 9203 | 1073 | 9205 | 9206 | 9207 | 4351 | 9209 | 4276 | 9211 | 2427 | 9213 | 3696 | 9215. | | | | |

9. The device according to claim 7, wherein in the case that the M×N check matrix is a 2304×9216 check matrix, the above sorting table IDX is as follows:

```
0 1 2 4 5 7 9 10 11 13 15 19 22 23 25 26 28 33 35 37
38 40 41 42 45 59 62 69 71 72 74 79 80 81 82 83 85 87 91 94
97 100 109 110 112 113 114 117 131 134 141 143 144 151 152 155 157 163 166 169
172 174 182 185 186 193 194 219 224 225 229 230 233 236 245 246 248 254 258 260
265 267 291 292 296 305 317 318 320 324 331 332 333 335 337 343 346 349 352 354
363 364 377 380 383 389 390 392 396 400 403 405 407 409 410 415 418 421 424 426
432 436 437 439 442 443 445 449 451 460 468 475 477 479 481 482 487 490 493 496
498 510 512 513 517 541 546 549 553 563 566 570 573 575 582 584 585 589 615 620
625 626 627 635 641 642 644 651 657 661 665 668 677 680 686 688 690 692 699 720
724 727 729 730 731 733 734 739 745 748 750 756 757 760 761 763 765 767 769 779
781 782 784 789 791 792 794 796 799 802 803 805 811 817 821 828 832 835 837 839
841 850 856 857 864 871 875 877 883 884 892 906 908 913 928 939 944 945 949 950
956 965 968 975 981 985 989 992 1000 1001 1004 1014 1016 1021 1023 1050 1057 1061 1069 1072
1082 1086 1090 1094 1095 1120 1122 1129 1130 1141 1144 1152 1153 1157 1159 1161 1163 1165 1174 1178
1180 1185 1189 1192 1193 1194 1197 1211 1214 1223 1224 1232 1233 1235 1237 1243 1252 1261 1264 1265
1266 1269 1283 1286 1296 1304 1307 1309 1321 1324 1334 1338 1342 1361 1364 1371 1377 1381 1382 1385
1388 1393 1396 1397 1398 1400 1409 1410 1417 1419 1424 1432 1433 1436 1437 1439 1446 1453 1463 1465
1468 1469 1478 1479 1486 1496 1505 1508 1516 1518 1532 1535 1547 1548 1553 1555 1559 1561 1562 1574
1576 1585 1588 1589 1590 1593 1599 1610 1620 1629 1633 1639 1640 1645 1648 1660 1662 1665 1685 1688
1692 1701 1702 1703 1705 1706 1711 1717 1720 1733 1734 1741 1748 1760 1770 1772 1773 1774 1777 1780
1785 1788 1789 1791 1792 1795 1806 1809 1839 1842 1846 1848 1852 1854 1863 1867 1875 1885 1887 1889
1897 1901 1904 1912 1913 1914 1916 1918 1920 1921 1924 1929 1932 1933 1935 1936 1939 1943 1944 1948
1955 1957 1958 1972 1986 1989 1991 1992 1994 1996 2001 2004 2007 2008 2011 2018 2022 2045 2058 2065
2067 2077 2080 2081 2084 2092 2093 2094 2108 2123 2124 2128 2135 2137 2138 2146 2149 2152 2153 2156
2160 2165 2169 2170 2171 2173 2180 2188 2192 2193 2202 2209 2213 2221 2224 2225 2228 2235 2236 2237
2238 2253 2255 2259 2263 2272 2273 2274 2275 2276 2278 2281 2286 2291 2294 2296 2299 2307 2309 2310
2311 2315 2316 2320 2325 2331 2332 2335 2346 2365 2368 2372 2382 2386 2404 2417 2418 2429 2430 2435
2438 2439 2440 2446 2447 2451 2461 2465 2476 2477 2480 2485 2489 2490 2494 2499 2501 2504 2513 2516
2519 2526 2533 2537 2543 2548 2549 2552 2555 2561 2562 2569 2576 2591 2598 2605 2609 2620 2629 2633
2634 2637 2643 2644 2652 2654 2655 2659 2661 2664 2669 2675 2677 2686 2689 2692 2693 2701 2705 2706
2709 2723 2726 2730 2739 2740 2742 2748 2749 2752 2759 2760 2761 2762 2764 2771 2778 2779 2783 2784
2793 2799 2803 2806 2814 2819 2824 2830 2832 2835 2849 2850 2856 2860 2867 2868 2870 2873 2875 2876
2886 2888 2895 2908 2921 2922 2926 2932 2942 2944 2945 2947 2949 2950 2951 2956 2958 2960 2965 2978
2980 2987 2988 2994 2996 3006 3010 3015 3019 3027 3041 3053 3054 3056 3065 3066 3072 3075 3076 3078
3080 3087 3088 3102 3111 3133 3137 3138 3147 3148 3153 3156 3158 3159 3174 3192 3195 3199 3204 3208
3212 3215 3219 3229 3232 3245 3246 3252 3254 3263 3265 3268 3269 3272 3282 3291 3296 3305 3308 3316
3318 3324 3326 3327 3328 3339 3341 3344 3348 3352 3355 3357 3359 3361 3376 3380 3386 3390 3399 3401
3402 3407 3409 3411 3419 3426 3430 3433 3434 3435 3446 3449 3452 3453 3462 3468 3470 3471 3472 3482
3484 3485 3488 3497 3498 3508 3515 3518 3519 3523 3527 3534 3540 3544 3557 3570 3577 3591 3592 3593
3596 3606 3629 3641 3642 3648 3659 3662 3663 3668 3678 3704 3714 3717 3719 3720 3723 3735 3737 3740
3748 3750 3757 3758 3761 3768 3771 3773 3778 3781 3786 3788 3809 3811 3822 3823 3829 3838 3843 3844
3848 3857 3858 3860 3888 3899 3901 3903 3905 3916 3917 3920 3930 3940 3964 3966 3969 3973 3985 3987
3988 3989 3992 4002 4003 4006 4012 4018 4024 4025 4028 4038 4044 4047 4050 4059 4061 4074 4089 4095
4096 4097 4100 4110 4122 4131 4135 4138 4140 4144 4146 4148 4153 4164 4165 4167 4168 4172 4176 4183
4184 4187 4189 4205 4208 4216 4218 4225 4237 4239 4240 4241 4244 4253 4254 4259 4261 4264 4271 4274
4276 4288 4290 4297 4301 4309 4312 4315 4324 4325 4326 4331 4339 4343 4348 4362 4374 4378 4383 4385
4392 4399 4405 4420 4421 4424 4434 4441 4443 4446 4455 4456 4457 4460 4470 4474 4482 4489 4491 4492
4496 4506 4513 4518 4525 4527 4528 4529 4540 4549 4556 4563 4564 4565 4567 4568 4575 4576 4578 4585
4591 4600 4603 4606 4614 4619 4621 4633 4639 4650 4655 4657 4658 4672 4686 4692 4697 4704 4711 4714
4722 4727 4729 4738 4752 4757 4760 4763 4765 4771 4775 4777 4778 4780 4785 4794 4797 4799 4801 4802
4806 4813 4816 4817 4819 4820 4830 4831 4837 4839 4846 4849 4853 4856 4858 4871 4873 4888 4889 4892
4893 4903 4907 4908 4909 4914 4918 4924 4925 4928 4932 4939 4943 4957 4960 4961 4969 4974 4981 4983
4993 4996 5010 5017 5029 5031 5032 5033 5035 5047 5051 5053 5059 5068 5081 5087 5099 5102 5105 5107
5109 5119 5125 5137 5140 5154 5160 5161 5163 5176 5216 5226 5227 5232 5237 5251 5271 5285 5299 5314
5317 5334 5339 5346 5378 5389 5392 5406 5411 5424 5429 5450 5464 5483 5486 5537 5547 5550 5569 5571
5572 5587 5598 5599 5604 5607 5609 5611 5612 5616 5625 5626 5635 5644 5648 5681 5695 5702 5707 5717
5734 5735 5744 5749 5753 5761 5779 5786 5797 5819 5821 5822 5824 5839 5840 5897 5918 5931 5933 5957
5967 5972 6005 6029 6031 6041 6074 6075 6091 6098 6114 6120 6127 6130 6140 6145 6148 6149 6184 6202
```

-continued 6210 6213 6217 6220 6230 6251 6253 6254 6264 6297 6304 6329 6341 6347 6348 6354 6363 6367 6386 6388
6401 6415 6437 6450 6459 6461 6462 6471 6473 6475 6478 6486 6487 6497 6502 6522 6537 6540 6543 6547
6585 6594 6610 6630 6687 6696 6703 6717 6725 6727 6742 6746 6752 6761 6769 6782 6785 6788 6795 6797
6810 6846 6876 6882 6883 6894 6899 6903 6915 6919 6921 6941 6954 6968 6971 6973 6977 6979 6990 7020
7027 7042 7043 7063 7079 7104 7109 7111 7121 7124 7136 7170 7214 7222 7224 7237 7241 7242 7259 7282
7293 7299 7301 7311 7325 7337 7344 7349 7357 7386 7388 7422 7452 7462 7466 7488 7517 7520 7548 7553
7565 7584 7589 7597 7606 7610 7617 7625 7640 7648 7668 7673 7681 7683 7704 7709 7756 7757 7763 7776
7786 7806 7812 7814 7841 7848 7867 7876 7887 7894 7901 7913 7920 7940 7959 7973 7985 8006 8016 8028
8048 8057 8095 8100 8108 8110 8119 8122 8125 8128 8152 8159 8181 8191 8196 8202 8220 8224 8232 8236
8242 8272 8283 8318 8333 8336 8337 8340 8345 8347 8360 8381 8391 8395 8427 8432 8462 8473 8495 8513
8520 8550 8554 8576 8621 8641 8648 8655 8658 8660 8695 8714 8719 8729 8751 8762 8787 8797 8823 8825
8837 8877 8895 8936 8946 8947 8984 8998 9031 9036 9084 9122 9214 2072 2195 3656 3752 3942 4007 4092
4380 4524 4927 4962 5003 5048 5248 5305 5320 5716 6166 6192 6392 6396 6716 6932 7025 7048 7295 7330
7355 7366 7574 7675 7713 7766 7823 7964 8036 8113 8145 8223 8244 8355 8441 8592 8715 8732 8814 8828
8886 8908 8988 9038 9061 9129 9147 1583 1643 1697 416 124 1975 2111 2112 488 2284 2363 2618 2638
2704 2802 2805 2872 662 3085 3172 3952 4009 4075 4468 4743 4964 5037 5751 5954 5983 5999 6004 6081
6320 6477 6532 6723 6892 7211 8156 8472 8544 8659 1631 1782 2250 2758 2890 3007 3356 3384 3473 3559
3728 3783 3910 3958 4093 4152 4270 4279 4300 4305 4320 4430 4452 4503 4531 4561 4566 4624 4644 4720
4798 4848 4886 4940 4970 4999 5098 5152 5245 5258 5359 5368 5403 5461 5557 5669 5682 5701 5800 5885
6066 6128 6205 6404 6757 6934 7346 7482 7501 7744 7837 7859 7886 7897 8198 8210 8243 8258 8264 8282
8418 8420 8750 9091 9152 1798 2161 2185 2304 2458 3084 3167 3257 3320 3443 3581 3725 3913 3955 4026
4053 4080 4169 4233 4273 4431 4459 4539 4716 4725 4788 4804 4827 4828 4843 4855 4899 5014 5134 5377
6133 6196 6277 6345 6975 7046 7290 7370 7825 7840 1315 8922 1622 1630 1664 1758 523 2464 2510 53
2632 2920 2999 717 3483 3644 3794 4245 4432 4504 4599 4698 4783 4851 4867 5122 5202 5479 5679 5964
6151 6219 285 6508 6656 6900 6937 7456 8268 8281 9058 1980 2350 2741 3284 3791 3816 3996 4521 4588
4868 4890 4896 4916 5020 5220 5431 5936 8319 2268 2443 2646 3358 886 4258 4608 4701 1696 1818 1882
1979 2066 2210 2322 2416 557 2581 2747 2807 2877 656 2970 2977 3150 3170 3456 3669 3679 3764 3800
3812 814 4010 4034 885 4299 4311 4345 4406 4415 4517 953 4664 4706 4836 4865 4879 4885 5173 5344
5356 5361 5402 5578 5859 5937 6061 6358 6519 6957 7151 7312 7459 1281 7798 8081 8235 8249 8308 8437
8673 8683 8766 9100 4669 2736 2905 3716 4741 5025 5629 427 1963 2035 2326 2371 2649 2696 162 2845
2995 3009 3092 3134 3240 3395 3516 3724 3739 3948 3976 4045 4136 4318 4412 937 4530 362 4815 4913
5128 5178 5240 5259 5400 5416 5708 6089 6096 6131 1156 6258 6545 6673 6942 7672 7691 7861 8083 1557
8566 8878 8991 4248 4572 2205 3500 3691 1405 6284 6860 3329 4015 4824 1450 434 466 2251 520 2323
2493 2772 2788 2796 3062 3765 3830 4087 4268 4414 4626 5172 5422 5741 5943 6243 6375 6958 7505 7508
1340 8309 8681 8834 8910 1861 423 1999 2168 2394 2540 2943 3315 3576 3713 869 4519 4612 4635 5004
5831 6123 7141 7161 7551 7855 1937 3017 4581 4689 4986 6305 6595 6602 4629 453 321 478 2303 2392
177 4071 4808 5641 1126 1171 7053 8669 9156 4472 8816 514 2647 2738 4302 4653 6907 4464 1969 2683
2826 3094 3710 4458 4791 4841 5008 5562 302 7816 8039 8261 897 562 2716 633 4056 4534 4627 4910
5331 6086 6397 8161 8323 8744 9065 1934 2052 569 2566 3861 4805 5254 6359 2157 2445 1509 4329 4387
4860 3198 130 3762 4212 5666 6344 8884 8229 3226 4444 5286 372 457 2200 3951 4648 2422 2766 3459
4119 4533 1908 2260 58 3251 3406 4063 4428 5217 2985 3365 4875 2034 2143 3178 5929 6318 279 7768
8045 2062 3671 1926 3760 4243 2002 2216 2866 2187 754 5121 417 2244 2662 3970 3999 4630 105 160
3726 3873 1813 5642 6160 1427 3709 4500 6872 3112 6910 3184 187 9174 2628 4737 4861 2014 4000 8342
3478 6239 7688 8346 3650 2829 8456 2114 463 2729 2032 4557 1423 4107 6201 133 6951 3060 951 1347
2983 4294 3477 982 7669 293 4447 1689 2473 2121 1573 1713 7072 3706 6134 4359 5909 1493 3631 4480
3711 2352 2676 4377 4593 2589 3818 3729 2328 4084 3833 148 2663 7616 5205 6337 381 4809 2279 6710
4425 2734 5296 3089 6115 2031 771 76 374 8518 6181 3747 9033 4750 2842 3185 2509 588 3487 2144
5028 5463 5544 2808 3458 2855 4179 3637 4462 3181 853 5348 4436 4618 6207 4596 2179 4594 7387 1484
619 4449 1951 2283 4251 256 5210 4163 4134 4207 3437 1707 2782 4391 2013 8312 3045 3214 2535 758
2038 1998 3936 149 4514 21 1691 4789 3994 538 4863 5614 3346 6228 5758 3063 808 1418 1067 6680
4537 4642 1455 5917 2266 7534 2367 4194 4228 2670 7461 572 1071 2914 6249 3732 3939 2889 3549 5600
2517 2186 4078 5157 1118 4068 4032 1927 2703 2936 4361 3008 106 2718 5150 2864 18 6132 2162 8709
2839 2883 2857 6190 3665 2665 2880 1570 2785 2085 84 1661 165 5805 4488 2577 2848 7590 8985 7960
8304 2673 4120 2714 3074 3972 3105 2349 4368 3123 3506 3636 995 6380 7177 6947 5026 2844 859 3599
2194 450 3574 6533 2678 5094 4678 5336 6057 75 6880 4001 6312 5345 560 4844 3141 4995 6049 2854
4200 2917 4344 8298 4423 1444 2797 2579 2619 6252 4877 6247 5457 6513 7271 3612 6235 4175 5565 4584
3670 6868 4141 4342 8003 2400 4088 2410 1675 4968 5333 1472 3997 7068 2041 5602 6767 998 2897 3525
2388 3627 2847 3874 1568 2305 2306 52 2308 518 519 1678 2312 2313 2314 521 522 2317 2318 2319
1616 2321 1683 1819 2324 524 1754 2327 2068 2329 2330 525 526 2333 2334 527 2336 2337 2338 2339
2340 2341 2342 2343 2344 2345 528 2347 2348 2227 1652 2351 2061 2353 2354 2355 2356 2357 2358 2359
2360 2361 2362 1457 2364 529 2366 2166 530 2369 2370 1755 531 2373 2374 2375 2376 2377 2378 2379
2380 2381 532 2383 2384 2385 533 2387 2300 2389 2390 2391 1879 2393 1849 2395 2396 2397 2398 2399
2285 2401 2402 2403 534 2405 2406 2407 2408 2409 2287 2411 2412 2413 2414 2415 1684 535 536 2419
2420 2421 441 2423 2424 2425 2426 2427 2428 537 476 2431 2432 2433 2434 539 2436 2437 540 145
542 2441 2442 1670 2444 435 543 544 2448 2449 2450 545 2452 2453 2454 2455 2456 2457 1569 2459
2460 146 2462 2463 1617 547 2466 2467 2468 2469 2470 2471 2472 2048 2474 2475 548 147 2478 2479
550 2481 2482 2483 2484 551 2486 2487 2488 552 2071 2491 2492 1820 554 2495 2496 2497 2498 555
2500 556 2502 2503 378 2505 2506 2507 2508 2096 1618 2511 2512 558 2514 2515 559 486 2518 2254
2520 2521 2522 2523 2524 2525 561 2527 2528 2529 2530 2531 2532 118 2534 474 2536 1974 2538 2539
1850 2541 2542 564 2544 2545 2546 2547 565 150 2550 2551 567 2553 2554 568 2556 2557 2558 2559
2560 431 1619 2563 2564 2565 1930 2567 2568 571 2570 2571 2572 2573 2574 2575 484 2215 2578 2267
2580 1686 2582 2583 2584 2585 2586 2587 2588 459 2590 54 2592 2593 2594 2595 2596 2597 574 2599
2600 2601 2602 2603 2604 153 2606 2607 2608 576 2610 2611 2612 2613 2614 2615 2616 2617 1458 1669
577 2621 2622 2623 2624 2625 2626 2627 2017 578 2630 2631 368 579 580 2635 2636 581 1459 2639
2640 2641 2642 154 583 2645 1671 1892 2648 1756 2650 2651 55 2653 156 586 2656 2657 2658 587
2660 2097 448 1876 56 1805 2666 2667 2668 590 135 2671 2672 138 2674 591 1981 592 1993 2679
2680 2681 2682 1899 2684 2685 593 2687 2688 594 2690 2691 595 596 2694 2695 1757 2697 2698 2699
2700 597 2702 136 1460 598 599 2707 2708 600 2710 2711 2712 2713 2223 2715 425 2717 489 2719
2720 2721 2722 601 2724 2725 602 2727 2728 2029 603 2731 2732 2733 2028 2735 1745 2737 1893 604
605 1653 606 2743 2744 2745 2746 1687 607 608 2750 2751 609 2753 2754 2755 2756 2757 2057 610

-continued 611 612 613 2763 614 2765 1451 2767 2768 2769 2770 158 1821 2773 2774 2775 2776 2777 616 617
2780 2781 2132 618 2120 2208 2786 2787 1822 2789 2790 2791 2792 159 2794 2795 1823 2164 2798 621
2800 2801 1461 622 2804 1462 623 379 2103 2809 2810 2811 2812 2813 624 2815 2816 2817 2818 1847
2820 2821 2822 2823 161 2825 1900 2827 2828 2025 1615 2831 628 2834 629 2836 2837 2838 1954
2840 2841 467 2843 499 1759 2846 2302 1987 630 631 2851 2852 2853 503 2105 632 137 2858 2859
1915 2861 2862 2863 1394 2865 1988 634 57 2869 636 2871 338 637 2874 638 639 2047 2878 2879
2206 2881 2882 2201 2884 2885 640 2887 164 2177 1494 2891 2892 2893 2894 2212 2896 2298 2898 2899
2900 2901 2902 2903 2904 1746 2906 2907 643 2909 2910 2911 2912 2913 485 2915 2916 2261 2918 2919
1621 1964 645 2923 2924 2925 646 2927 2928 2929 2930 2931 647 2933 2934 2935 2189 2937 2938 2939
2940 2941 648 1851 649 650 2946 167 2948 652 653 654 2952 2953 2954 2955 655 2957 1690 2959
168 2961 2962 2963 2964 658 2966 2967 2968 2969 48 2971 2972 2973 2974 2975 2976 103 659 2979
660 2981 2982 2040 2984 1970 2986 14 1464 2989 2990 2991 2992 2993 663 393 664 2997 2998 1612
3000 3001 3002 3003 3004 3005 170 1495 2191 1761 666 3011 3012 3013 3014 667 3016 115 3018 171
3020 3021 3022 3023 3024 3025 3026 669 3028 3029 3030 3031 3032 3033 3034 3035 3036 3037 3038 3039
3040 670 3042 3043 3044 2136 3046 3047 3048 3049 3050 3051 3052 671 672 3055 673 3057 3058 3059
2037 3061 1824 2155 3064 674 675 3067 3068 3069 3070 3071 676 3073 494 60 678 3077 679 3079
173 3081 3082 3083 2207 339 3086 681 682 2083 3090 3091 1762 3093 47 3095 3096 3097 3098 3099
3100 3101 683 3103 3104 2226 3106 3107 3108 3109 3110 684 2009 3113 3114 3115 3116 3117 3118 3119
3120 3121 3122 2229 3124 3125 3126 3127 3128 3129 3130 3131 3132 685 1763 3135 3136 61 687 3139
3140 2256 3142 3143 3144 3145 3146 175 689 3149 1693 3151 3152 176 3154 3155 691 3157 1880 693
3160 3161 3162 3163 3164 3165 3166 1571 3168 3169 1694 3171 1466 3173 694 3175 3176 3177 1452 3179
3180 2109 3182 3183 454 2095 3186 3187 3188 3189 3190 3191 695 3193 3194 696 3196 3197 1941 697
3200 3201 3202 3203 698 3205 3206 3207 178 3209 3210 3211 700 3213 473 701 3216 3217 3218 702
3220 3221 3222 3223 3224 3225 1949 3227 3228 703 3230 3231 704 3233 3234 3235 3236 3237 3238 3239
1764 3241 3242 3243 3244 705 706 3247 3248 3249 3250 1965 707 3253 708 3255 3256 1572 3258 3259
3260 3261 3262 709 3264 710 3266 3267 711 712 3270 3271 713 3273 3274 3275 3276 3277 3278 3279
3280 3281 714 3283 1654 3285 3286 3287 3288 3289 3290 715 3292 3293 3294 3295 716 3297 3298 3299
3300 3301 3302 3303 3304 1623 3306 3307 718 3309 3310 3311 3312 3313 3314 412 719 3317 179 3319
2050 3321 3322 3323 721 3325 722 723 180 1811 3330 3331 3332 3673 3674 3675 3676 3677 3338 725
3340 726 3342 3343 181 3345 132 3347 728 3349 3350 3351 3 3353 3354 183 345 184 1672 732
3360 63 3362 3363 3364 1971 3366 3367 3368 3369 3370 3371 3372 3373 3374 3375 64 3377 3378 3379
735 3381 3382 3383 1497 3385 736 3387 3388 3389 737 3391 3392 3393 3394 1765 3396 3397 3398 738
3400 2012 740 3403 3404 3405 1966 741 3408 742 3410 743 3412 3413 3414 3415 3416 3417 3418 744
3420 3421 3422 3423 3424 3425 188 3427 3428 3429 746 3431 3432 747 189 749 3436 2130 3438 3439
3440 3441 3442 359 3444 3445 190 3447 3448 751 3450 3451 752 753 3454 3455 1695 3457 2104 1959
3460 3461 1990 3463 3464 3465 3466 3467 755 3469 191 192 2139 1498 3474 3475 3476 2042 2020 3479
3480 3481 759 1624 65 66 3486 2098 762 3489 3490 3491 3492 3493 3494 3495 3496 195 764 3499
406 3501 3502 3503 3504 3505 2230 3507 196 3509 3510 3511 3512 3513 3514 766 1766 3517 197 768
3520 3521 3522 198 3524 516 3526 770 3528 3529 3530 3531 3532 3533 2086 3535 3536 3537 3538 3539
772 3541 3542 3543 773 3545 3546 3547 3548 2178 3550 3551 3552 3553 3554 3555 3556 774 3558 1499
3560 3561 3562 3563 3564 3565 3566 3567 3568 3569 775 3571 3572 3573 2242 3575 1853 776 3578 3579
3580 1575 3582 3583 3584 3585 3586 3587 3588 3589 3590 777 778 199 3594 3595 780 3597 3598 2239
3600 3601 3602 3603 3604 3605 200 3607 3608 3609 3610 3611 508 3613 3614 3615 3616 3617 3618 3619
3620 3621 3622 3623 3624 3625 3626 2301 3628 201 3630 458 3632 3633 3634 3635 2231 2107 3638 3639
3640 783 202 3643 1625 3645 3646 3647 785 3649 2024 3651 3652 3653 3654 3655 1395 3657 3658 786
3660 3661 787 788 3664 2204 3666 3667 203 1677 2280 1982 3672 3673 3674 3675 3676 3677 790 1449
3680 3681 3682 3683 3684 3685 3686 3687 3688 3689 3690 1807 3692 3693 3694 3695 3696 3697 3698 3699
3700 3701 3702 3703 204 3705 2053 3707 3708 2006 1902 2060 3712 413 205 3715 1747 793 3718 206
795 3721 3722 207 1767 360 2000 3727 1500 129 3730 3731 2175 3733 3734 797 3736 798 3738 1768
208 3741 3742 3743 3744 3745 3746 2091 800 3749 801 3751 322 3753 3754 3755 3756 209 210 3759
1984 804 122 3763 1698 1825 3766 3767 211 3769 3770 806 3772 807 3774 3775 3776 3777 1753 3779
3780 809 3782 1501 3784 3785 810 3787 212 3789 3790 1655 3792 3793 1626 3795 3796 3797 3798 3799
1699 3801 3802 3803 3804 3805 3806 3807 3808 812 3810 813 1700 3813 3814 3815 1656 3817 1681 3819
3820 3821 2076 815 3824 3825 3826 3827 3828 816 1826 3831 3832 3833 3834 3835 3836 3837 213 3839
3840 3841 3842 818 819 3845 3846 3847 820 3849 3850 3851 3852 3853 3854 3855 3856 214 822 3859
823 1931 3862 3863 3864 3865 3866 3867 3868 3869 3870 3871 3872 2241 1878 3875 3876 3877 3878 3879
3880 3881 3882 3883 3884 3885 3886 3887 824 3889 3890 3891 3892 3893 3894 3895 3896 3897 3898 825
3900 826 3902 827 3904 215 3906 3907 3908 3909 1502 3911 1577 3914 3915 829 830 3918 3919
831 3921 3922 3923 3924 3925 3926 3927 3928 3929 216 3931 3932 3933 3934 3935 2142 3937 3938 2176
833 3941 323 3943 3944 3945 3946 3947 1769 3949 3950 440 1467 3953 3954 1578 3956 3957 1503 3959
3960 3961 3962 3963 834 3965 217 3967 3968 836 1995 3971 495 218 3974 3975 394 3977 3978 3979
3980 3981 3982 3983 3984 838 3986 67 840 220 3990 3991 842 3993 2148 3995 1657 2292 3998 127
455 1817 843 844 4004 4005 845 89 4008 340 382 4011 846 4013 4014 1812 4016 4017 847 4019
4020 4021 4022 4023 848 849 1579 4027 221 4029 4030 4031 2181 4033 104 4035 4036 4037 851 4039
4040 4041 4042 4043 852 1771 4046 2110 4048 4049 854 4051 4052 1580 4054 4055 119 4057 4058 855
4060 222 4062 1967 4064 4065 4066 4067 1567 4069 4070 1881 4072 4073 223 341 4076 4077 2182 4079
1581 4081 4082 4083 2069 4085 4086 1827 142 858 4090 4091 1399 1504 4094 500 860 861 4098 4099
862 4101 4102 4103 4104 4105 4106 2033 4108 4109 863 4111 4112 4113 4114 4115 4116 4117 4118 1960
2222 4121 68 4123 4124 4125 4126 4127 4128 4129 4130 865 4132 4133 471 866 395 4137 867 4139
868 2282 4142 4143 1855 4145 870 4147 27 4149 4150 4151 96 872 4154 4155 4156 4157 4158 4159
4160 4161 4162 2127 873 874 4166 226 876 1582 4170 4171 227 4173 4174 2277 878 4177 4178 2106
4180 4181 4182 879 880 4185 4186 881 4188 882 4190 4191 4192 4193 2167 4195 4196 4197 4198 4199
1752 4201 4202 4203 4204 228 4206 2129 70 4209 4210 4211 438 4213 4214 4215 1704 4217 1673 4219
4220 4221 4222 4223 4224 887 4226 4227 411 4229 4230 4231 4232 1447 4234 4235 4236 888 4238 889
890 891 4242 1985 16 1627 4246 4247 1803 4249 4250 470 4252 893 894 4255 4256 4257 1674 895
4260 896 4262 4263 46 4265 4266 4267 1828 4269 1506 898 4272 1584 899 4275 900 4277 4278 1507
4280 4281 4282 4283 4284 4285 4286 4287 901 4289 902 4291 4292 4293 1891 4295 4296 903 4298 384
347 904 1894 4303 4304 1866 4306 4307 4308 905 4310 385 231 4313 4314 907 4316 4317 108 4319
1510 4321 4322 4323 232 909 910 4327 4328 1938 4330 911 4332 4333 4334 4335 4336 4337 4338 912
4340 4341 469 29 2262 2131 4346 4347 914 4349 4350 4351 4352 4353 4354 4355 4356 4357 4358 2055

```
4360 2190 915 4363 4364 4365 4366 4367 139 4369 4370 4371 4372 4373 916 4375 4376 2063 917 4379
325 4381 4382 918 4384 919 4386 121 4388 4389 4390 2133 920 4393 4394 4395 4396 4397 4398 921
4400 4401 4402 4403 4404 922 1708 4407 4408 4409 4410 4411 397 4413 1829 1709 4416 4417 4418 4419
923 924 4422 2264 925 462 4426 4427 1968 4429 1511 361 1628 4433 2264 926 4435 1454 4437 4438 4439
4440 927 4442 234 1950 4445 929 2046 4448 2049 4450 4451 1512 4453 4454 930 931 932 1903 1586
933 4461 1942 4463 420 4465 4466 4467 1470 4469 934 4471 419 4473 935 4475 4476 4477 4478 4479
2059 4481 936 4483 4484 4485 4486 4487 2214 1775 4490 938 235 4493 4494 4495 940 4497 4498 4499
452 4501 4502 1513 369 4505 941 4507 4508 4509 4510 4511 4512 942 2099 4515 4516 1710 943 1856
4520 1658 4522 4523 1401 73 4526 237 946 947 1776 1514 4532 1961 1917 4535 4536 480 4538 1587
948 4541 4542 4543 4544 4545 4546 4547 4548 238 4550 4551 4552 4553 4554 4555 239 491 4558 4559
4560 1515 4562 2140 952 386 348 954 955 4569 4570 4571 1804 4573 4574 240 957 4577 958 4579
4580 1868 4582 4583 2078 959 4586 4587 1659 4589 4590 960 4592 2064 2117 4595 2115 4597 4598 1613
961 4601 4602 962 4604 4605 963 4607 2288 4609 4610 4611 1857 4613 964 4615 4616 4617 2113 241
4620 966 4622 4623 1517 4625 1830 1751 4628 1874 1997 4631 4632 967 4634 1858 4636 4637 4638 242
4640 4641 1566 4643 2145 4645 4646 4647 1956 4649 969 4651 4652 1895 4654 970 4656 971 972 4659
4660 4661 4662 4663 1712 4665 4666 4667 4668 1744 4670 4671 973 4673 4674 4675 4676 4677 2246 4679
4680 4681 4682 4683 4684 4685 974 4687 4688 1869 4690 4691 243 4693 4694 4695 4696 976 1490 4699
4700 1676 4702 4703 977 4705 2051 4707 4708 4709 4710 978 4712 4713 979 4715 398 4717 4718 4719
1519 4721 980 4723 4724 12 4726 244 4728 2043 4730 4731 4732 4733 4734 4735 4736 2015 983 4739
4740 107 4742 1471 4744 4745 4746 4747 4748 4749 1816 4751 984 4753 4754 4755 4756 30 4758 4759
986 4761 4762 987 4764 988 4766 4767 4768 4769 4770 2249 4772 4773 4774 990 4776 991 247 4779
993 4781 4782 1632 4784 994 4786 4787 101 2147 4790 422 4792 4793 2232 4795 4796 996 1520 997
4800 2297 999 4803 1591 120 2087 4807 1679 461 4810 4811 4812 249 4814 1778 1002 1003 4818 250
1005 4821 4822 4823 444 4825 4826 1592 365 4829 1006 1007 4832 4833 4834 4835 1714 1008 4838 1009
4840 1905 4842 1594 502 4845 1010 4847 1521 1011 4850 370 4852 1012 4854 1595 1013 4857 251 4859
1940 2016 4862 2150 4864 1715 4866 1634 375 4869 4870 1015 4872 252 4874 125 4876 2270 4878 1716
4880 4881 4882 4883 4884 387 1522 4887 1017 1018 2211 4891 1019 1020 4894 4895 376 4897 4898 1596
4900 4901 4902 253 4904 4905 4906 1022 77 1024 1919 4911 4912 1779 1025 4915 1663 4917 1026 4919
4920 4921 4922 4923 1027 1028 4926 1402 1029 4929 4930 4931 1030 4933 4934 4935 4936 4937 4938 1031
1523 4941 4942 1032 4944 4945 4946 4947 4948 4949 4950 4951 4952 4953 4954 4955 4956 1033 4958 4959
1034 1035 1403 4963 51 4965 4966 4967 2289 1036 1524 4971 4972 4973 1037 4975 4976 4977 4978 4979
4980 1038 4982 1039 4984 4985 1870 4987 4988 4989 4990 4991 4992 1040 4994 2257 1041 4997 4998 1525
5000 5001 5002 1404 1859 5005 5006 5007 1906 5009 1042 5011 5012 5013 1597 5015 5016 1043 5018 5019
1614 5021 5022 5023 5024 1749 140 5027 2100 1044 5030 1045 1046 1047 5034 1048 5036 1473 5038 5039
5040 5041 5042 5043 5044 5045 5046 1049 1808 5049 5050 255 5052 1051 5054 5055 5056 5057 5058 1052
5060 5061 5062 5063 5064 5065 5066 5067 1053 5069 5070 5071 5072 5073 5074 5075 5076 5077 5078 5079
5080 1054 5082 5083 5084 5085 5086 1055 5088 5089 5090 5091 5092 5093 2245 5095 5096 5097 1526 1056
5100 5101 2125 5103 5104 1058 5106 5107 5108 1060 5110 5111 5112 5113 5114 5115 5116 5117 118 257
5120 446 1635 5123 5124 1062 5126 5127 399 5129 5130 5131 5132 5133 1598 5135 5136 1063 5138 5139
1064 5141 5142 5143 5144 5145 5146 5147 5148 5149 2240 5151 1527 5153 1065 5155 5156 2183 5158 5159
1066 2158 5162 1068 5164 5165 5166 5167 5168 5169 5170 5171 1831 1718 5174 5175 78 5177 1781 5179
5180 5181 5182 5183 5184 5185 5186 5187 5188 5189 5190 5191 5192 5193 5194 5195 5196 5197 5198 5199
5200 5201 1636 5203 5204 2074 5206 5207 5208 5209 2126 5211 5212 5213 5214 5215 1070 1898 5218 5219
102 5221 5222 5223 5224 5225 2172 259 5228 5229 5230 5231 1073 5233 5234 5235 5236 1074 5238 5239
1491 5241 5242 5243 5244 1528 5246 5247 1406 5249 5250 1075 5252 5253 433 5255 5256 5257 1529 1783
5260 5261 5262 5263 5264 5265 5266 5267 5268 5269 1076 5272 5273 5274 5275 5276 5277 5278 5279
5280 5281 5282 5283 5284 1077 2122 5287 5288 5289 5290 5291 5292 5293 5294 5295 2082 5297 5298 1078
5300 5301 5302 5303 5304 1407 5306 5307 5308 5309 5310 5311 5312 5313 1079 5315 5316 1080 5318 5319
1408 5321 5322 5323 5324 5325 5326 5327 5328 5329 5330 428 5332 2290 1081 5335 2247 5337 5338 31
5340 5341 5342 5343 1719 501 1083 5347 39 5349 5350 5351 5352 5353 5354 5355 388 5357 5358 1530
5360 1721 5362 5363 5364 5365 5366 5367 1531 5369 5370 5371 5372 5373 5374 5375 5376 366 1084 5379
5380 5381 5382 5383 5384 5385 5386 5387 5388 1085 5390 5391 261 5393 5394 5395 5396 5397 5398 5399
1784 5401 1722 350 5404 5405 1087 5407 5408 5409 5410 1088 5412 5413 5414 5415 6 5417 5418 5419
5420 5421 1832 5423 1089 5425 5426 5427 5428 262 5430 1666 5432 5433 5434 5435 5436 5437 5438 5439
5440 5441 5442 5443 5444 5445 5446 5447 5448 5449 1091 5451 5452 5453 5454 5455 5456 505 5458 5459
5460 1533 5462 2101 1092 5465 5466 5467 5468 5469 5470 5471 5472 5473 5474 5475 5476 5477 5478 1637
5480 5481 5482 1093 5484 5485 263 5487 5488 5489 5490 5491 5492 5493 5494 5495 5496 5497 5498 5499
5500 5501 5502 5503 5504 5505 5506 5507 5508 5509 5510 5511 5512 5513 5514 5515 5516 5517 5518 5519
5520 5521 5522 5523 5524 5525 5526 5527 5528 5529 5530 5531 5532 5533 5534 5535 5536 264 5538 5539
5540 5541 5542 5543 2102 5545 5546 1096 5548 5549 1097 5551 5552 5553 5554 5555 5556 1534 5558 5559
5560 5561 1907 5563 5564 50 5566 5567 5568 1098 5570 1099 1100 5573 5574 5575 5576 5577 1723 5579
5580 5581 5582 5583 5584 5585 5586 1101 5588 5589 5590 5591 5592 5593 5594 5595 5596 5597 1102 1103
2116 5601 2295 5603 1104 5605 5606 1105 5608 1106 5610 1107 1108 5613 2151 5615 1109 5617 5618 5619
5620 5621 5622 5623 5624 1110 1111 5627 5628 1750 5630 5631 5632 5633 5634 1112 5636 5637 5638 5639
5640 1883 2003 5643 1113 5645 5646 5647 1114 5649 5650 5651 5652 5653 5654 5655 5656 5657 5658 5659
5660 5661 5662 5663 5664 5665 1945 5667 5668 351 5670 5671 5672 5673 5674 5675 5676 5677 5678 1638
5680 1115 1536 5683 5684 5685 5686 5687 5688 5689 5690 5691 5692 5693 5694 1116 5696 5697 5698 5699
5700 1537 1117 5703 5704 5705 5706 2184 1786 5709 5710 5711 5712 5713 5714 5715 326 1119 5718 5719
5720 5721 5722 5723 5724 5725 5726 5727 5728 5729 5730 5731 5732 5733 32 1121 5736 5737 5738 5739
5740 1833 5742 5743 266 5745 5746 5747 5748 1123 5750 1474 5752 1124 5754 5755 5756 5757 2154 5759
5760 1125 5762 5763 5764 5765 5766 5767 5768 5769 5770 5771 5772 5773 5774 5775 5776 5777 5778 1884
5780 5781 5782 5783 5784 5785 1127 5787 5788 5789 5790 5791 5792 5793 5794 5795 5796 1128 5798 5799
1538 5801 5802 5803 5804 492 5806 5807 5808 5809 5810 5811 5812 5813 5814 5815 5816 5817 5818 17
5820 268 1131 5823 1132 5825 5826 5827 5828 5829 5830 1860 5832 5833 5834 5835 5836 5837 5838 1133
1134 5841 5842 5843 5844 5845 5846 5847 5848 5849 5850 5851 5852 5853 5854 5855 5856 5857 5858 1724
5860 5861 5862 5863 5864 5865 5866 5867 5868 5869 5870 5871 5872 5873 5874 5875 5876 5877 5878 5879
5880 5881 5882 5883 5884 1539 5886 5887 5888 5889 5890 5891 5892 5893 5894 5895 5896 1135 5898 5899
5900 5901 5902 5903 5904 5905 5906 5907 5908 2056 5910 5911 5912 5913 5914 5915 5916 2163 1136 5919
5920 5921 5922 5923 5924 5925 5926 5927 5928 1976 5930 1137 5932 1138 5934 5935 1667 1725 5938 5939
5940 5941 5942 1834 5944 5945 5946 5947 5948 5949 5950 5951 5952 5953 1475 5955 5956 1139 5958 5959
```

-continued 5960 5961 5962 5963 371 5965 5966 1140 5968 5969 5970 5971 269 5973 5974 5975 5976 5977 5978 5979
5980 5981 5982 1476 5984 5985 5986 5987 5988 5989 5990 5991 5992 5993 5994 5995 5996 5997 5998 1477
6000 6001 6002 6003 342 1142 6006 6007 6008 6009 6010 6011 6012 6013 6014 6015 6016 6017 6018 6019
6020 6021 6022 6023 6024 6025 6026 6027 6028 1143 6030 270 6032 6033 6034 6035 6036 6037 6038 6039
6040 1145 6042 6043 6044 6045 6046 6047 6048 2258 6050 6051 6052 6053 6054 6055 6056 2248 6058 6059
6060 1726 6062 6063 6064 6065 1540 6067 6068 6069 6070 6071 6072 6073 1146 1147 6076 6077 6078 6079
6080 95 6082 6083 6084 6085 429 6087 6088 1787 6090 1148 6092 6093 6094 6095 401 6097 1149 6099
6100 6101 6102 6103 6104 6105 6106 6107 6108 6109 6110 6111 6112 6113 1150 464 6116 6117 6118 6119
1151 6121 6122 1845 6124 6125 6126 271 1541 6129 272 402 2197 1600 2054 6135 6136 6137 6138 6139
1154 6141 6142 6143 6144 1155 6146 6147 1790 273 6150 1952 6152 6153 6154 6155 6156 6157 6158 6159
128 6161 6162 6163 6164 6165 327 6167 6168 6169 6170 6171 6172 6173 6174 6175 6176 6177 6178 6179
6180 2090 6182 6183 1158 6185 6186 6187 6188 6189 2203 6191 1411 6193 6194 6195 1601 6197 6198 6199
6200 1973 274 6203 6204 1542 6206 2027 6208 6209 1160 6211 6212 275 6214 6215 6216 1162 6218 1641
276 6221 6222 6223 6224 6225 6226 6227 1877 6229 1164 6231 6232 6233 6234 509 6236 6237 6238 2021
6240 6241 6242 1835 6244 6245 6246 2271 6248 2174 6250 277 2269 1166 1167 6255 6256 6257 43 6259
6260 6261 6262 6263 1168 6265 6266 6267 6268 6269 6270 6271 6272 6273 6274 6275 6276 1602 6278 6279
6280 6281 6282 6283 44 6285 6286 6287 6288 6289 6290 6291 6292 6293 6294 6295 6296 1169 6298 6299
6300 6301 6302 6303 1170 1871 6306 6307 6308 6309 6310 6311 2252 6313 6314 6315 6316 6317 1977 6319
1480 6321 6322 6323 6324 6325 6326 6327 6328 447 6330 6331 6332 6333 6334 6335 6336 2075 6338 6339
6340 1172 6342 6343 1946 1603 6346 1173 278 6349 6350 6351 6352 6353 1175 6355 6356 6357 1727 126
6360 6361 6362 1176 6364 6365 6366 1177 6368 6369 6370 6371 6372 6373 6374 1836 6376 6377 6378 6379
2233 6381 6382 6383 6384 6385 1978 6387 1179 6389 6390 6391 1412 6393 6394 6395 1413 1922 6398 6399
6400 280 6402 6403 1543 6405 6406 6407 6408 6409 6410 6411 6412 6413 6414 1181 6416 6417 6418 6419
6420 6421 6422 6423 6424 6425 6426 6427 6428 6429 6430 6431 6432 6433 6434 6435 6436 1182 6438 6439
6440 6441 6442 6443 6444 6445 6446 6447 6448 6449 1183 6451 6452 6453 6454 6455 6456 6457 6458 1184
6460 281 1186 6463 6464 6465 6466 6467 6468 6469 6470 1187 6472 1188 6474 282 6476 1481 1190 6479
6480 6481 6482 6483 6484 6485 1191 283 6488 6489 6490 6491 6492 6493 6494 6495 6496 284 6498 6499
6500 6501 1642 6503 6504 6505 6506 6507 1448 6509 6510 6511 6512 506 6514 6515 6516 6517 6518 1728
6520 6521 1195 6523 6524 6525 6526 6527 6528 6529 6530 6531 1482 2243 6534 6535 6536 1196 6538 6539
286 6541 6542 1198 6544 404 6546 1199 6548 6549 6550 6551 6552 6553 6554 6555 6556 6557 6558 6559
6560 6561 6562 6563 6564 6565 6566 6567 6568 6569 6570 6571 6572 6573 6574 6575 6576 6577 6578 6579
6580 6581 6582 6583 6584 1200 6586 6587 6588 6589 6590 6591 6592 6593 1201 1872 6596 6597 6598 6599
6600 6601 1873 6603 6604 6605 6606 6607 6608 6609 1202 6611 6612 6613 6614 6615 6616 6617 6618 6619
6620 6621 6622 6623 6624 6625 6626 6627 6628 6629 1203 6631 6632 6633 6634 6635 6636 6637 6638 6639
6640 6641 6642 6643 6644 6645 6646 6647 6648 6649 6650 6651 6652 6653 6654 6655 1644 6657 6658 6659
6660 6661 6662 6663 6664 6665 6666 6667 6668 6669 6670 6671 6672 1793 6674 6675 6676 6677 6678 6679
2159 6681 6682 6683 6684 6685 6686 1204 6688 6689 6690 6691 6692 6693 6694 6695 1205 6697 6698 6699
6700 6701 6702 1206 6704 6705 6706 6707 6708 6709 2079 6711 6712 6713 6714 6715 1414 1207 6718 6719
6720 6721 6722 1483 6724 1208 6726 1209 6728 6729 6730 6731 6732 6733 6734 6735 6736 6737 6738 6739
6740 6741 1210 6743 6744 6745 287 6747 6748 6749 6750 6751 1212 6753 6754 6755 6756 1544 6758 6759
6760 1213 6762 6763 6764 6765 6766 515 6768 288 6770 6771 6772 6773 6774 6775 6776 6777 6778 6779
6780 6781 1215 6783 6784 1216 6786 6787 1217 6789 6790 6791 6792 6793 6794 1218 6796 1219 6798 6799
6800 6801 6802 6803 6804 6805 6806 6807 6808 6809 1220 6811 6812 6813 6814 6815 6816 6817 6818 6819
6820 6821 6822 6823 6824 6825 6826 6827 6828 6829 6830 6831 6832 6833 6834 6835 6836 6837 6838 6839
6840 6841 6842 6843 6844 6845 1221 6847 6848 6849 6850 6851 6852 6853 6854 6855 6856 6857 6858 6859
1810 6861 6862 6863 6864 6865 6866 6867 511 6869 6870 6871 1814 6873 6874 6875 1222 6877 6878 6879
1492 6881 289 290 6884 6885 6886 6887 6888 6889 6890 6891 2119 6893 1225 6895 6896 6897 6898 1226
373 6901 6902 1227 6904 6905 6906 1896 6908 6909 2010 6911 6912 6913 6914 1228 6916 6917 6918 1229
6920 1230 6922 6923 6924 6925 6926 6927 6928 6929 6930 6931 1415 6933 1545 6935 6936 1646 6938 6939
6940 1231 1794 6943 6944 6945 6946 497 6948 6949 6950 2036 6952 6953 34 6955 6956 1729 1837 6959
6960 6961 6962 6963 6964 6965 6966 6967 2196 6969 6970 6971 6972 1953 6974 1604 6976 1236 6978 294
6980 6981 6982 6983 6984 6985 6986 6987 6988 6989 1238 6991 6992 6993 6994 6995 6996 6997 6998 6999
7000 7001 7002 7003 7004 7005 7006 7007 7008 7009 7010 7011 7012 7013 7014 7015 7016 7017 7018 7019
1239 7021 7022 7023 7024 1416 7026 1240 7028 7029 7030 7031 7032 7033 7034 7035 7036 7037 7038 7039
7040 7041 1241 1242 7044 7045 1605 7047 328 7049 7050 7051 7052 1886 7054 7055 7056 7057 7058 7059
7060 7061 7062 295 7064 7065 7066 7067 2293 7069 7070 7071 1928 7073 7074 7075 7076 7077 7078 1244
7080 7081 7082 7083 7084 7085 7086 7087 7088 7089 7090 7091 7092 7093 7094 7095 7096 7097 7098 7099
7100 7101 7102 7103 1245 7105 7106 7107 7108 1246 7110 1247 7112 7113 7114 7115 7116 7117 7118 7119
7120 1248 7122 7123 1249 7125 7126 7127 7128 7129 7130 7131 7132 7133 7134 7135 1250 7137 7138 7139
7140 1862 7142 7143 7144 7145 7146 7147 7148 7149 7150 1730 7152 7153 7154 7155 7156 7157 7158 7159
7160 414 7162 7163 7164 7165 7166 7167 7168 7169 1251 7171 7172 7173 7174 7175 7176 2234 7178 7179
7180 7181 7182 7183 7184 7185 7186 7187 7188 7189 7190 7191 7192 7193 7194 7195 7196 7197 7198 7199
7200 7201 7202 7203 7204 7205 7206 7207 7208 7209 7210 1485 7212 7213 1682 7215 7216 7217 7218 7219
7220 7221 1253 7223 1254 7225 7226 7227 7228 7229 7230 7231 7232 7233 7234 7235 7236 1255 7238 7239
7240 1256 1257 7243 7244 7245 7246 7247 7248 7249 7250 7251 7252 7253 7254 7255 7256 7257 7258 1258
7260 7261 7262 7263 7264 7265 7266 7267 7268 7269 7270 507 7272 7273 7274 7275 7276 7277 7278 7279
7280 7281 1259 7283 7284 7285 7286 7287 7288 7289 7290 7291 7292 1260 7294 1815 7296 7297 7298 297
7300 1262 7302 7303 7304 7305 7306 7307 7308 7309 7310 1263 1731 7313 7314 7315 7316 7317 7318 7319
7320 7321 7322 7323 7324 298 7326 7327 7328 7329 329 7331 7332 7333 7334 7335 7336 299 7338 7339
7340 7341 7342 7343 300 7345 1546 7347 7348 1267 7350 7351 7352 7353 7354 1420 7356 1268 7358 7359
7360 7361 7362 7363 7364 7365 1421 7367 7368 7369 1607 7371 7372 7373 7374 7375 7376 1377 7378 7379
7380 7381 7382 7383 7384 7385 301 2118 1270 7389 7390 7391 7392 7393 7394 7395 7396 7397 7398 7399
7400 7401 7402 7403 7404 7405 7406 7407 7408 7409 7410 7411 7412 7413 7414 7415 7416 7417 7418 7419
7420 7421 1271 7423 7424 7425 7426 7427 7428 7429 7430 7431 7432 7433 7434 7435 7436 7437 7438 7439
7440 7441 1272 7443 7444 7445 7446 7447 7448 7449 7450 7451 1272 7453 7454 7455 1647 7457 7458 1732
7460 483 1273 7463 7464 7465 1274 7467 7468 7469 7470 7471 7472 7473 7474 7475 7476 7477 7478 7479
7480 7481 98 7483 7484 7485 7486 7487 1275 7489 7490 7491 7492 7493 7494 7495 7496 7497 7498 7499
7500 353 7502 7503 7504 1838 7506 7507 408 7509 7510 7511 7512 7513 7514 7515 1276 7518 7519
1277 7521 7522 7523 7524 7525 7526 7527 7528 7529 7530 7531 7532 7533 49 7535 7536 7537 7538 7539
7540 7541 7542 7543 7544 7545 7546 7547 1278 7549 7550 1864 7552 1279 7554 7555 7556 7557 7558 7559

-continued 7560 7561 7562 7563 7564 1280 7566 7567 7568 7569 7570 7571 7572 7573 1422 7575 7576 7577 7578 7579
7580 7581 7582 7583 2141 7585 7586 7587 7588 1282 2217 7591 7592 7593 7594 7595 7596 1962 7598 7599
7600 7601 7602 7603 7604 7605 1284 7607 7608 7609 1285 7611 7612 7613 7614 7615 2073 303 7618 7619
7620 7621 7622 7623 7624 1287 7626 7627 7628 7629 7630 7631 7632 7633 7634 7635 7636 7637 7638 7639
1288 7641 7642 7643 7644 7645 7646 7647 1289 7649 7650 7651 7652 7653 7654 7655 7656 7657 7658 7659
7660 7661 7662 7663 7664 7665 7666 7667 1290 2044 7670 7671 111 1291 7674 2030 7676 7677 7678 7679
7680 1292 7682 1293 7684 7685 7686 7687 456 7689 7690 1796 7692 7693 7694 7695 7696 7697 7698 7699
7700 7701 7702 7703 1294 7705 7706 7707 7708 1295 7710 7711 7712 330 7714 1794 7715 7716 7717 7718 7719
7720 7721 7722 7723 7724 7725 7726 7727 7728 7729 7730 7731 7732 7733 7734 7735 7736 7737 7738 7739
7740 7741 7742 7743 1549 7745 7746 7747 7748 7749 7750 7751 7752 7753 7754 7755 304 1297 7758 7759
7760 7761 7762 1298 7764 7765 1425 7767 1680 7769 7770 7771 7772 7773 7774 7775 1299 7777 7778 7779
7780 7781 7782 7783 7784 7785 1300 7787 7788 7789 7790 7791 7792 7793 7794 7795 7796 7797 2198 7799
7800 7801 7802 7803 7804 7805 1301 7807 7808 7809 7810 7811 1302 7813 1303 7815 1909 7817 7818 7819
7820 7821 7822 1426 7824 1608 7826 7827 7828 7829 7830 7831 7832 7833 7834 7835 7836 1550 7838 7839
1609 36 7842 7843 7844 7845 7846 7847 1305 7849 7850 7851 7852 7853 7854 1865 7856 7857 7858 1551
7860 1797 7862 7863 7864 7865 7866 1306 7868 7869 7870 7871 7872 7873 7874 7875 306 7877 7878 7879
7880 7881 7882 7883 7884 7885 1552 1308 7888 7889 7890 7891 7892 7893 307 7895 7896 99 7898 7899
7900 1310 7902 7903 7904 7905 7906 7907 7908 7909 7910 7911 7912 1311 7914 7915 7916 7917 7918 7919
1312 7921 7922 7923 7924 7925 7926 7927 7928 7929 7930 7931 7932 7933 7934 7935 7936 7937 7938 7939
1313 7941 7942 7943 7944 7945 7946 7947 7948 7949 7950 7951 7952 7953 7954 7955 7956 7957 7958 1314
2219 7961 7962 2005 7965 7966 7967 7968 7969 7970 7971 7972 367 7974 7975 7976 7977 7978 7979
7980 7981 7982 7983 7984 1316 7986 7987 7988 7989 7990 7991 7992 7993 7994 7995 7996 7997 7998 7999
8000 8001 8002 1456 8004 8005 1317 8007 8008 8009 8010 8011 8012 8013 8014 8015 1318 8017 8018 8019
8020 8021 8022 8023 8024 8025 8026 8027 1319 8029 8030 8031 8032 8033 8034 8035 1428 8037 8038 1910
8040 8041 8042 8043 8044 1651 8046 8047 1320 8049 8050 8051 8052 8053 8054 8055 8056 308 8058 8059
8060 8061 8062 8063 8064 8065 8066 8067 8068 8069 8070 8071 8072 8073 8074 8075 8076 8077 8078 8079
8080 1735 8082 1565 8084 8085 8086 8087 8088 8089 8090 8091 8092 8093 8094 1322 8096 8097 8098 8099
1323 8101 8102 8103 8104 8105 8106 8107 309 8109 1325 8111 8112 1429 8114 8115 8116 8117 8118 1326
8120 8121 1327 8123 8124 1328 8126 8127 1329 8129 8130 8131 8132 8133 8134 8135 8136 8137 8138 8139
8140 8141 8142 8143 8144 1430 8146 8147 8148 8149 8150 8151 1330 8153 8154 8155 344 8157 8158 1331
8160 1923 8162 8163 8164 8165 8166 8167 8168 8169 8170 8171 8172 8173 8174 8175 8176 8177 8178 8179
8180 1332 8182 8183 8184 8185 8186 8187 8188 8189 8190 1333 8192 8193 8194 8195 310 8197 1554 8199
8200 8201 1335 8203 8204 8205 8206 8207 8208 8209 355 8211 8212 8213 8214 8215 8216 8217 8218 8219
1336 8221 8222 1431 1337 8225 8226 8227 8228 123 8230 8231 311 8233 8234 1736 1339 8237 8238 8239
8240 8241 1840 1556 90 8245 8246 8247 8248 1737 8250 8251 8252 8253 8254 8255 8256 8257 1799 8259
8260 1911 8262 8263 1558 8265 8266 8267 2088 8269 8270 8271 1341 8273 8274 8275 8276 8277 8278 8279
8280 1649 356 312 8284 8285 8286 8287 8288 8289 8290 8291 8292 8293 8294 8295 8296 8297 504 8299
8300 8301 8302 8303 2220 8305 8306 8307 1738 1841 8310 8311 472 8313 8314 8315 8316 8317 1343 1668
8320 8321 8322 430 8324 8325 8326 8327 8328 8329 8330 8331 8332 1344 8334 8335 1345 1346 8338 8339
2039 8341 2019 8343 8344 1348 2023 1349 8348 8349 8350 8351 8352 8353 8354 20 8356 8357 8358 8359
1350 8361 8362 8363 8364 8365 8366 8367 8368 8369 8370 8371 8372 8373 8374 8375 8376 8377 8378 8379
8380 1351 8382 8383 8384 8385 8386 8387 8388 8389 8390 1352 8392 8393 8394 1353 8396 8397 8398 8399
8400 8401 8402 8403 8404 8405 8406 8407 8408 8409 8410 8411 8412 8413 8414 8415 8416 8417 1560 8419
357 8421 8422 8423 8424 8425 8426 1354 8428 8429 8430 8431 1355 8433 8434 8435 8436 1739 8438 8439
8440 1434 8442 8443 8444 8445 8446 8447 8448 8449 8450 8451 8452 8453 8454 8455 2026 8457 8458 8459
8460 8461 1356 8463 8464 8465 8466 8467 8468 8469 8470 8471 1487 1357 8474 8475 8476 8477 8478 8479
8480 8481 8482 8483 8484 8485 8486 8487 8488 8489 8490 8491 8492 8493 8494 1358 8496 8497 8498 8499
8500 8501 8502 8503 8504 8505 8506 8507 8508 8509 8510 8511 8512 1359 8514 8515 8516 8517 2089 8519
1360 8521 8522 8523 8524 8525 8526 8527 8528 8529 8530 8531 8532 8533 8534 8535 8536 8537 8538 8539
8540 8541 8542 8543 1488 8545 8546 8547 8548 8549 313 8551 8552 8553 1362 8555 8556 8557 8558 8559
8560 8561 8562 8563 8564 8565 1800 8567 8568 8569 8570 8571 8572 8573 8574 8575 1363 8577 8578 8579
8580 8581 8582 8583 8584 8585 8586 8587 8588 8589 8590 8591 1435 8593 8594 8595 8596 8597 8598 8599
8600 8601 8602 8603 8604 8605 8606 8607 8608 8609 8610 8611 8612 8613 8614 8615 8616 8617 8618 8619
8620 314 8622 8623 8624 8625 8626 8627 8628 8629 8630 8631 8632 8633 8634 8635 8636 8637 8638 8639
8640 1365 8642 8643 8644 8645 8646 8647 1366 8649 8650 8651 8652 8653 8654 1367 8656 8657 1368 1489
1369 8661 8662 8663 8664 8665 8666 8667 8668 116 8670 8671 8672 1740 8674 8675 8676 8677 8678 8679
8680 24 8682 391 8684 8685 8686 8687 8688 8689 8690 8691 8692 8693 8694 1370 8696 8697 8698 8699
8700 8701 8702 8703 8704 8705 8706 8707 8708 2199 8710 8711 8712 8713 315 92 8716 8717 8718 1372
8720 8721 8722 8723 8724 8725 8726 8727 8728 1373 8730 8731 334 8733 8734 8735 8736 8737 8738 8739
8740 8741 8742 8743 1925 8745 8746 8747 8748 8749 358 1374 8752 8753 8754 8755 8756 8757 8758 8759
8760 8761 1375 8763 8764 8765 1742 8767 8768 8769 8770 8771 8772 8773 8774 8775 8776 8777 8778 8779
8780 8781 8782 8783 8784 8785 8786 1376 8788 8789 8790 8791 8792 8793 8794 8795 8796 316 8798 8799
8800 8801 8802 8803 8804 8805 8806 8807 8808 8809 8810 8811 8812 8813 1438 8815 1890 8817 8818 8819
8820 8821 8822 1378 8824 1379 8826 8827 93 8829 8830 8831 8832 8833 1843 8835 8836 1380 8838 8839
8840 8841 8842 8843 8844 8845 8846 8847 8848 8849 8850 8851 8852 8853 8854 8855 8856 8857 8858 8859
8860 8861 8862 8863 8864 8865 8866 8867 8868 8869 8870 8871 8872 8873 8874 8875 8876 86 1801 8879
8880 8881 8882 8883 1947 8885 1440 8887 8888 8889 8890 8891 8892 8893 8894 8 8896 8897 8898 8899
8900 8901 8902 8903 8904 8905 8906 8907 1441 8909 1844 8911 8912 8913 8914 8915 8916 8917 8918 8919
8920 8921 1611 8923 8924 8925 8926 8927 8928 8929 8930 8931 8932 8933 8934 8935 1383 8937 8938 8939
8940 8941 8942 8943 8944 8945 1384 319 8948 8949 8950 8951 8952 8953 8954 8955 8956 8957 8958 8959
8960 8961 8962 8963 8964 8965 8966 8967 8968 8969 8970 8971 8972 8973 8974 8975 8976 8977 8978 8979
8980 8981 8982 8983 1386 2218 8986 8987 1442 8989 8990 1802 8992 8993 8994 8995 8996 8997 1387 8999
9000 9001 9002 9003 9004 9005 9006 9007 9008 9009 9010 9011 9012 9013 9014 9015 9016 9017 9018 9019
9020 9021 9022 9023 9024 9025 9026 9027 9028 9029 9030 88 9032 465 9034 9035 1389 9037 1443 9039
9040 9041 9042 9043 9044 9045 9046 9047 9048 9049 9050 9051 9052 9053 9054 9055 9056 9057 1650 9059
9060 2265 9062 9063 9064 1983 9066 9067 9068 9069 9070 9071 9072 9073 9074 9075 9076 9077 9078 9079
9080 9081 9082 9083 1390 9085 9086 9087 9088 9089 9090 1563 9092 9093 9094 9095 9096 9097 9098 9099
1743 9101 9102 9103 9104 9105 9106 9107 9108 9109 9110 9111 9112 9113 9114 9115 9116 9117 9118 9119
9120 9121 1391 9123 9124 9125 9126 9127 9128 1445 9130 9131 9132 9133 9134 9135 9136 9137 9138 9139
9140 9141 9142 9143 9144 9145 9146 336 9148 9149 9150 9151 1564 9153 9154 9155 1888 9157 9158 9159

-continued 9160 9161 9162 9163 9164 9165 9166 9167 9168 9169 9170 9171 9172 9173 2134 9175 9176 9177 9178 9179
9180 9181 9182 9183 9184 9185 9186 9187 9188 9189 9190 9191 9192 9193 9194 9195 9196 9197 9198 9199 9200 9201 9202
9203 9204 9205 9206 9207 9208 9209 9210 9211 9212 9213 1392 9215.

10. A method of decoding the system code sequence formed by the encoding method according to claim 6 using a processor, comprising the following steps:

using a processor to decode the system code sequence outputted by the encoding device based on the M×N check matrix using any decoding algorithm, and generating a hard-decision sequence $\{\hat{c}_i, 0 \leq i \leq N\}$; and using a processor to extract an information sequence $\{\hat{m}_k, 0 \leq k \leq N-M-1\}$ from the hard-decision sequence using the same sorting table IDX as that for encoding, where $\hat{m}_k = \hat{c}_{I_{k+M}}, 0 \leq k \leq N-M$.

11. A decoding device which decodes the inputted encoded system code sequence using the decoding method according to claim 6 and outputs the decoded information sequence, the decoding device comprising:

An LDPC decoding module which decodes an in-putted system code sequence LLR using any LDPC decoding algorithm and outputs a hard-decision sequence $\hat{c}$;

a sorting index module having N memory units which stores index values of a sorting table IDX; and a sorting output module which extracts an information sequence $\hat{m}$ from the hard-decision sequence $\hat{c}$ based on the stored index values in the sorting index table and output it.

12. A method for constructing an LPDC check matrix using a processor, in the case that the constructed check matrix has dimensions of M×N, the method comprising the following steps:

first step: using a processor to obtain a common factor set $F_c$ of M and N;

second step: using a processor to select a proper extending ratio $K \in F_c$ and generating a fundamental matrix with dimensions $M_B \times N_B$ using any manner, in which $M_B = M/K, N_B = N/K$;

third step: using a processor to extend the fundamental matrix by rows and constructing a $M \times N_B$ matrix, the step comprising:

for non-zero elements with row-column coordinate (m,n) in the fundamental matrix, and selecting a set of row extending coefficients $\{k_i, 0 \leq k_i \leq K-1, i \in Z^+\}$ which are different from each other, with "1" on positions $(k_i \times M_B + m, n)$ of the $M \times N_B$ matrix, where the $Z^+$ denotes the set of positive integers; and fourth step: using a processor to extend K columns based on each column of the constructed $M \times N_B$ matrix.

13. The method according to claim 12, wherein the method of extending out K columns per column of the constructed $M \times N_B$ matrix comprises:

the $t^{th}$ column extended by a certain column of the constructed $M \times N_B$ matrix is obtained by cyclic shifting $t \times M_B$ positions downward, where $0 \leq t \leq K-1$.

14. The method according to claim 12, wherein the $M \times N_B$ matrix is stored in code table form, and each row of the code table records positions of "1" in each column of the $M \times N_B$ matrix.

* * * * *